US012765340B2

(12) United States Patent
Okuda et al.

(10) Patent No.: US 12,765,340 B2
(45) Date of Patent: Oct. 13, 2026

(54) SEMICONDUCTOR DEVICE

(71) Applicant: ROHM CO., LTD., Kyoto (JP)

(72) Inventors: Hajime Okuda, Kyoto (JP); Yuji Osumi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 830 days.

(21) Appl. No.: 18/022,746

(22) PCT Filed: Sep. 16, 2021

(86) PCT No.: PCT/JP2021/034165
§ 371 (c)(1),
(2) Date: Feb. 23, 2023

(87) PCT Pub. No.: WO2022/065202
PCT Pub. Date: Mar. 31, 2022

(65) Prior Publication Data

US 2023/0326786 A1 Oct. 12, 2023

(30) Foreign Application Priority Data

Sep. 25, 2020 (JP) ................................ 2020-160875

(51) Int. Cl.

| | |
|---|---|
| ***H10W 10/17*** | (2026.01) |
| ***H10D 30/01*** | (2025.01) |
| ***H10D 30/66*** | (2025.01) |
| ***H10D 64/23*** | (2025.01) |
| ***H10D 84/01*** | (2025.01) |

(Continued)

(52) U.S. Cl.
CPC ........ *H10W 10/17* (2026.01); *H10D 30/0297* (2025.01); *H10D 30/668* (2025.01); *H10D 64/258* (2025.01); *H10D 84/0188* (2025.01); *H10D 84/038* (2025.01); *H10D 84/856* (2025.01); *H10W 10/0145* (2026.01)

(58) Field of Classification Search
CPC . H10W 10/17; H10W 10/0145; H10W 10/00; H10W 10/01; H10D 30/0297; H10D 30/668; H10D 64/258; H10D 84/0188; H10D 84/038; H10D 84/856; H10D 30/0221; H10D 30/603; H10D 30/665; H10D 64/117; H10D 64/516; H10D 62/378; H10D 64/20; H10D 62/127; H10D 64/518; H01L 21/76232; H01L 21/76
USPC .......................................................... 257/288
See application file for complete search history.

(56) References Cited

U.S. PATENT DOCUMENTS

2018/0226480 A1* 8/2018 Okuda ................ H10D 30/668

FOREIGN PATENT DOCUMENTS

| | | |
|---|---|---|
| JP | 4-291768 A | 10/1992 |
| JP | 10-112456 A | 4/1998 |
| JP | 2003-142676 A | 5/2003 |

OTHER PUBLICATIONS

International Search Report and Written Opinion mailed on Nov. 22, 2021, received for PCT Application PCT/JP2021/034165, filed on Sep. 16, 2021, 13 pages including English Translation.

(Continued)

*Primary Examiner* — Theresa T Doan
(74) *Attorney, Agent, or Firm* — XSENSUS LLP

(57) ABSTRACT

A semiconductor device includes a semiconductor chip that has a main surface, and a field insulating film that partially covers the main surface and has an insulating side wall in which an inclined angle made with the main surface is not less than 20° and not more than 40°.

15 Claims, 68 Drawing Sheets

(51) Int. Cl.

| | |
|---|---|
| ***H10D 84/03*** | (2025.01) |
| ***H10D 84/85*** | (2025.01) |
| ***H10W 10/00*** | (2026.01) |

(56) References Cited

OTHER PUBLICATIONS

Notice of Reasons for Refusal (Dispatch date: Jul. 3, 2025) issued in corresponding Japanese Patent Application No. 2022-551937 (6 pages; with English machine translation).

* cited by examiner

SEMICONDUCTOR DEVICE

CROSS-REFERENCE TO RELATED APPLICATIONS

The present application is based on PCT filing PCT/JP2021/034165, filed Sep. 16, 2021, which claims priority to Japanese Patent Application No. 2020-160875, filed Sep. 25, 2020, the entire contents of each are incorporated herein by reference.

TECHNICAL FIELD

The present invention relates to a semiconductor device.

BACKGROUND ART

Patent Literature 1 discloses a semiconductor device that includes a semiconductor substrate, a thick oxide film, a thin oxide film, and a polysilicon layer. The thick oxide film is locally formed on the semiconductor substrate. The thin oxide film forms a high step with the thick oxide film on the semiconductor substrate. A side wall angle of the thick oxide film is from 70° to 80°. The polysilicon layer is formed on the thick oxide film and the thin oxide film. After a step of forming the polysilicon layer, residue called a polysilicon stick remains in a state that it adheres to the high step between the thick oxide film and the thin oxide film. The polysilicon stick is completely removed by a dry etching method.

PRIOR ART LITERATURE

Patent Literature

Patent Literature 1: Japanese Patent Application Publication No. 10-112456

SUMMARY OF INVENTION

Technical Problem

One preferred embodiment of the present invention provides a semiconductor device that can be improved in reliability.

Solution to Problem

One preferred embodiment of the present invention provides a semiconductor device including a semiconductor chip that has a main surface, and a field insulating film that partially covers the main surface and has an insulating side wall in which an inclined angle made with the main surface is not less than 20° and not more than 40°.

One preferred embodiment of the present invention provides a semiconductor device including a semiconductor chip that has a main surface, a trench separation structure that demarcates a device region in the main surface and that includes a separation trench which is formed in the main surface, a separation insulating film which covers an inner wall of the separation trench and a separation electrode which is embedded in the separation trench across the separation insulating film, a functional device that is formed in the device region at the main surface, and a field insulating film that partially covers the main surface so as to expose the functional device in the device region and has an insulating side wall in which an inclined angle made with the main surface is not less than 20° and not more than 40°.

BRIEF DESCRIPTION OF DRAWINGS

FIG. 22O is a cross-sectional view for describing a step subsequent to that of FIG. 22N.

DESCRIPTION OF EMBODIMENTS

Figure 1:
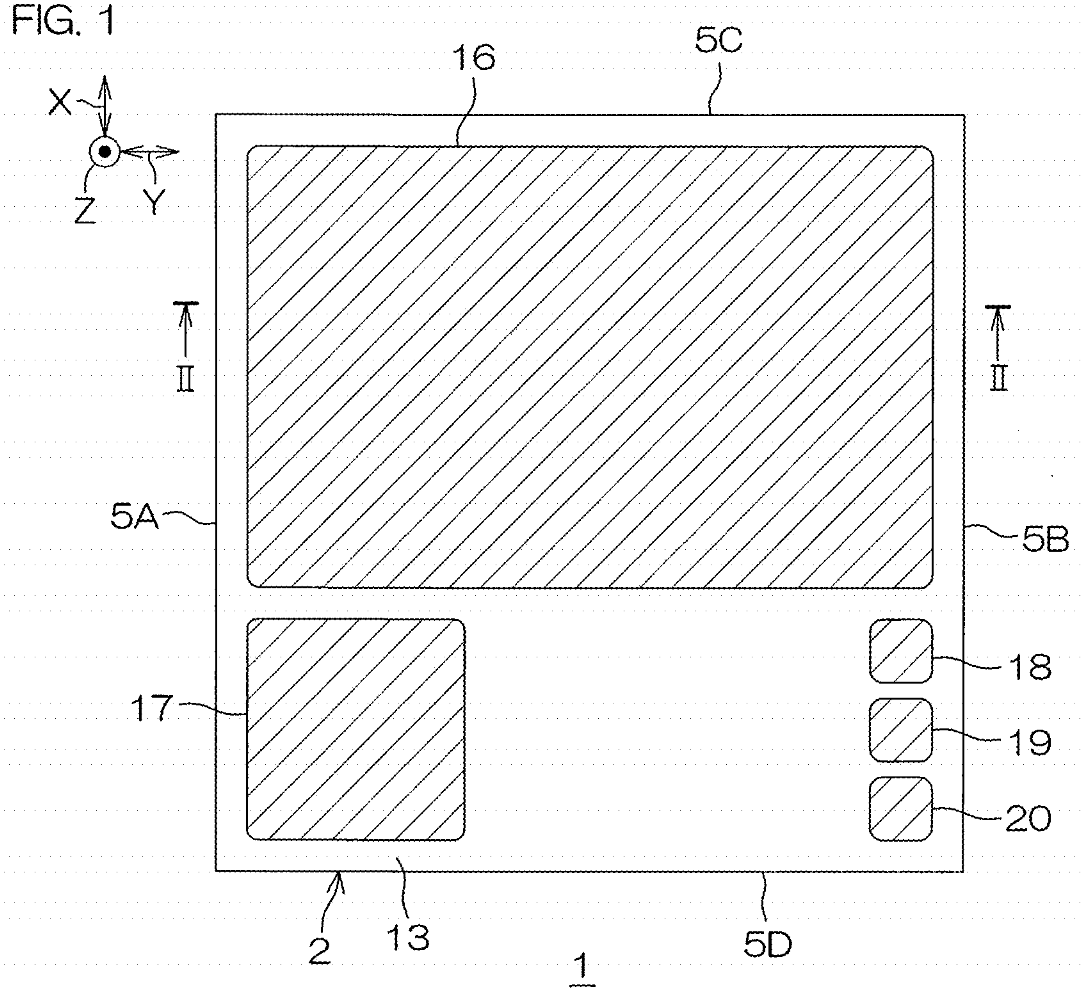
FIG. 1 is a plan view of a semiconductor device according to a preferred embodiment of the present invention.
Figure 2:
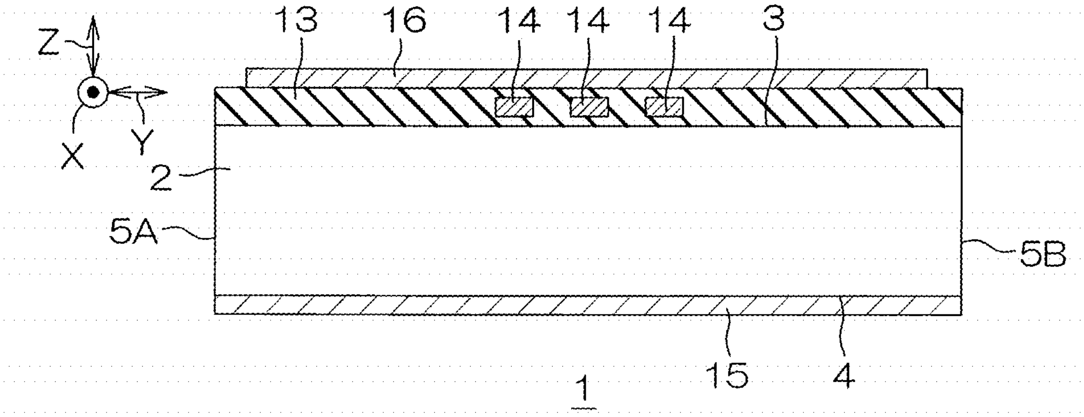
FIG. 2 is a cross-sectional view taken along line II-II shown in FIG. 1.
Figure 3:
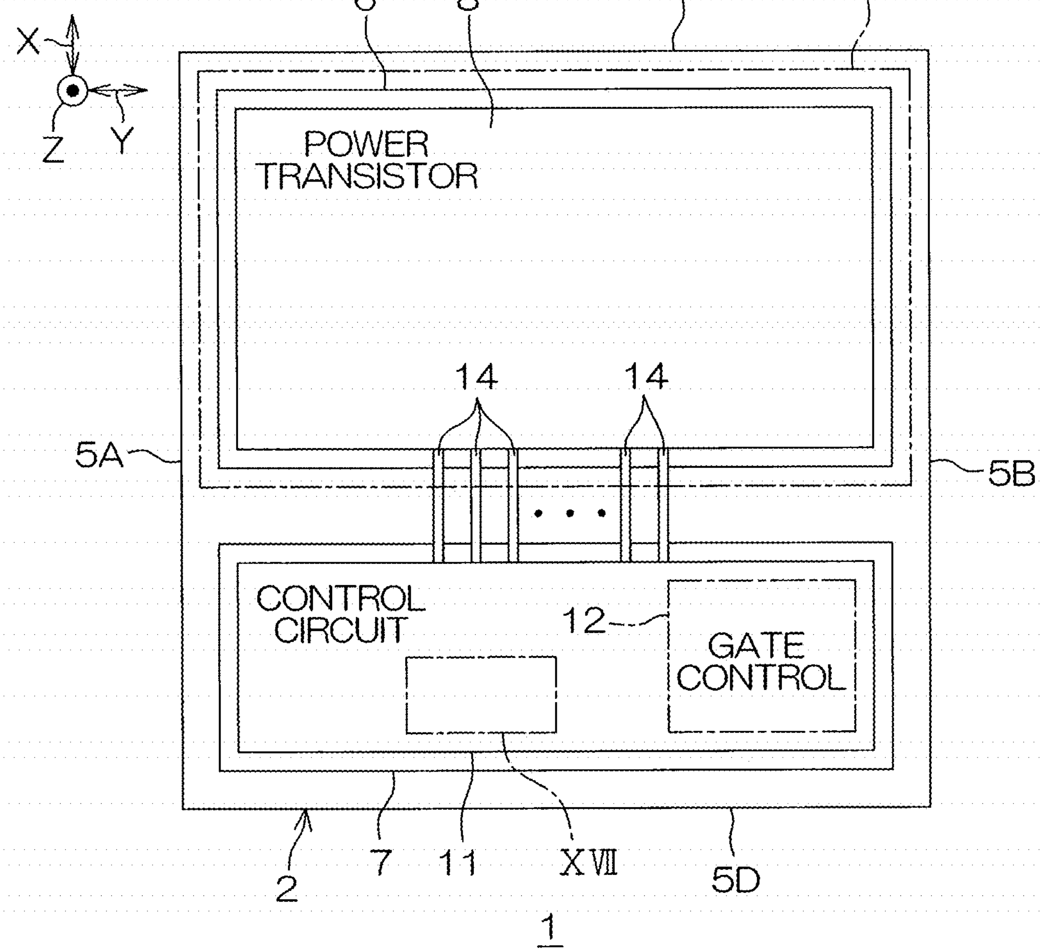
FIG. 3 is a plan view of a structure of a semiconductor chip shown in FIG. 1.
Figure 4:
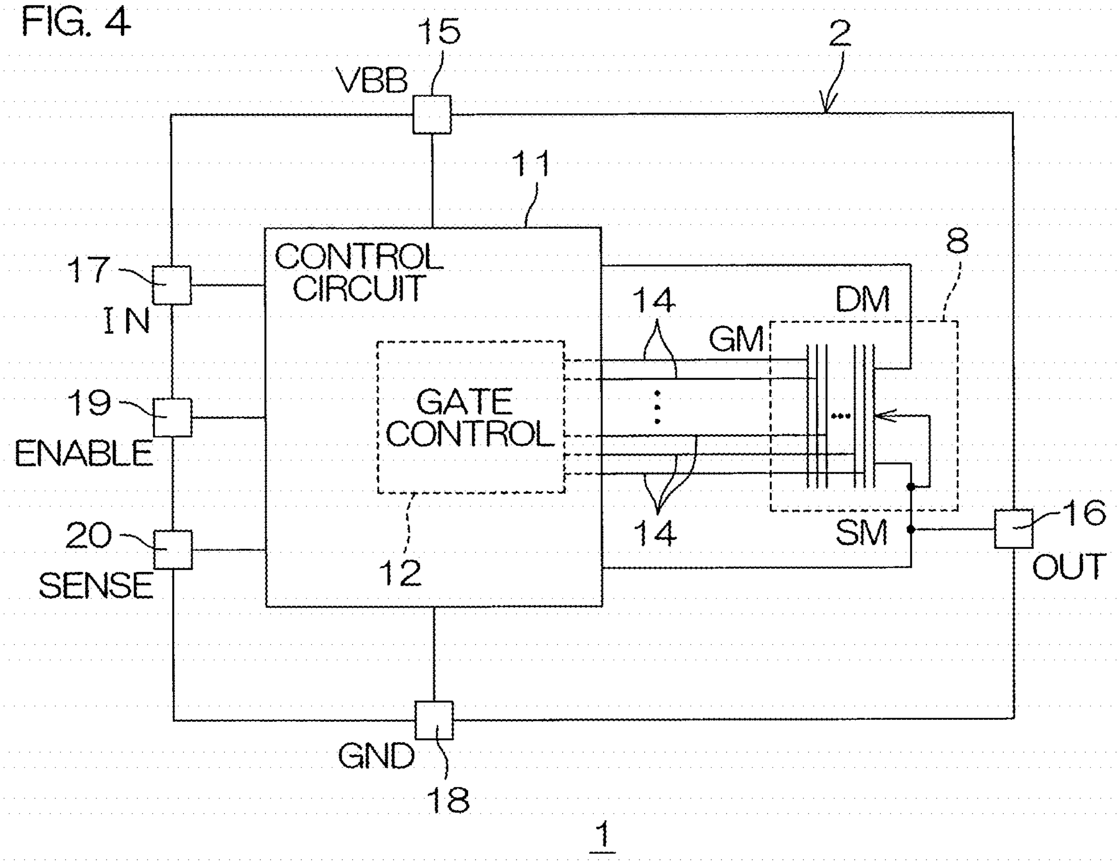
FIG. 4 is a block circuit diagram of an electrical structure of the semiconductor device shown in FIG. 1.
Figure 5:
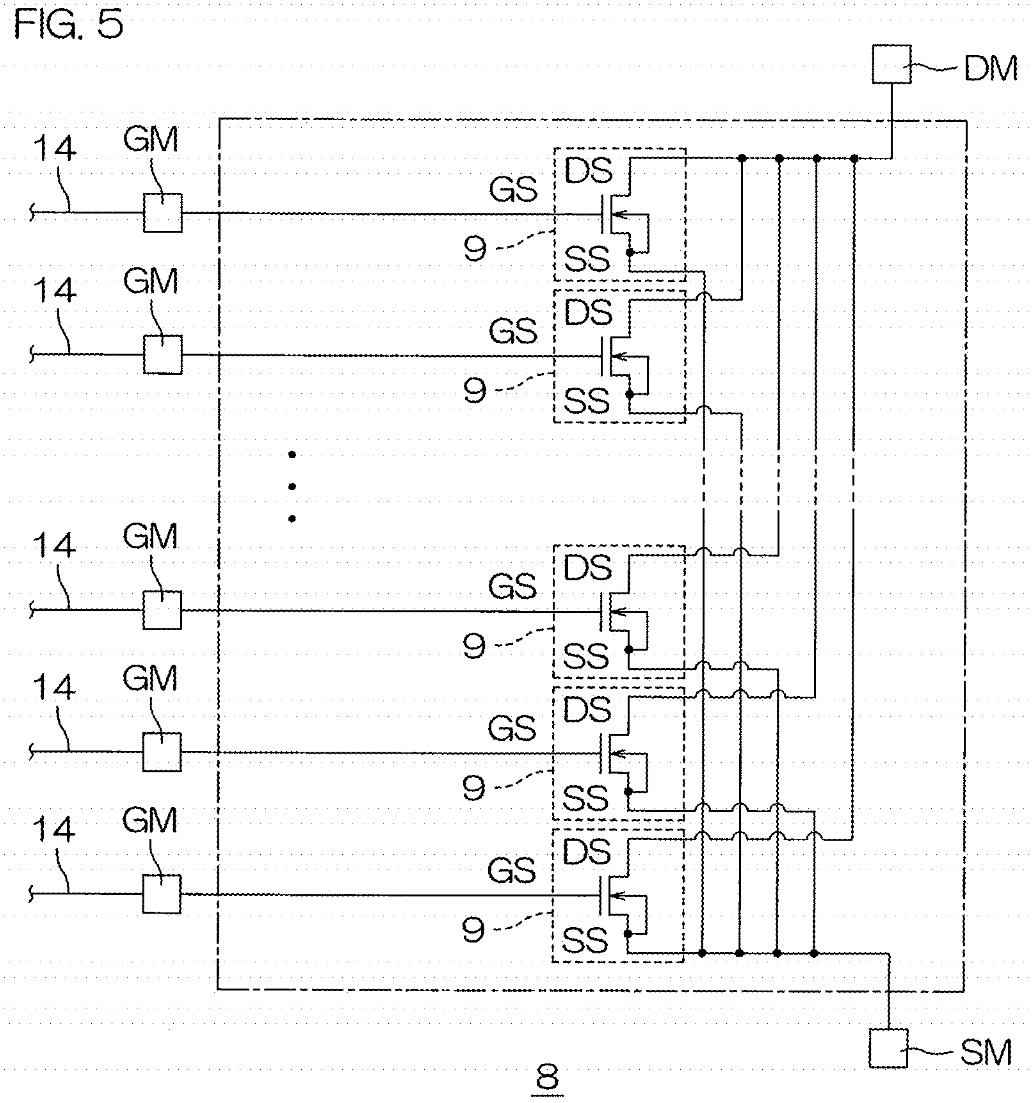
FIG. 5 is an equivalent circuit diagram of a power transistor shown in FIG. 4.
Figure 6:
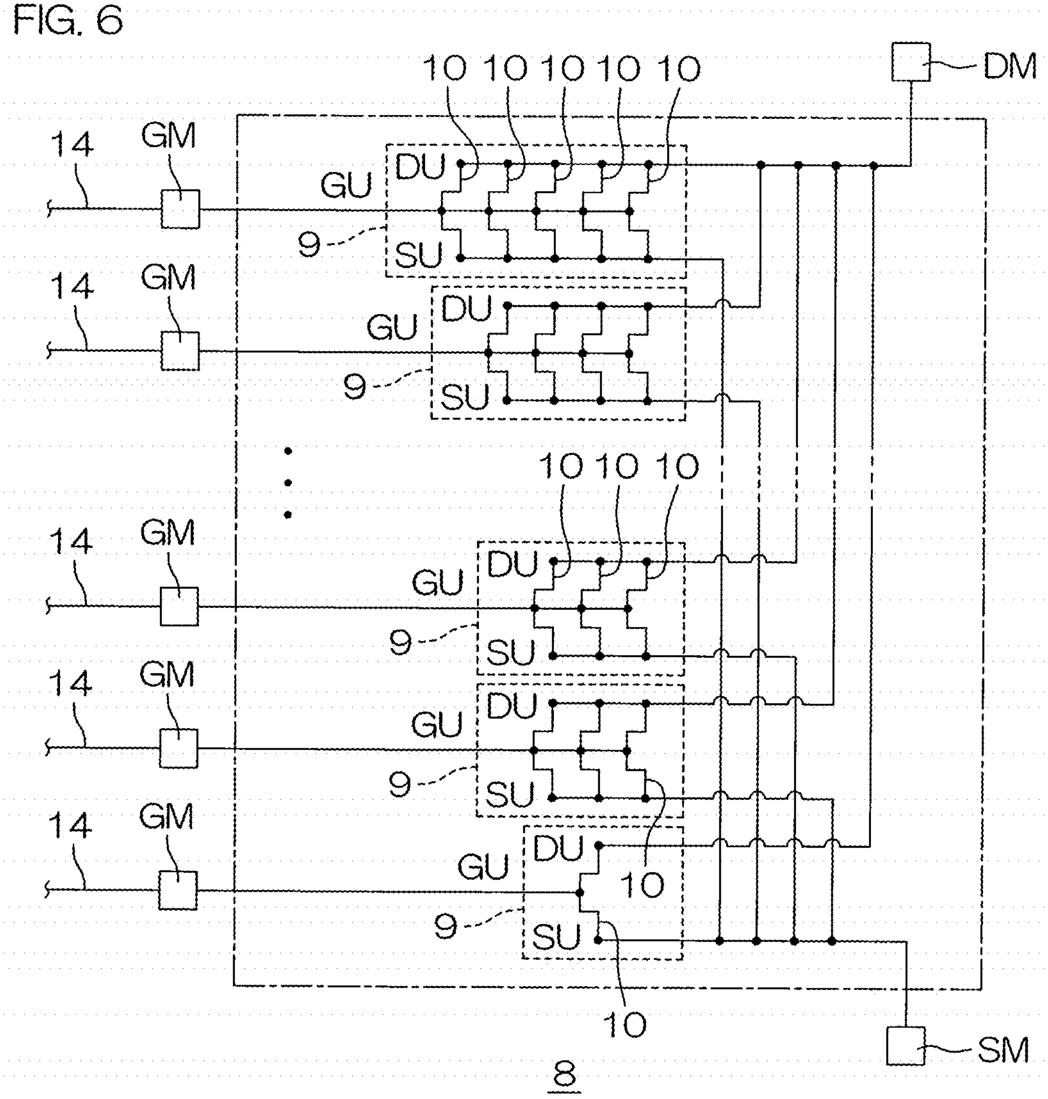
FIG. 6 is another equivalent circuit diagram of the power transistor shown in FIG. 5.

FIG. 1 is a plan view of a semiconductor device 1 according to a preferred embodiment of the present invention. FIG. 2 is a cross-sectional view taken along line II-II shown in FIG. 1. FIG. 3 is a plan view of a structure of a semiconductor chip 2 shown in FIG. 1. FIG. 4 is a block circuit diagram of an electrical structure of the semiconductor device 1 shown in FIG. 1. FIG. 5 is an equivalent circuit diagram of a power transistor 8 shown in FIG. 4. FIG. 6 is another equivalent circuit diagram of the power transistor 8 shown in FIG. 5.

Hereinafter, a description will be given of an embodiment example in which the semiconductor device 1 is constituted of a high side switching device. However, the semiconductor device 1 can be provided as a low side switching device by adjusting electrical connection modes and functions of various structures.

With reference to FIG. 1 and FIG. 2, in this embodiment, the semiconductor device 1 includes the semiconductor chip 2 that is formed in a rectangular parallelepiped shape. Specifically, the semiconductor chip 2 is constituted of an Si (silicon) chip. The semiconductor chip 2 has a first main surface 3 on one side, a second main surface 4 on the other side, and first to fourth side surfaces 5A to 5D that connect the first main surface 3 and the second main surface 4. The first main surface 3 and the second main surface 4 are formed in a quadrilateral shape in a plan view, as viewed from a normal direction Z thereto (hereinafter, simply referred to as "plan view").

The first main surface 3 is a device surface in which a functional device is formed. The second main surface 4 is a mounting surface and may be constituted of a ground surface having a ground mark. The first to fourth side surfaces 5A to 5D include a first side surface 5A, a second side surface 5B, a third side surface 5C, and a fourth side surface 5D. The first side surface 5A and the second side surface 5B extend in a first direction X along the first main surface 3 and oppose a second direction Y that intersects (specifically, orthogonal to) in the first direction X. The third side surface 5C and the fourth side surface 5D extend in the second direction Y and oppose the first direction X.

With reference to FIG. 3, the semiconductor device 1 includes a first device region 6 that is demarcated in the first main surface 3. The first device region 6 is an output region in which an output signal that is output to an outside is generated. In this embodiment, the first device region 6 is demarcated in a region of the first main surface 3 on the third side surface 5C side. The arrangement and planar shape of the first device region 6 are arbitrary and not restricted to a particular mode. However, in view of obtaining favorable output characteristics, the first device region 6 preferably occupies an area that is not less than half of the first main surface 3.

The semiconductor device 1 includes a second device region 7 that is demarcated in a region of the first main surface 3 different from the first device region 6. The second device region 7 is an input region into which an electrical signal from the outside is input. In this embodiment, the second device region 7 is demarcated in a region on the fourth side surface 5D side with respect to the first device region 6. The arrangement and planar shape of the second device region 7 are arbitrary and not restricted to a particular mode.

The second device region 7 preferably has a planar area that is not more than a planar area of the first device region 6. The second device region 7 is preferably formed so as to have an area ratio of not less than 0.1 and not more than 1 in relation to the first device region 6. The area ratio is a ratio of the planar area of the second device region 7 in relation to the planar area of the first device region 6. The area ratio may be not less than 0.1 and not more than 0.25, not less than 0.25 and not more than 0.5, not less than 0.5 and not more than 0.75, or not less than 0.75 and not more than 1. The area ratio is preferably less than 1. As a matter of course, the second device region 7 that has a planar area greater than the planar area of the first device region 6 may be adopted.

With reference to FIG. 3 to FIG. 6, the semiconductor device 1 includes an n-system (n≥2) power transistor 8 as an example of an insulated gate type gate-split transistor that is formed in the first device region 6. The power transistor 8 may be referred to as a power MISFET (Metal Insulator Semiconductor Field Effect Transistor). The power transistor 8 includes one main drain DM, one main source SM, and n-number (n≥2) of main gates GM.

The same or different n-number of gate signals G are to be input to the n-number of main gates GM at an arbitrary timing. The gate signal G includes an on signal that controls the power transistor 8 in an on state and an off signal that controls the power transistor 8 in an off state. The power transistor 8 outputs a single output current IOUT (output signal) from the main drain DM and the main source SM in response to the n-number of the gate signals G which are to be input to the n-number of the main gates GM. That is, the power transistor 8 is constituted of a multiple-input/single-output type switching device. Specifically, the output current IOUT is a drain source current that flows between the main drain DM and the main source SM.

With reference to FIG. 5, specifically, the power transistor 8 includes n-number (n≥2) of system transistors 9 as individually controlled objects. More specifically, the power transistor 8 is constituted of a parallel circuit of the n-number of the system transistors 9 that are connected in parallel so that the n-number of the gate signals G is to be individually input. In this embodiment, the n-number of the system transistors 9 are collectively formed in the single first device region 6. The n-number of the system transistors 9 are constituted so as to be controlled in an on state and in an off state electrically independently of each other. That is, the n-system power transistor 8 is constituted so that the system transistor 9 in an on state can coexist with the system transistor 9 in an off state at an arbitrary timing.

The n-number of the system transistors 9 each include a system drain DS, a system source SS, and a system gate GS. The system drains DS of the n-number of the system transistors 9 are each connected to the main drain DM. The system sources SS of the n-number of the system transistors 9 are each connected to the main source SM. The system gates GS of the n-number of the system transistors 9 are each connected to the main gate GM in a one-to-one corresponding relationship.

That is, the main drain DM, the main source SM, and the n-number of the main gates GM of the power transistor 8 are respectively constituted of the system drain DS, the system source SS, and the n-number of the system gates GS of the n-number of the system transistors 9. The n-number of the main gates GM are practically constituted of the n-number of the system gates GS.

The n-number of the system transistors 9 generate an electrical signal for each system in response to the gate signal G and output the signal in the main drain DM and the main source SM. Specifically, the electrical signal for each system is a drain source current that flows between the system drain DS and the system source SS of each system transistor 9. The electrical signals for each system are added between the main drain DM and the main source SM. Thereby, the single output current IOUT is generated.

The n-number of the system transistors 9 preferably have a gate threshold voltage that is substantially equal to each other. Hereinafter, the term "substantially equal" in this specification includes a case that a value to be measured (here, a gate threshold voltage of one system transistor 9) is completely in agreement with a value to be compared (here, a gate threshold voltage of the other system transistor 9) and also includes a case that a value to be measured is within a range of not less than 0.9 times and not more than 1.1 times larger than a value to be compared. The n-number of the system transistors 9 may have a channel area that is substantially equal to each other or may have a channel area that is different from each other. That is, the n-number of the system transistors 9 may have on-resistance characteristics that are substantially similar to each other or may have on-resistance characteristics that are different from each other.

With reference to FIG. 6, the n-number of the system transistors 9 each include one or a plurality of unit transistors that are systematized (made into a group) as an individually controlled object. Specifically, the n-number of the system transistors 9 are each constituted of a parallel circuit of one or the plurality of unit transistors 10. A case that the system transistor 9 is constituted of a single unit transistor 10 is also to be included in a "parallel circuit" described here.

The number of the unit transistors 10 included in each system transistor 9 is arbitrary. It is, however, preferable that, among the n-number of the system transistors 9, at least one system transistor 9 includes the plurality of unit transistors 10. The n-number of the system transistors 9 may be constituted of the same number of the unit transistors 10 or may be constituted of a different number of the unit transistors 10.

Each unit transistor 10 includes a unit drain DU, a unit source SU, and a unit gate GU. In each of the system transistors 9, the unit drain DU of one or the plurality of unit transistors 10 is electrically connected to the system drain DS. Also, in each of the system transistors 9, the unit source SU of one or the plurality of unit transistors 10 is electrically connected to the system source SS. Also, in each of the system transistors 9, the unit gate GU of one or the plurality of unit transistors 10 is electrically connected to the system gate GS.

That is, the system drain DS, the system source SS, and the system gate GS of each system transistor 9 is respectively constituted of the unit drain DU, the unit source SU, and the unit gate GU of one or the plurality of unit transistors 10.

The plurality of unit transistors 10 may be a trench gate type or a planar gate type. The plurality of unit transistors preferably have a gate threshold voltage that is substantially equal to each other. The plurality of unit transistors 10 may also have a channel area that is substantially equal to each other or may have a channel area that is different from each other. That is, the plurality of unit transistors 10 may have on-resistance characteristics that are substantially similar to each other or may have on-resistance characteristics that are different from each other.

An adjustment is made for the number of the plurality of unit transistors 10, the gate threshold voltage, the channel area, etc., thus making it possible to accurately adjust the gate threshold voltage and on-resistance characteristics (channel area) of each system transistor 9. Electrical characteristics of each system transistor 9 are adjusted in accordance with electrical specifications of the power transistor 8 to be attained. The electrical specifications of the power transistor 8 include, for example, a channel utilization rate, an on-resistance Ron, and a switching waveform.

With reference to FIG. 3 and FIG. 4, the semiconductor device 1 includes a control IC 11 (control integrated circuit) as an example of a control circuit that is formed in the second device region 7. The control IC 11 includes plural types of functional circuits that realize various functions in response to an electrical signal input from outside. The plural types of functional circuits include a gate control circuit 12 that drives and controls the power transistor 8 in response to an electrical signal from outside. Specifically, the gate control circuit 12 is constituted so as to generate the n-number of the gate signals G that individually control the n-number of the system transistors 9. The control IC 11 forms a so-called IPD (Intelligent Power Device) together with the power transistor 8. The IPD is also referred to as an IPM (Intelligent Power Module).

With reference to FIG. 2, the semiconductor device 1 includes an interlayer insulating layer 13 that covers the first main surface 3. The interlayer insulating layer 13 collectively covers the first device region 6 and the second device region 7. In this embodiment, the interlayer insulating layer 13 is constituted of a multilayer wiring structure that has a laminated structure in which a plurality of insulating layers and a plurality of wiring layers are alternately laminated. Each insulating layer includes at least one of an $SiO_2$ film and an SiN film. Each wiring layer may include at least one among an Al layer, a Cu layer, an AlCu alloy layer, an AlSiCu alloy layer, and an AlSi alloy layer.

With reference to FIG. 3, the semiconductor device 1 includes n-number of gate wirings 14 as an example of a control wiring that is formed above (anywhere above) the first main surface 3. The n-number of the gate wirings 14 are constituted of n-number of wiring layers formed inside the interlayer insulating layer 13. The n-number of the gate wirings 14 are selectively routed inside the interlayer insulating layer 13 and are each electrically connected to the n-number of the main gates GM of the power transistor 8 and the control IC 11 (gate control circuit 12).

Specifically, the n-number of the gate wirings 14 are electrically connected to the n-number of the main gates GM (the n-number of the system gates GS) of the power transistor 8 in a one-to-one corresponding relationship in an electrically independent state. Thereby, the n-number of the gate wirings 14 transmit the n-number of the gate signals G generated by the control IC 11 (gate control circuit 12) individually to the n-number of the main gates GM of the power transistor 8.

That is, the n-number of the gate wirings 14 are each electrically connected to the unit gate GU of one or the plurality of unit transistors 10 that are to be systematized as an individually controlled object from an aggregation made up of the plurality of unit transistors 10. The n-number of the gate wirings 14 may include one or a plurality of gate wirings 14 that are electrically connected to one unit transistor 10 and that are to be systematized as an individually controlled object. Also, the n-number of the gate wiring 14 may include one or a plurality of gate wirings 14 that connect in parallel the plurality of unit transistors 10 to be systematized as an individually controlled object.

The semiconductor device 1 includes a plurality (six in this embodiment) of terminal electrodes 15 to 20. In FIG. 1, the plurality of terminal electrodes 15 to 20 are indicated by hatching. The number of the plurality of terminal electrodes 15 to 20, the arrangement and planar shape thereof are adjusted in an arbitrary mode in accordance with a specification of the power transistor 8 and that of the control IC 11 and not restricted to the mode shown in FIG. 1. In this embodiment, the plurality of terminal electrodes to 20 include a drain terminal 15 (power supply terminal VBB), a source terminal 16 (output terminal OUT), an input terminal 17, a reference terminal 18, an enable terminal 19, and a sense terminal 20.

The drain terminal 15 directly covers the second main surface 4 of the semiconductor chip 2 and is electrically connected to the second main surface 4. The drain terminal 15 is electrically connected to the main drain DM of the power transistor 8 and the control IC 11. The drain terminal 15 transmits a power supply voltage VB to the main drain DM of the power transistor 8 and various circuits of the control IC 11. The drain terminal 15 may include at least one among a Ti layer, an Ni layer, an Au layer, an Ag layer, and an Al layer. The drain terminal 15 may have a laminated structure in which at least two among the Ti layer, the Ni layer, the Au layer, the Ag layer and the Al layer are laminated in an arbitrary mode.

The source terminal 16, the input terminal 17, the reference terminal 18, the enable terminal 19, and the sense terminal are formed on the interlayer insulating layer 13. The source terminal 16 is formed above the first device region 6 in the first main surface 3. The source terminal 16 is electrically connected to the main source SM of the power transistor 8 and the control IC 11. The source terminal 16 transmits to the outside an output current IOUT that is generated by the power transistor 8.

The input terminal 17, the reference terminal 18, the enable terminal 19, and the sense terminal 20 are each formed above a region of the first main surface 3 outside the first device region 6 (specifically, second device region 7). The input terminal 17 transmits an input voltage that drives the control IC 11. The reference terminal 18 transmits a reference voltage (for example, ground voltage GND) to the power transistor 8 and the control IC 11. The enable terminal 19 transmits an electrical signal that enables or disables some of or all of the functions of the control IC 11. The sense terminal 20 transmits an electrical signal that detects an abnormality of the control IC 11.

The terminal electrodes 16 to 20 excluding the drain terminal 15 may include at least one among a pure Al layer, a pure Cu layer, an AlCu alloy layer, an AlSiCu alloy layer, and an AlSi alloy layer. A plating layer may be formed on each of outer surfaces of the terminal electrodes 16 to 20. The plating layer may include at least one among an Ni layer, a Pd layer, and an Au layer.

Figure 7:
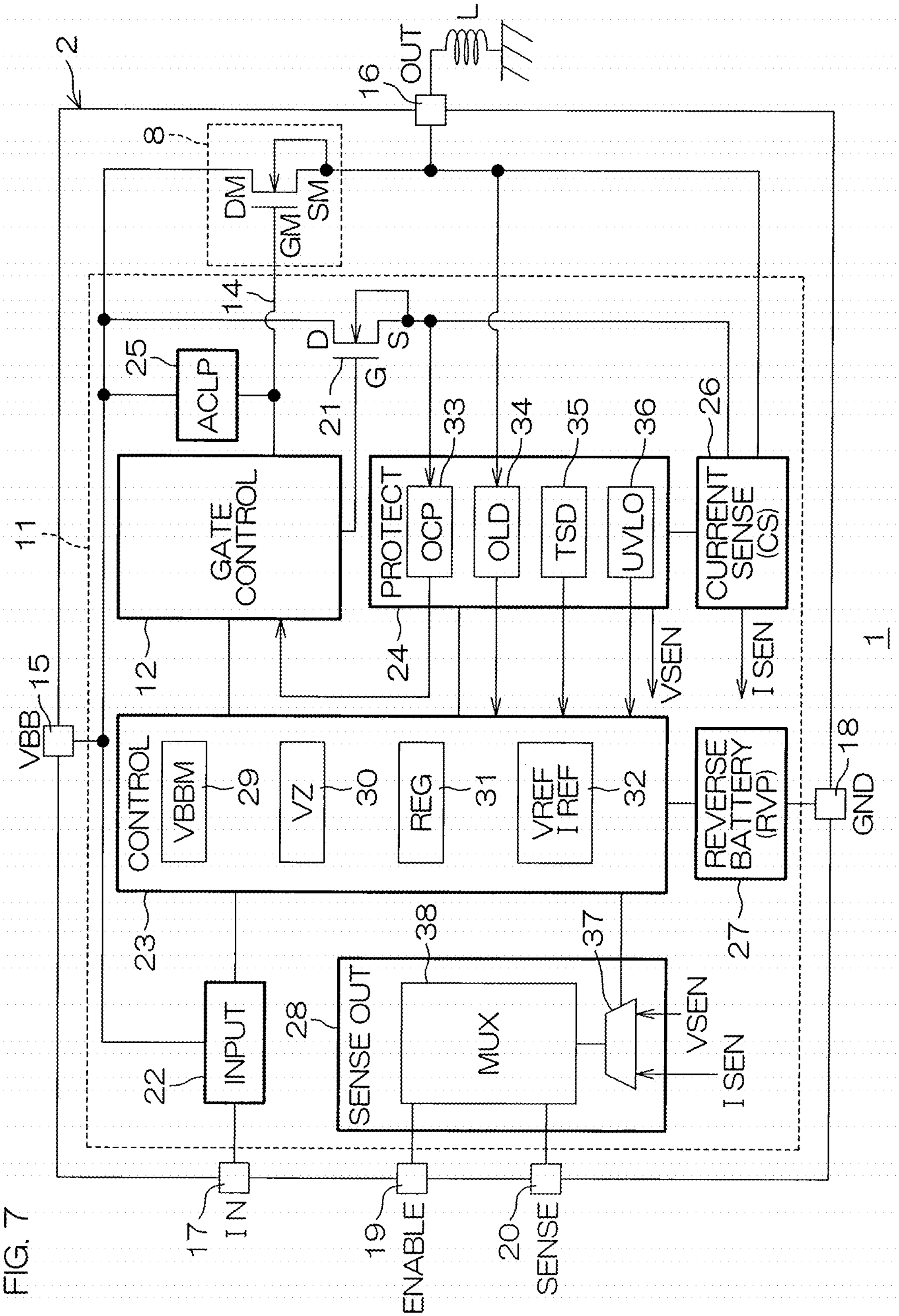
FIG. 7 is a block circuit diagram of one configuration example of the semiconductor device shown in FIG. 1.

FIG. 7 is a block circuit diagram of one configuration example of the semiconductor device 1 shown in FIG. 1. Hereinafter, a description will be given of an example in which the semiconductor device 1 is mounted on an automobile. The semiconductor device 1 includes the drain terminal 15, the source terminal 16, the input terminal 17, the reference terminal 18, the enable terminal 19, the sense terminal 20, the power transistor 8, and the control IC 11.

The drain terminal 15 is connected to a power supply. The power supply voltage VB may be not less than 10V and not more than 20V. The source terminal 16 is connected to an inductive load L. The inductive load L may be an inductance component such as a coil, a solenoid, and a harness, or the like. The input terminal 17 is externally connected to an MCU (Micro Controller Unit), a DC/DC converter or an LDO (Low Drop Out). The input voltage may be not less than 1V and not more than 10V. The reference terminal 18 is grounded. The enable terminal 19 may be connected to the MCU. An electrical signal that enables or disables some of or all of the functions of the control IC 11 is to be input to the enable terminal 19. The sense terminal 20 may be connected to a resistor.

The main drain DM of the power transistor 8 is electrically connected to the drain terminal 15. The main source SM of the power transistor 8 is electrically connected to the control IC 11 (current detecting circuit 26 to be described later) and the source terminal 16. The n-number of the main gates GM of the power transistor 8 are electrically connected via the n-number of the gate wirings 14 to the control IC 11 (specifically, gate control circuit 12). In FIG. 7, the n-number of the gate wirings 14 are shown in a simplified manner by one line.

The control IC 11 includes the gate control circuit 12, a sense transistor 21, an input circuit 22, a current/voltage control circuit 23, a protection circuit 24, an active clamp circuit 25, a current detecting circuit 26, a power-supply reverse connection protection circuit 27, and an abnormality detecting circuit 28. The sense transistor 21 includes a drain, a source, and a gate. The gate of the sense transistor 21 is electrically connected to the gate control circuit 12. The drain of the sense transistor 21 is electrically connected to the drain terminal 15. The source of the sense transistor 21 is electrically connected to the current detecting circuit 26.

The input circuit 22 is electrically connected to the input terminal 17 and the current/voltage control circuit 23. The input circuit 22 may include a Schmitt trigger circuit. The input circuit 22 shapes a waveform of an electrical signal that is applied to the input terminal 17. A signal generated by the input circuit 22 is to be input to the current/voltage control circuit 23.

The current/voltage control circuit 23 is electrically connected to the protection circuit 24, the gate control circuit 12, the power-supply reverse connection protection circuit 27, and the abnormality detecting circuit 28. The current/voltage control circuit 23 may include a logic circuit. The current/voltage control circuit 23 generates various types of voltage and current in response to an electrical signal from the input circuit 22 and an electrical signal from the protection circuit 24. In this embodiment, the current/voltage control circuit 23 includes a driving voltage generating circuit 29, a first constant-voltage generating circuit 30, a second constant-voltage generating circuit 31, and a reference voltage/current generating circuit 32.

The driving voltage generating circuit 29 generates a driving voltage that drives the gate control circuit 12. The driving voltage may be set at a value obtained by subtracting a predetermined value from the power supply voltage VB. The driving voltage generating circuit 29 may generate a driving voltage of not less than 5V and not more than 15V which are values obtained by subtracting 5V from the power supply voltage VB. The driving voltage is to be input to the gate control circuit 12.

The first constant-voltage generating circuit 30 generates a first constant voltage that drives the protection circuit 24. The first constant-voltage generating circuit 30 may include a Zener diode and a regulator circuit (here, Zener diode). The first constant voltage may be not less than 1V and not more than 5V. The first constant voltage is to be input to the protection circuit 24 (specifically, load open detecting circuit 34, etc., to be described later).

The second constant-voltage generating circuit 31 generates a second constant voltage that drives the protection circuit 24. The second constant-voltage generating circuit 31 may include a Zener diode and a regulator circuit (here, regulator circuit). The second constant voltage may be not less than 1V and not more than 5V. The second constant voltage is to be input to the protection circuit 24 (specifically, overheat protection circuit 35 or low-voltage malfunction suppression circuit 36 to be described later).

The reference voltage/current generating circuit 32 generates a reference voltage and a reference current to be applied to various circuits. The reference voltage may be not less than 1V and not more than 5V. The reference current may be not less than 1 mA and not more than 1 A. The reference voltage and the reference current are to be input to various circuits. Where the various circuits include a comparator, the reference voltage and the reference current may be to be input to the comparator.

The protection circuit 24 is electrically connected to the current/voltage control circuit 23, the gate control circuit 12, the abnormality detecting circuit 28, a source of the power transistor 8, and a source of the sense transistor 21. The protection circuit 24 includes an overcurrent protection circuit 33, a load open detecting circuit 34, an overheat protection circuit 35, and a low-voltage malfunction suppression circuit 36.

The overcurrent protection circuit 33 is electrically connected to the gate control circuit 12 and the source of the sense transistor 21. The overcurrent protection circuit 33 detects an output current that flows through the power transistor 8 and restricts the output current to a value lower than a certain value, thereby protecting the power transistor 8 from an overcurrent. The overcurrent protection circuit 33 may include a current monitoring circuit. A signal generated by the overcurrent protection circuit 33 is to be input to the gate control circuit 12 (specifically, driving signal output circuit to be described later).

The load open detecting circuit 34 is electrically connected to the current/voltage control circuit 23 and the main source SM of the power transistor 8. The load open detecting circuit 34 detects an open state of load. A signal generated by the load open detecting circuit 34 is to be input to the current/voltage control circuit 23.

The overheat protection circuit 35 is electrically connected to the current/voltage control circuit 23. The overheat protection circuit 35 monitors a temperature of the power transistor 8 to protect the power transistor 8 from an excessive rise in temperature. When a temperature of the power transistor 8 reaches a predetermined threshold value or when a difference in temperature between the power transistor 8 and the other circuit reaches a predetermined threshold value, the overheat protection circuit 35 forcibly controls the power transistor 8 so as to be in an OFF state. The overheat protection circuit 35 may include a temperature-sensitive device such as a temperature-sensitive diode, a thermistor, etc. A signal generated by the overheat protection circuit 35 is to be input to the current/voltage control circuit 23.

The low-voltage malfunction suppression circuit 36 is electrically connected to the current/voltage control circuit 23. The low-voltage malfunction suppression circuit 36 suppresses a malfunction of the power transistor 8 where the power supply voltage VB is less than a predetermined value. A signal generated by the low-voltage malfunction suppression circuit 36 is to be input to the current/voltage control circuit 23.

The gate control circuit 12 is electrically connected to the current/voltage control circuit 23, the protection circuit 24, the n-number of the main gates GM of the power transistor 8, and a gate of the sense transistor 21. The gate control circuit 12 may include an oscillation circuit and a charge pump circuit. The gate control circuit 12 performs on/off control of the power transistor 8 in response to an electrical signal from the current/voltage control circuit 23 and an electrical signal from the protection circuit 24.

The gate control circuit 12 generates the n-number of gate signals G that are to be output to the n-number of gate wirings 14. The n-number of the gate signals G are to be input to the power transistor 8 via the n-number of the gate wirings 14. Thereby, on/off control of the power transistor 8 is performed. Also, the gate control circuit 12 performs on/off control of the sense transistor 21. The gate control circuit 12 generates a gate signal that is to be output to a gate of the sense transistor 21 in response to an electrical signal from the current/voltage control circuit 23 and an electrical signal from the protection circuit 24. Thereby, on/off control of the sense transistor 21 is performed. The sense transistor 21 is preferably controlled at the same time with the power transistor 8.

The active clamp circuit 25 is electrically connected to the drain terminal 15, the main gate GM of the power transistor 8, and the gate of the sense transistor 21. The active clamp circuit protects the power transistor 8 from a counter electromotive force. The active clamp circuit 25 may include a plurality of diodes. The active clamp circuit 25 may have a pair of diodes including a first diode array and a second diode array that are connected in a reverse biased manner.

The first diode array includes one or a plurality of diodes that are connected in series in the forward direction. The second diode array includes one or a plurality of diodes that are connected in series in the forward direction and connected to the first diode array in a reverse biased manner. One or the plurality of diodes that constitute the first diode array may include at least one of a pn junction diode and a Zener diode. One or the plurality of diodes that constitute the second diode array may include at least one of a pn junction diode and a Zener diode.

The current detecting circuit 26 is electrically connected to the protection circuit 24, the abnormality detecting circuit 28, a source of the power transistor 8, and a source of the sense transistor 21. The current detecting circuit 26 detects a current that flows through the power transistor 8 and the sense transistor 21 to generate a current detecting signal. The current detecting signal is to be input to the abnormality detecting circuit 28.

The power-supply reverse connection protection circuit 27 is electrically connected to the reference terminal 18 and the current/voltage control circuit 23. The power-supply reverse connection protection circuit 27 protects the current/voltage control circuit 23, the power transistor 8, etc., when the power supply is reversely connected.

The abnormality detecting circuit 28 is electrically connected to the current/voltage control circuit 23, the protection circuit 24 and the current detecting circuit 26. The abnormality detecting circuit 28 monitors a voltage of the protection circuit 24. Where there is found an abnormality (change in voltage, etc.) in any one of the overcurrent protection circuit 33, the load open detecting circuit 34, the overheat protection circuit 35 and the low-voltage malfunction suppression circuit 36, the abnormality detecting circuit 28 generates an abnormality detecting signal according to a voltage of the protection circuit 24 and outputs the signal to the outside.

Specifically, the abnormality detecting circuit 28 includes a first multiplexer circuit 37 and a second multiplexer circuit 38. The first multiplexer circuit 37 includes two input portions, one output portion, and one selective input portion. The protection circuit 24 and the current detecting circuit 26 are each connected to the input portion of the first multiplexer circuit 37. The second multiplexer circuit 38 is connected to the output portion of the first multiplexer circuit 37. The current/voltage control circuit 23 is connected to the selective input portion of the first multiplexer circuit 37.

The first multiplexer circuit 37 generates an abnormality detecting signal in response to an electrical signal from the current/voltage control circuit 23, a voltage detecting signal from the protection circuit 24, and a current detecting signal from the current detecting circuit 26. The abnormality detecting signal generated by the first multiplexer circuit 37 is to be input to the second multiplexer circuit 38. The second multiplexer circuit 38 includes two input portions and one output portion. The output portion of the first multiplexer circuit 37 and the enable terminal 19 are each connected to the input portion of the second multiplexer circuit 38. The sense terminal 20 is connected to the output portion of the second multiplexer circuit 38.

Where an MCU is connected to the enable terminal 19 and a resistor is connected to the sense terminal 20, an on signal is to be input to the enable terminal 19 from the MCU, and the abnormality detecting signal is taken out from the sense terminal 20. The abnormality detecting signal is converted into a voltage signal by the resistor that is electrically connected to the sense terminal 20. An abnormal state of the semiconductor device 1 is detected by the voltage signal.

Figure 8A:
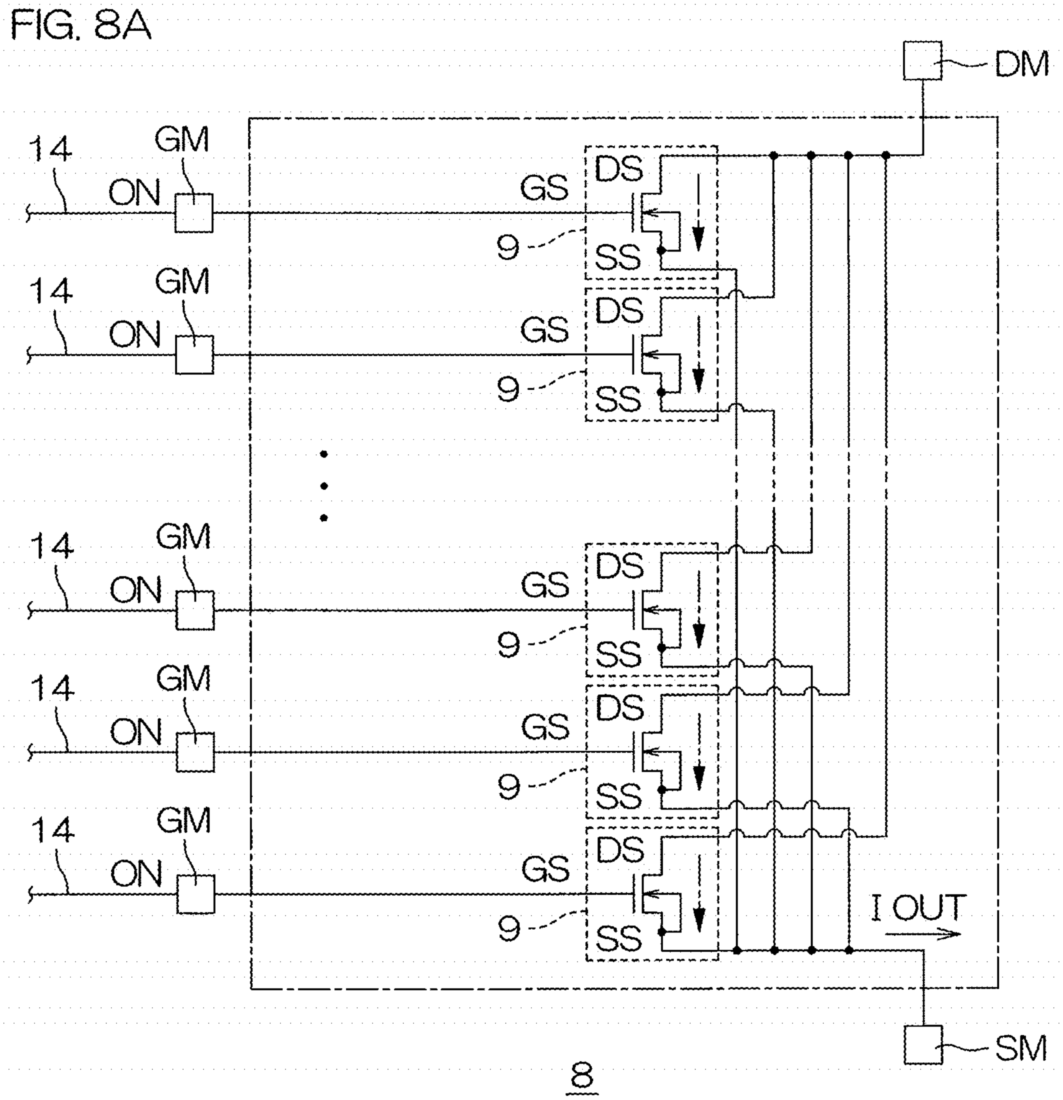
FIG. 8A is a circuit diagram for describing an operation example of the power transistor.
Figure 8B:
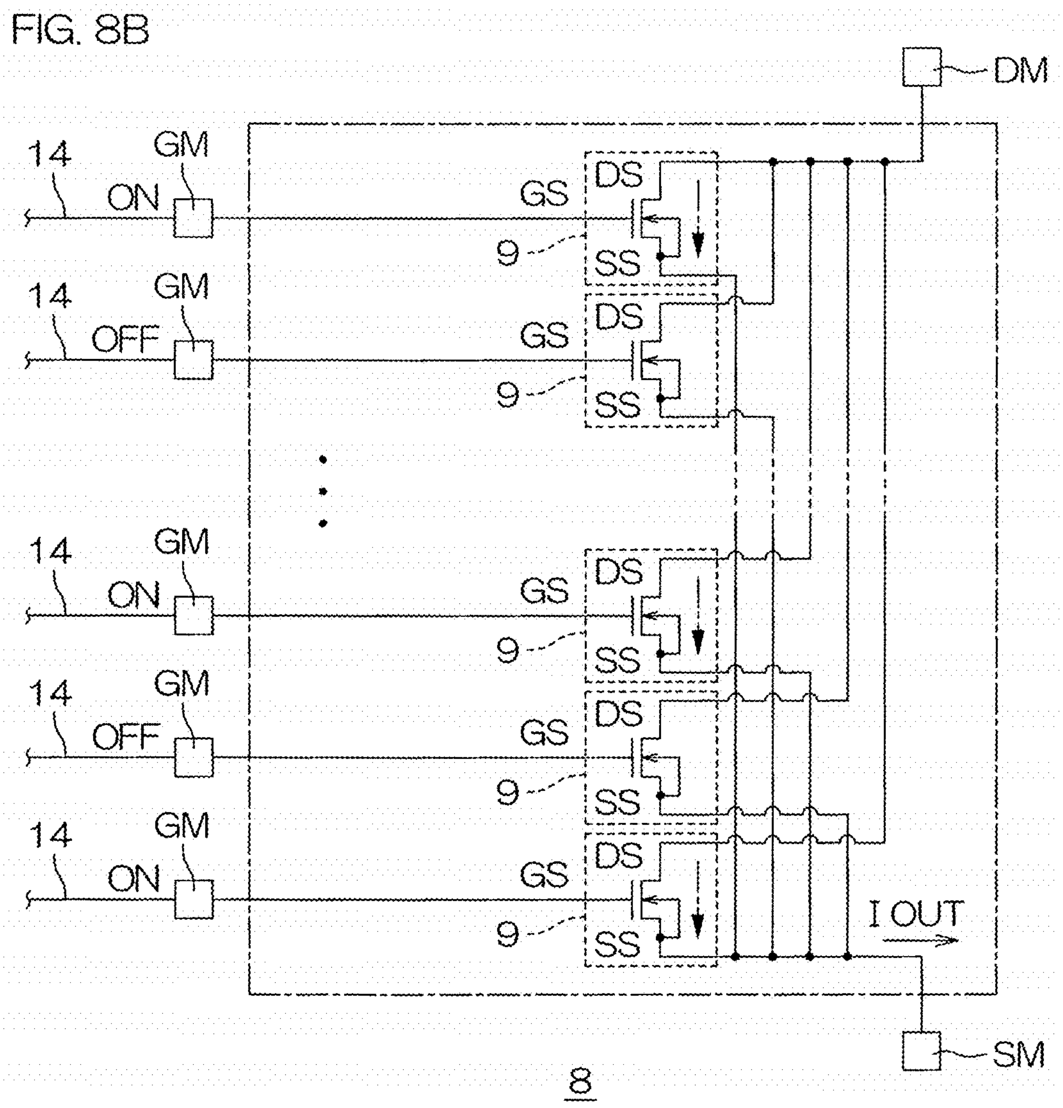
FIG. 8B is a circuit diagram for describing an operation example of the power transistor.
Figure 8C:
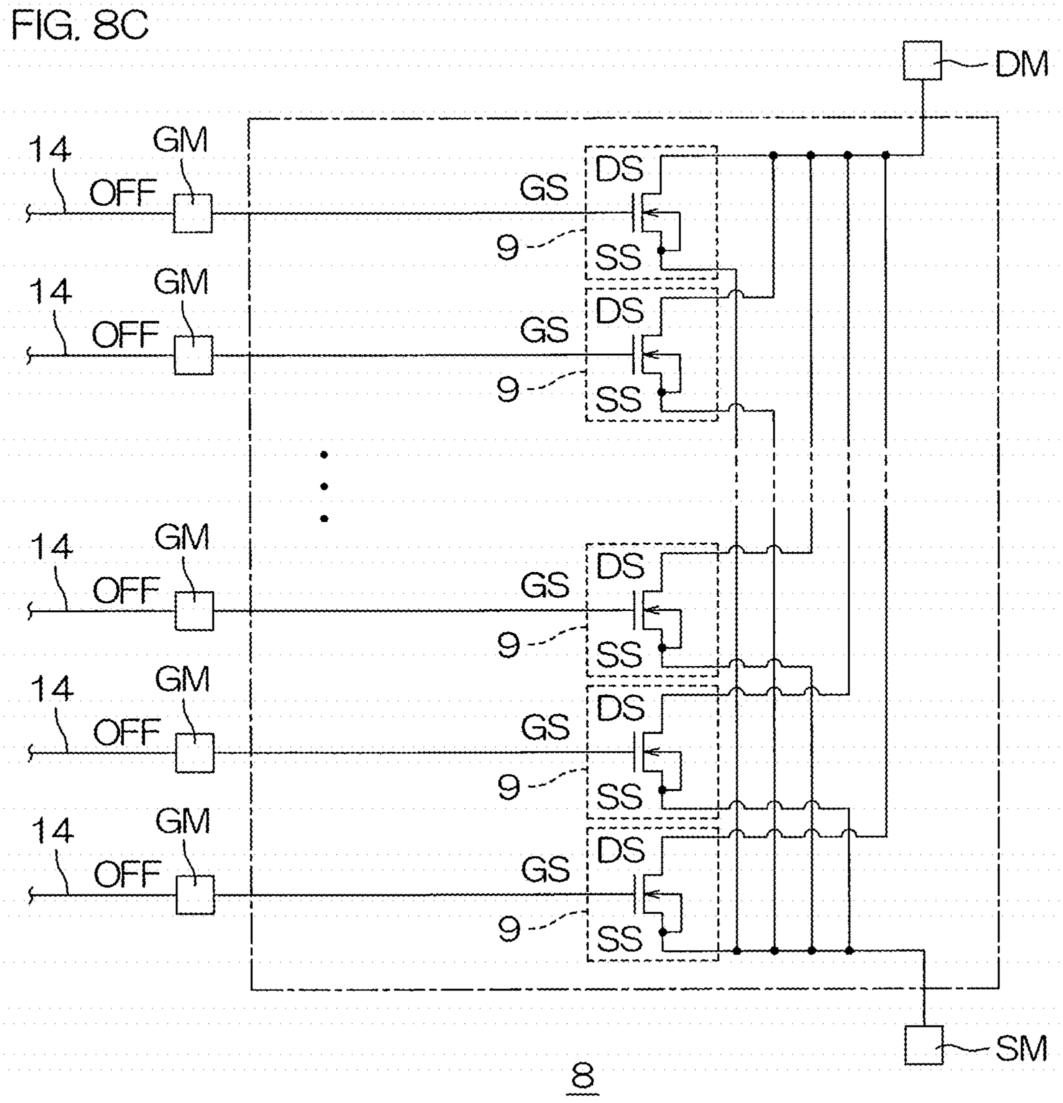
FIG. 8C is a circuit diagram for describing an operation example of the power transistor.

FIG. 8A to FIG. 8C each correspond to FIG. 5 and are circuit diagrams for describing an operation example of the power transistor 8. With reference to FIG. 8A, when the gate signals G greater than the gate threshold voltage (that is, on signal) are input to all the n-number of the gate wirings 14, all the system transistors 9 are turned into on states. In this case, the power transistor 8 is turned into an on state in a state that all current paths are opened. Therefore, the power transistor 8 is relatively increased in channel utilization rate and relatively decreased in on-resistance Ron.

With reference to FIG. 8B, when the gate signals G greater than the gate threshold voltage (that is, on signal) are input to the x number ($1 \leq x < n$) of gate wirings 14 and the gate signals G less than the gate threshold voltage (that is, off signal) are input to the ($n-x$) number of the gate wirings 14, the x number of system transistors 9 are turned into on states and the ($n-x$) number of the system transistors 9 are turned into off states. In this case, the power transistor 8 is turned into an on state, with some of the current paths being closed. Therefore, the power transistor 8 is relatively decreased in channel utilization rate and relatively increased in on-resistance Ron.

With reference to FIG. 8C, when the gate signals G less than the gate threshold voltage (that is, off signal) are input to all the n-number of gate wirings 14, a state where all current paths are closed develops. Thereby, all the system transistors 9 are turned into off states, and the power transistor 8 is turned into an off state.

Figure 9:
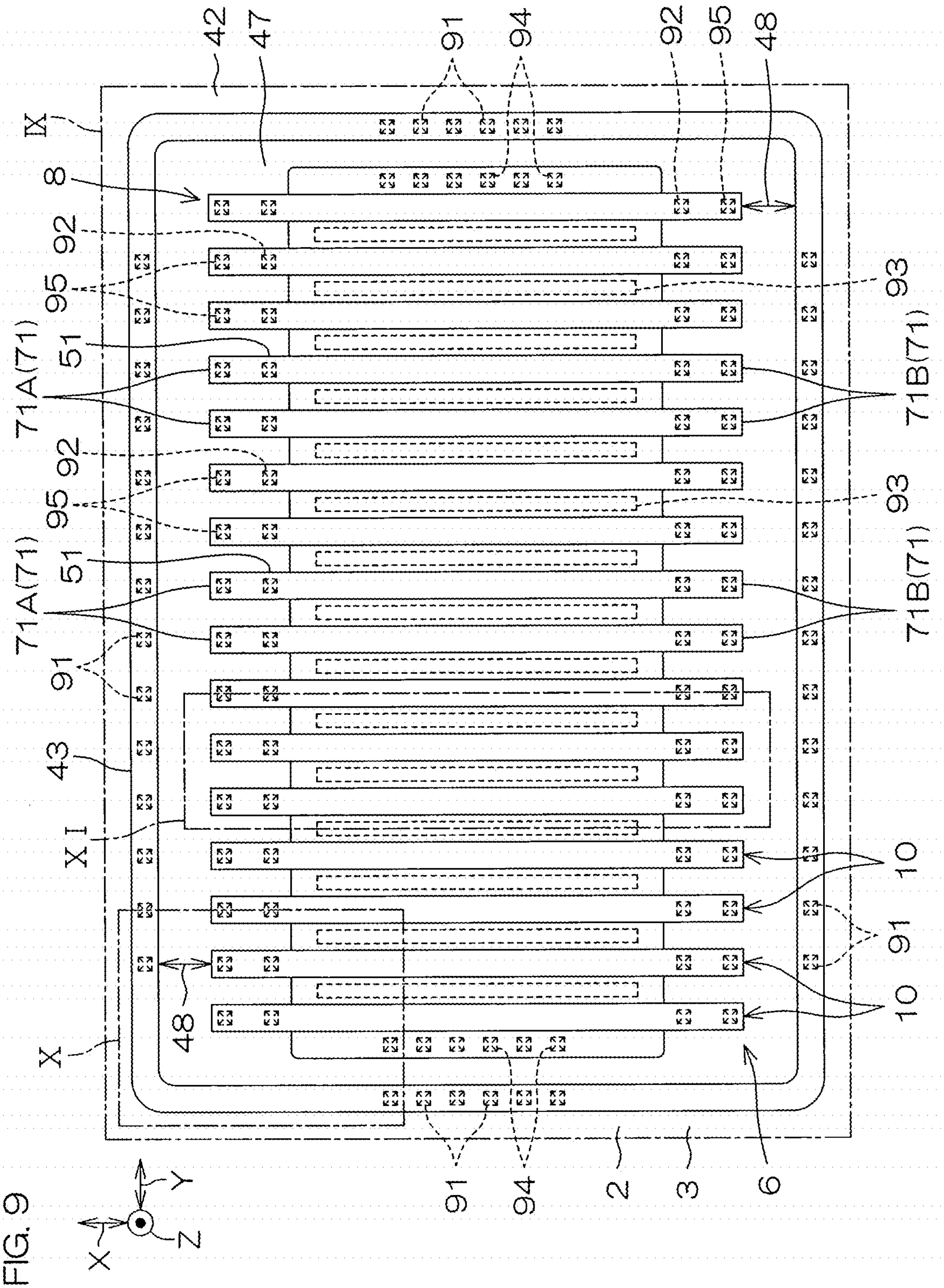
FIG. 9 is an enlarged view of a region IX shown in FIG. 3.
Figure 10:
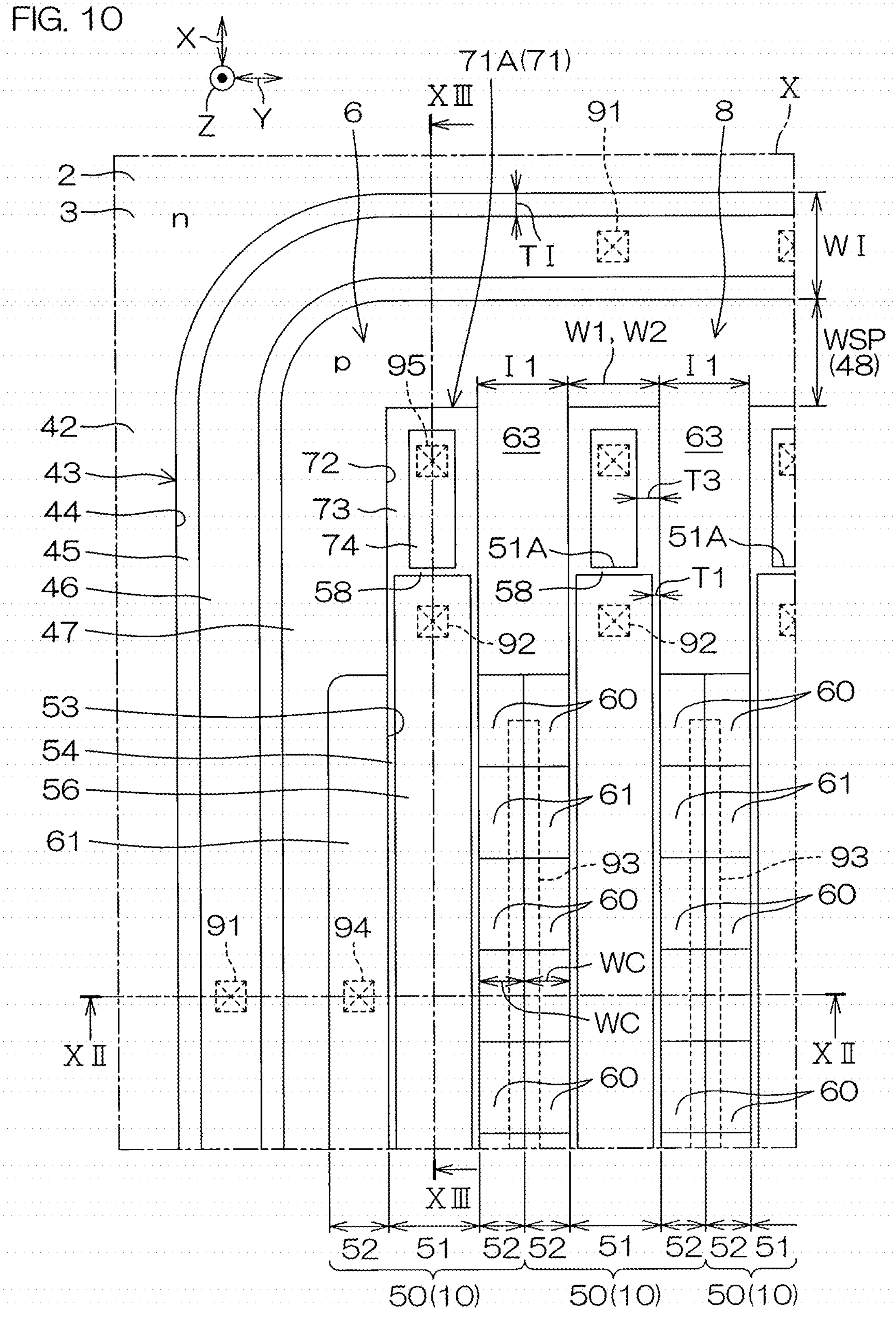
FIG. 10 is an enlarged view of a region X shown in FIG. 9.
Figure 11:
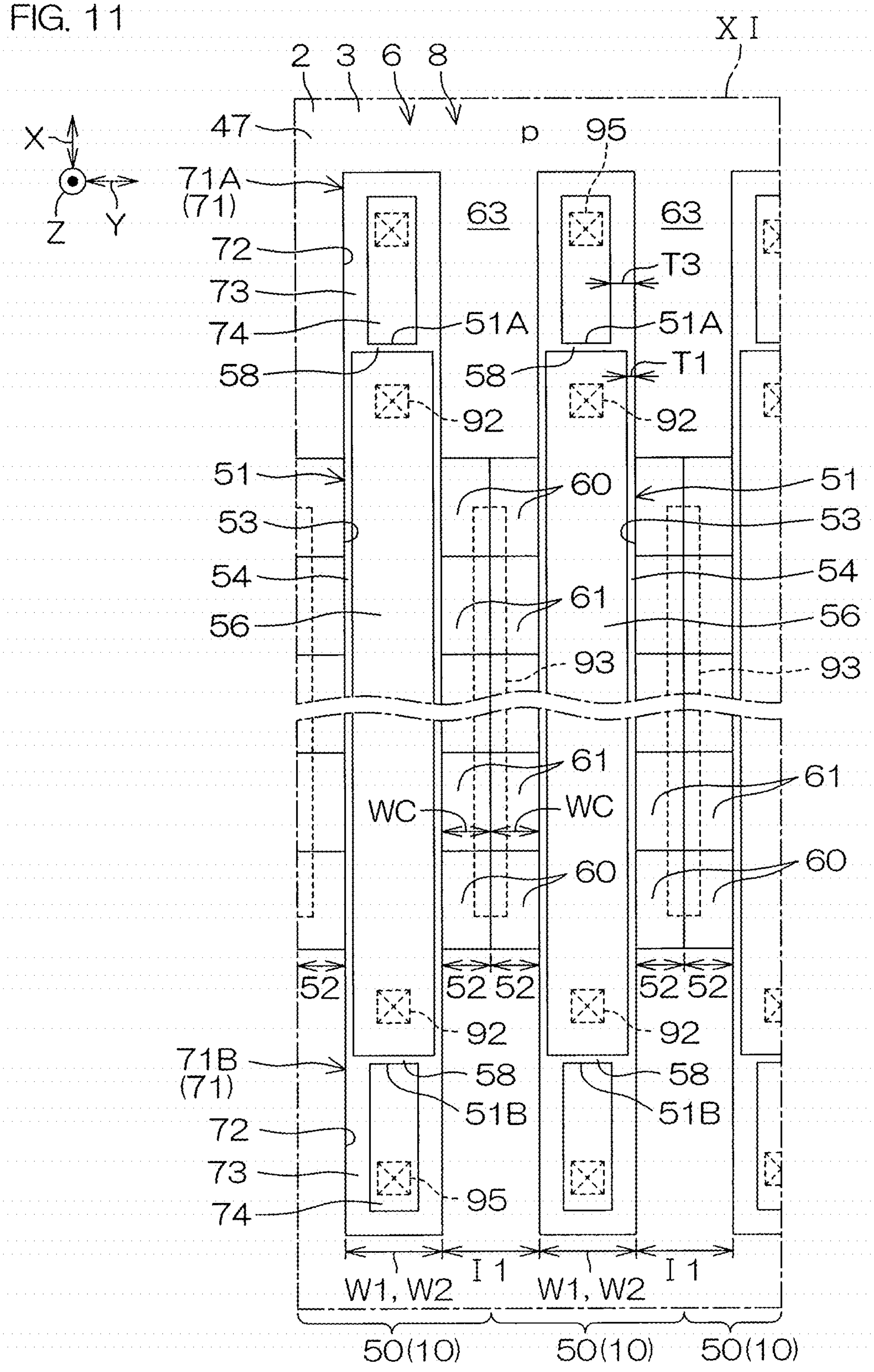
FIG. 11 is an enlarged view of a region XI shown in FIG. 9, a part of which is omitted.
Figure 12:
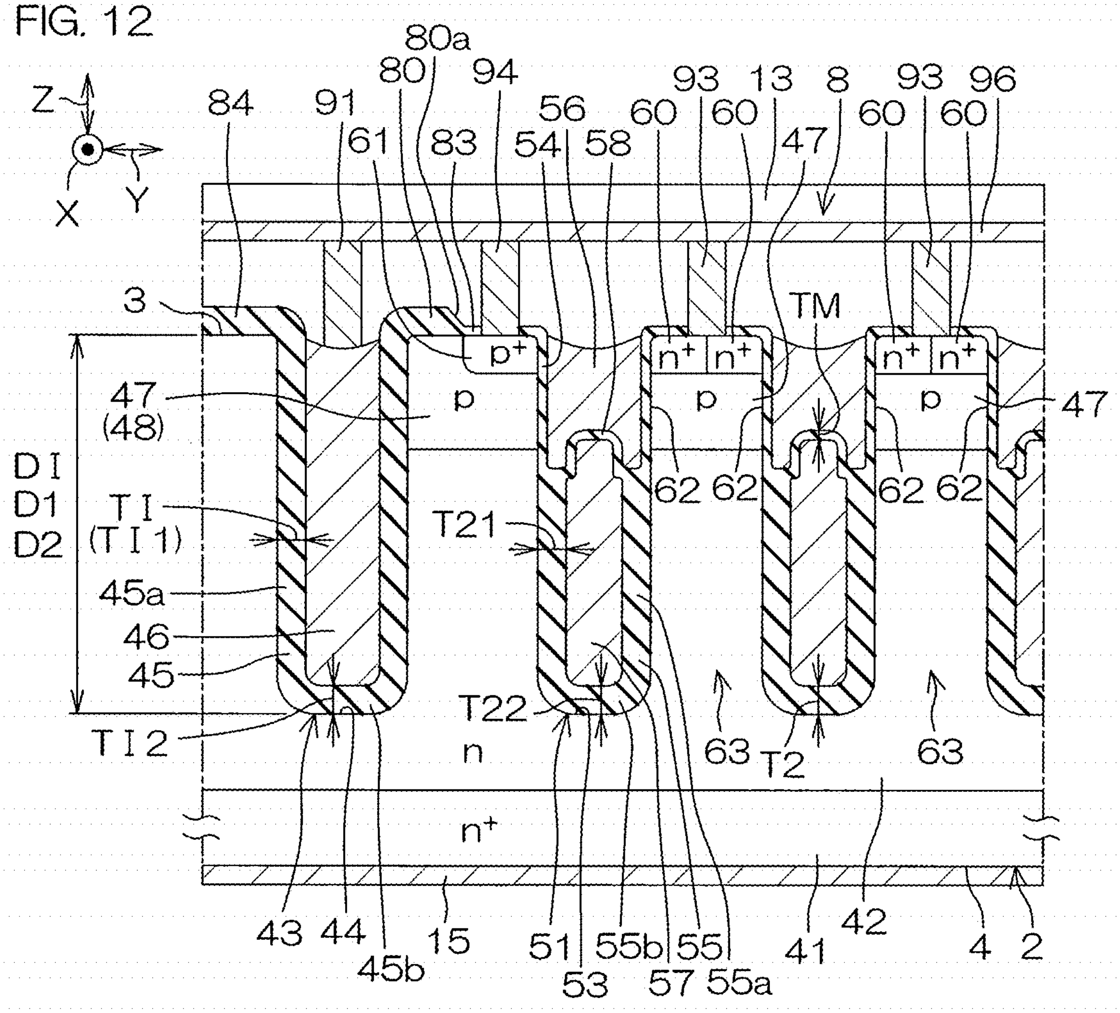
FIG. 12 is a cross-sectional view taken along line XII-XII shown in FIG. 10.
Figure 13:
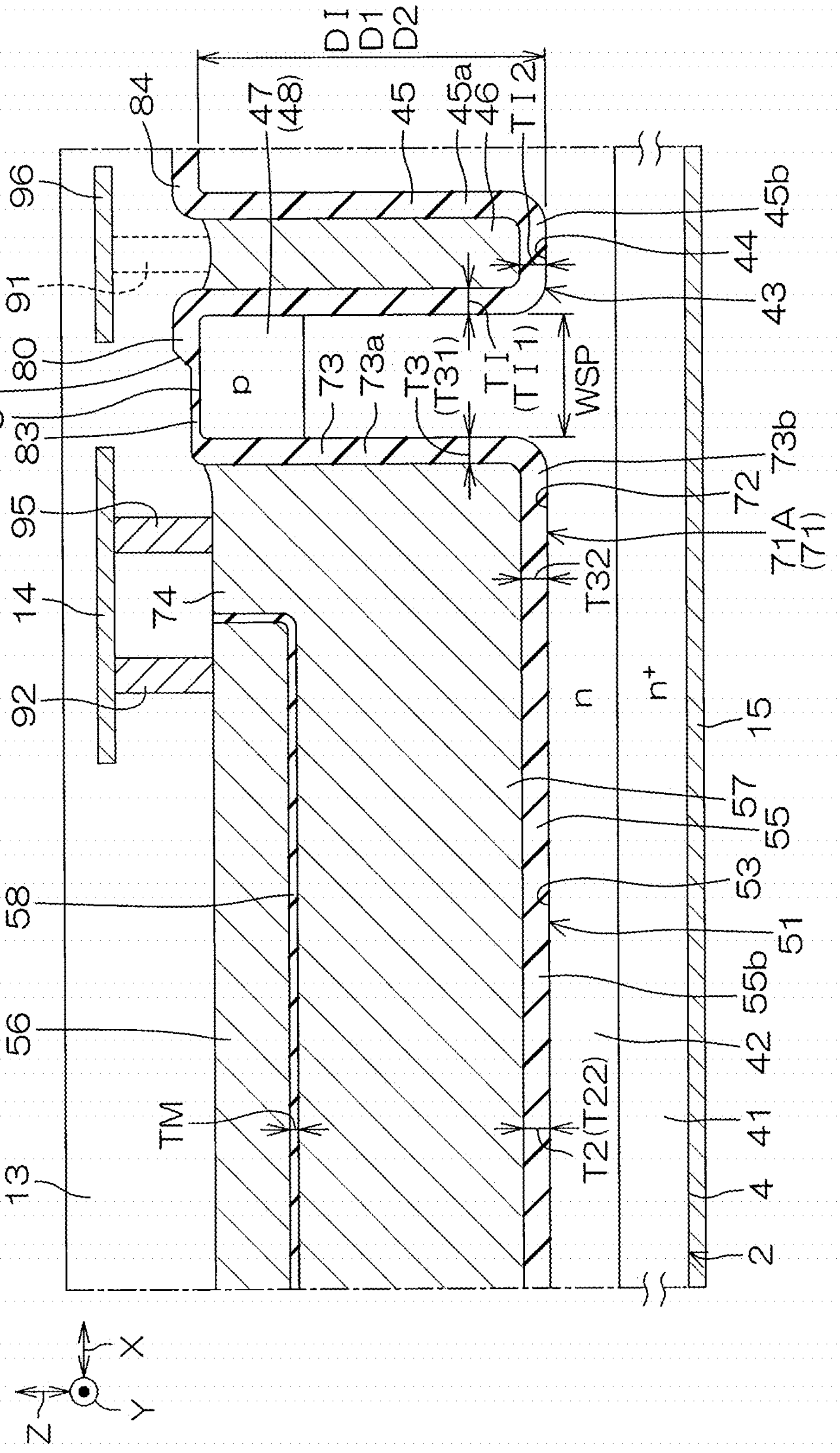
FIG. 13 is a cross-sectional view taken along line XIII-XIII shown in FIG. 10.
Figure 14A:
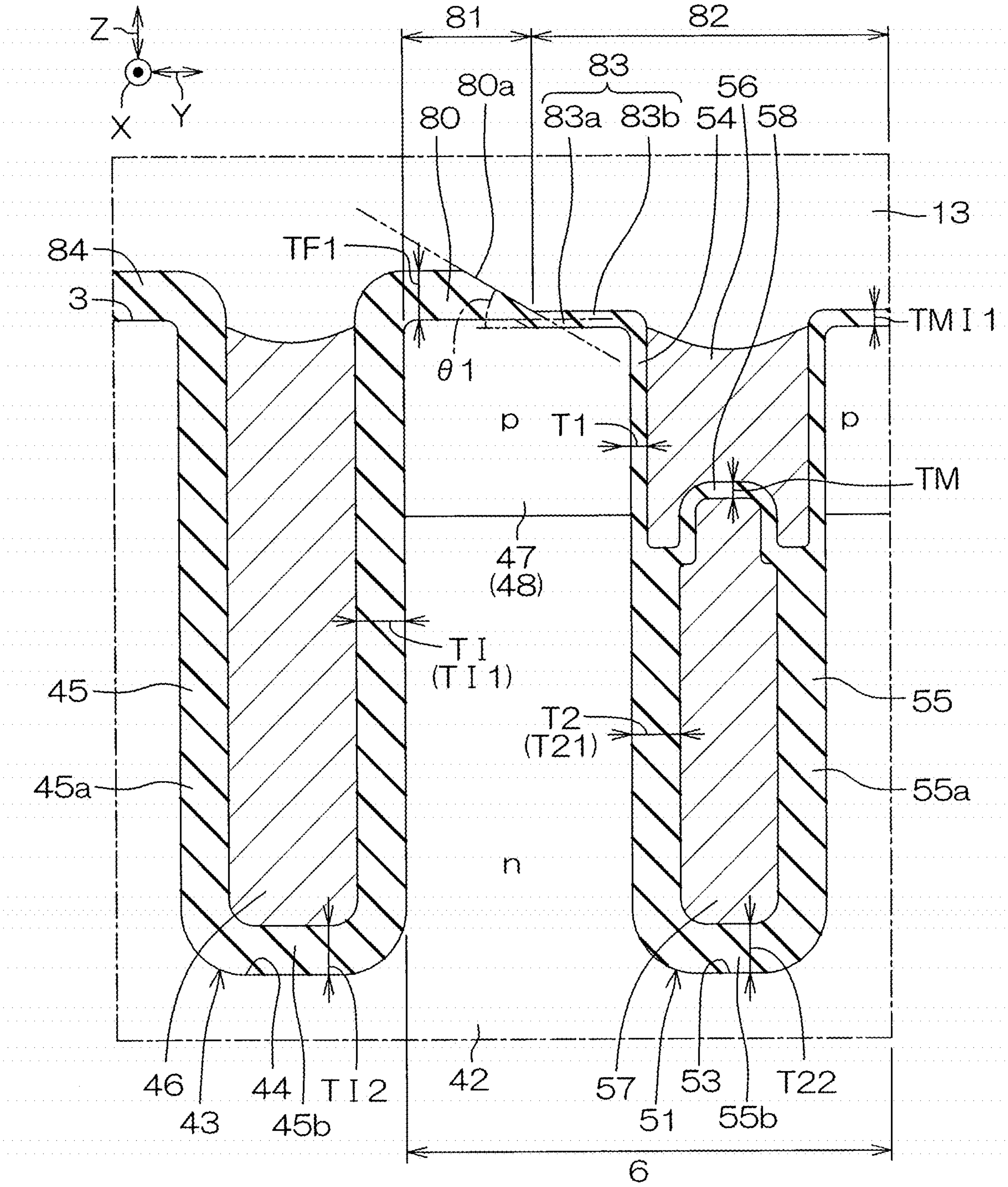
FIG. 14A is an enlarged cross-sectional view of main portions of a structure shown in FIG. 12.
Figure 14B:
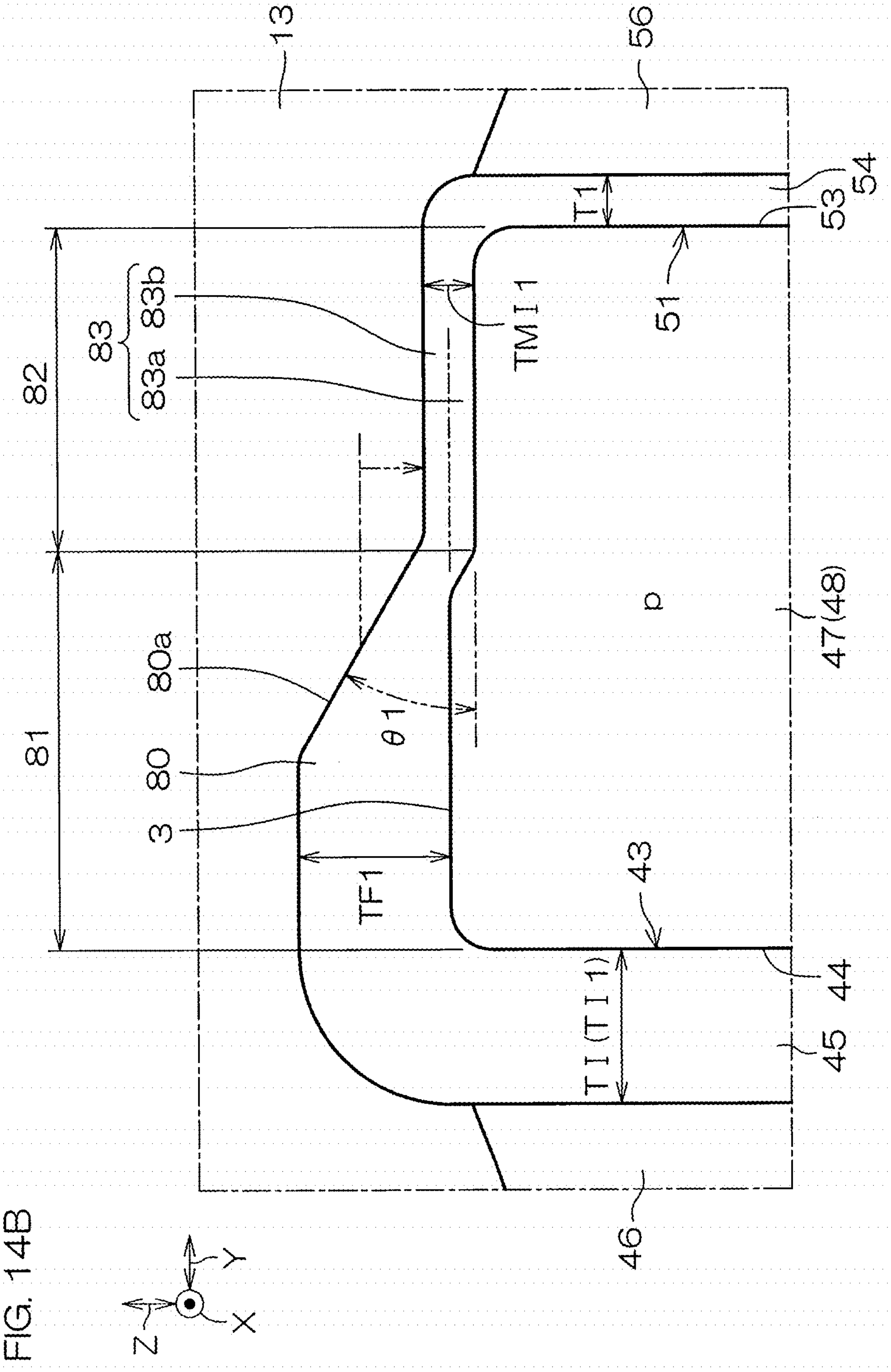
FIG. 14B is an enlarged cross-sectional view of main portions shown in FIG. 14A.
Figure 15:
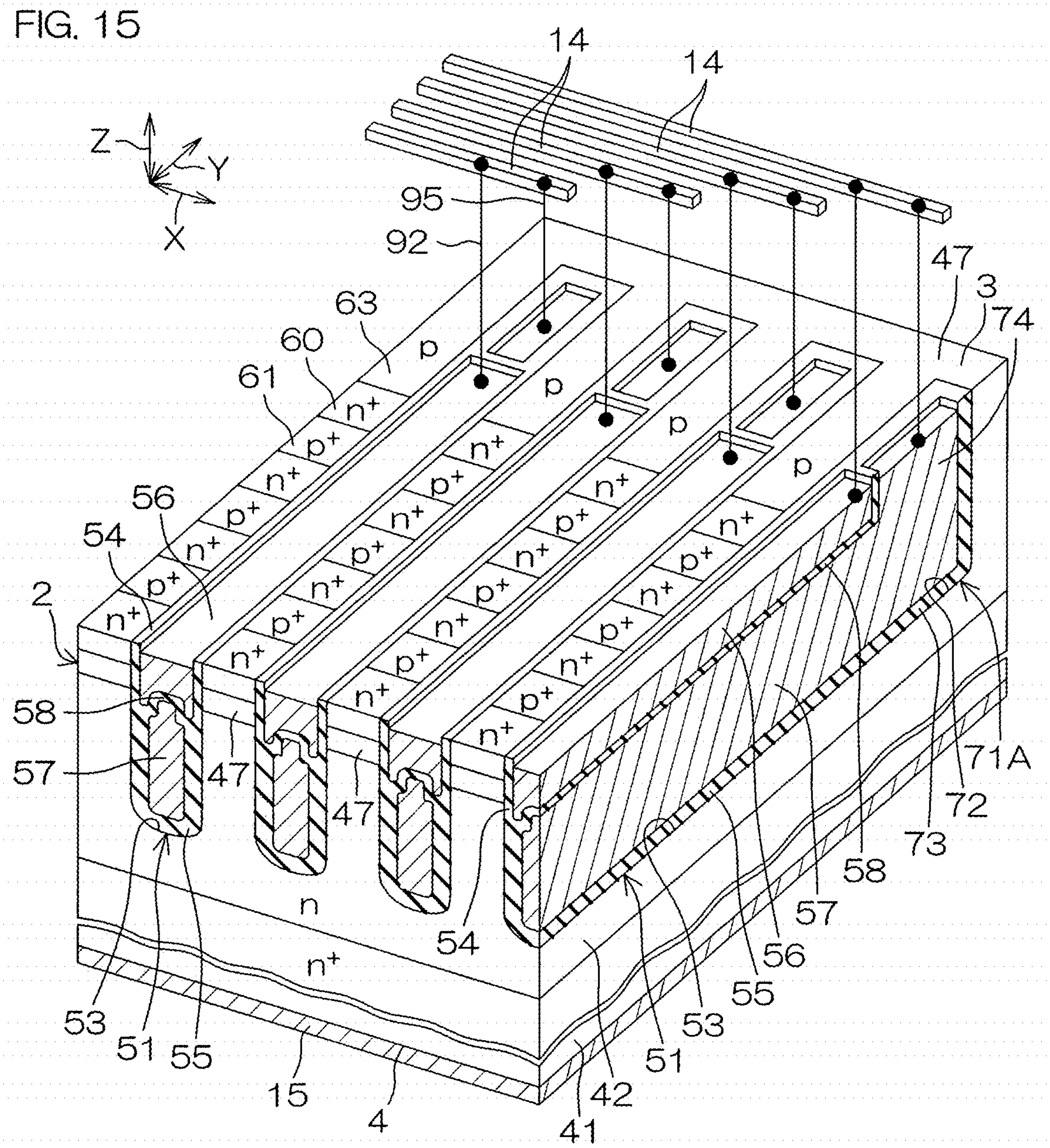
FIG. 15 is a cross-sectional perspective view of main portions of a first device region shown in FIG. 9.

Next, a specific structure of the first device region 6 (power transistor 8) will be described with reference to FIG. 9 to FIG. 15. FIG. 9 is an enlarged view of a region IX shown in FIG. 3. FIG. 10 is an enlarged view of a region X shown in FIG. 9. FIG. 11 is an enlarged view of a region XI shown in FIG. 9, a part of which is omitted. FIG. 12 is a cross-sectional view taken along line XII-XII shown in FIG. 10. FIG. 13 is a cross-sectional view taken along line XIII-XIII shown in FIG. 10. FIG. 14A is an enlarged cross-sectional view of main portions of a structure shown in FIG. 12. FIG. 14B is an enlarged cross-sectional view of the main portions shown in FIG. 14A. FIG. 15 is a cross-sectional perspective view of main portions of the first device region 6 shown in FIG. 9. In FIG. 14B, for the sake of convenience, hatching is omitted. In FIG. 15, for the sake of convenience, a structure on the first main surface 3 is omitted, and the gate wiring 14, etc., are shown in a simplified manner.

With reference to FIG. 9 to FIG. 15 (FIG. 12 and FIG. 13, in particular), the semiconductor device 1 includes an n-type (first conductive type) first semiconductor region 41 that is formed in a surface layer portion of the second main surface 4 of the semiconductor chip 2. The first semiconductor region 41 forms a main drain DM of the power transistor 8. The first semiconductor region 41 may be referred to as a drain region. The first semiconductor region 41 is formed in an entire area of the surface layer portion of the second main surface 4 and exposed from the second main surface 4 as well as from the first to fourth side surfaces 5A to 5D. An n-type impurity concentration of the first semiconductor region 41 may be not less than $1\times10^{18}$ $cm^{-3}$ and not more than $1\times10^{21}$ $cm^{-3}$. In this embodiment, the first semiconductor region 41 is formed of a semiconductor substrate (Si substrate).

A thickness of the first semiconductor region 41 may be not less than 10 μm and not more than 450 μm. The thickness of the first semiconductor region 41 may be not less than 10 μm and not more than 50 μm, not less than 50 μm and not more than 150 μm, not less than 150 μm and not more than 250 μm, not less than 250 μm and not more than 350 μm, or not less than 350 μm and not more than 450 μm. The thickness of the first semiconductor region 41 is preferably not less than 50 μm and not more than 150 μm.

The semiconductor device 1 includes an n-type second semiconductor region 42 that is formed in a surface layer portion of the first main surface 3 of the semiconductor chip 2. The second semiconductor region 42 forms the main drain DM of the power transistor 8 together with the first semiconductor region 41. The second semiconductor region 42 may be referred to as a drift region or a drain drift region. The second semiconductor region 42 is formed in an entire area of the surface layer portion of the first main surface 3 so as to be electrically connected to the first semiconductor region 41 and exposed from the first main surface 3 as well as from the first to fourth side surfaces 5A to 5D.

The second semiconductor region 42 has an n-type impurity concentration less than the n-type impurity concentration of the first semiconductor region 41. The n-type impurity concentration of the second semiconductor region 42 may be not less than $1\times10^{15}$ $cm^{-3}$ and not more than $1\times10^{13}$ $cm^{-3}$ which are. In this embodiment, the second semiconductor region 42 is formed by an epitaxial layer (Si epitaxial layer).

The second semiconductor region 42 has a thickness that is less than the thickness of the first semiconductor region 41. The thickness of the second semiconductor region 42 may be not less than 5 μm and not more than 20 μm. The thickness of the second semiconductor region 42 may be not less than 5 μm and not more than μm, not less than 10 μm and not more than 15 μm, or not less than 15 μm and not more than 20 μm. The thickness of the second semiconductor region 42 is preferably not less than 5 μm and not more than 15 μm.

The semiconductor device 1 includes a first trench separation structure 43 that demarcates the first device region 6 in the first main surface 3, as an example of a region separation structure. The first trench separation structure 43 may be referred to as a DTI (Deep Trench Isolation) structure or an STI (Shallow Trench Isolation) structure.

The first trench separation structure 43 is formed in an annular shape that surrounds a part of the first main surface 3 in a plan view and demarcates the first device region 6 in a predetermined shape. In this embodiment, the first trench separation structure 43 is formed in a quadrilateral annular shape having four sides parallel to the first to fourth side surfaces 5A to 5D in a plan view and demarcates the first device region 6 in a quadrilateral shape. A planar shape of the first trench separation structure 43 is arbitrary and may be formed in a polygonal annular shape. The first device region 6 may be demarcated in a polygonal shape according to the planar shape of the first trench separation structure 43.

The first trench separation structure 43 has a separation width WI. The separation width WI is a width in a direction orthogonal to a direction in which the first trench separation structure 43 extends. The separation width WI may be not less than 0.5 μm and not more than 2.5 μm. The separation width WI may be not less than 0.5 μm and not more than 1 μm, not less than 1 μm and not more than 1.5 μm, not less than 1.5 μm and not more than 2 μm, or not less than 2 μm and not more than 2.5 μm. The separation width WI is preferably not less than 1.2 μm and not more than 2 μm.

The first trench separation structure 43 has a separation depth DI. The separation depth DI may be not less than 1 μm and not more than 10 μm. The separation depth DI may be not less than 1 μm and not more than 2.5 μm, not less than 2.5 μm and not more than 5 μm, not less than 5 μm and not more than 7.5 μm, or not less than 7.5 μm and not more than 10 μm. The separation depth DI is preferably not less than 2 μm and not more than 6 μm.

An aspect ratio DI/WI of the first trench separation structure 43 may be more than 1 and not more than 5. The aspect ratio DI/WI is a ratio of the separation depth DI in relation to the separation width WI. The aspect ratio DI/WI is preferably not less than 2. A bottom wall of the first trench separation structure 43 is preferably formed at an interval of not less than 1 μm and not more than 10 μm with respect to a bottom portion of the second semiconductor region 42. The bottom wall of the first trench separation structure 43 is in particular preferably formed at an interval of not less than 1 μm and not more than 5 μm with respect to the bottom portion of the second semiconductor region 42.

The first trench separation structure 43 has a corner portion that connects in a circular arc shape a portion extending in the first direction X and a portion extending in the second direction Y. In this embodiment, four corners of the first trench separation structure 43 are formed in a circular arc shape. That is, the first device region 6 is demarcated in a quadrilateral shape having four corners, each of which extends in a circular arc shape. The corner portion of the first trench separation structure 43 preferably has a certain separation width WI along a circular arc direction.

The first trench separation structure 43 has a single electrode structure that includes a separation trench 44, a separation insulating film 45 (separating insulator), and a separation electrode 46. The separation trench 44 digs down from the first main surface 3 toward the second main surface 4. The separation trench 44 is formed at an interval on the first main surface 3 side from the bottom portion of the second semiconductor region 42.

The separation trench 44 includes a side wall and a bottom wall. An angle of the side wall of the separation trench 44 that is made with the first main surface 3 inside the semiconductor chip 2 may be not less than 90° and not more than 92°. The separation trench 44 may be formed in a tapered shape that becomes narrower in opening width from an opening thereof to the bottom wall. A bottom wall corner portion of the separation trench 44 is preferably formed in a curved shape. The bottom wall of the separation trench 44 in its entirety may be formed so as to move to the second main surface 4 in a curved shape.

The separation insulating film 45 is formed on a wall surface of the separation trench 44. Specifically, the separation insulating film 45 is formed as a film in an entire area of the wall surface of the separation trench 44 and demarcates a U-letter shaped recess space inside the separation trench 44. In this embodiment, the separation insulating film 45 includes a silicon oxide film. Specifically, the separation insulating film 45 includes a silicon oxide film that is made up of an oxide of the semiconductor chip 2.

The separation insulating film 45 has a separation thickness TI. The separation thickness TI is a thickness of the separation insulating film 45 along the normal direction of the wall surface of the separation trench 44. The separation thickness TI may be not less than 0.1 μm and not more than 1 μm. The separation thickness TI may be not less than 0.1 μm and not more than 0.25 μm, not less than 0.25 μm and not more than 0.5 μm, not less than 0.5 μm and not more than 0.75 μm, or not less than 0.75 μm and not more than 1 μm. The separation thickness TI is preferably not less than 0.15 μm and not more than 0.65 μm.

Specifically, the separation insulating film 45 includes a first portion 45*a* and a second portion 45*b*. The first portion 45*a* is a portion that covers the side wall of the separation trench 44. The second portion 45*b* is a portion that covers the bottom wall of the separation trench 44. The first portion 45*a* has a first separation thickness TI1. The first separation thickness TI1 is a thickness of the first portion 45*a* along the normal direction of the side wall of the separation trench 44. The separation thickness TI of the separation insulating film 45 is defined by the first separation thickness TI1.

The second portion 45*b* has a second separation thickness TI2 different from the first separation thickness TI1 (TI1≠TI2). The second separation thickness TI2 is a thickness of the second portion 45*b* along the normal direction of the bottom wall of the separation trench 44. The second separation thickness TI2 is preferably less than the first separation thickness TI1 (TI2<TI1). The second separation thickness TI2 may be not less than 0.6 times and less than 1 time larger than the first separation thickness TI1. The second separation thickness TI2 is preferably not less than 0.7 times and not more than 0.9 times larger than the first separation thickness TI1.

The separation electrode 46 is embedded in the separation trench 44 as an integral object across the separation insulating film 45. In this embodiment, the separation electrode 46 includes conductive polysilicon. A source voltage (for example, ground voltage) may be applied as a reference voltage to the separation electrode 46.

The semiconductor device 1 includes a p-type (second conductive type) body region 47 that is formed in the surface layer portion of the first main surface 3 at the first device region 6. A p-type impurity concentration of the body region 47 may be not less than $1\times10^{16}$ $cm^{-3}$ and not more than $1\times10^{13}$ $cm^{-3}$. The body region 47 is formed in an entire area of the surface layer portion of the first main surface 3 in the first device region 6 and in contact with the first trench separation structure 43. The body region 47 is formed in a region on the first main surface 3 side with respect to the bottom wall of the first trench separation structure 43. Specifically, the body region 47 is formed in a region on the first main surface 3 side with respect to an intermediate portion of the first trench separation structure 43.

The semiconductor device 1 includes a body space 48 that is formed along an inner peripheral wall of the first trench separation structure 43 in the first device region 6. The body space 48 is made up of a part of the body region 47. The body space 48 is formed in an annular shape along the inner peripheral wall of the first trench separation structure 43 to surround an interior of the first device region 6 in a plan view.

The body space 48 has a space width WSP. The space width WSP may be not less than the separation width WI (WI≤WSP) or may be less than the separation width WI (WSP<WI). The body space 48 preferably has a certain space width WSP along the inner peripheral wall of the first trench separation structure 43. The space width WSP may be not less than 1 μm and not more than 2.5 μm. The space width WSP may be not less than 1 μm and not more than 1.5 μm, not less than 1.5 μm and not more than 2 μm, or not less than 2 μm and not more than 2.5 μm. The space width WSP is preferably not less than 1.2 μm and not more than 2 μm.

The semiconductor device 1 includes the power transistor 8 that is formed in the first device region 6 on the first main surface 3. The power transistor 8 is formed in first main surface 3 at an interval by the space width WSP from the first trench separation structure 43. Thereby, the power transistor 8 opposes the first trench separation structure 43 across the body space 48.

Specifically, the power transistor 8 includes the plurality of unit transistors 10 that are collectively formed in the first main surface 3 of the first device region 6. Although FIG. 9 shows an example in which 16 unit transistors 10 are formed, the number of the unit transistors 10 is arbitrary. The plurality of unit transistors 10 are each formed as a band (rectangular shape) extending in the first direction X and aligned in a single row in the second direction Y in a plan view. Thereby, the plurality of unit transistors 10 are formed as stripes extending in the first direction X in a plan view.

With reference to FIG. 10 and FIG. 11, specifically, the plurality of unit transistors 10 are each constituted of a unit cell 50. Each unit cell 50 includes one trench gate structure 51 and a channel cell 52 that is controlled by the trench gate structure 51. The channel cell 52 is a region where control of opening and closing a current path is performed by the trench gate structure 51. In this embodiment, the unit cell 50 includes a pair of channel cells 52 that are formed on both sides of one trench gate structure 51.

A cell width of the unit cell 50 may be not less than 1 μm and not more than 5 μm. The cell width is a width in a direction orthogonal to a direction in which the unit cell 50 extends (that is, second direction Y). A length of the unit cell 50 in the first direction X is arbitrary and adjusted by a length of the trench gate structure 51. Hereinafter, a structure of one unit transistor 10 (unit cell 50) will be described and, thereafter, the arrangement of the plurality of unit transistors 10 (unit cell 50) will be described.

The trench gate structure 51 is formed as a band (rectangular shape) extending in the first direction X in a plan view. The trench gate structure 51 has a first end portion 51A on one side and a second end portion 51B on the other side regarding the first direction X (longitudinal direction).

The trench gate structure 51 has a first width W1. The first width W1 is a width of the trench gate structure 51 in a transverse direction (second direction Y). The first width W1 may be substantially equal to the separation width WI of the first trench separation structure 43 (W1≈W1). The first width W1 is preferably less than the separation width W1 (W1<W1). The first width W1 is preferably less than the space width WSP (W1<WSP). The first width W1 may be not less than 0.5 μm and not more than 2 μm. The first width W1 may be not less than 0.5 μm and not more than 1 μm, not less than 1 μm and not more than 1.5 μm, or not less than 1.5 μm and not more than 2 μm. The first width W1 is preferably not less than 0.5 μm and not more than 1.5 μm.

The trench gate structure 51 has a first depth D1. In this embodiment, the first depth D1 is substantially equal to the separation depth DI of the first trench separation structure 43 (D1≈D1). The first depth D1 is preferably less than the separation depth D1 (D1<D1). The first depth D1 may be not less than 1 μm and not more than 10 μm. The first depth D1 may be not less than 1 μm and not more than 2.5 μm, not less than 2.5 μm and not more than 5 μm, not less than 5 μm and not more than 7.5 μm, or not less than 7.5 μm and not more than 10 μm. The first depth D1 is preferably not less than 2 μm and not more than 6 μm.

An aspect ratio D1/W1 of the trench gate structure 51 may be more than 1 and not more than 5. The aspect ratio D1/W1 is a ratio of the first depth D1 in relation to the first width W1. The aspect ratio D1/W1 is in particular preferably not less than 2. A bottom wall of the trench gate structure 51 is preferably formed at an interval of not less than 1 μm and not more than 10 μm with respect to the bottom portion of the second semiconductor region 42. The bottom wall of the trench gate structure 51 is in particular preferably formed at an interval of not less than 1 μm and not more than 5 μm with respect to the bottom portion of the second semiconductor region 42.

The trench gate structure 51 has a multiple electrode structure that includes a gate trench 53, an upper insulating film 54, a lower insulating film 55, an upper electrode 56, a lower electrode 57, and an intermediate insulating film 58. The upper insulating film 54, the lower insulating film 55 and the intermediate insulating film 58 constitute a first insulator. Thereby, the upper electrode 56 and the lower electrode 57 are embedded inside the gate trench 53 so as to be insulated and separated by the first insulator in an up/down direction.

The gate trench 53 digs down from the first main surface 3 to the second main surface 4. The gate trench 53 penetrates through the body region 47 and is formed at an interval on the first main surface 3 side from a bottom portion of the second semiconductor region 42. The gate trench 53 includes a side wall and a bottom wall. An angle of the side wall of the gate trench 53 that is made with the first main surface 3 inside the semiconductor chip 2 may be not less than 90° and not more than 92°.

The gate trench 53 may be formed in a tapered shape so that an opening width will become narrower from an opening thereof to the bottom wall. A bottom wall corner portion of the gate trench 53 is preferably formed in a curved shape. The bottom wall of the gate trench 53 in its entirety may be formed in a curved shape toward the second main surface 4.

The upper insulating film 54 covers an upper wall surface of the gate trench 53. Specifically, the upper insulating film 54 covers the upper wall surface that is positioned in a region of the gate trench 53 on the opening side with respect to a bottom portion of the body region 47. A lower portion of the upper insulating film 54 crosses a boundary between the second semiconductor region 42 and the body region 47.

The upper insulating film 54 has a portion that covers the body region 47 and a portion that covers the second semiconductor region 42. A covered area of the body region 47 by the upper insulating film 54 is larger than a covered area of the second semiconductor region 42 by the upper insulating film 54. In this embodiment, the upper insulating film 54 includes silicon oxide. Specifically, the upper insulating film 54 includes a silicon oxide film that is made up of an oxide of the semiconductor chip 2. The upper insulating film 54 is formed as a gate insulating film.

The upper insulating film 54 has a first thickness T1 less than the separation thickness T1 of the separation insulating film 45 (T1<T1). The first thickness T1 is a thickness of the upper insulating film 54 along the normal direction of a wall surface of the gate trench 53. The first thickness T1 may be not less than 0.01 μm and not more than 0.05 μm. The first thickness T1 may be not less than 0.01 μm and not more than 0.02 μm, not less than 0.02 μm and not more than 0.03 μm, not less than 0.03 μm and not more than 0.04 μm, or not less than 0.04 μm and not more than 0.05 μm. The first thickness T1 is preferably not less than 0.02 μm and not more than 0.04 μm.

The lower insulating film 55 covers a lower wall surface of the gate trench 53. Specifically, the lower insulating film 55 covers the lower wall surface that is positioned in a region of the gate trench 53 on the bottom wall side with respect to the bottom portion of the body region 47. The lower insulating film 55 demarcates a U-letter shaped recess space in a region of the gate trench 53 on the bottom wall side. The lower insulating film 55 is in contact with the second semiconductor region 42. In this embodiment, the lower insulating film 55 includes silicon oxide. Specifically, the lower insulating film 55 includes a silicon oxide film that is made up of an oxide of the semiconductor chip 2. The lower insulating film 55 is formed as a field insulating film.

The lower insulating film 55 has a second thickness T2 greater than the first thickness T1 of the upper insulating film 54 (T1<T2). The second thickness T2 may be substantially equal to the separation thickness T1 of the separation insulating film 45 (T2≈T1). The second thickness T2 is a thickness of the lower insulating film 55 along the normal direction of the wall surface of the gate trench 53. The second thickness T2 may be not less than 0.1 μm and not more than 1 μm. The second thickness T2 may be not less than 0.1 μm and not more than 0.25 μm, not less than 0.25 μm and not more than 0.5 μm, not less than 0.5 μm and not more than 0.75 μm, or not less than 0.75 μm and not more than 1 μm. The second thickness T2 is preferably not less than 0.15 μm and not more than 0.65 μm.

Specifically, the lower insulating film 55 includes a first portion 55*a* and a second portion 55*b*. The first portion 55*a* is a portion that covers a side wall of the gate trench 53. The second portion 55*b* is a portion that covers a bottom wall of the gate trench 53. The first portion 55*a* has a first lower thickness T21. The first lower thickness T21 is a thickness of the first portion 55*a* along the normal direction of the side wall of the gate trench 53. The second thickness T2 of the lower insulating film 55 is defined by the first lower thickness T21.

The second portion 45*b* has a second lower thickness T22 different from the first lower thickness T21 (T21≠T22). The second lower thickness T22 is a thickness of the second portion 45*b* along the normal direction of the bottom wall of the gate trench 53. The second lower thickness T22 is preferably less than the first lower thickness T21 (T22<T21). The second lower thickness T22 may be not less than 0.6 times and less than 1 time larger than the first lower thickness T21. The second lower thickness T22 is preferably not less than 0.7 times and not more than 0.9 times larger than the first lower thickness T21. The second lower thickness T22 may be substantially equal to the second separation thickness TI2 of the separation insulating film 45 (T22≈TI2).

The upper electrode 56 is embedded in the upper side (on the opening side) inside the gate trench 53 across the upper insulating film 54. The upper electrode 56 is formed as a band (rectangular shape) extending in the first direction X in a plan view. The upper electrode 56 opposes the body region 47 and the second semiconductor region 42 across the upper insulating film 54. An opposing area of the upper electrode 56 to the body region 47 is larger than an opposing area of the upper electrode 56 to the second semiconductor region 42. In this embodiment, the upper electrode 56 includes conductive polysilicon. The upper electrode 56 is formed as a gate electrode. The gate signal G is to be applied to the upper electrode 56.

The lower electrode 57 is embedded in the lower side (bottom wall side) inside the gate trench 53 across the lower insulating film 55. The lower electrode 57 opposes the second semiconductor region 42 across the lower insulating film 55. The lower electrode 57 has an upper end portion that protrudes from the lower insulating film 55 to the first main surface 3 side. The upper end portion of the lower electrode 57 extends toward the upper electrode 56 so as to be engaged with a bottom portion of the upper electrode 56. Thereby, the upper end portion of the lower electrode 57 opposes the upper insulating film 54 across the bottom portion of the upper electrode 56 with respect to the second direction Y.

In this embodiment, the lower electrode 57 includes conductive polysilicon. In this embodiment, the lower electrode 57 is formed as a gate electrode. Therefore, the gate signal G is to be applied to the lower electrode 57 at the same time with the upper electrode 56. The upper electrode 56 and the lower electrode 57 that are arranged inside the common gate trench 53 are controlled at the same time. It is, thereby, possible to suppress a voltage drop between the upper electrode 56 and the lower electrode 57 and, therefore, possible to suppress an electric field concentration between the upper electrode 56 and the lower electrode 57. The semiconductor chip 2 (in particular, second semiconductor region 42) can also be decreased in on-resistance Ron. This structure is in particular effective in a case that the semiconductor device 1 is provided as a device that is mounted on an automobile.

The intermediate insulating film 58 is interposed between the upper electrode 56 and the lower electrode 57 and electrically insulates the upper electrode 56 and the lower electrode 57. Specifically, the intermediate insulating film 58 covers the lower electrode 57 (upper end portion) that is exposed from the lower insulating film 55 in a region between the upper electrode 56 and the lower electrode 57. The intermediate insulating film 58 continues to the upper insulating film 54 and the lower insulating film 55. In this embodiment, the intermediate insulating film 58 includes silicon oxide. Specifically, the intermediate insulating film 58 includes a silicon oxide film that is made up of an oxide of the lower electrode 57.

The intermediate insulating film 58 has an intermediate thickness TM that is less than the second thickness T2 of the lower insulating film 55 in the normal direction Z (TM<T2). The intermediate thickness TM may be not less than 0.01 μm and not more than 0.05 μm. The intermediate thickness TM may be not less than 0.01 μm and not more than 0.02 μm, not less than 0.02 μm and not more than 0.03 μm, not less than 0.03 μm and not more than 0.04 μm, or not less than 0.04 μm and not more than 0.05 μm. The intermediate thickness TM is preferably not less than 0.02 μm and not more than 0.04 μm.

The pair of channel cells 52 are each formed as a band extending in the first direction X on both sides of the trench gate structure 51. The pair of channel cells 52 each have a channel width WC. The channel width WC may be not less than 0.1 μm and not more than 1 μm.

The pair of channel cells 52 each include an n-type source region 60 that is formed in a surface layer portion of the body region 47. The number of the source regions 60 included in the pair of channel cells 52 is arbitrary. In this embodiment, the pair of channel cells 52 each include a plurality of source regions 60. One or the plurality of source regions 60 that are included in the unit cell 50 form a unit source SU (a part of the main source SM of the power transistor 8) of the unit transistor 10.

An n-type impurity concentration of the source region 60 is higher than the n-type impurity concentration of the second semiconductor region 42. The n-type impurity concentration of the source region 60 may be not less than $1\times10^{18}$ $cm^{-3}$ and not more than $1\times10^{21}$ $cm^{-3}$. The plurality of source regions 60 are formed at an interval in the first direction X in each of the channel cells 52. Bottom portions of the plurality of source regions 60 are positioned in a region on the first main surface 3 side with respect to the bottom portion of the body region 47.

The pair of channel cells 52 each include a p-type contact region 61 that is formed in the surface layer portion of the body region 47 in a region different from the source region 60. The number of contact regions 61 included in the pair of channel cells 52 is arbitrary. In this embodiment, the pair of channel cells 52 each include the plurality of contact regions 61. A p-type impurity concentration of the contact region 61 is higher than the p-type impurity concentration of the body region 47. The p-type impurity concentration of the contact region 61 may be not less than $1\times10^{18}$ $cm^{-3}$ and not more than $1\times10^{21}$ $cm^{-3}$.

The plurality of contact regions 61 are formed at an interval in the first direction X in each of the channel cells 52. Specifically, the plurality of contact regions 61 are alternately formed together with the plurality of source regions 60 in the first direction X in a manner that one source region 60 is held between the contact regions 61. Bottom portions of the plurality of contact regions 61 are positioned in a region on the first main surface 3 side with respect to the bottom portion of the body region 47.

The pair of channel cells 52 include a plurality of channel regions 62 that are defined between the plurality of source regions 60 and the second semiconductor region 42 inside the body region 47. On/off control of the plurality of channel regions 62 is performed at the same time by the trench gate structure 51. Therefore, one channel of the unit transistor 10 is formed by the plurality of channel regions 62.

A plurality of unit cells 50 are formed so that a plurality of trench gate structures 51 are aligned in a single row at a first interval I1 in the second direction Y. That is, the plurality of trench gate structures 51 are each formed as a band extending in the first direction X in the first device region 6 and formed at the first interval I1 in the second direction Y in a plan view. That is, the plurality of unit cells 50 (the plurality of trench gate structures 51) are formed as stripes extending in the first direction X in a plan view.

Plateau-like mesa portions 63 extending in the first direction X are each demarcated in a region between the pair of trench gate structures 51 that are adjacent to each other. That is, the plurality of trench gate structures 51 are alternately formed with the plurality of mesa portions 63 in the second direction Y in a manner that one mesa portion 63 is held between them.

In this embodiment, the plurality of unit cells 50 are each formed so that the channel cells 52 are made integral with each other at a mesa portion 63 positioned between the pair of unit cells 50 that are adjacent to each other. The plurality of source regions 60 and the plurality of contact regions 61 are alternately formed along the first direction X in the surface layer portion of the body region 47 in each mesa portion 63. In this embodiment, the plurality of unit cells 50 are each formed by a region between central portions of the pair of mesa portions 63 that are adjacent to each other.

In the above-described structure as well, on/off control of the channel region 62 at each unit cell 50 is performed for each unit cell 50. In view of the pair of unit cells 50 that are adjacent to each other, where the unit cell 50 (trench gate structure 51) on one side is controlled so as to be in an on state, the channel region 62 of this unit cell 50 on one side is turned into an on state, but the channel region 62 of the unit cell 50 on the other side is not turned into an on state. Therefore, unless there is provided an electrical connection from outside, the plurality of unit cells 50 (trench gate structures 51) are electrically independent. Thereby, each unit cell 50 functions as one unit transistor 10.

The trench gate structures 51, each of which is made up of two unit cells 50 arranged on both sides with regard to the second direction Y, are each formed so that a space width WSP is kept in the first direction X from the first trench separation structure 43. In this embodiment, the two unit cells 50 arranged on both sides do not include the source region 60 in the channel cell 52 on the first trench separation structure 43 side. According to such a structure, a main current path can be restricted to the mesa portion 63 and a current leakage can also be suppressed between the trench gate structure 51 and the first trench separation structure 43.

In this embodiment, the two unit cells 50 arranged on both sides include only the contact region 61 at the channel cell 52 on the first trench separation structure 43 side (hereinafter, referred to as an "outermost contact region 61"). The outermost contact region 61 is preferably formed at an interval on the trench gate structure 51 side from the first trench separation structure 43. The outermost contact region 61 is connected to a side wall of a corresponding trench gate structure 51. The outermost contact region 61 may be formed as a band extending along the side wall of the corresponding trench gate structure 51.

With reference to FIG. 10 and FIG. 11, in this embodiment, the first interval I1 corresponds to a value obtained by doubling a channel width WC. The first interval I1 is preferably set at a value in which a depletion layer spreading from the plurality of trench gate structures 51 is made integral at a site lower than the bottom walls of the plurality of trench gate structures 51. The first interval I1 may be not less than 0.25 times larger than the first width W1 and not more than 1.5 times larger than the first width W1. The first interval I1 is preferably not more than the first width W1 (I1≤W1). The first interval I1 is preferably less than the space width WSP (I1≤WSP).

The first interval I1 may be not less than 0.5 μm and not more than 2 μm. The first interval I1 may be not less than 0.5 μm and not more than 1 μm, not less than 1 μm and not more than 1.5 μm, or not less than 1.5 μm and not more than 2 μm. The first interval I1 is preferably not less than 0.4 μm and not more than 1.6 μm.

With reference to FIG. 9 to FIG. 11, the semiconductor device 1 includes a plurality (32 in this embodiment) of trench contact structures 71 that are formed in the first device region 6 at the first main surface 3. The plurality of trench contact structures 71 are also constituents of the power transistor 8. Specifically, the plurality of trench contact structures 71 include a plurality (16, in this embodiment) of first trench contact structures 71A and a plurality (16, in this embodiment) of second trench contact structures 71B.

The plurality of first trench contact structures 71A are each formed in a region between the first end portions 51A of the plurality of trench gate structures 51 and the first trench separation structure 43. The plurality of first trench contact structures 71A are individually connected to the first end portions 51A of the plurality of trench gate structures 51 and formed each as a band (rectangular shape) extending in the first direction X. The plurality of first trench contact structures 71A are formed at an interval of the space width WSP from the first trench separation structure 43 in the first direction X. A length of the plurality of first trench contact structures 71A in the first direction X is arbitrary.

The plurality of second trench contact structures 71B are each formed in a region between the second end portions 51B of the plurality of trench gate structures 51 and the first trench separation structure 43. The plurality of second trench contact structures 71B are individually connected to the second end portions 51B of the plurality of trench gate structures 51 and are each formed as a band (rectangular shape) extending in the first direction X. With regard to the first direction X, the plurality of second trench contact structures 71B are formed at an interval of the space width WSP from the first trench separation structure 43. A length of the plurality of second trench contact structures 71B in the first direction X is arbitrary.

The plurality of trench contact structures 71 each have a second width W2 and a second depth D2. The second width W2 is a width in a direction (second direction Y) orthogonal to a direction (first direction X) in which the trench contact structure 71 extends. In this embodiment, the second width W2 is substantially equal to the first width W1 of the trench gate structure 51 (W2≈W1). Also, in this embodiment, the second depth D2 is substantially equal to the first depth D1 of the trench gate structure 51 (D2≈D1). Therefore, an aspect ratio D2/W2 of the plurality of trench contact structures 71 is substantially equal to an aspect ratio D1/W1 of the trench gate structure 51 (D2/W2≈D1/W1).

Specifically, the plurality of trench contact structures 71 each have a single electrode structure that includes a contact trench 72, a contact insulating film 73 (second insulator), and a contact electrode 74. The contact trench 72 digs down from the first main surface 3 to the second main surface 4 so as to be communicatively connected to the gate trench 53. The contact trench 72 is formed at an interval from a bottom portion of the second semiconductor region 42 to the first main surface 3 side.

The contact trench 72 includes a side wall and a bottom wall. An angle of the side wall of the contact trench 72 that is made with the first main surface 3 inside the semiconductor chip 2 may be not less than 90° and not more than 92°. The contact trench 72 may be formed in a tapered shape in which an opening width becomes narrower from an opening thereof to the bottom wall. A bottom wall corner portion of the contact trench 72 is preferably formed in a curved shape. The bottom wall of the contact trench 72 in its entirety may be formed in a curved shape toward the second main surface 4. The bottom wall of the contact trench 72 is smoothly connected to the bottom wall of the gate trench 53.

The contact insulating film 73 is formed on a wall surface of the contact trench 72. Specifically, the contact insulating film 73 is formed as a film in an entire area of the wall surface of the contact trench 72 to demarcate a U-letter shaped recess space inside the contact trench 72. In this embodiment, the contact insulating film 73 includes a silicon oxide film. Specifically, the contact insulating film 73 includes a silicon oxide film that is made up of an oxide of the semiconductor chip 2.

The contact insulating film 73 has a third thickness T3 greater than the first thickness T1 of the upper insulating film 54 (T1<T3). The third thickness T3 is a thickness of the contact insulating film 73 along the normal direction of the wall surface of the contact trench 72. The third thickness T3 may be substantially equal to the separation thickness T1 of the separation insulating film 45 (T3≈T1). The third thickness T3 may be substantially equal to the second thickness T2 of the lower insulating film 55 (T3≈T2).

The third thickness T3 may be not less than 0.1 μm and not more than 1 μm. The third thickness T3 may be not less than 0.1 μm and not more than 0.25 μm, not less than 0.25 μm and not more than 0.5 μm, not less than 0.5 μm and not more than 0.75 μm, or not less than 0.75 μm and not more than 1 μm. The third thickness T3 is preferably not less than 0.15 μm and not more than 0.65 μm.

Specifically, the contact insulating film 73 includes a first portion 73*a* and a second portion 73*b*. The first portion 73*a* is a portion that covers the side wall of the contact trench 72. The second portion 73*b* is a portion that covers the bottom wall of the contact trench 72. The first portion 73*a* has a first contact thickness T31. The first contact thickness T31 is a thickness of the first portion 73*a* along the normal direction of the side wall of the contact trench 72. The third thickness T3 of the contact insulating film 73 is defined by the first contact thickness T31.

The second portion 73*b* has a second contact thickness T32 that is different from the first contact thickness T31 (T31≠T32). The second contact thickness T32 is a thickness of the second portion 73*b* along the normal direction of the bottom wall of the contact trench 72. The second contact thickness T32 is preferably less than the first contact thickness T31 (T32<T31). The second contact thickness T32 may be not less than 0.6 times and less than 1 time larger than the first contact thickness T31. The second contact thickness T32 is preferably not less than 0.7 times and not more than 0.9 times larger than the first contact thickness T31. The second contact thickness T32 may be substantially equal to the second separation thickness T12 of the separation insulating film 45 (T32≈T12).

The contact electrode 74 is embedded in the contact trench 72 as an integral object across the contact insulating film 73. In this embodiment, the contact electrode 74 includes conductive polysilicon. The contact electrode 74 is fixed at the same potential as the lower electrode 57 of the trench gate structure 51. That is, the contact electrode 74 is formed as a gate electrode, and the gate signal G is to be applied to the contact electrode 74.

Specifically, the contact electrode 74 is connected to the lower electrode 57 of the trench gate structure 51 at a communicatively connected portion of the contact trench 72 and the gate trench 53. Also, the contact electrode 74 is electrically insulated from the upper electrode 56 of the trench gate structure 51 across the intermediate insulating film 58. That is, the contact electrode 74 is constituted of a lead-out portion that is led out from the gate trench 53 to the contact trench 72 across the contact insulating film 73 and the intermediate insulating film 58 in the lower electrode 57.

In terms of a structure, the trench contact structure 71 includes the contact electrode 74 that is fixed at the same potential as the lower electrode 57 and, therefore, the trench contact structure 71 is controlled at the same time with the corresponding trench gate structure 51. Therefore, the total number of the trench gate structures 51 (unit cells 50) that can be systematized as the system transistor 9 (that is, the maximum system number that the power transistor 8 has) is determined by the trench contact structure 71.

In this embodiment, the trench contact structure 71 is connected one each to both end portions (first end portion 51A and second end portion 51B) of each trench gate structure 51. Therefore, each trench gate structure 51 is controlled at the same time with the two trench contact structures 71 at both end portions. That is, in this embodiment, a configuration that sixteen (16) trench gate structures 51 are controlled so as to be electrically independent is provided.

Therefore, in this embodiment, the total number of the unit transistors 10 that can be systematized as a system transistor 9 is "16," and the maximum system number that the power transistor 8 has is given as "16." The number of gate wirings 14 connected to the plurality of trench gate structures 51 is adjusted, by which the maximum number of 16 gate signals G can be individually to be input to the 16 trench gate structures 51 in a one-to-one corresponding relationship. The number of systems is increased, thus making it possible to increase the number of patterns that can be combined with the gate signal G that is to be input to the n-number of the system transistors 9.

With reference to FIG. 12 to FIG. 14B, the semiconductor device 1 includes a first field insulating film 80 that partially covers the first main surface 3 in the first device region 6. In this embodiment, the first field insulating film 80 includes a silicon oxide film. Specifically, the first field insulating film 80 includes a silicon oxide film that is made up of an oxide of the semiconductor chip 2.

The first field insulating film 80 is formed at an interval on the first trench separation structure 43 side from the power transistor 8 (the plurality of trench gate structures 51 and the plurality of trench contact structures 71) and covers a periphery of the first trench separation structure 43 in a plan view. The first field insulating film 80 covers the body region 47 (body space 48). That is, the first field insulating film 80 opposes the second semiconductor region 42 (first semiconductor region 41) across the body region 47 (body space 48) at a peripheral edge portion of the first device region 6.

The first field insulating film 80 extends as a band along an inner wall surface of the first trench separation structure 43 in a plan view. In this embodiment, the first field insulating film 80 is formed in an annular shape extending along the inner peripheral wall of the first trench separation structure 43 to surround an internal portion of the first device region 6 over an entire circumference in a plan view. That is, the first field insulating film 80 has a side extending in one direction (first direction X) and a side extending in an intersecting direction (second direction Y) that intersects the one direction in a plan view.

The first field insulating film 80 continues to the separation insulating film 45 that is exposed from the inner peripheral wall of the first trench separation structure 43. That is, the first device region 6 is demarcated inside the semiconductor chip 2 by the first trench separation structure 43 and demarcated on the semiconductor chip 2 by the first field insulating film 80.

The first field insulating film 80 has a first insulating side wall 80*a* that demarcates an internal portion of the first device region 6. The first insulating side wall 80*a* is formed at an inner peripheral edge of the first field insulating film 80 over an entire circumference. That is, the first insulating side wall 80*a* is formed in a side extending in one direction (first direction X) and a side extending in an intersecting direction (second direction Y) that intersects the one direction in the first field insulating film 80.

The first insulating side wall 80*a* is positioned on the body region 47 (body space 48). The first insulating side wall 80*a* is inclined obliquely downward so as to make an acute angle with the first main surface 3. Specifically, the first insulating side wall 80*a* has an upper end portion positioned on a main surface side of the first field insulating film 80 and a lower end portion positioned on the first main surface 3 side and is inclined obliquely downward from the upper end portion to the lower end portion.

The first insulating side wall 80*a* makes with the first main surface 3 a first inclined angle $\theta 1$ that is not less than 20° and not more than 40° ($20° \leq \theta 1 \leq 40°$). Where there is drawn a straight line that connects the upper end portion and the lower end portion of the first insulating side wall 80*a* in a cross-sectional view, the first inclined angle $\theta 1$ is an angle (absolute value) of the straight line that is made with the first main surface 3 inside the first field insulating film 80. The first inclined angle $\theta 1$ is preferably less than 40° ($\theta 1 < 40°$).

It is particularly preferable that the first inclined angle $\theta 1$ falls within a range of 30°±6° ($24° \leq \theta 1 \leq 36°$). The first inclined angle $\theta 1$ typically falls within a range of not less than 28° and not more than 36° ($28° \leq \theta 1 \leq 36°$). The first insulating side wall 80*a* may be inclined in a curved shape that is depressed toward the first main surface 3 in a region between the upper end portion and the lower end portion. In this case as well, where there is drawn a straight line that connects the upper end portion and the lower end portion of the first insulating side wall 80*a* in a cross-sectional view, the first inclined angle $\theta 1$ is an angle (absolute value) of the straight line that is made with the first main surface 3.

The first field insulating film 80 has a first field thickness TF1. The first field thickness TF1 is a thickness of a portion of the first field insulating film 80 along the normal direction Z excluding a portion that forms the first insulating side wall 80*a*. The first field thickness TF1 may be substantially equal to the first separation thickness TI1 (=separation thickness T1) of the separation insulating film 45 (TF1≈TI1). The first field thickness TF1 is preferably greater than the second separation thickness TI2 of the separation insulating film 45 (TI2<TF1).

The first field thickness TF1 is preferably not less than the first thickness T1 of the upper insulating film 54 (T1≤TF1). The first field thickness TF1 is in particular preferably greater than the first thickness T1 (T1<TF1). The first field thickness TF1 may be substantially equal to the first lower thickness T21 of the lower insulating film 55 (=second thickness T2) (TF1≈T21). The first field thickness TF1 is preferably greater than the second lower thickness T22 of the lower insulating film 55 (T22<TF1).

The first field thickness TF1 is preferably greater than the intermediate thickness TM (TM<TF1). The first field thickness TF1 may be substantially equal to the first contact thickness T31 of the contact insulating film 73 (=third thickness T3) (TF1≈T31). The first field thickness TF1 is preferably greater than the second contact thickness T32 of the contact insulating film 73 (T32<TF1).

The first field thickness TF1 may be not less than 0.1 μm and not more than 1 μm. The first field thickness TF1 may be not less than 0.1 μm and not more than 0.25 μm, not less than 0.25 μm and not more than 0.5 μm, not less than 0.5 μm and not more than 0.75 μm, or not less than 0.75 μm and not more than 1 μm. The first field thickness TF1 is preferably not less than 0.15 μm and not more than 0.65 μm.

With reference to FIG. 12 to FIG. 14B (in particular, FIG. 14A and FIG. 14B), the semiconductor device 1 includes a first hidden surface 81 and a first exposed surface 82 that are formed in the first device region 6 on the first main surface 3. The first hidden surface 81 is formed at a portion of the first main surface 3 that is covered by the first field insulating film 80.

The first exposed surface 82 is formed at a portion of the first main surface 3 that is exposed from the first field insulating film 80. In other words, the first main surface 3 includes the first hidden surface 81 and the first exposed surface 82 that are demarcated by the first field insulating film 80 in the first device region 6, and the power transistor 8 (the plurality of unit cells 50) is formed in the first exposed surface 82.

In this embodiment, the first exposed surface 82 is depressed in the thickness direction of the semiconductor chip 2 (second main surface 4 side) with respect to the first hidden surface 81. Specifically, the first exposed surface 82 is depressed one step in the thickness direction of the semiconductor chip 2 with respect to the first hidden surface 81, with the first insulating side wall 80*a* of the first field insulating film 80 given as a starting point. The first exposed surface 82 is formed at a depth position between the bottom portion of the body region 47 and the first hidden surface 81 in the normal direction Z. The first exposed surface 82 is preferably depressed in a range of more than 0 μm and not more than 0.5 μm (preferably, not more than 0.2 μm) with respect to the first hidden surface 81 in the normal direction Z.

With reference to FIG. 12 to FIG. 14B (in particular, FIG. 14A and FIG. 14B), the semiconductor device 1 includes a first main surface insulating film 83 that selectively covers the first main surface 3 in the first device region 6. In this embodiment, the first main surface insulating film 83 includes a silicon oxide film. Specifically, the first main surface insulating film 83 includes a silicon oxide film that is made up of an oxide of the semiconductor chip 2. The first main surface insulating film 83 covers a region of the first main surface 3 outside the gate trench 53, the contact trench 72 and the first field insulating film 80.

The first main surface insulating film 83 covers the first exposed surface 82 and continues to the upper insulating film 54, the contact insulating film 73, and the first insulating side wall 80*a* of the first field insulating film 80. The first main surface insulating film 83 is formed at an interval on the semiconductor chip 2 side (first exposed surface 82 side) from an intermediate portion of the first field insulating film 80 in the thickness direction. Specifically, where there is drawn a line that passes through the intermediate portion of the thickness direction of the first field insulating film 80 along the first exposed surface 82 (first main surface 3) in a cross-sectional view, the first main surface insulating film 83 is formed at an interval on the semiconductor chip 2 side from the line.

The first main surface insulating film 83 includes a first region 83*a* and a second region 83*b*. The first region 83*a* is positioned on the semiconductor chip 2 side with respect to the first hidden surface 81. The second region 83*b* is positioned on a side opposite to the semiconductor chip 2 (the main surface side of the first field insulating film 80) with respect to the first hidden surface 81. Specifically, where there is drawn an extension line that extends in parallel to the first hidden surface 81 from on the first hidden surface 81 in a cross-sectional view, the first region 83*a* is positioned on the semiconductor chip 2 side with respect to the extension line. The second region 83*b* is positioned on a side opposite to the first region 83*a* across the extension line (that is, on a side opposite to the semiconductor chip 2).

The first main surface insulating film 83 has a first insulation thickness TMI1 that is less than the first field thickness TF1 of the first field insulating film 80 (TMI1<TF1). The first insulation thickness TMI1 is preferably not more than one-fifth of the first field thickness TF1 (TMI1≤⅕×TF1). The first insulation thickness TMI1 may be substantially equal to the first thickness T1 of the upper insulating film 54 (TMI1≈T1).

The first insulation thickness TMI1 may be not less than 0.01 μm and not more than 0.05 μm. The first insulation thickness TMI1 may be not less than 0.01 μm and not more than 0.02 μm, not less than 0.02 μm and not more than 0.03 μm, not less than 0.03 μm and not more than 0.04 μm, or not less than 0.04 μm and not more than 0.05 μm. The first insulation thickness TMI1 is preferably not less than 0.02 μm and not more than 0.04 μm.

The semiconductor device 1 includes an outer field insulating film 84 that covers a region outside the first device region 6. The outer field insulating film 84 covers a periphery of the first trench separation structure 43 in a region outside the first device region 6. The outer field insulating film 84 surrounds the first trench separation structure 43 in the region outside the first device region 6 in a plan view and continues to the separation insulating film 45 that is exposed from an outer peripheral wall of the first trench separation structure 43. As with the first field insulating film 80, the outer field insulating film 84 has a first field thickness TF1.

The semiconductor device 1 includes the aforementioned interlayer insulating layer 13 that covers the first main surface 3. The interlayer insulating layer 13 covers the first trench separation structure 43, the plurality of trench gate structures 51, the first field insulating film 80, and the first main surface insulating film 83 in the first device region 6. The interlayer insulating layer 13 passes through the first insulating side wall 80*a* from on the first main surface insulating film 83 and covers the first field insulating film 80. The interlayer insulating layer 13 covers the first insulating side wall 80*a* over the entire circumference of the first insulating side wall 80*a* in the first device region 6.

The semiconductor device 1 includes a plurality of plug electrodes 91 to 95 embedded in the interlayer insulating layer 13. The plurality of plug electrodes 91 to 95 include a plurality of first plug electrodes 91, a plurality of second plug electrodes 92, a plurality of third plug electrodes 93, a plurality of fourth plug electrodes 94, and a plurality of fifth plug electrodes 95. The plurality of plug electrodes 91 to 95 may be each made up of a tungsten plug electrode that has a laminated structure including a titanium-based metal film and a tungsten film. In FIG. 9 to FIG. 11, the plurality of plug electrodes 91 to 95 are indicated by a cross mark. Also, in FIG. 15, the first plug electrode 91 and the fifth plug electrode 95 are indicated by a line for simplification.

The plurality of first plug electrodes 91 are each constituted of a source plug electrode for the separation electrode 46. The plurality of first plug electrodes 91 are each embedded in a portion of the interlayer insulating layer 13 that covers the first trench separation structure 43. The plurality of first plug electrodes 91 are embedded at an interval along the separation electrode 46 and are each electrically connected to the separation electrode 46. The arrangement and shape of the plurality of first plug electrodes 91 are arbitrary. One or the plurality of first plug electrodes 91 that extend as a band or in an annular shape in a plan view may be formed on the separation electrode 46.

The plurality of second plug electrodes 92 are each constituted of a gate plug electrode for the upper electrode 56. The plurality of second plug electrodes 92 are each embedded in a portion of the interlayer insulating layer 13 that covers the plurality of trench gate structures 51. The plurality of second plug electrodes 92 are embedded at an interval along each upper electrode 56 and electrically connected to each upper electrode 56. In this embodiment, the plurality of second plug electrodes 92 are each electrically connected to both end portions of each upper electrode 56. The arrangement and shape of the plurality of second plug electrodes 92 are arbitrary. One or the plurality of second plug electrodes 92 that extend as a band along the upper electrode 56 in a plan view may be formed on each upper electrode 56.

The plurality of third plug electrodes 93 are each constituted of a source plug electrode for the source region 60 (contact region 61). The plurality of third plug electrodes 93 are each embedded in a portion of the interlayer insulating layer 13 that covers the plurality of mesa portions 63. The plurality of third plug electrodes 93 are each embedded as a band extending along the plurality of mesa portions 63 in a plan view. The third plug electrodes 93 are each electrically connected to the plurality of source regions 60 and the plurality of contact regions 61 at each mesa portion 63. The arrangement and shape of the plurality of third plug electrodes 93 are arbitrary. The plurality of third plug electrodes 93 may be formed on each mesa portion 63.

The plurality of fourth plug electrodes 94 are each constituted of a source plug electrode for the outermost contact region 61. The plurality of fourth plug electrodes 94 are each embedded in a portion of the interlayer insulating layer 13 that covers a plurality of outermost contact regions 61. The plurality of fourth plug electrodes 94 are embedded at an interval along each outermost contact region 61 and are each electrically connected to each outermost contact region 61. The arrangement and shape of the plurality of fourth plug electrodes 94 are arbitrary. One or the plurality of fourth plug electrodes 94 that extend as a band along the outermost contact region 61 in a plan view may be formed on each of the outermost contact regions 61.

The plurality of fifth plug electrodes 95 are each constituted of a gate plug electrode for the contact electrode 74. The plurality of fifth plug electrodes 95 are each embedded in a portion of the interlayer insulating layer 13 that covers the plurality of contact electrodes 74. Each of the fifth plug electrodes 95 is electrically connected to each of the contact electrodes 74. The arrangement and shape of the plurality of fifth plug electrodes 95 are arbitrary. One or the plurality of fifth plug electrodes 95 that extend as a band along the contact electrode 74 in a plan view may be formed on each of the contact electrodes 74.

The semiconductor device 1 includes one or a plurality of source wirings 96 that are formed inside the interlayer insulating layer 13. One or the plurality of source wirings 96 are constituted of a wiring layer that is formed inside the interlayer insulating layer 13. One or the plurality of source wirings 96 are selectively routed inside the interlayer insulating layer 13 and electrically connected to the separation electrode 46, the source region 60, and the contact region 61 via the plurality of first plug electrodes 91, the plurality of third plug electrodes 93, and the plurality of fourth plug electrodes 94. One or the plurality of source wirings 96 are electrically connected to the aforementioned source terminal 16.

The semiconductor device 1 includes the n-number of aforementioned gate wirings 14 that are formed inside the interlayer insulating layer 13. In this embodiment, the n-number of the gate wirings 14 are routed inside the first device region 6 by crossing the first trench separation structure 43 and the first field insulating film 80 from the second device region 7 in a plan view.

The n-number of the gate wirings 14 are electrically connected to the control IC 11 (gate control circuit 12) in the second device region 7. The n-number of the gate wirings 14 are electrically connected to the plurality of second plug electrodes 92 and the plurality of fifth plug electrodes 95 in the first device region 6. That is, the n-number of the gate wirings 14 are each electrically connected to the upper electrode 56, the lower electrode 57, and the contact electrode 74 in the first device region 6.

Specifically, the n-number of the gate wirings 14 are each electrically connected to one or the plurality of trench gate structures 51 (unit transistor 10) that are to be systematized as an individually controlled object. The n-number of the gate wirings 14 may include one or the plurality of gate wirings 14 that are electrically connected to one trench gate structure 51 that is to be systematized as an individually controlled object. The n-number of the gate wirings 14 may also include one or the plurality of gate wirings 14 that connect in parallel the plurality of trench gate structures 51 that are to be systematized as an individually controlled object.

The n-number of the gate wirings 14 are each electrically connected to the upper electrode 56 and the lower electrode 57 of the trench gate structure 51. That is, the n-number of the gate wirings 14 are each electrically connected to one or the plurality of trench gate structures 51 and also to one or the plurality of trench contact structures 71 that are connected to one or the plurality of trench gate structures 51. One system transistor 9 is constituted of a parallel circuit of one or the plurality of trench gate structures 51 (unit transistor 10) that are electrically connected to one gate wiring 14.

The plurality of unit transistors 10 (unit cell 50) each have a predetermined channel ratio RC. When a planar area of the pair of channel cells 52 in each unit transistor 10 is given as 100%, a ratio of a channel area of the channel region 62 in relation to this planar area is obtained, and the channel ratio RC is defined by this ratio. The channel area is defined by a sum of the planar area of one or the plurality of source regions 60 in each unit transistor 10.

In this embodiment, the plurality of unit transistors 10 each have a channel ratio RC of 50%. Therefore, a total channel ratio RT of the plurality of unit transistors 10 is 50%. Where a total planar area of the channel cells 52 is given as 100%, the total channel ratio RT is defined by a ratio of the total channel area of all the channel regions 62 in relation to the total planar area.

In the n-system power transistor 8, the total channel ratio RT is divided by the n-number of the system transistors 9 into the n-number of system channel ratios RS, each of which is constituted of the same or a different value. That is, a sum of the n-number of the system channel ratios RS is given as the total channel ratio RT.

The channel ratio RC of each unit transistor 10 can be adjusted in a range of not less than 0% and not more than 100%. Where the channel ratio RC is 0%, no source region 60 is formed in the pair of channel cells 52. In this case, one of or both of the body region 47 and the contact region 61 are formed in the pair of channel cells 52. Where the channel ratio RC is 100%, only the source region 60 is formed in the pair of channel cells 52, and neither the contact region 61 nor the body region 47 is formed. In view of electrical characteristics of the unit transistor 10, the channel ratio RC is preferably adjusted in a range of more than 0% and less than 100%.

The channel ratio RC may be adjusted for each unit transistor 10. That is, the plurality of unit transistors 10 may have a channel ratio RC that is different from each other or may have a channel ratio RC that is substantially equal to each other. In this case, the n-number of the system transistors 9 may include one or the plurality of unit transistors 10 that are systematized as an individually controlled object from an aggregation of the plurality of unit transistors 10 each having the same or a different channel ratio RC. Also, the n-number of the system transistors 9 may each have the same or a different system channel ratio RS.

The channel ratio RC relates to a rise in temperature of the first device region 6 (semiconductor chip 2). For example, an increase in channel ratio RC results in an easy rise in temperature of the first device region 6. On the other hand, a decrease in channel ratio RC results in a difficult rise in temperature of the first device region 6. Therefore, the channel ratio RC may be adjusted for each unit transistor 10 based on a temperature distribution of the first device region 6.

One or the plurality of unit transistors 10 that have a relatively small channel ratio RC may be arranged in a region where a temperature rises easily, and one or the plurality of unit transistors 10 that have a relatively large channel ratio RC may be arranged in a region where a temperature rises difficultly. A central portion of the first device region 6 is given as an example of the region where a temperature rises easily. A peripheral edge portion of the first device region 6 is given as an example of the region where a temperature rises difficultly.

One or the plurality of unit transistors 10 that have a relatively low first channel ratio RC may be arranged in a region where a temperature rises easily (for example, central portion). The first channel ratio RC may be, as an example, not less than 20% and not more than 40% (for example, 25%). One or the plurality of unit transistors 10 that have a second channel ratio RC greater than the first channel ratio RC may be arranged in a region where a temperature rises difficultly (for example, peripheral edge portion). The second channel ratio RC may be, as an example, not less than 60% and not more than 80% (for example, 75%).

One or the plurality of unit transistors 10 that have a third channel ratio RC greater than the first channel ratio RC and less than the second channel ratio RC may be arranged between the region where a temperature rises easily and the region where a temperature rises difficultly. The third channel ratio RC may be more than 40% and less than 60% (for example, 50%). The total channel ratio RT of the first to the third channel ratio RC may be adjusted to 50%. That is, the total channel ratio RT may be adjusted while the channel ratio RC is adjusted for each unit transistor 10 based on a temperature distribution in the first device region 6.

Also, the unit transistor 10 having the first channel ratio RC, the unit transistor 10 having the second channel ratio RC, and the unit transistor 10 having the third channel ratio RC may be arrayed repeatedly in a regular order. The plural types of unit transistors 10 may be arrayed in this order repeatedly in the second direction Y. In this case, the total channel ratio RT may be adjusted to 50%. According to such a structure, a biased temperature distribution in the first device region 6 can be suppressed by a relatively simple design.

Figure 16A:
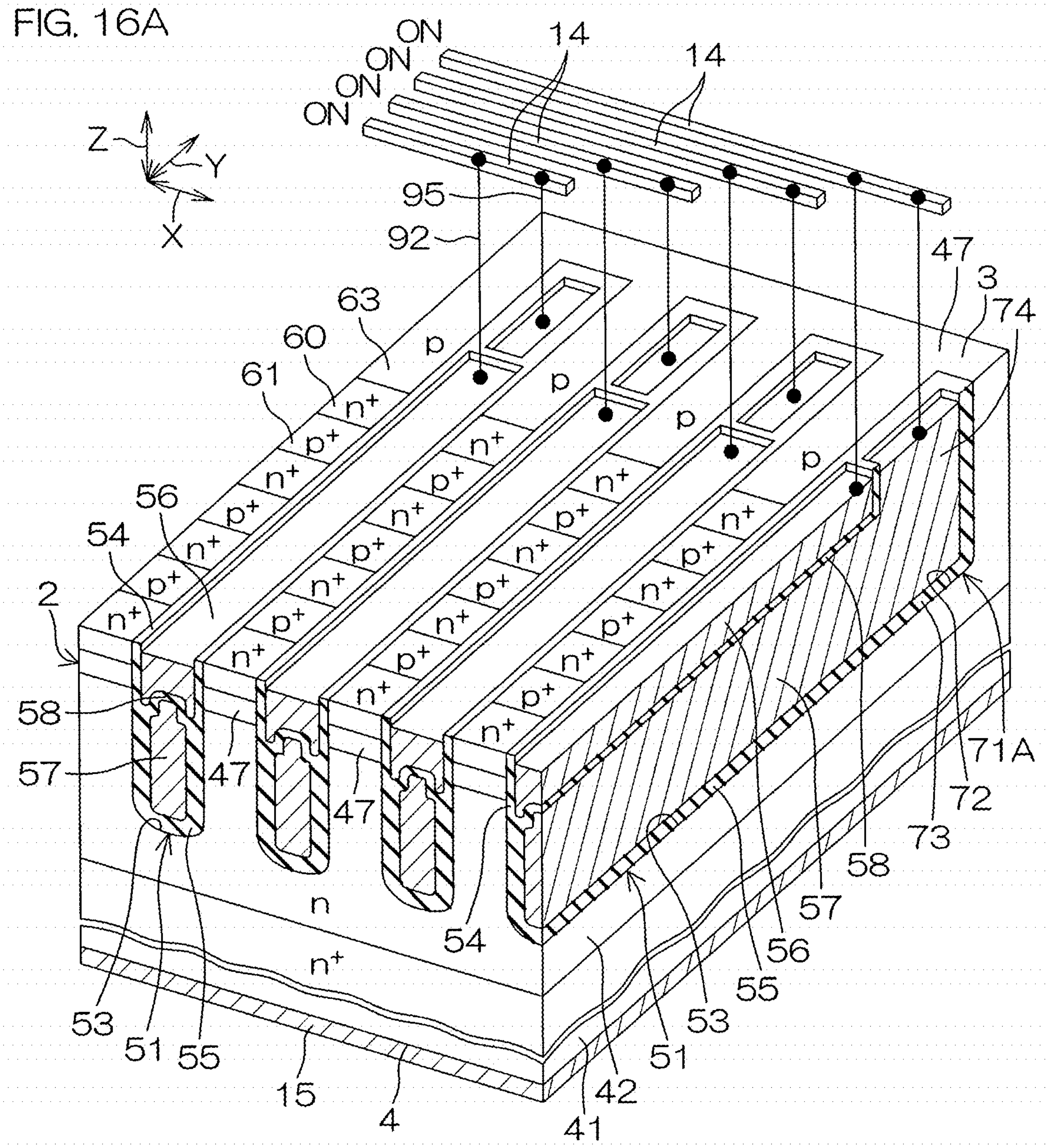
FIG. 16A is a cross-sectional perspective view of a control example of the power transistor.
Figure 16B:
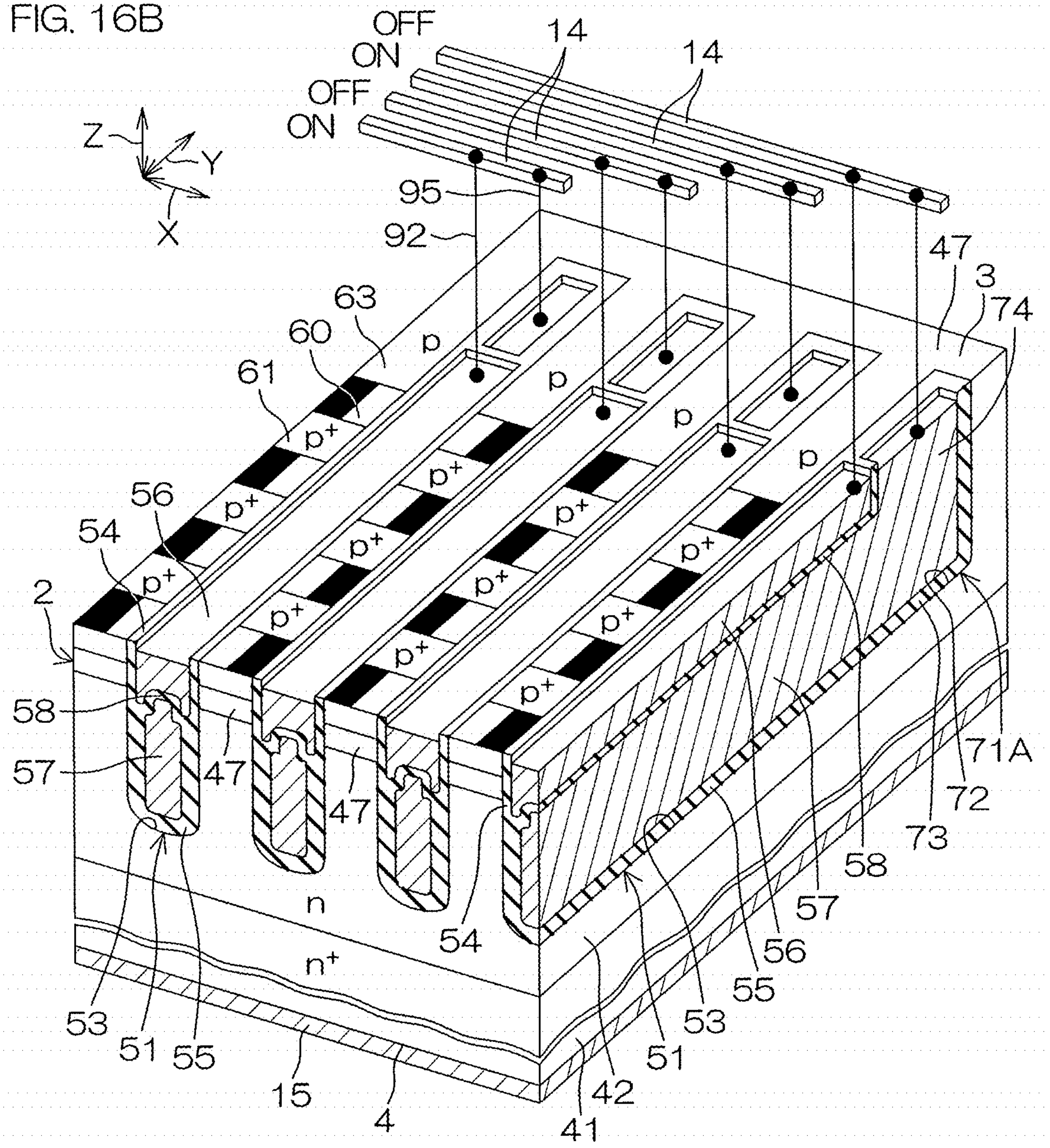
FIG. 16B is a cross-sectional perspective view of a control example of the power transistor.
Figure 16C:
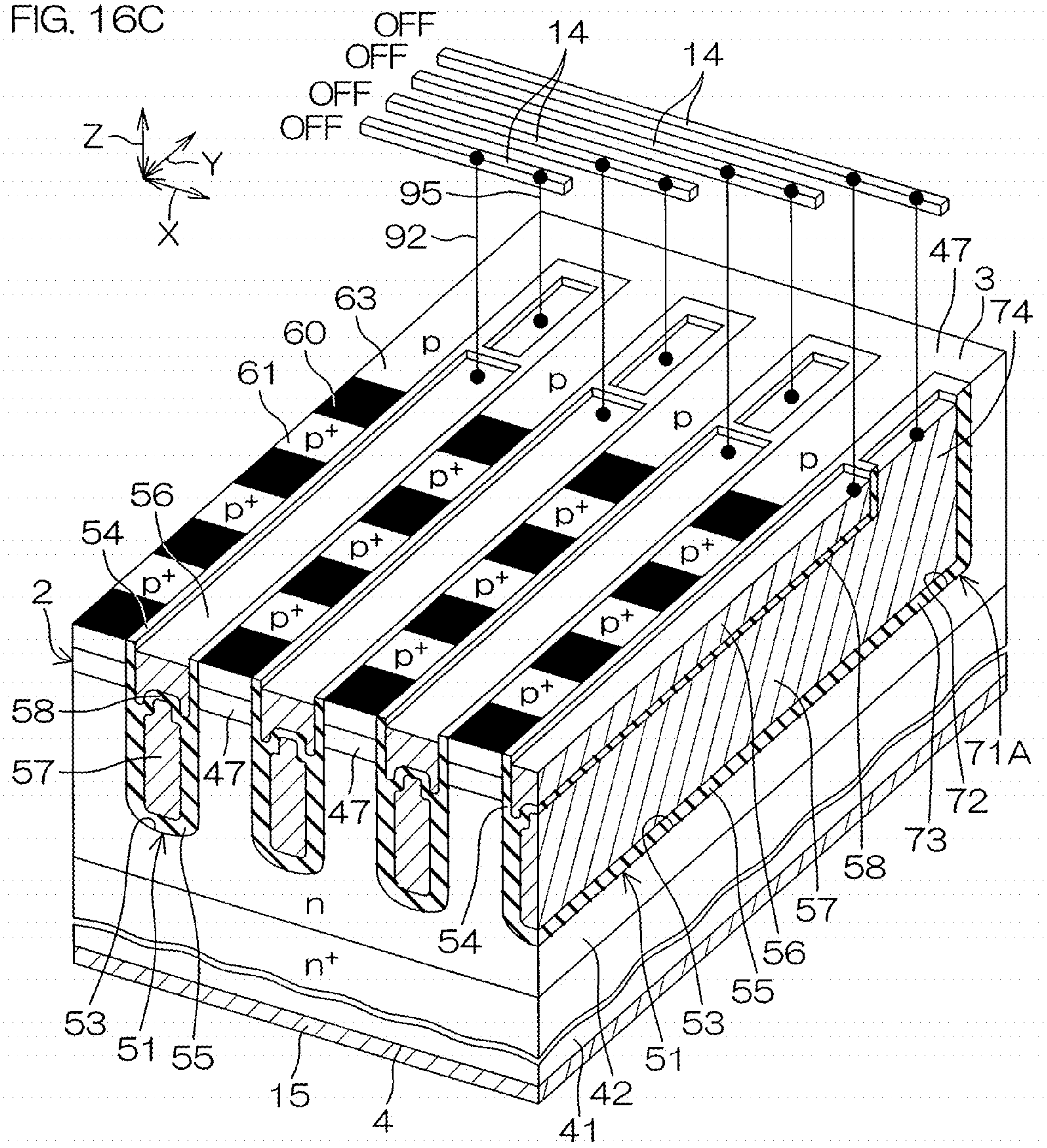
FIG. 16C is a cross-sectional perspective view of a control example of the power transistor.

FIG. 16A to FIG. 16C are each a cross-sectional perspective view of a control example of the power transistor 8. In FIG. 16A to FIG. 16C, a channel (source region 60) in an off state is indicated by a filled-in hatching.

With reference to FIG. 16A, where the gate signals G greater than the gate threshold voltage (that is, on signal) are input to all the n-number of the gate wirings 14, all the unit transistors 10 (the n-number of the system transistors 9) are controlled so that they are turned into on states at the same time. Thereby, the power transistor 8 is driven at the total channel ratio RT (that is, the n-number of system channel ratios RS). Therefore, the power transistor 8 is relatively increased in channel utilization rate and relatively decreased in on-resistance Ron. The total channel ratio RT determines the minimum value of the on-resistance Ron.

With reference to FIG. 16B, where the gate signal G greater than the gate threshold voltage (that is, on signal) are input to the x number ($1 \leq x < n$) of the gate wirings 14 and the gate signals G less than the gate threshold voltage (that is, off signal) are input to the ($n-x$) number of the gate wirings 14, the x number of the system transistors 9 are turned into on states and the ($n-x$) number of the system transistors 9 are turned into off states. In this case, the power transistor 8 is driven at the x number of the system channel ratios RS (that is, less than the total channel ratio RT). Therefore, the power transistor 8 is relatively decreased in channel utilization rate and relatively increased in on-resistance Ron.

With reference to FIG. 16C, where the gate signals G less than the gate threshold voltage (that is, off signal) is input to all the n-number of the gate wirings 14, all the unit transistors (the n-number of the system transistors 9) are turned into off states at the same time. The power transistor 8 is, therefore, stopped.

The power transistor 8 is electrically connected, for example, to the inductive load L. In this case, when the gate signals G greater than the gate threshold voltage are input to the power transistor 8, the power transistor 8 proceeds to a normal operation from a stop state after going through an on-transition operation.

On the other hand, where the gate signals G less than the gate threshold voltage are input to the power transistor 8 during a normal operation, the power transistor 8 proceeds to an active clamp operation from the normal operation after going through an off-transition operation. The active clamp operation means an operation in which a counter electromotive force resulting from an inductive energy of the inductive load L is consumed (absorbed) by the power transistor 8. The power transistor 8 proceeds to the stop state after the active clamp operation.

The power transistor 8 is constituted of at least two systems (that is, $n \geq 2$) and may include at least two system transistors 9. At least the two system transistors 9 each include one or the plurality of unit transistors 10. At least the two system transistors 9 are each electrically connected to at least two gate wirings 14 and individually controlled by at least two gate signals G. Therefore, with two or more systems of the power transistor 8, it is possible to realize at least two operation modes each of which is made up of a different on-resistance Ron.

The two-system power transistor 8 including the first and the second system transistors 9 is controlled by a first operation mode, a second operation mode and a third operation mode. In the first operation mode, the first and the second system transistors 9 are controlled in on states at the same time. In the second operation mode, one of the first and the second system transistors 9 is controlled in an on state and the other of them is controlled in an off state. In the third operation mode, the first and the second system transistors 9 are controlled in off states at the same time.

That is, the power transistor 8 is driven at a total channel ratio RT (for example, 50%) in the first operation mode. Also, the power transistor 8 is driven at the system channel ratio RS (for example, 25%, that is less than the total channel ratio RT) of any one of the first and the second system transistors 9 in the second operation mode. Also, the power transistor 8 is turned into the stop state in the third operation mode.

The power transistor 8 may be driven in the first operation mode during an on-transition operation, during a normal operation and during an off-transition operation. In this case, a current is allowed to flow by using the first and the second system transistors 9. That is, the power transistor 8 is driven at the total channel ratio RT (=50%) during the on-transition operation, during the normal operation, and during the off-transition operation.

On the other hand, the power transistor 8 may be driven in the second operation mode during the active clamp operation. In this case, a current is allowed to flow by using only one of the first and the second system transistors 9. That is, the power transistor 8 is driven at the channel ratio (=25%) of less than the total channel ratio RT (=50%) during the active clamp operation.

That is, during the active clamp operation, the power transistor 8 is driven at the on-resistance Ron greater than the on-resistance Ron during the normal operation. It is, thereby, possible to consume (absorb) the counter electromotive force, with an abrupt rise in temperature being suppressed. As a result, it is possible to improve an active clamp tolerance. When the counter electromotive force resulting from an inductive load L is completely consumed, the power transistor 8 is turned into the third operation mode (=stop state).

The power transistor 8 is preferably constituted of at least three systems (that is, $n \geq 3$) to include at least three system transistors 9. At least the three system transistors 9 each include one or the plurality of unit transistors 10. At least three system transistors 9 are each electrically connected to at least three gate wirings 14 and individually controlled by at least three gate signals G. Therefore, with the power transistor 8 having three or more systems, it is possible to realize at least three operation modes each of which is constituted of a different on-resistance Ron.

The three-system power transistor 8 including the first to the third system transistors 9 is controlled in a first operation mode, a second operation mode, a third operation mode and a fourth operation mode. In the first operation mode, the first to the third system transistors 9 are controlled in on states at the same time. In the second operation mode, only any two of the first to the third system transistors 9 are controlled in on states. In the third operation mode, only any one of the first to the third system transistors 9 is controlled in on state.

In the fourth operation mode, the first to the third system transistors 9 are controlled in off states at the same time.

That is, the power transistor 8 is driven at the total channel ratio RT (for example, 75%) in the first operation mode. The power transistor 8 is also driven at a sum of any two of the system channel ratios RS (for example, 50%) of the first to the third system transistors 9 in the second operation mode. The power transistor 8 is also driven at any one of the system channel ratios RS (for example, 25%) of the first to the third system transistors 9 in the third operation mode. Also, the power transistor 8 is turned into a stop state in the fourth operation mode.

The power transistor 8 may be driven in the first operation mode during the on-transition operation. In this case, a current is allowed to flow by using the first to the third system transistors 9. That is, during the on-transition operation, the power transistor 8 is driven at the total channel ratio RT (=75%). It is, thereby, possible to decrease an on-resistance Ron. Therefore, it is possible to suppress an electric energy consumption even in such a situation that an excessive rush current can flow during the on-transition operation.

During the normal operation, the power transistor 8 may be driven in the second operation mode. In this case, a current is allowed to flow by using only any two of the first to the third system transistors 9. Thereby, during the normal operation, the power transistor 8 is driven at the channel ratio (=50%) that is less than the channel ratio (=75%) during the on-transition operation.

During the off-transition operation, the power transistor 8 may be driven in the first operation mode. In this case, a current is allowed to flow by using the first to the third system transistors 9. That is, during the off-transition operation, the power transistor 8 is driven at the total channel ratio RT (=75%) greater than the channel ratio (=50%) during the normal operation.

During the active clamp operation, the power transistor 8 may be driven in the third operation mode. In this case, a current is allowed to flow by using only any one of the first to the third system transistors 9. That is, during the active clamp operation, the power transistor 8 is driven at the channel ratio (=25%) which is less than the channel ratio (=50%) during the normal operation.

That is, during the active clamp operation, the power transistor 8 is driven at the on-resistance Ron greater than the on-resistance Ron during the normal operation. It is, thereby, possible to consume (absorb) the counter electromotive force, while the abrupt rise in temperature is suppressed. As a result, it is possible to improve the active clamp tolerance. When the counter electromotive force resulting from the inductive load L is completely consumed, the power transistor 8 is turned into the fourth operation mode (=stop state).

Figure 17:
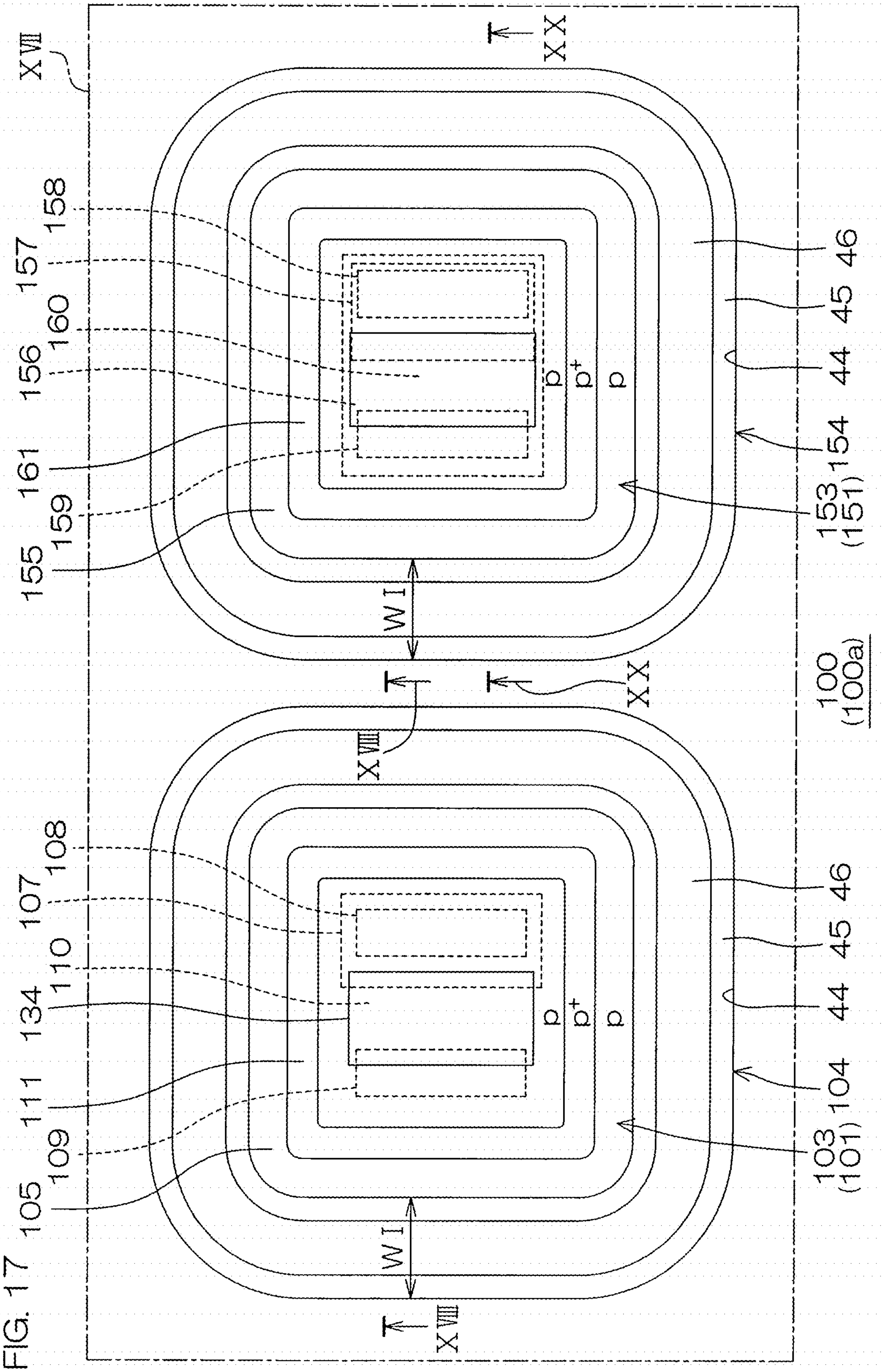
FIG. 17 is an enlarged view of a region XVII shown in FIG. 3.
Figure 18:
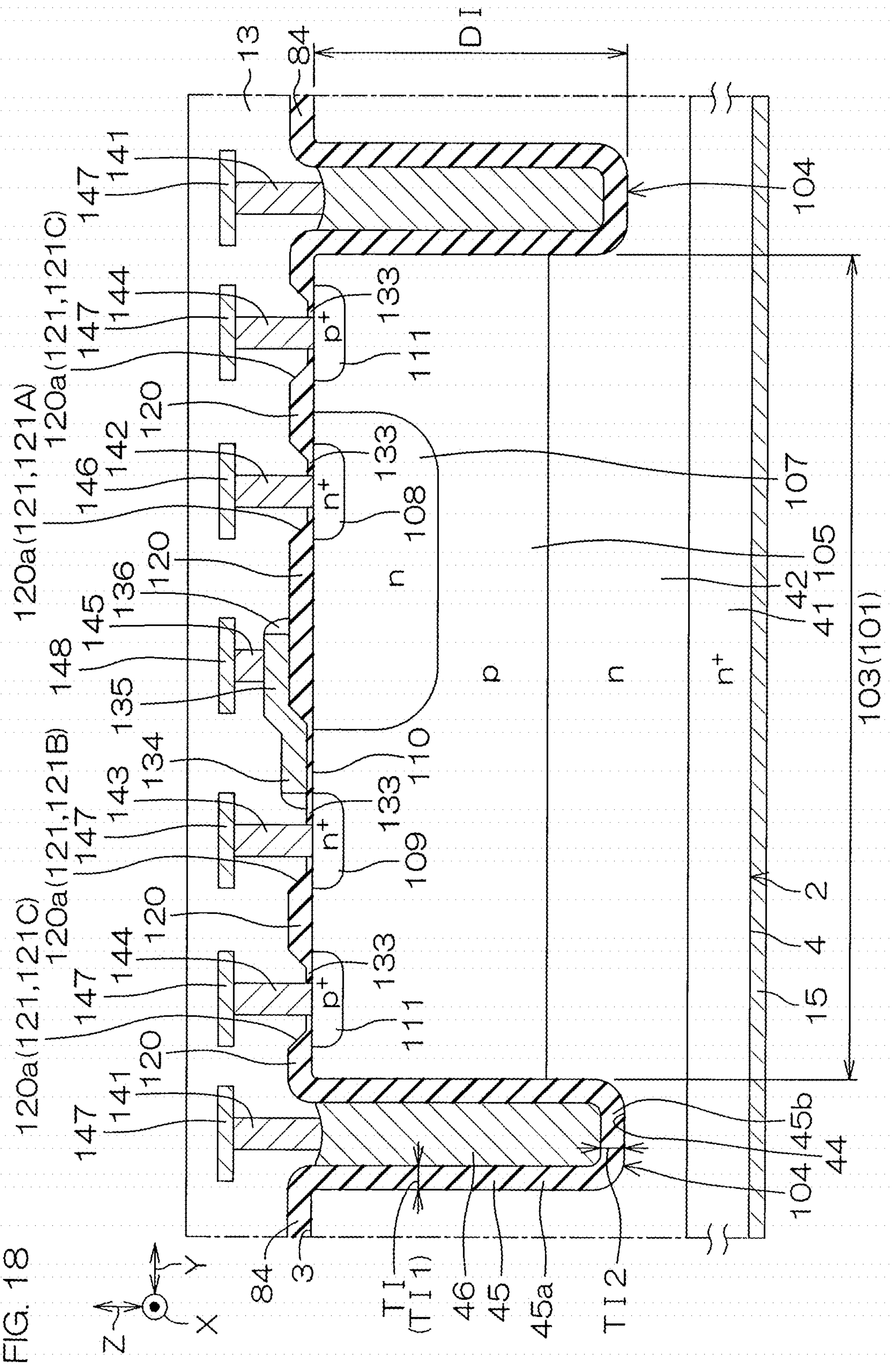
FIG. 18 is a cross-sectional view taken along line XVIII-XVIII shown in FIG. 17.
Figure 19:
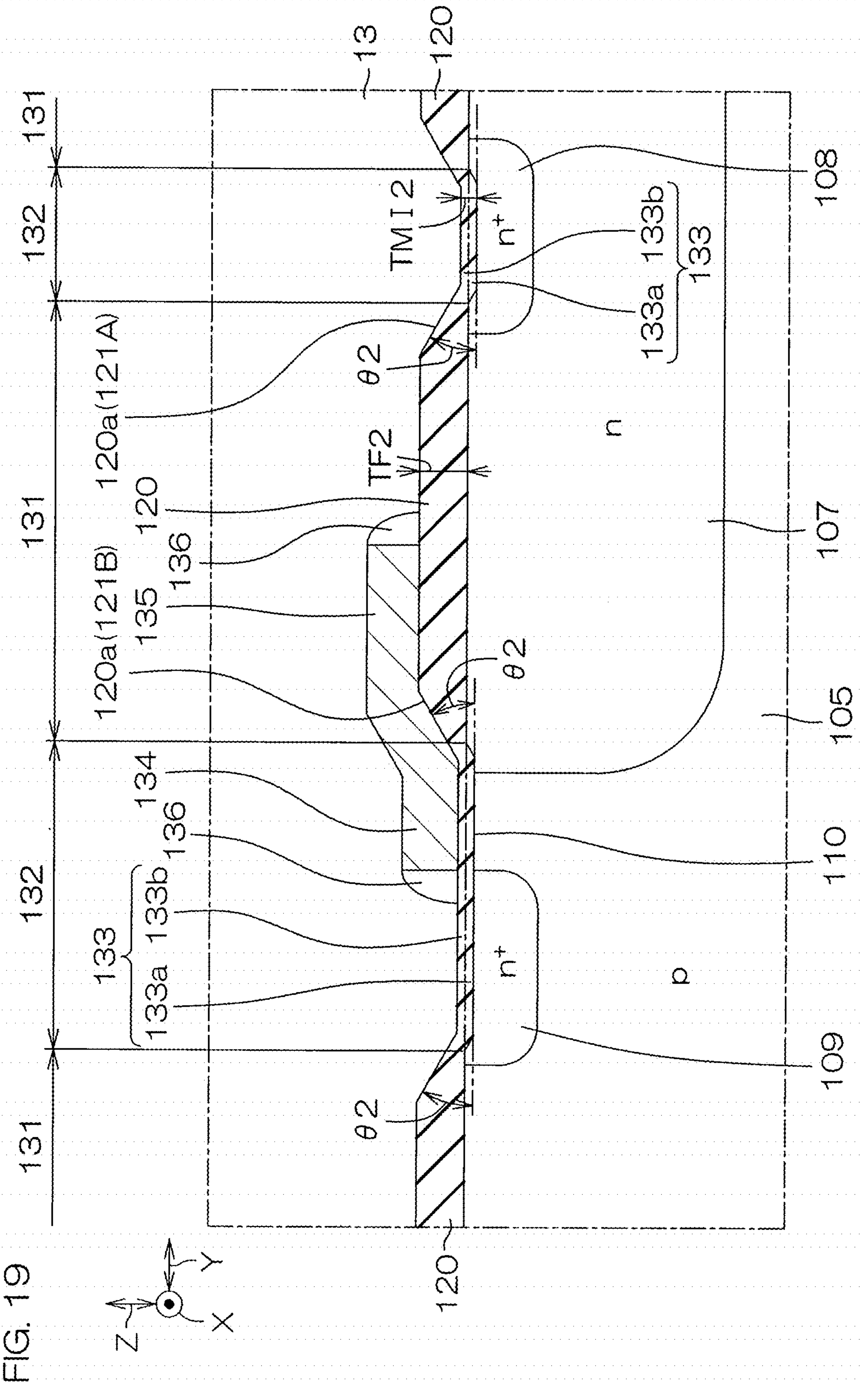
FIG. 19 is an enlarged cross-sectional view of main portions of a structure shown in FIG. 18.
Figure 20:
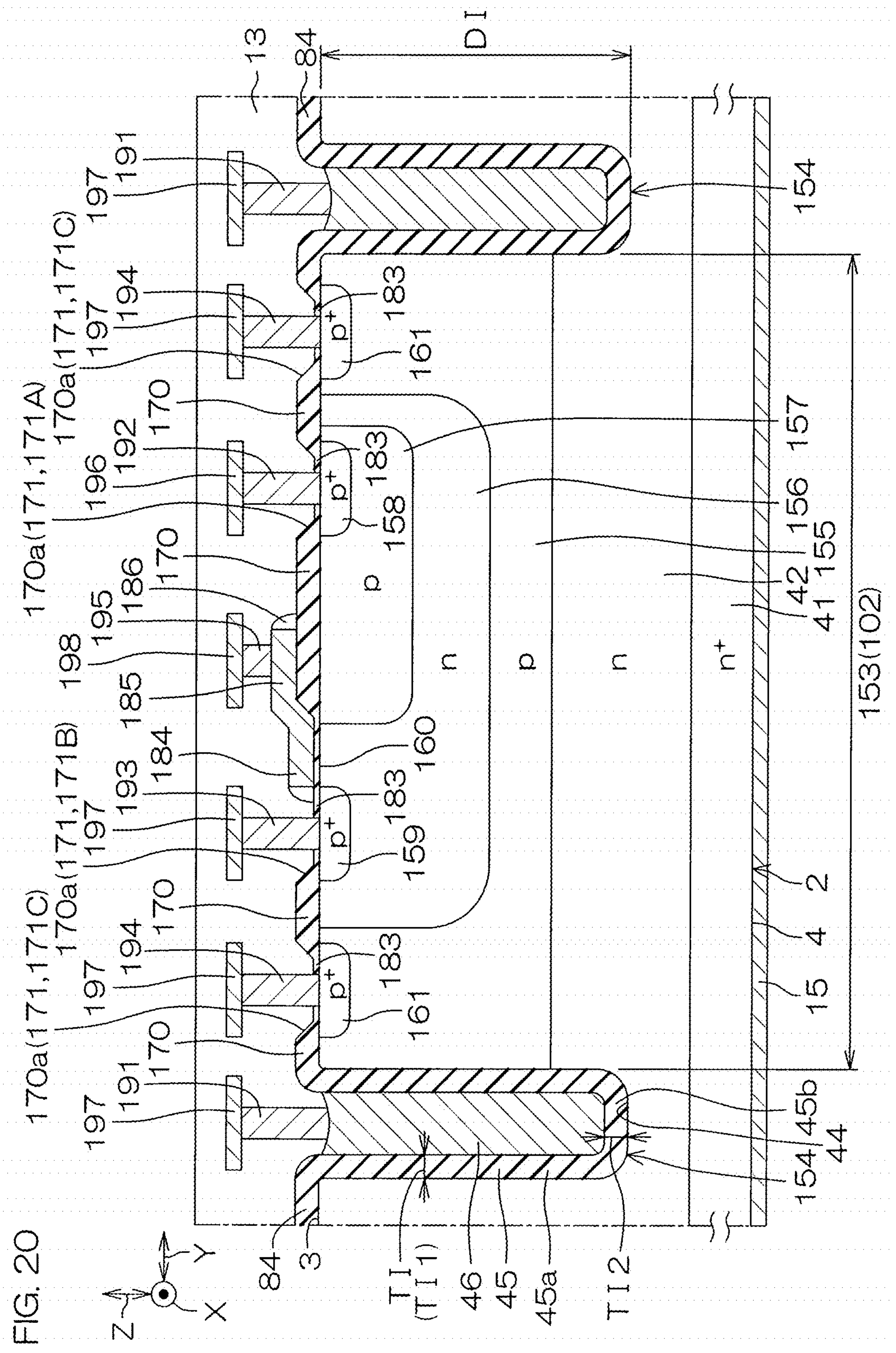
FIG. 20 is a cross-sectional view taken along line XX-XX shown in FIG. 17.
Figure 21:
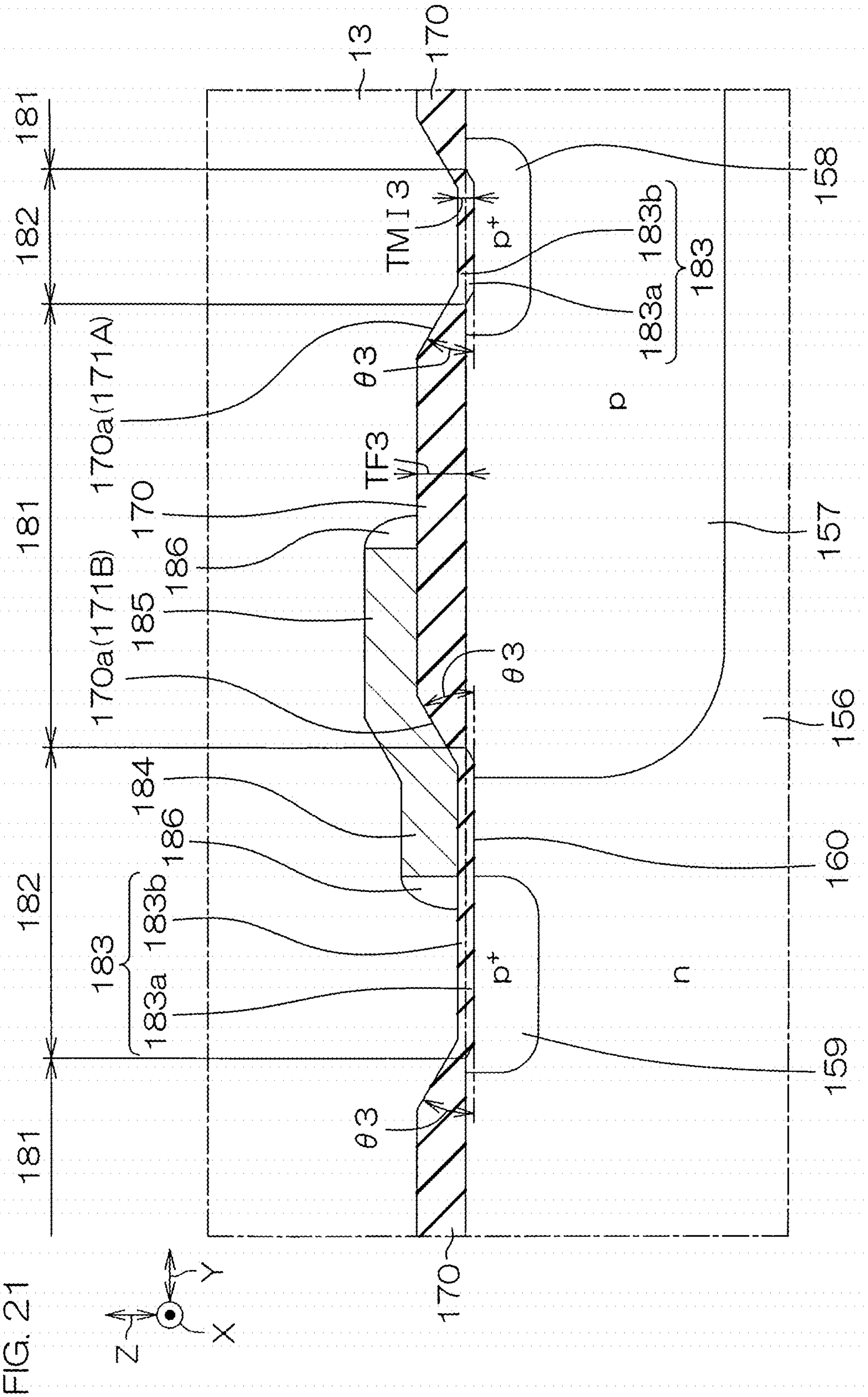
FIG. 21 is an enlarged cross-sectional view of main portions of a structure shown in FIG. 20.

FIG. 17 is an enlarged view of the region XVII shown in FIG. 3. FIG. 18 is a cross-sectional view taken along line XVIII-XVIII shown in FIG. 17. FIG. 19 is an enlarged cross-sectional view of main portions of the structure shown in FIG. 18. FIG. 20 is a cross-sectional view taken along line XX-XX shown in FIG. 17. FIG. 21 is an enlarged cross-sectional view of main portions of the structure shown in FIG. 20.

With reference to FIG. 17 to FIG. 21, the semiconductor device 1 includes a CMIS region 100 (Complementary Metal Insulator Semiconductor Region) that is demarcated in the first main surface 3 at the second device region 7. The CMIS region 100 is a region to which a voltage (potential) different from the first device region 6 is to be applied, and a region in which a CMIS **100*a* that constitutes one circuit of the control IC 11 is formed. That is, the control IC 11 includes the CMIS 100*a* that is formed in an arbitrary region in the first main surface 3 of the second device region 7**.

Specifically, the CMIS **100*a* includes an n-type first MISFET 101 and a p-type second MISFET 102 that are connected in a complementary manner. The first MISFET 101 is driven and controlled under voltage applying conditions different from those of the power transistor 8. The second MISFET 102 is driven and controlled under voltage applying conditions different from those of the power transistor 8 and the first MISFET 101. Hereinafter, a specific structure inside the CMIS region 100** will be described.

With reference to FIG. 17 to FIG. 19, the semiconductor device 1 includes a second trench separation structure 104 as an example of the region separation structure that demarcates a first MIS region 103 in the first main surface 3 of the CMIS region 100. The first MIS region 103 is a device region that is controlled under voltage applying conditions different from those of the first device region 6. The second trench separation structure 104 may be referred to as a DTI (deep trench isolation) structure or an STI (shallow trench isolation) structure.

The second trench separation structure 104 is formed in an annular shape that surrounds a part of the first main surface 3 in a plan view and demarcates the first MIS region 103 in a predetermined shape. In this embodiment, the second trench separation structure 104 is formed in a quadrilateral annular shape that has four sides parallel to peripheral edges (first to fourth side surfaces 5A to 5D) of the first main surface 3 in a plan view to demarcate the first MIS region 103 in a quadrilateral shape. A planar shape of the second trench separation structure 104 is arbitrary and may be formed in a polygonal annular shape. The first MIS region 103 may be demarcated in a polygonal shape in accordance with the planar shape of the second trench separation structure 104.

As with the first trench separation structure 43, the second trench separation structure 104 has a separation width WI and a separation depth DI (that is, aspect ratio DI/WI). A bottom wall of the second trench separation structure 104 is in particular preferably formed at an interval of not less than 1 μm and not more than 5 μm with respect to the bottom portion of the second semiconductor region 42.

The second trench separation structure 104 has a corner portion that connects in a circular arc shape a portion that extends in the first direction X and a portion that extends in the second direction Y. In this embodiment, four corners of the second trench separation structure 104 are formed in a circular arc shape. That is, the first MIS region 103 is demarcated in a quadrilateral shape that has four corners, each of which extends in a circular arc shape. The corner portion of the second trench separation structure 104 preferably has a certain separation width WI along a circular arc direction.

As with the first trench separation structure 43, the second trench separation structure 104 has a single electrode structure that includes a separation trench 44, a separation insulating film 45 (separating insulator) and a separation electrode 46. The "separation trench 44," the "separation insulating film 45" and the "separation electrode 46" of the second trench separation structure 104 may be respectively referred to as a "second separation trench," a "second separation insulating film" and a "second separation electrode." The descriptions of the separation trench 44, the separation insulating film 45 and the separation electrode 46 of the second trench separation structure 104 are omitted here, since the descriptions of the separation trench 44, the separation insulating film 45 and the separation electrode 46 of the first trench separation structure 43 are applied to those of the second trench separation structure 104.

The semiconductor device 1 includes a p-type first well region 105 that is formed in the surface layer portion of the first main surface 3 at the first MIS region 103. The first well region 105 is formed in an entire area of the surface layer portion of the first main surface 3 in the first MIS region 103 and in contact with the second trench separation structure 104. The first well region 105 is formed in a region on the first main surface 3 side with respect to the bottom wall of the second trench separation structure 104. A bottom portion of the first well region 105 is formed in a region on the bottom wall side of the second trench separation structure 104 with respect to an intermediate portion of the second trench separation structure 104. That is, the bottom portion of the first well region 105 is formed in a region on the bottom wall side of the second trench separation structure 104 with respect to a depth position of the bottom portion of the body region 47.

The semiconductor device 1 includes an n-type first drift region 107 that is formed in a surface layer portion of the first well region 105. The first drift region 107 is formed in the surface layer portion of the first well region 105 at an interval from the second trench separation structure 104. The first drift region 107 may be formed as a band that extends in one direction (first direction X) in a plan view. The first drift region 107 is formed at an interval on the first main surface 3 side from the bottom portion of the first well region 105. The first drift region 107 opposes the second semiconductor region 42 across a part of the first well region 105.

The semiconductor device 1 includes an n-type first drain region 108 that is formed in a surface layer portion of the first drift region 107. The first drain region 108 has an n-type impurity concentration higher than an n-type impurity concentration of the first drift region 107. The first drain region 108 is formed in the surface layer portion of the first drift region 107 at an interval from the peripheral edge of the first drift region 107. The first drain region 108 may be formed as a band that extends in one direction (first direction X) in a plan view. The first drain region 108 is formed at an interval on the first main surface 3 side from a bottom portion of the first drift region 107. The first drain region 108 opposes the first well region 105 across a part of the first drift region 107.

The semiconductor device 1 includes an n-type first source region 109 that is formed in the surface layer portion of the first well region 105 at an interval from the first drift region 107. The first source region 109 has an n-type impurity concentration that is substantially equal to the n-type impurity concentration of the first drain region 108. The first source region 109 is formed at an interval from the second trench separation structure 104. The first source region 109 may be formed as a band that extends in one direction (first direction X) in a plan view. The first source region 109 is formed at an interval on the first main surface 3 side from a depth position of the bottom portion of the first drift region 107.

The semiconductor device 1 includes a first channel region 110 that is formed in the surface layer portion of the first well region 105 in a region between the first drift region 107 and the first source region 109. A channel of the first MISFET 101 is formed by the first channel region 110.

The semiconductor device 1 includes a p-type first contact region 111 that is formed in the surface layer portion of the first well region 105. The first contact region 111 has a p-type impurity concentration higher than the p-type impurity concentration of the first well region 105. The first contact region 111 is formed at an interval from the second trench separation structure 104. The first contact region 111 is formed as a band that extends along the second trench separation structure 104 in a plan view. The first contact region 111 is preferably formed in an annular shape that surrounds the first drift region 107 and the first source region 109. The first contact region 111 may be in contact with the second trench separation structure 104.

The semiconductor device 1 includes a second field insulating film 120 that partially covers the first main surface 3 in the first MIS region 103. In this embodiment, the second field insulating film 120 includes a silicon oxide film. Specifically, the second field insulating film 120 includes a silicon oxide film that is made up of an oxide of the semiconductor chip 2.

The second field insulating film 120 covers the first drift region 107. The second field insulating film 120 covers a region between the first drain region 108 and the first contact region 111. The second field insulating film 120 covers a region between the first source region 109 and the first contact region 111. The second field insulating film 120 covers a region between the second trench separation structure 104 and the first contact region 111. The second field insulating film 120 continues to the separation insulating film 45 that is exposed from an inner peripheral wall of the second trench separation structure 104 at a peripheral edge portion of the first MIS region 103.

The second field insulating film 120 includes a plurality of first openings 121, each of which exposes the first main surface 3. The plurality of first openings 121 include at least one first drain opening 121A, at least one first channel opening 121B, and at least one first contact opening 121C.

The first drain opening 121A exposes the first drain region 108. The number of the first drain openings 121A is arbitrary. One first drain opening 121A may be formed or a plurality of first drain openings 121A may be formed. The first channel opening 121B exposes the first source region 109 and the first channel region 110. The first channel opening 121B may expose the first drift region 107. The number of the first channel openings 121B is arbitrary. One first channel opening 121B may be formed or the plurality of first channel openings 121B may be formed.

The first contact opening 121C exposes the first contact region 111. The number of the first contact openings 121C is arbitrary. One first contact opening 121C may be formed or the plurality of first contact openings 121C may be formed. In this case, the plurality of first contact openings 121C are preferably formed at an interval along the first contact region 111.

The plurality of first openings 121 may be each formed in a quadrilateral shape in a plan view. That is, the plurality of first openings 121 may each have a side extending in one direction (first direction X) and a side extending in an intersecting direction that intersects the one direction (second direction Y) in a plan view.

The second field insulating film 120 has a plurality of second insulating side walls **120*a*, each of which demarcates the plurality of first openings 121. The plurality of second insulating side walls 120*a* are individually formed over an entire circumference of an inner wall of the plurality of first openings 121. That is, the plurality of second insulating side walls 120*a* are each formed at a side extending in one direction (first direction X) and at a side extending in an intersecting direction that intersects the one direction (second direction Y) at the plurality of first openings 121. Each of the second insulating side walls 120***a* is inclined obliquely downward so as to make an acute angle with the first main surface 3. Specifically, each second insulating side wall 120*a* has an upper end portion positioned on the main surface side of the second field insulating film 120 and a lower end portion positioned on the first main surface 3 side and is inclined obliquely downward from the upper end portion to the lower end portion thereof.

Each of the second insulating side walls 120*a* makes with the first main surface 3 a second inclined angle θ2 that is not less than 20° and not more than 40° (20°≤θ2≤40°). Where there is drawn a straight line that connects the upper end portion and the lower end portion of each second insulating side wall 120*a* in a cross-sectional view, the second inclined angle θ2 is an angle (absolute value) of the straight line that is made with the first main surface 3 inside the second field insulating film 120.

The second inclined angle θ2 is preferably less than 40° (θ2<40°). It is particularly preferable that the second inclined angle θ2 falls within a range of 30°±6° (24°≤θ2≤36°). The second inclined angle θ2 falls typically within a range of not less than 28° and not more than 36° (28°≤θ2≤36°. It is preferable that the second inclined angle θ2 is substantially equal to the first inclined angle θ1 of the first field insulating film 80 (θ1≈θ2).

Each second insulating side wall 120*a* may be depressed to the first main surface 3 in a region between the upper end portion and the lower end portion and inclined in a curved shape. In this case as well, where there is drawn a straight line that connects the upper end portion and the lower end portion of each second insulating side wall 120*a* in a cross-sectional view, the second inclined angle θ2 is an angle (absolute value) of the straight line that is made with the first main surface 3.

The second field insulating film 120 has a second field thickness TF2. The second field thickness TF2 is a thickness of a portion of the second field insulating film 120 along the normal direction Z excluding a portion that forms the second insulating side wall 120*a*. The second field thickness TF2 may be substantially equal to the first separation thickness TI1 of the separation insulating film 45 (TF2≈TI1). The second field thickness TF2 is preferably greater than the second separation thickness TI2 of the separation insulating film 45 (TI2<TF2).

The second field thickness TF2 is preferably not less than the first thickness T1 of the upper insulating film 54 (T1≤TF2). The second field thickness TF2 is in particular preferably greater than the first thickness T1 (T1<TF2). The second field thickness TF2 may be substantially equal to the first lower thickness T21 (=second thickness T2) of the lower insulating film 55 (TF2≈T21). The second field thickness TF2 is preferably greater than the second lower thickness T22 of the lower insulating film 55 (T22<TF2).

The second field thickness TF2 is preferably greater than the intermediate thickness TM (TM<TF2). The second field thickness TF2 may be substantially equal to the first contact thickness T31 (=third thickness T3) of the contact insulating film 73 (TF2≈T31). The second field thickness TF2 is preferably greater than the second contact thickness T32 of the contact insulating film 73 (T32<TF2). It is preferable that the second field thickness TF2 is substantially equal to the first field thickness TF1 of the first field insulating film 80 (TF1≈TF2).

The second field thickness TF2 may be not less than 0.1 μm and not more than 1 μm. The second field thickness TF2 may be not less than 0.1 μm and not more than 0.25 μm, not less than 0.25 μm and not more than 0.5 μm, not less than 0.5 μm and not more than 0.75 μm, or not less than 0.75 μm and not more than 1 μm. The second field thickness TF2 is preferably not less than 0.15 μm and not more than 0.65 μm.

The semiconductor device 1 includes a second hidden surface 131 and a second exposed surface 132 that are formed in the first MIS region 103 on the first main surface 3. The second hidden surface 131 is formed at a portion of the first main surface 3 that is covered by the second field insulating film 120. The second exposed surface 132 is formed at a portion of the first main surface 3 that is exposed from the second field insulating film 120. In other words, the first main surface 3 includes the second hidden surface 131 and the second exposed surface 132 that are demarcated in the first MIS region 103 by the second field insulating film 120.

In this embodiment, the second exposed surface 132 is depressed to the second hidden surface 131 in the thickness direction of the semiconductor chip 2 (on the second main surface 4 side). Specifically, the second exposed surface 132 is depressed one step to the second hidden surface 131 in the thickness direction of the semiconductor chip 2, with each second insulating side wall 120*a* of the second field insulating film 120 given as a starting point.

The second exposed surface 132 is formed at a depth position between a bottom portion of the first source region 109 (bottom portion of first drain region 108 and bottom portion of first contact region 111) and the second hidden surface 131 in the normal direction Z. The second exposed surface 132 is preferably depressed to the second hidden surface 131 in a range of more than 0 μm and not more than 0.5 μm (preferably, not more than 0.2 μm) in the normal direction Z.

The semiconductor device 1 includes a second main surface insulating film 133 that selectively covers the first main surface 3 in the first MIS region 103. In this embodiment, the second main surface insulating film 133 includes a silicon oxide film. Specifically, the second main surface insulating film 133 includes a silicon oxide film that is made up of an oxide of the semiconductor chip 2. The second main surface insulating film 133 covers a portion of the first main surface 3 that is exposed from the plurality of first openings 121. That is, the second main surface insulating film 133 covers at least the first drain region 108, the first source region 109, the first channel region 110, and the first contact region 111.

The second main surface insulating film 133 covers the second exposed surface 132 and continues to each second insulating side wall 120*a* of the second field insulating film 120. The second main surface insulating film 133 is formed at an interval on the semiconductor chip 2 side (second exposed surface 132 side) from an intermediate portion of the second field insulating film 120 in the thickness direction. Specifically, where there is drawn a line that passes through an intermediate portion of the thickness direction of the second field insulating film 120 along the second exposed surface 132 (first main surface 3) in a cross-sectional view, the second main surface insulating film 133 is formed at an interval on the semiconductor chip 2 side from the line.

The second main surface insulating film 133 includes a first region 133*a* and a second region 133*b*. The first region 133*a* is positioned on the semiconductor chip 2 side with respect to the second hidden surface 131. The second region 133*b* is positioned on a side opposite to the semiconductor chip 2 with respect to the second hidden surface 131 (on the main surface side of the second field insulating film 120). Specifically, where there is drawn an extension line that extends in parallel to the second hidden surface 131 from on the second hidden surface 131 in a cross-sectional view, the first region 133*a* is positioned on the semiconductor chip 2 side with respect to the extension line. The second region 133*b* is positioned on a side opposite to the first region 133*a* (that is, on a side opposite to the semiconductor chip 2) across the extension line.

The second main surface insulating film 133 has a second insulation thickness TMI2 that is less than the second field thickness TF2 of the second field insulating film 120 (TMI2<TF2). The second insulation thickness TMI2 is preferably not more than one-fifth of the second field thickness TF2 (TMI2≤⅕×TF2). The second insulation thickness TMI2 may be substantially equal to the first insulation thickness TMI1 of the first main surface insulating film 83 (TMI2≈TMI1).

The semiconductor device 1 includes the aforementioned outer field insulating film 84 that covers a region outside the first MIS region 103. The outer field insulating film 84 covers a periphery of the second trench separation structure 104 in a region outside the first MIS region 103. The outer field insulating film 84 surrounds the second trench separation structure 104 in a region outside the first MIS region 103 in a plan view and continues to the separation insulating film 45 that is exposed from an outer peripheral wall of the second trench separation structure 104.

The semiconductor device 1 includes a first gate electrode 134 (main surface electrode) that opposes the first channel region 110 across the second main surface insulating film 133 inside the first channel opening 121B. In this embodiment, the first gate electrode 134 includes conductive polysilicon. A gate potential is to be applied to the first gate electrode 134. On/off control of the first channel region 110 is performed by the first gate electrode 134. Specifically, the first gate electrode 134 opposes the first drift region 107, the first source region 109, and the first channel region 110 in a plan view.

The first gate electrode 134 is formed as a band that extends along the first channel region 110 in a plan view. The first gate electrode 134 has a first lead-out portion 135 that is led out onto the second field insulating film 120 which passes through the second insulating side wall 120*a* from on the second main surface insulating film 133 and is positioned on the first drain region 108 side. The first lead-out portion 135 is formed at an interval on the first source region 109 side from the first drain region 108 to oppose the first drift region 107 across the second field insulating film 120.

The first gate electrode 134 has a side wall having an inclined angle that is steeper than that of the second insulating side wall 120*a* of the second field insulating film 120. Where there is drawn a straight line that connects the upper end portion and the lower end portion of the side wall of the first gate electrode 134, the inclined angle of the side wall of the first gate electrode 134 is an angle (absolute value) of the straight line that is made with the first main surface 3 inside the first gate electrode 134. The inclined angle of the side wall of the first gate electrode 134 may be not less than 45° and not more than 90°. The inclined angle of the side wall of the first gate electrode 134 is preferably not less than 60° and not more than 90°.

The semiconductor device 1 includes a first side wall structure 136 that covers the side wall of the first gate electrode 134. The first side wall structure 136 is positioned on the second field insulating film 120 and the second main surface insulating film 133. The first side wall structure 136 includes at least one of silicon oxide and silicon nitride. In this embodiment, the first side wall structure 136 includes silicon oxide. The first side wall structure 136 may include silicon nitride. That is, the first side wall structure 136 may include an insulator that is different from the second field insulating film 120 and the second main surface insulating film 133.

The semiconductor device 1 includes the aforementioned interlayer insulating layer 13 that covers the first main surface 3 in the first MIS region 103. The semiconductor device 1 includes a plurality of plug electrodes 141 to 145 that are embedded in the interlayer insulating layer 13. The plurality of plug electrodes 141 to 145 may be each constituted of a tungsten plug electrode having a laminated structure that includes a titanium-based metal film and a tungsten film. The plurality of plug electrodes 141 to 145 include at least one sixth plug electrode 141, at least one seventh plug electrode 142, at least one eighth plug electrode 143, at least one ninth plug electrode 144, and at least one tenth plug electrode 145.

The sixth plug electrode 141 is constituted of a source plug electrode for the separation electrode 46. The sixth plug electrode 141 is embedded in a portion of the interlayer insulating layer 13 that covers the second trench separation structure 104 and electrically connected to the separation electrode 46. The seventh plug electrode 142 is constituted of a drain plug electrode for the first drain region 108.

The seventh plug electrode 142 is embedded in a portion of the interlayer insulating layer 13 that covers the first drain region 108 and electrically connected to the first drain region 108. The eighth plug electrode 143 is constituted of a source plug electrode for the first source region 109. The eighth plug electrode 143 is embedded in a portion of the interlayer insulating layer 13 that covers the first source region 109 and electrically connected to the first source region 109.

The ninth plug electrode 144 is constituted of a source plug electrode for the first contact region 111. The ninth plug electrode 144 is embedded in a portion of the interlayer insulating layer 13 that covers the first contact region 111 and electrically connected to the first contact region 111. The tenth plug electrode 145 is constituted of a gate plug electrode for the first gate electrode 134. The tenth plug electrode 145 is embedded in a portion of the interlayer insulating layer 13 that covers the first gate electrode 134 and electrically connected to the first gate electrode 134. The tenth plug electrode 145 may be connected to the first lead-out portion 135 of the first gate electrode 134.

The semiconductor device 1 includes one or a plurality of first drain wirings 146 that are formed inside the interlayer insulating layer 13. One or the plurality of first drain wirings 146 are constituted of a wiring layer that is formed inside the interlayer insulating layer 13. One or the plurality of first drain wirings 146 may be selectively routed inside the interlayer insulating layer 13 and electrically connected to the first drain region 108 via the seventh plug electrode 142.

The semiconductor device 1 includes one or a plurality of first source wirings 147 that are formed inside the interlayer insulating layer 13. One or the plurality of first source wirings 147 are constituted of a wiring layer that is formed inside the interlayer insulating layer 13. One or the plurality of first source wirings 147 are selectively routed inside the interlayer insulating layer 13 and electrically connected to the separation electrode 46, the first source region 109, and the first contact region 111 via the sixth plug electrode 141, the eighth plug electrode 143, and the ninth plug electrode 144.

The semiconductor device 1 includes one or a plurality of first gate wirings 148 that are formed inside the interlayer insulating layer 13. One or the plurality of first gate wirings 148 are constituted of a wiring layer that is formed inside the interlayer insulating layer 13. One or the plurality of first gate wirings 148 are selectively routed inside the interlayer insulating layer 13 and electrically connected to the first gate electrode 134 via the tenth plug electrode 145.

With reference to FIG. 17, FIG. 20 and FIG. 21, the semiconductor device 1 includes a third trench separation structure 154 as an example of a region separation structure that demarcates a second MIS region 153 in the first main surface 3 of the CMIS region 100. The second MIS region 153 is a device region that is controlled under voltage applying conditions different from those of the first device region 6 and the first MIS region 103. The third trench separation structure 154 may be referred to as a DTI (Deep Trench Isolation) structure or an STI (Shallow Trench Isolation) structure.

The third trench separation structure 154 is formed in an annular shape that surrounds a part of the first main surface 3 at an interval from the second trench separation structure 104 in a plan view and demarcates the second MIS region 153 in a predetermined shape. The third trench separation structure 154 may be formed integrally with the second trench separation structure 104 in a region between the first MIS region 103 and the second MIS region 153.

In this embodiment, the third trench separation structure 154 is formed in a quadrilateral annular shape having four sides parallel to peripheral edges (first to fourth side surfaces 5A to 5D) of the first main surface 3 in a plan view to demarcate the second MIS region 153 in a quadrilateral shape. A planar shape of the third trench separation structure 154 is arbitrary and may be formed in a polygonal annular shape. The second MIS region 153 may be demarcated in a polygonal shape according to the planar shape of the third trench separation structure 154.

As with the first trench separation structure 43, the third trench separation structure 154 has a separation width WI and a separation depth DI (that is, aspect ratio DI/WI). A bottom wall of the third trench separation structure 154 is in particular preferably formed at an interval of not less than 1 μm and not more than 5 μm with respect to the bottom portion of the second semiconductor region 42.

The third trench separation structure 154 has a corner portion that connects a portion extending in the first direction X and a portion extending in the second direction Y in a circular arc shape. In this embodiment, four corners of the third trench separation structure 154 are formed in a circular arc shape. That is, the second MIS region 153 is demarcated in a quadrilateral shape having the four corners, each of which extends in a circular arc shape. The corner portion of the third trench separation structure 154 preferably has a certain separation width WI along a circular arc direction.

As with the first trench separation structure 43, the third trench separation structure 154 has a single electrode structure that includes a separation trench 44, a separation insulating film 45 (separating insulator), and a separation electrode 46. The "separation trench 44," the "separation insulating film 45," and the "separation electrode 46" of the third trench separation structure 154 may be respectively referred to as a "third separation trench," a "third separation insulating film," and a "third separation electrode." The descriptions of the separation trench 44, the separation insulating film 45 and the separation electrode 46 of the third trench separation structure 154 are omitted here, since the descriptions of the separation trench 44, and therefore descriptions of the separation insulating film 45 and the separation electrode 46 of the first trench separation structure 43 are applied to those of the third trench separation structure 154.

The semiconductor device 1 includes a p-type second well region 155 that is formed in the surface layer portion of the first main surface 3 at the second MIS region 153. The second well region 155 is formed in an entire area of the surface layer portion of the first main surface 3 in the second MIS region 153 and in contact with the third trench separation structure 154. The second well region 155 is formed in a region on the first main surface 3 side with respect to the bottom wall of the third trench separation structure 154. A bottom portion of the second well region 155 is formed in a region of the third trench separation structure 154 on the bottom wall side with respect to an intermediate portion of the third trench separation structure 154. That is, the bottom portion of the second well region 155 is formed in a region of the third trench separation structure 154 on the bottom wall side with respect to a depth position of the bottom portion of the body region 47.

The semiconductor device 1 includes an n-type third well region 156 that is formed in a surface layer portion of the second well region 155 at an interval from the third trench separation structure 154. The third well region 156 may be formed in a quadrilateral shape having four sides that are parallel to the third trench separation structure 154 in a plan view. The third well region 156 is formed in a region on the first main surface 3 side with respect to the bottom portion of the second well region 155. The third well region 156 opposes the second semiconductor region 42 across a part of the second well region 155.

The semiconductor device 1 includes a p-type second drift region 157 that is formed in a surface layer portion of the third well region 156. The second drift region 157 is formed in the surface layer portion of the third well region 156 at an interval from a peripheral edge of the third well region 156. The second drift region 157 may be formed as a band that extends in one direction (first direction X) in a plan view. The second drift region 157 is formed at an interval on the first main surface 3 side from a bottom portion of the third well region 156. The second drift region 157 opposes the second well region 155 across a part of the third well region 156.

The semiconductor device 1 includes a p-type second drain region 158 that is formed in a surface layer portion of the second drift region 157. The second drain region 158 has a p-type impurity concentration higher than a p-type impurity concentration of the second drift region 157. The second drain region 158 is formed in the surface layer portion of the second drift region 157 at an interval from a peripheral edge of the second drift region 157. The second drain region 158 may be formed as a band that extends in one direction (first direction X) in a plan view. The second drain region 158 is formed at an interval on the first main surface 3 side from a bottom portion of the second drift region 157. The second drain region 158 opposes the second well region 155 across a part of the second drift region 157.

The semiconductor device 1 includes a p-type second source region 159 that is formed in the surface layer portion of the third well region 156 at an interval from the second drift region 157. The second source region 159 has a p-type impurity concentration that is obtained by subtracting the p-type impurity concentration of the second drift region 157 from the p-type impurity concentration of the second drain region 158. The second source region 159 is formed at an interval from the third trench separation structure 154. The second source region 159 may be formed as a band that extends in one direction (first direction X) in a plan view. The second source region 159 is formed at an interval on the first main surface 3 side from a depth position of the bottom portion of the second drift region 157.

The semiconductor device 1 includes a second channel region 160 that is formed at a region between the second drift region 157 and the second source region 159 in the surface layer portion of the second well region 155. A channel of the second MISFET 102 is formed by the second channel region 160.

The semiconductor device 1 includes a p-type second contact region 161 that is formed in the surface layer portion of the second well region 155. The second contact region 161 has a p-type impurity concentration higher than the p-type impurity concentration of the second well region 155. The second contact region 161 is formed in a region between the third trench separation structure 154 and the third well region 156 at an interval from the third trench separation structure 154 and the third well region 156. The second contact region 161 is formed as a band that extends along the third trench separation structure 154 in a plan view. The second contact region 161 is preferably formed in an annular shape that surrounds the third well region 156. The second contact region 161 may be in contact with the third trench separation structure 154.

The semiconductor device 1 includes a third field insulating film 170 that partially covers the first main surface 3 in the second MIS region 153. In this embodiment, the third field insulating film 170 includes a silicon oxide film. Specifically, the third field insulating film 170 includes a silicon oxide film that is made up of an oxide of the semiconductor chip 2.

The third field insulating film 170 covers the second drift region 157. The third field insulating film 170 covers a region between the second drain region 158 and the second contact region 161. The third field insulating film 170 covers a region between the second source region 159 and the second contact region 161. The third field insulating film 170 covers a region between the third trench separation structure 154 and the second contact region 161. The third field insulating film 170 continues to the separation insulating film 45 that is exposed from an inner peripheral wall of the third trench separation structure 154 at a peripheral edge portion of the second MIS region 153.

The third field insulating film 170 includes a plurality of second openings 171, each of which exposes the first main surface 3. The plurality of second openings 171 include at least one second drain opening 171A, at least one second channel opening 171B, and at least one second contact opening 171C.

The second drain opening 171A exposes the second drain region 158. The number of the second drain openings 171A is arbitrary. One second drain opening 171A may be formed or a plurality of second drain openings 171A may be formed. The second channel opening 171B exposes the second source region 159 and the second channel region 160. The number of the second channel openings 171B is arbitrary. One second channel opening 171B may be formed or a plurality of second channel openings 171B may be formed.

The second contact opening 171C exposes the second contact region 161. The number of the second contact opening 171C is arbitrary. One second contact opening 171C may be formed or a plurality of second contact openings 171C may be formed. In this case, the plurality of second contact openings 171C are preferably formed at an interval along the second contact region 161.

The plurality of second openings 171 may be each formed in a quadrilateral shape in a plan view. That is, the plurality of second openings 171 may each have a side extending in one direction (first direction X) and a side extending in an intersecting direction that intersects the one direction (second direction Y) in a plan view.

The third field insulating film 170 has a plurality of third insulating side walls 170*a* that individually demarcates the plurality of second openings 171. The plurality of third insulating side walls 170*a* are each formed over an entire circumference of an inner wall of the plurality of second openings 171. That is, the plurality of third insulating side walls 170*a* are each formed in a side that extends in one direction (first direction X) and in a side that extends in an intersecting direction that intersects the one direction (second direction Y) in the plurality of second openings 171. Each of the third insulating side walls 170*a* is inclined obliquely downward so as to make an acute angle with the first main surface 3. Specifically, each of the third insulating side walls 170*a* has an upper end portion positioned on the main surface side of the third field insulating film 170 and a lower end portion positioned on the first main surface 3 side and is inclined obliquely downward from the upper end portion to the lower end portion.

Each third insulating side wall 170*a* makes with the first main surface 3 a third inclined angle $\theta$3 that is not less than 20° and not more than 40° ($20° \leq \theta 3 \leq 40°$. Where there is drawn a straight line that connects the upper end portion and the lower end portion of each third insulating side wall 170*a* in a cross-sectional view, the third inclined angle $\theta$3 is an angle (absolute value) of the straight line that is made with the first main surface 3 inside the third field insulating film 170. The third inclined angle $\theta$3 is preferably less than 40° ($\theta 3 < 40°$).

It is particularly preferable that the third inclined angle $\theta$3 falls within a range of 30°±6° ($24° \leq \theta 3 \leq 36°$). The third inclined angle $\theta$3 typically falls within a range of not less than 28° and not more than 36° ($28° \leq \theta 3 \leq 36°$). Preferably, the third inclined angle $\theta$3 is substantially equal to the first inclined angle $\theta$1 of the first field insulating film 80 ($\theta 1 \approx \theta 3$). Preferably, the third inclined angle $\theta$3 is substantially equal to the second inclined angle $\theta$2 of the second field insulating film 120 ($\theta 2 \approx \theta 3$).

Each of the third insulating side walls 170*a* may be depressed to the first main surface 3 in a region between the upper end portion and the lower end portion and inclined in a curved shape. In this case as well, where there is drawn a straight line that connects the upper end portion and the lower end portion of each third insulating side wall 170*a* in a cross-sectional view, the third inclined angle $\theta$3 is an angle (absolute value) of the straight line that is made with the first main surface 3.

The third field insulating film 170 has a third field thickness TF3. The third field thickness TF3 is a thickness of a portion of the third field insulating film 170 along the normal direction Z excluding a portion that forms the third insulating side wall 170*a*. The third field thickness TF3 may be substantially equal to the first separation thickness TI1 of the separation insulating film 45 ($TF3 \approx TI1$). The third field thickness TF3 is preferably greater than the second separation thickness TI2 of the separation insulating film 45 ($TI2 < TF3$).

The third field thickness TF3 is preferably not less than the first thickness T1 of the upper insulating film 54 ($T1 \leq TF3$). It is particularly preferable that the third field thickness TF3 exceeds the first thickness T1 ($T1 < TF3$). The third field thickness TF3 may be substantially equal to the first lower thickness T21 of the lower insulating film 55 (=second thickness T2) (TF3≈T21). The third field thickness TF3 is preferably greater than the second lower thickness T22 of the lower insulating film 55 (T22<TF3).

The third field thickness TF3 is preferably greater than the intermediate thickness TM (TM<TF3). The third field thickness TF3 may be substantially equal to the first contact thickness T31 of the contact insulating film 73 (=third thickness T3) (TF3≈T31). The third field thickness TF3 is preferably greater than the second contact thickness T32 of the contact insulating film 73 (T32<TF3). Preferably, the third field thickness TF3 is substantially equal to the first field thickness TF1 of the first field insulating film 80 (TF1≈TF3). Preferably, the third field thickness TF3 is substantially equal to the second field thickness TF2 of the second field insulating film 120 (TF2≈TF3).

The third field thickness TF3 may be not less than 0.1 μm and not more than 1 μm. The third field thickness TF3 may be not less than 0.1 μm and not more than 0.25 μm, not less than 0.25 μm and not more than 0.5 μm, not less than 0.5 μm and not more than 0.75 μm, or not less than 0.75 μm and not more than 1 μm. The third field thickness TF3 is preferably not less than 0.15 μm and not more than 0.65 μm.

The semiconductor device 1 includes the aforementioned outer field insulating film 84 that covers a region outside the second MIS region 153. The outer field insulating film 84 covers a periphery of the third trench separation structure 154 in a region outside the second MIS region 153. The outer field insulating film 84 surrounds the third trench separation structure 154 in a region outside the second MIS region 153 in a plan view and continues to the separation insulating film 45 that is exposed from an outer peripheral wall of the third trench separation structure 154.

The semiconductor device 1 includes a third hidden surface 181 and a third exposed surface 182 that are formed in the second MIS region 153 on the first main surface 3. The third hidden surface 181 is formed at a portion of the first main surface 3 that is covered by the third field insulating film 170. The third exposed surface 182 is formed at a portion of the first main surface 3 that is exposed from the third field insulating film 170. In other words, the first main surface 3 includes the third hidden surface 181 and the third exposed surface 182 that are demarcated by the third field insulating film 170 in the second MIS region 153.

In this embodiment, the third exposed surface 182 is depressed to the third hidden surface 181 in the thickness direction of the semiconductor chip 2 (second main surface 4 side). Specifically, the third exposed surface 182 is depressed one step to the third hidden surface 181 in the thickness direction of the semiconductor chip 2, with each third insulating side wall 170*a* of the third field insulating film 170 given as a starting point.

The third exposed surface 182 is formed at a depth position between a bottom portion of the second source region 159 (a bottom portion of the second drain region 158 and a bottom portion of the second contact region 161) and the third hidden surface 181 with respect to the normal direction Z. The third exposed surface 182 is preferably depressed to the third hidden surface 181 in a range of more than 0 μm and not more than 0.5 μm (preferably, not more than 0.2 μm) with respect to the normal direction Z.

The semiconductor device 1 includes a third main surface insulating film 183 that selectively covers the first main surface 3 in the second MIS region 153. In this embodiment, the third main surface insulating film 183 includes a silicon oxide film. Specifically, the third main surface insulating film 183 includes a silicon oxide film that is made up of an oxide of the semiconductor chip 2. The third main surface insulating film 183 covers a region of the first main surface 3 outside the third field insulating film 170.

The third main surface insulating film 183 covers the third exposed surface 182 and continues to each third insulating side wall 170*a* of the third field insulating film 170. The third main surface insulating film 183 is formed at an interval on the semiconductor chip 2 side (third exposed surface 182 side) from an intermediate portion of the third field insulating film 170 in the thickness direction. Specifically, where there is drawn a line that passes through the intermediate portion of the thickness direction of the third field insulating film 170 along the third exposed surface 182 (first main surface 3) in a cross-sectional view, the third main surface insulating film 183 is formed at an interval on the semiconductor chip 2 side from the line.

The third main surface insulating film 183 includes a first region 183*a* and a second region 183*b*. The first region 183*a* is positioned on the semiconductor chip 2 side with respect to the third hidden surface 181. The second region 183*b* is positioned on a side opposite to the semiconductor chip 2 (the main surface side of the third field insulating film 170) with respect to the third hidden surface 181. Specifically, where there is drawn an extension line that extends in parallel to the third hidden surface 181 from on the third hidden surface 181 in a cross-sectional view, the first region 183*a* is positioned on the semiconductor chip 2 side with respect to the extension line. The second region 183*b* is positioned on a side opposite to the first region 183*a* (that is, on a side opposite to the semiconductor chip 2) across the extension line.

The third main surface insulating film 183 has a third insulation thickness TMI3 that is less than the third field thickness TF3 of the third field insulating film 170 (TMI3<TF3). The third insulation thickness TMI3 is preferably not more than one-fifth of the third field thickness TF3 (TMI3≤⅕×TF3). The third insulation thickness TMI3 may be substantially equal to the first insulation thickness TMI1 of the first main surface insulating film 83 (TMI3≈TMI1).

The semiconductor device 1 includes a second gate electrode 184 (main surface electrode) that opposes the second channel region 160 across the third main surface insulating film 183 inside the first channel opening 121B. In this embodiment, the second gate electrode 184 includes conductive polysilicon. A gate potential is to be applied to the second gate electrode 184. On/off control of the second channel region 160 is performed by the second gate electrode 184. Specifically, the second gate electrode 184 opposes the second drift region 157, the second source region 159, and the second channel region 160 in a plan view.

The second gate electrode 184 is formed as a band that extends along the second channel region 160 in a plan view. The second gate electrode 184 has a second lead-out portion 185 that is led out onto the third field insulating film 170 positioned on the second drain region 158 side through the second insulating side wall 120*a* from on the third main surface insulating film 183. The second lead-out portion 185 is formed at an interval on the second source region 159 side from the second drain region 158 and opposes the second drift region 157 across the third field insulating film 170.

The second gate electrode 184 has a side wall that has an inclined angle steeper than that of the third insulating side wall 170*a* of the third field insulating film 170. Where there is drawn a straight line that connects the upper end portion and the lower end portion of the side wall of the second gate electrode 184, the inclined angle of the side wall of the second gate electrode 184 is an angle (absolute value) of the straight line that is made with the first main surface 3 inside the second gate electrode 184. The inclined angle of the side wall of the second gate electrode 184 may be not less than 45° and not more than 90°. The inclined angle of the side wall of the second gate electrode 184 is preferably not less than 60° and not more than 90°.

The semiconductor device 1 includes a second side wall structure 186 that covers the side wall of the second gate electrode 184. The second side wall structure 186 is positioned on the third field insulating film 170 and the third main surface insulating film 183. The second side wall structure 186 includes at least one of silicon oxide and silicon nitride. In this embodiment, the second side wall structure 186 includes silicon oxide. The second side wall structure 186 may include silicon nitride. That is, the second side wall structure 186 may include an insulator different from the third field insulating film 170 and the third main surface insulating film 183.

The semiconductor device 1 includes the aforementioned interlayer insulating layer 13 that covers the first main surface 3 in the second MIS region 153. The semiconductor device 1 includes a plurality of plug electrodes 191 to 195 that are embedded in the interlayer insulating layer 13. The plurality of plug electrodes 191 to 195 may be each constituted of a tungsten plug electrode having a laminated structure that includes a titanium-based metal film and a tungsten film. The plurality of plug electrodes 191 to 195 include at least one eleventh plug electrode 191, at least one twelfth plug electrode 192, at least one thirteenth plug electrode 193, at least one fourteenth plug electrode 194, and at least one fifteenth plug electrode 195.

The eleventh plug electrode 191 is constituted of a source plug electrode for the separation electrode 46. The eleventh plug electrode 191 is embedded in a portion of the interlayer insulating layer 13 that covers the third trench separation structure 154 and electrically connected to the separation electrode 46. The twelfth plug electrode 192 is constituted of a drain plug electrode for the second drain region 158. The twelfth plug electrode 192 is embedded in a portion of the interlayer insulating layer 13 that covers the second drain region 158 and electrically connected to the second drain region 158. The thirteenth plug electrode 193 is constituted of a source plug electrode for the second source region 159. The thirteenth plug electrode 193 is embedded in a portion of the interlayer insulating layer 13 that covers the second source region 159 and electrically connected to the second source region 159.

The fourteenth plug electrode 194 is constituted of a source plug electrode for the second contact region 161. The fourteenth plug electrode 194 is embedded in a portion of the interlayer insulating layer 13 that covers the second contact region 161 and electrically connected to the second contact region 161. The fifteenth plug electrode 195 is constituted of a gate plug electrode for the second gate electrode 184. The fifteenth plug electrode 195 is embedded in a portion of the interlayer insulating layer 13 that covers the second gate electrode 184 and electrically connected to the second gate electrode 184. The tenth plug electrode 145 may be connected to the second lead-out portion 185 of the second gate electrode 184.

The semiconductor device 1 includes one or a plurality of second drain wirings 196 that are formed inside the interlayer insulating layer 13. One or the plurality of second drain wirings 196 are constituted of a wiring layer that is formed inside the interlayer insulating layer 13. One or the plurality of second drain wirings 196 are selectively routed inside the interlayer insulating layer 13 and electrically connected to the second drain region 158 via the twelfth plug electrode 192.

The semiconductor device 1 includes one or a plurality of second source wirings 197 that are formed inside the interlayer insulating layer 13. One or the plurality of second source wirings 197 are constituted of a wiring layer that is formed inside the interlayer insulating layer 13. One or the plurality of second source wirings 197 are selectively routed inside the interlayer insulating layer 13 and electrically connected to the separation electrode 46, the second source region 159, and the second contact region 161 via the eleventh plug electrode 191, the thirteenth plug electrode 193, and the fourteenth plug electrode 194.

The semiconductor device 1 includes one or a plurality of second gate wirings 198 that are formed inside the interlayer insulating layer 13. One or the plurality of second gate wirings 198 are constituted of a wiring layer that is formed inside the interlayer insulating layer 13. One or the plurality of second gate wiring 198 are selectively routed inside the interlayer insulating layer 13 and electrically connected to the second gate electrode 184 via the fifteenth plug electrode 195.

Figure 22A:
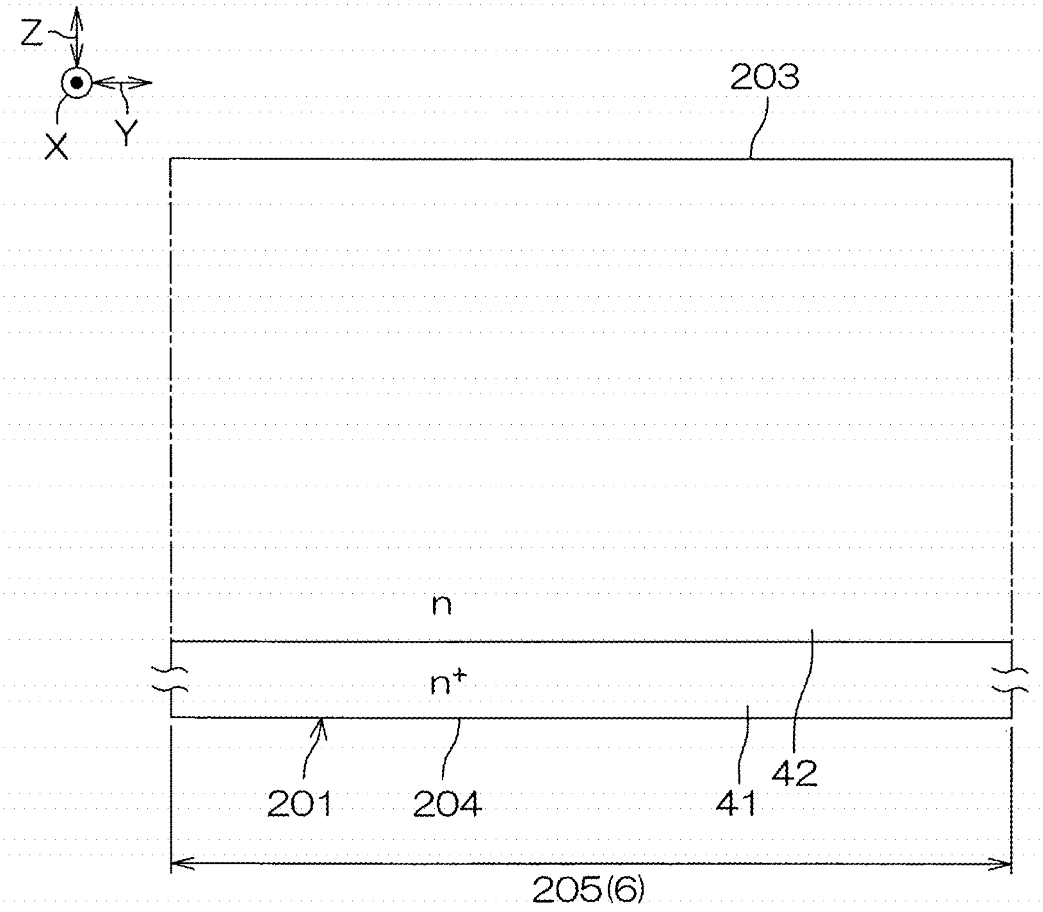
FIG. 22A corresponds to a region shown in FIG. 12 and is a cross-sectional view for describing an example of a method for manufacturing the semiconductor device.
Figure 22B:
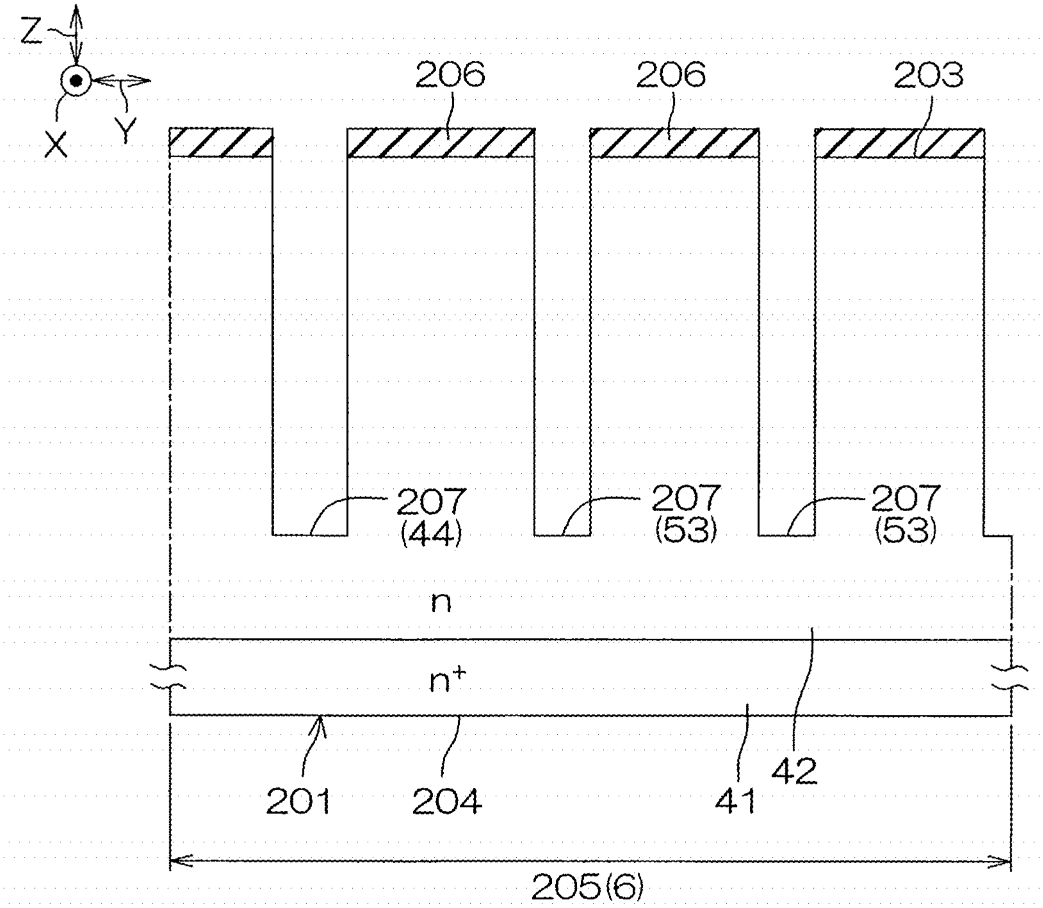
FIG. 22B is a cross-sectional view for describing a step subsequent to that of FIG. 22A.
Figure 22C:
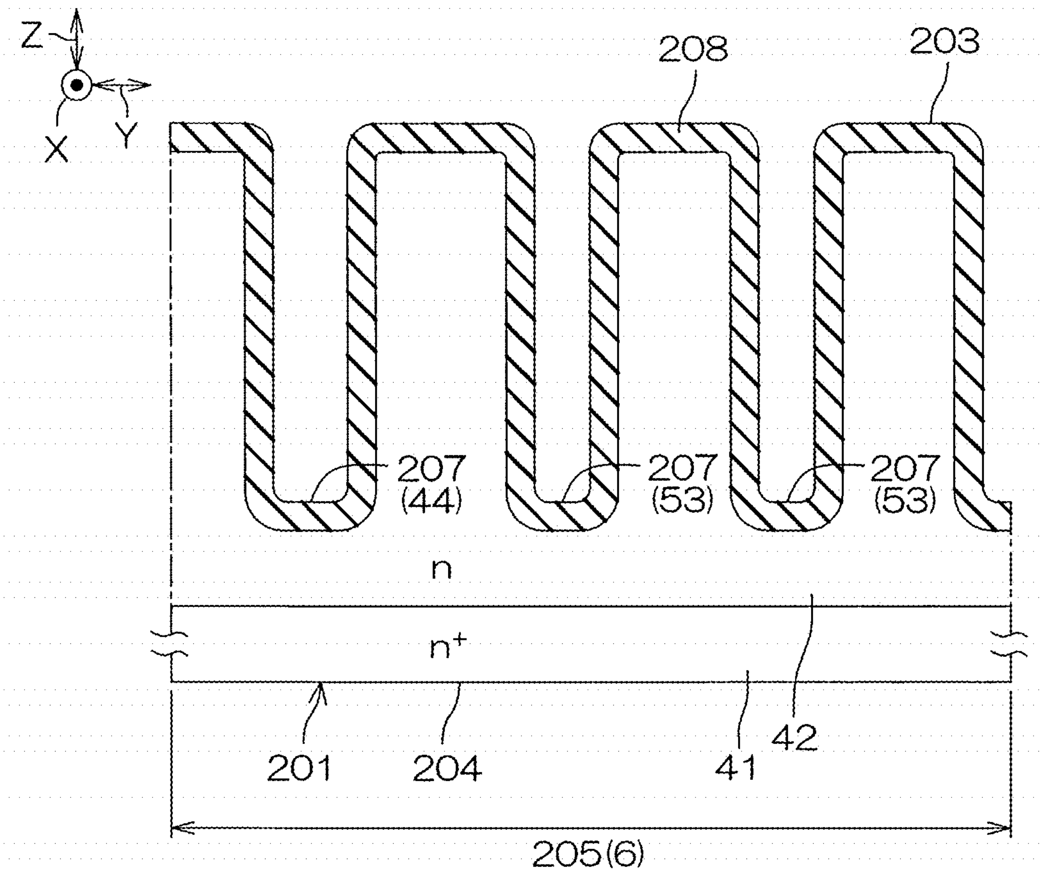
FIG. 22C is a cross-sectional view for describing a step subsequent to that of FIG. 22B.
Figure 22D:
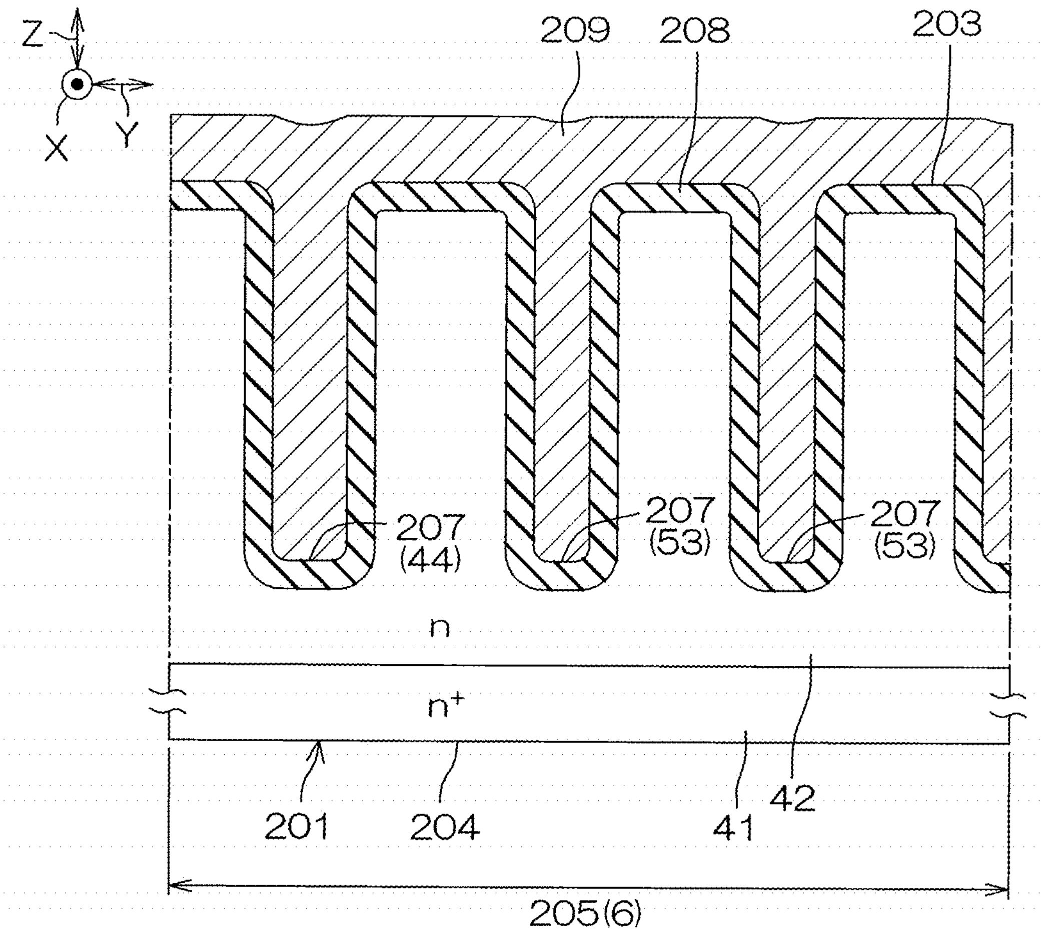
FIG. 22D is a cross-sectional view for describing a step subsequent to that of FIG. 22C.
Figure 22E:
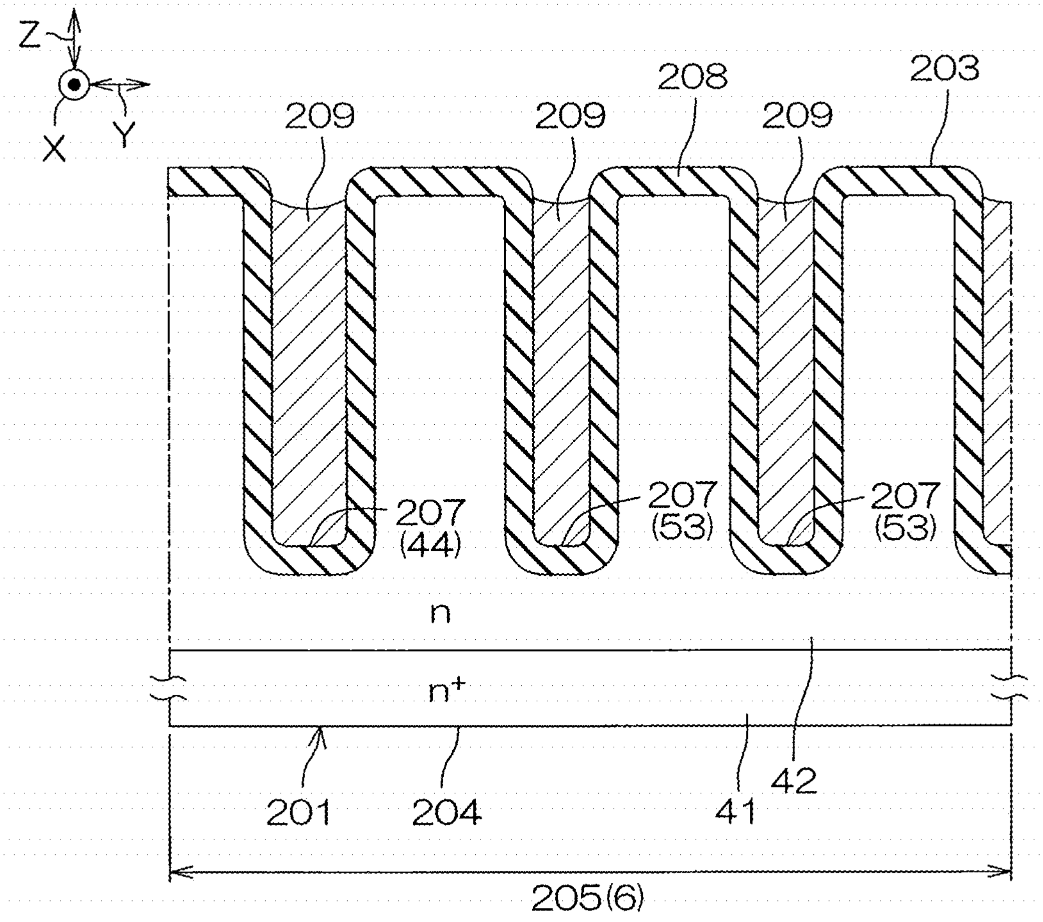
FIG. 22E is a cross-sectional view for describing a step subsequent to that of FIG. 22D.
Figure 22F:
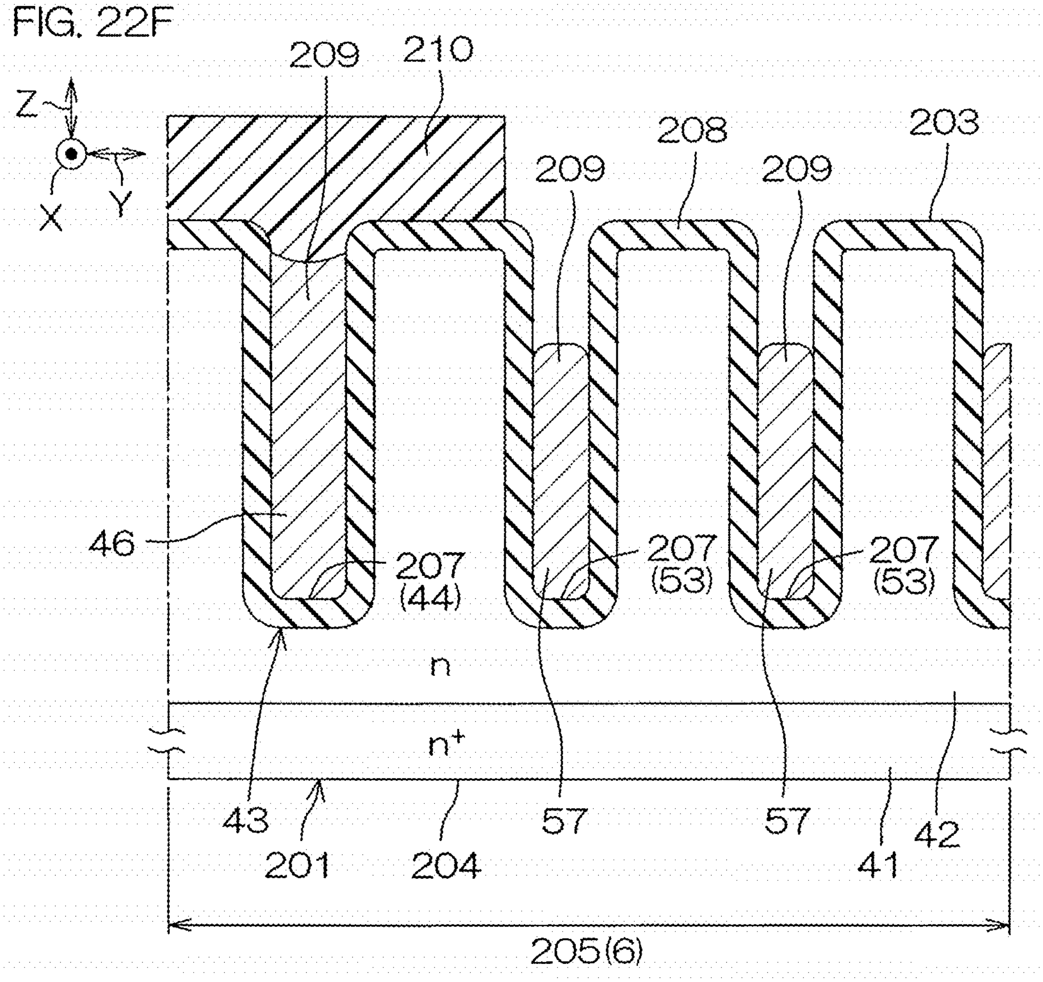
FIG. 22F is a cross-sectional view for describing a step subsequent to that of FIG. 22E.
Figure 22G:
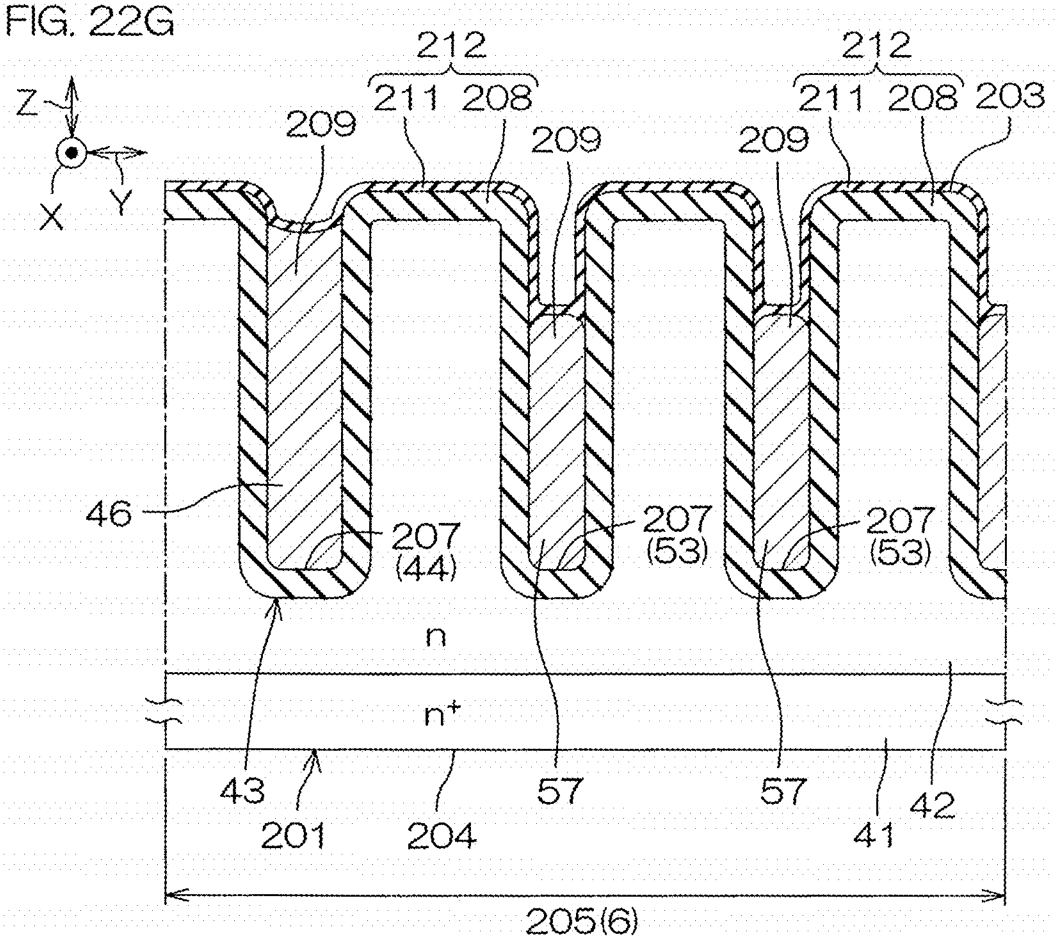
FIG. 22G is a cross-sectional view for describing a step subsequent to that of FIG. 22F.
Figure 22H:
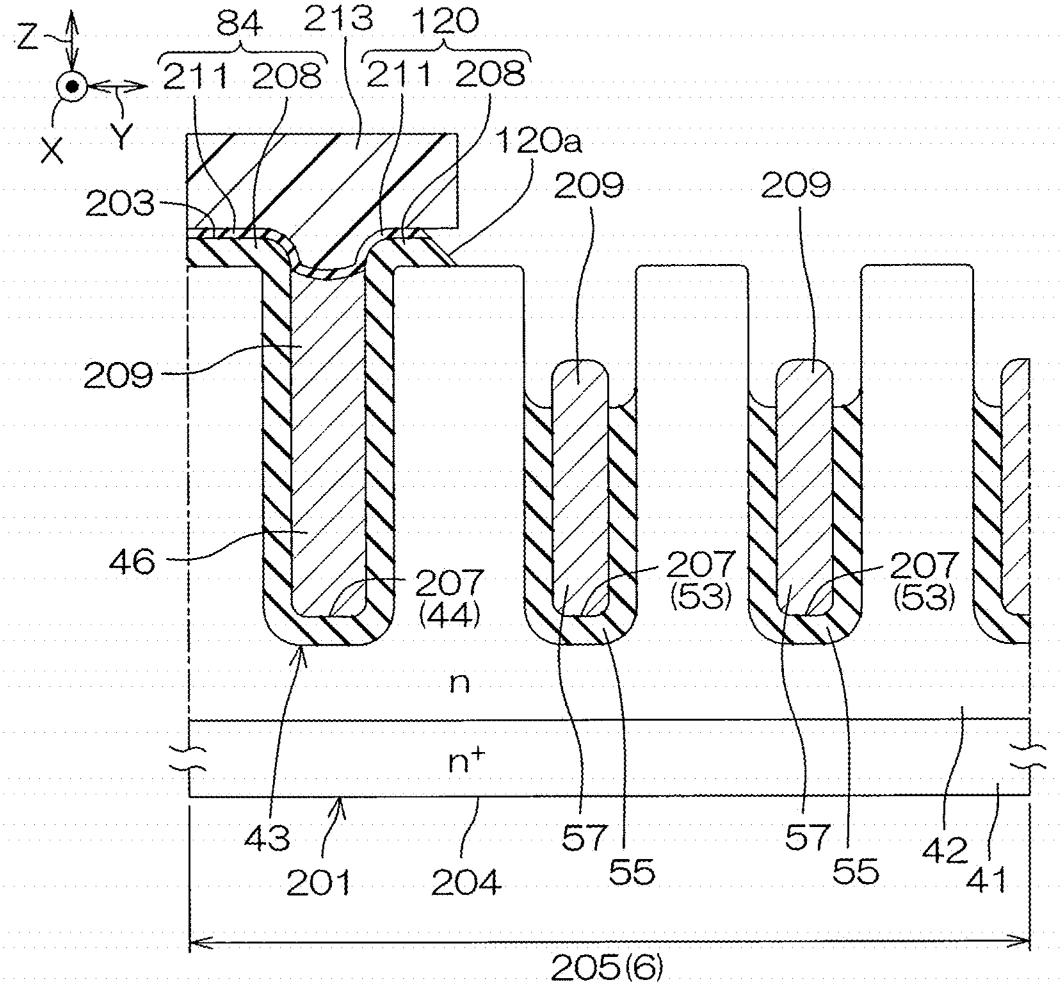
FIG. 22H is a cross-sectional view for describing a step subsequent to that of FIG. 22G.
Figure 22I:
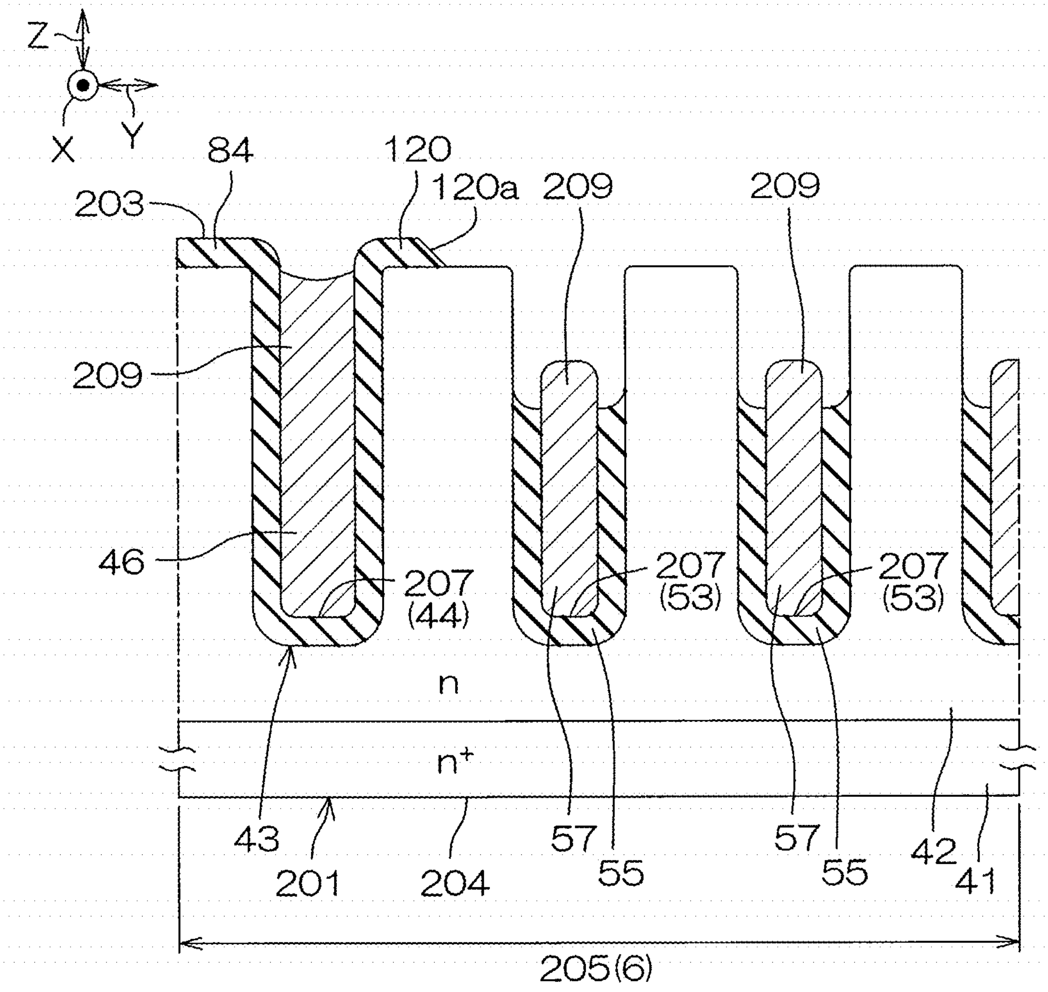
FIG. 22I is a cross-sectional view for describing a step subsequent to that of FIG. 22H.
Figure 22J:
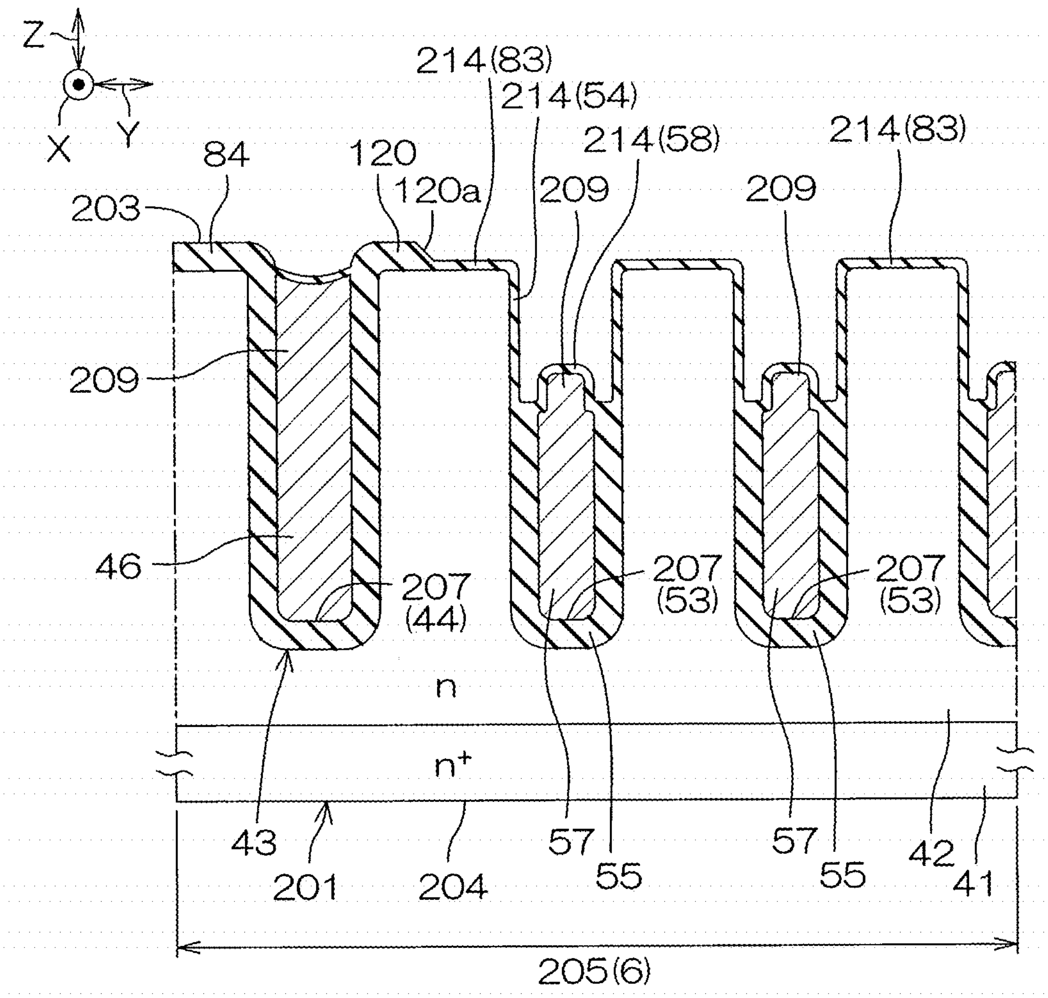
FIG. 22J is a cross-sectional view for describing a step subsequent to that of FIG. 22I.
Figure 22K:
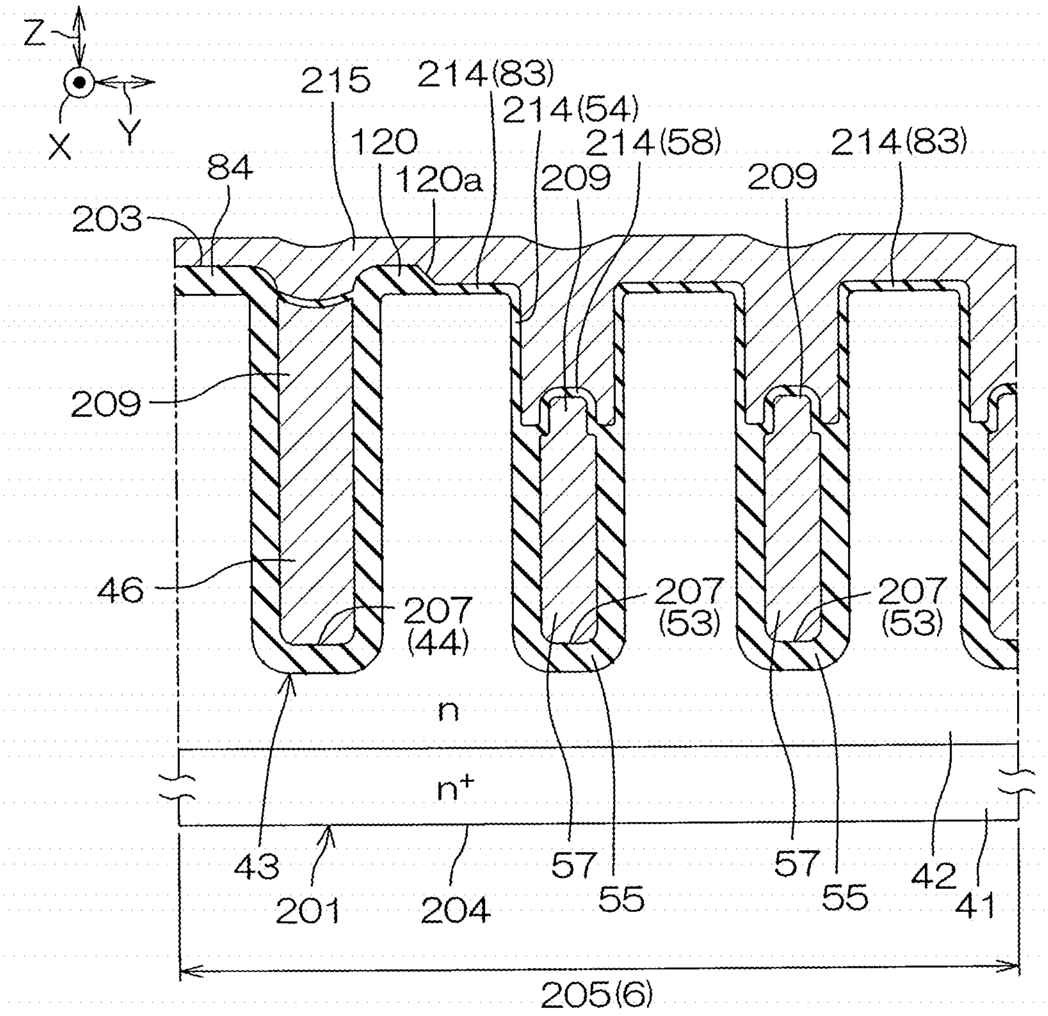
FIG. 22K is a cross-sectional view for describing a step subsequent to that of FIG. 22J.
Figure 22L:
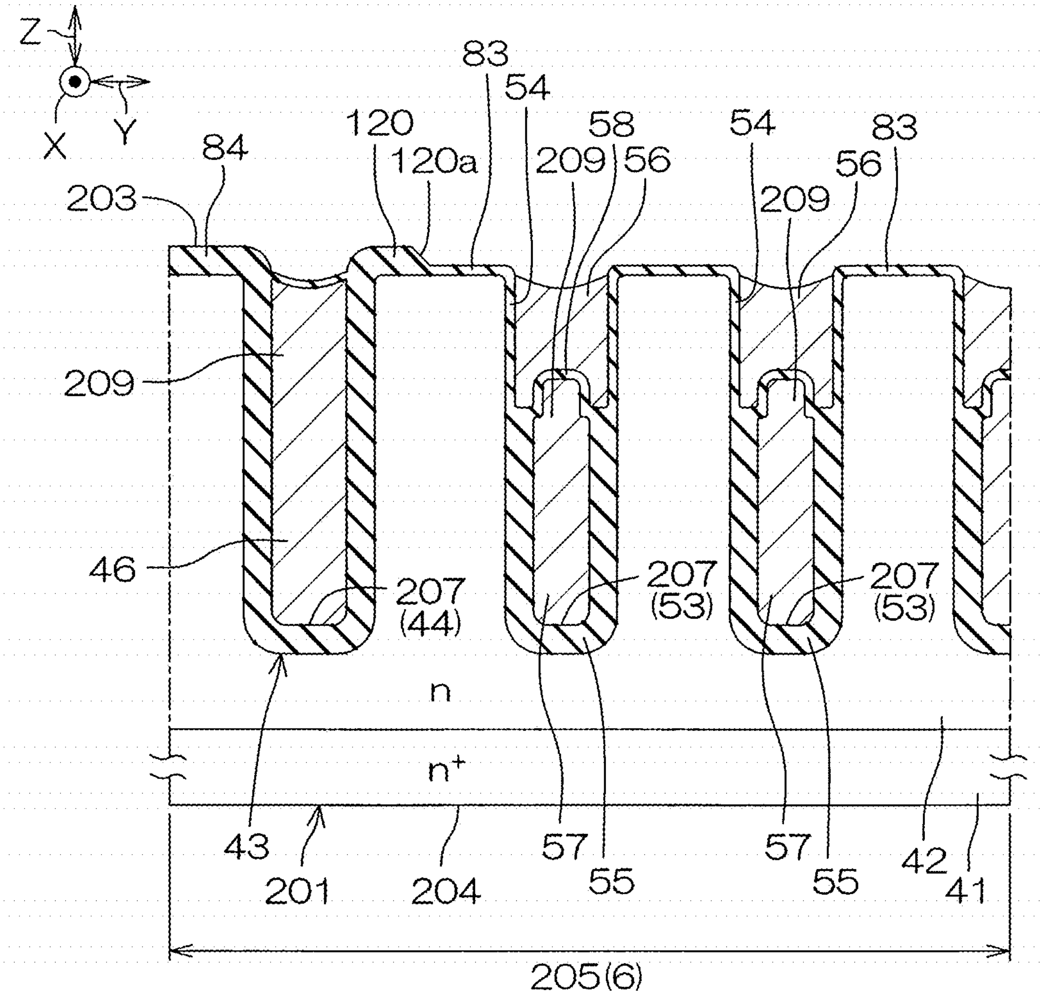
FIG. 22L is a cross-sectional view for describing a step subsequent to that of FIG. 22K.
Figure 22M:
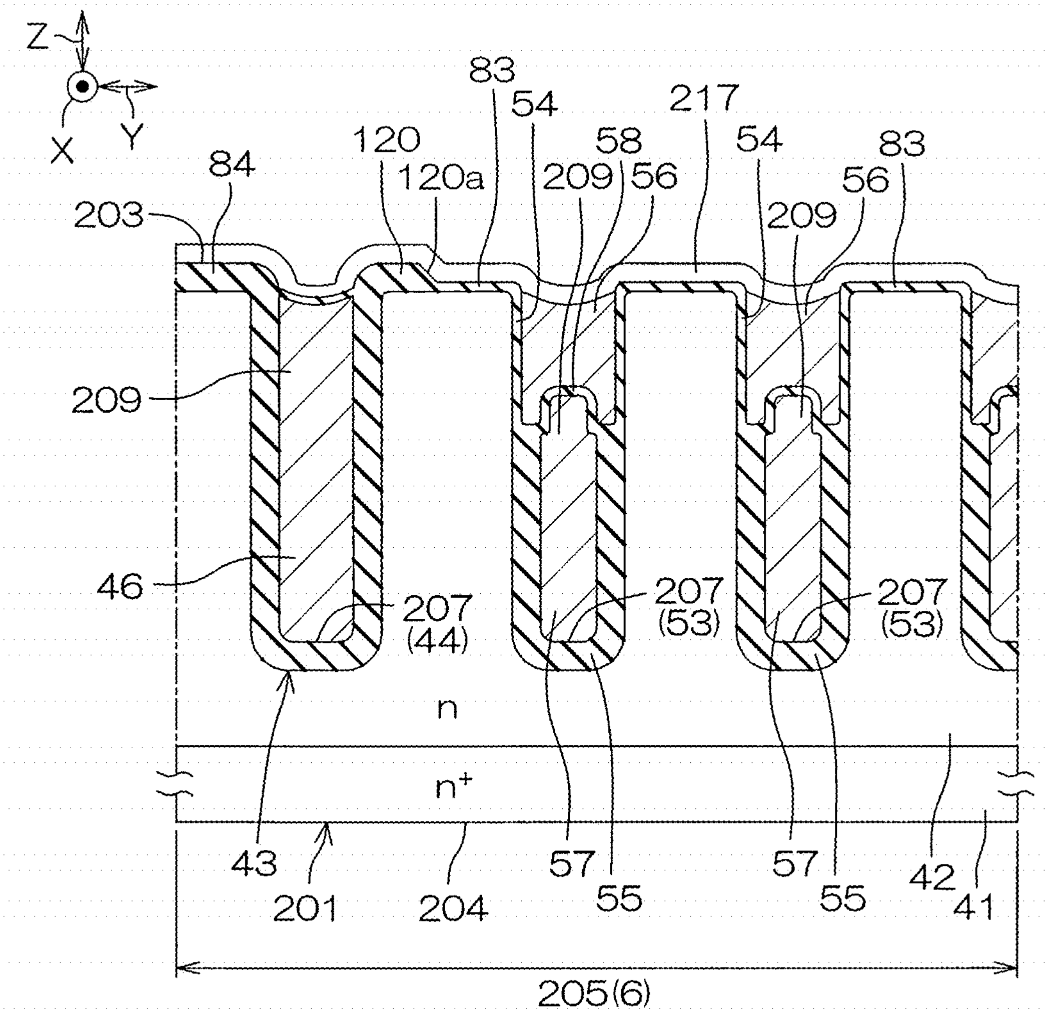
FIG. 22M is a cross-sectional view for describing a step subsequent to that of FIG. 22L.
Figure 22N:
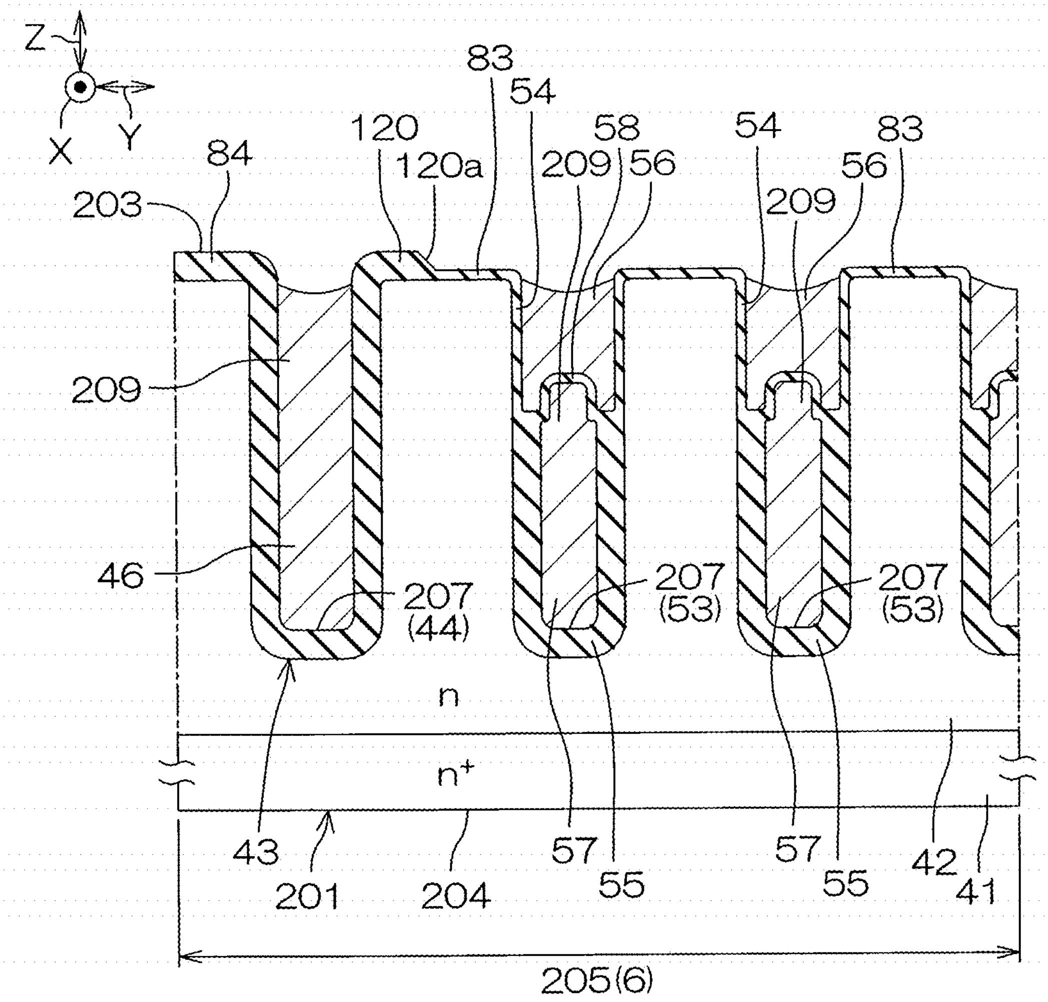
FIG. 22N is a cross-sectional view for describing a step subsequent to that of FIG. 22M.
Figure 220:
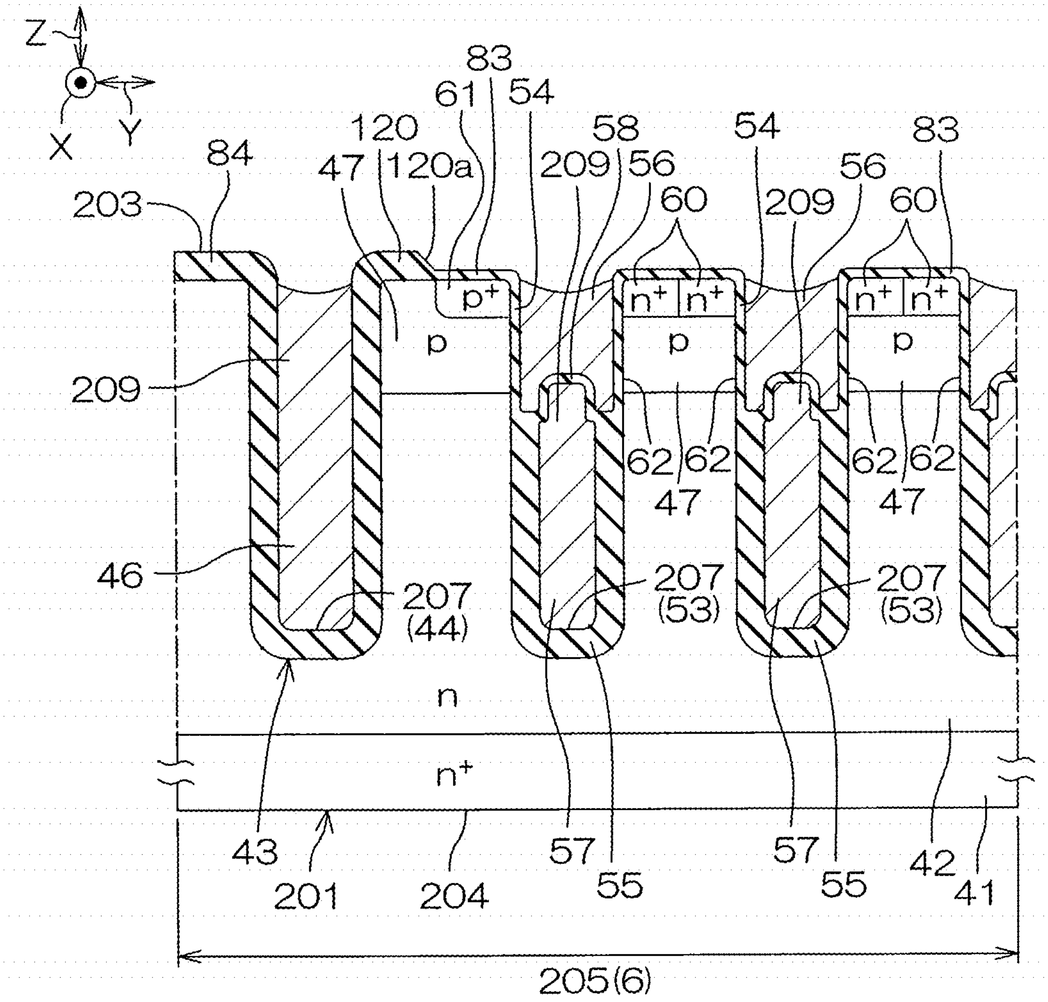
Figure 22P:
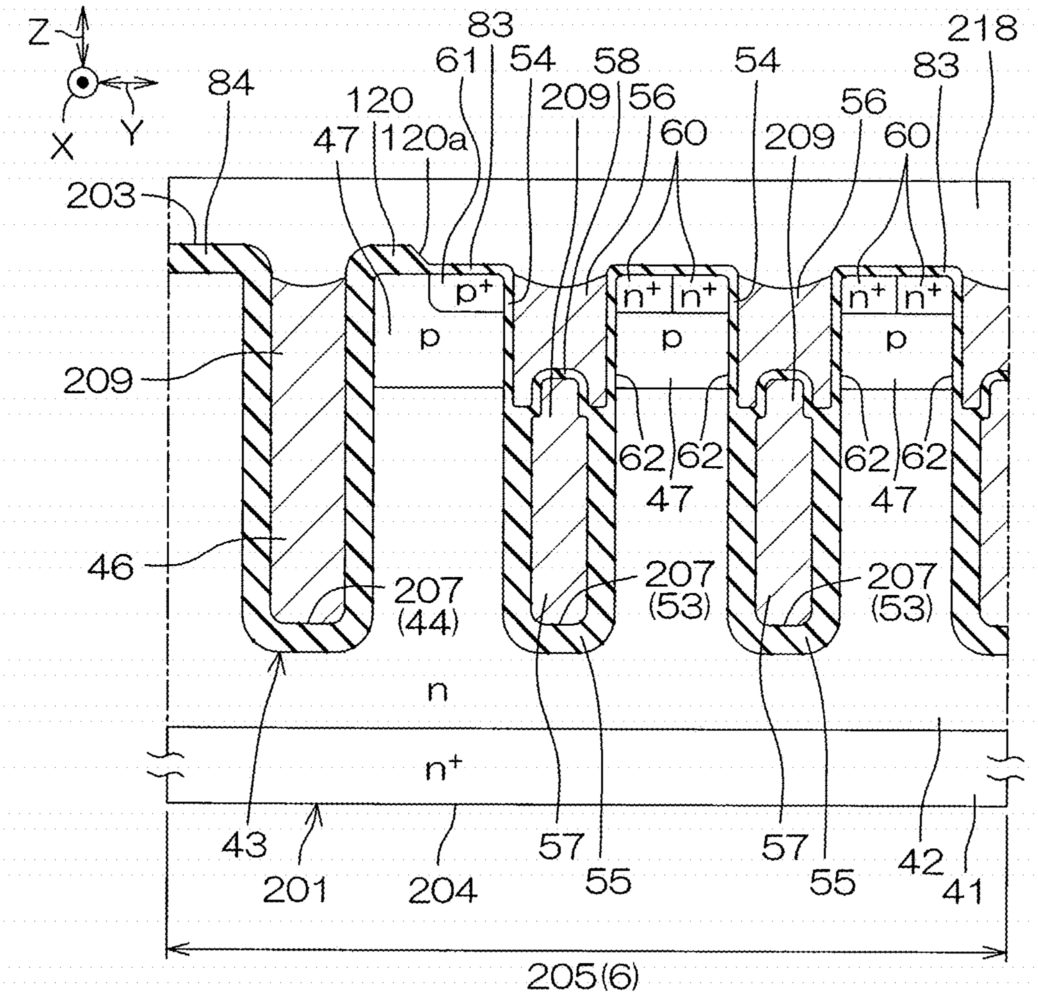
FIG. 22P is a cross-sectional view for describing a step subsequent to that of FIG. 22O.
Figure 22Q:
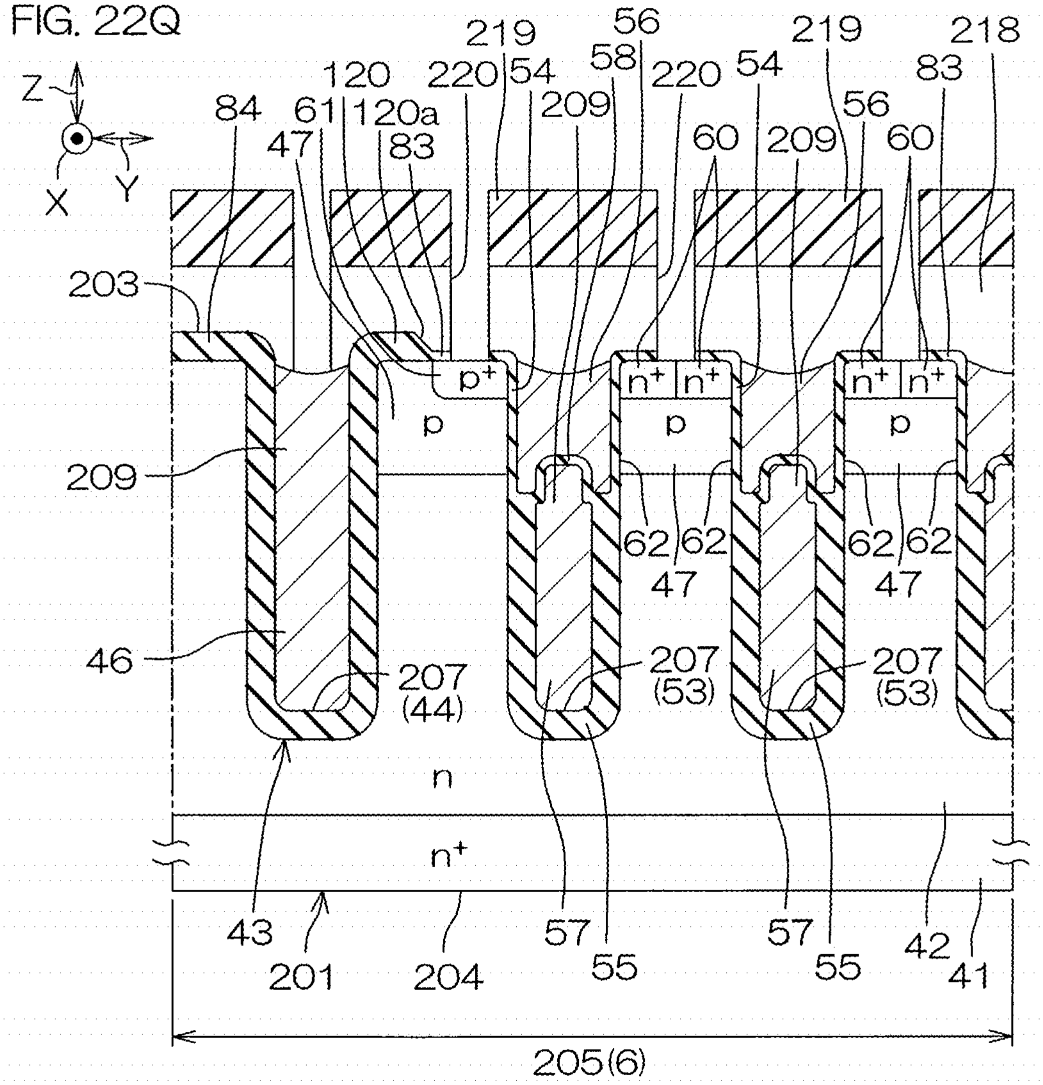
FIG. 22Q is a cross-sectional view for describing a step subsequent to that of FIG. 22P.
Figure 22R:
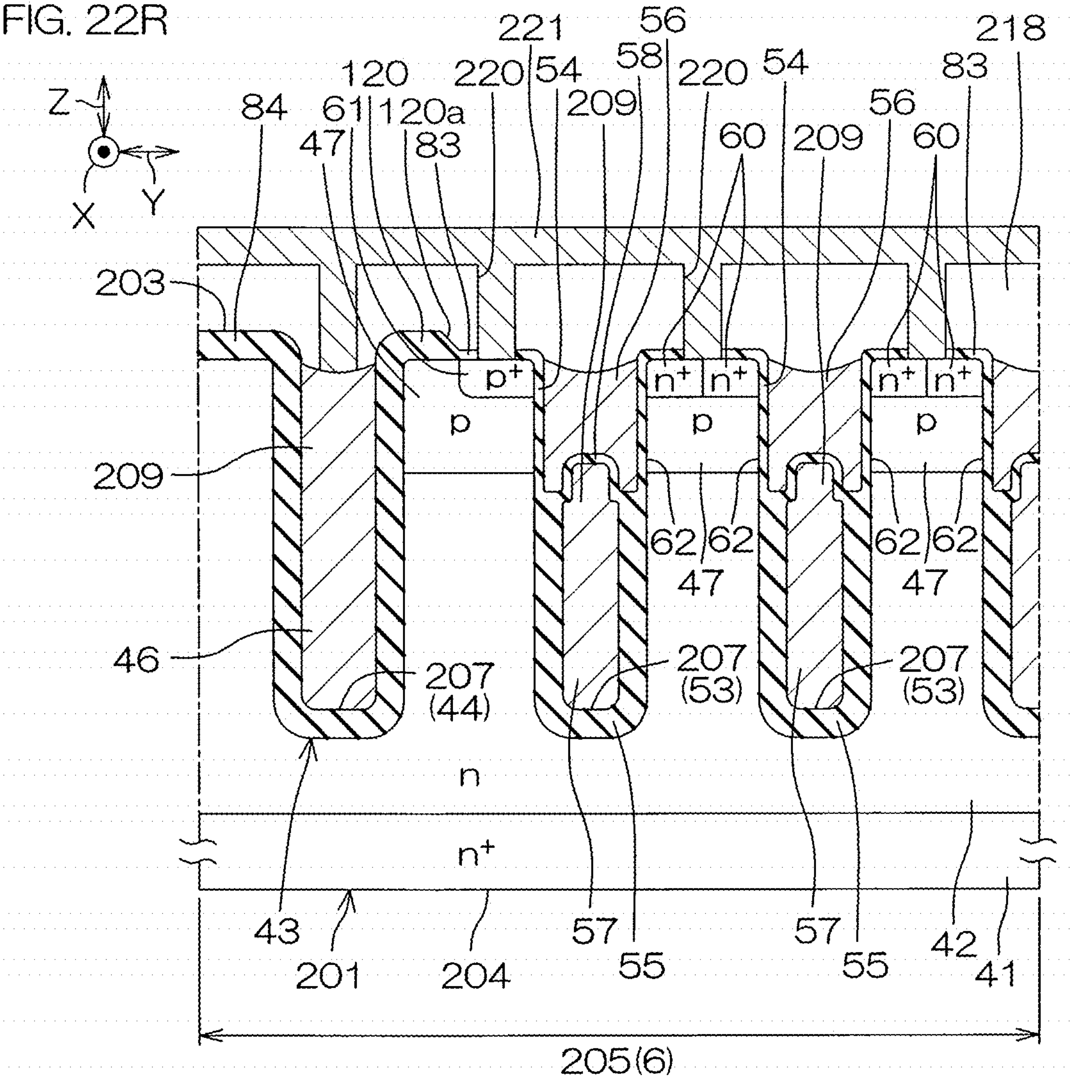
FIG. 22R is a cross-sectional view for describing a step subsequent to that of FIG. 22Q.
Figure 22S:
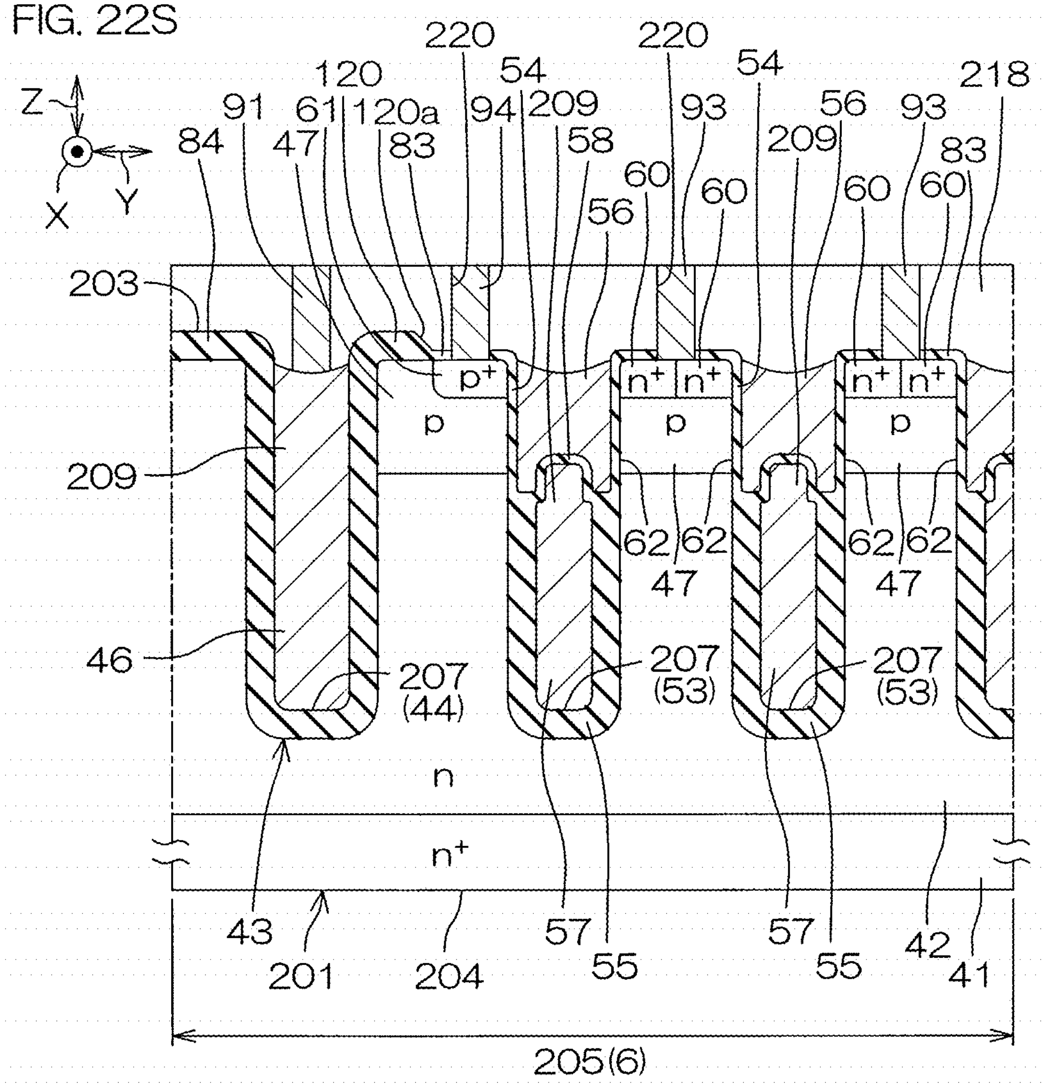
FIG. 22S is a cross-sectional view for describing a step subsequent to that of FIG. 22R.
Figure 22T:
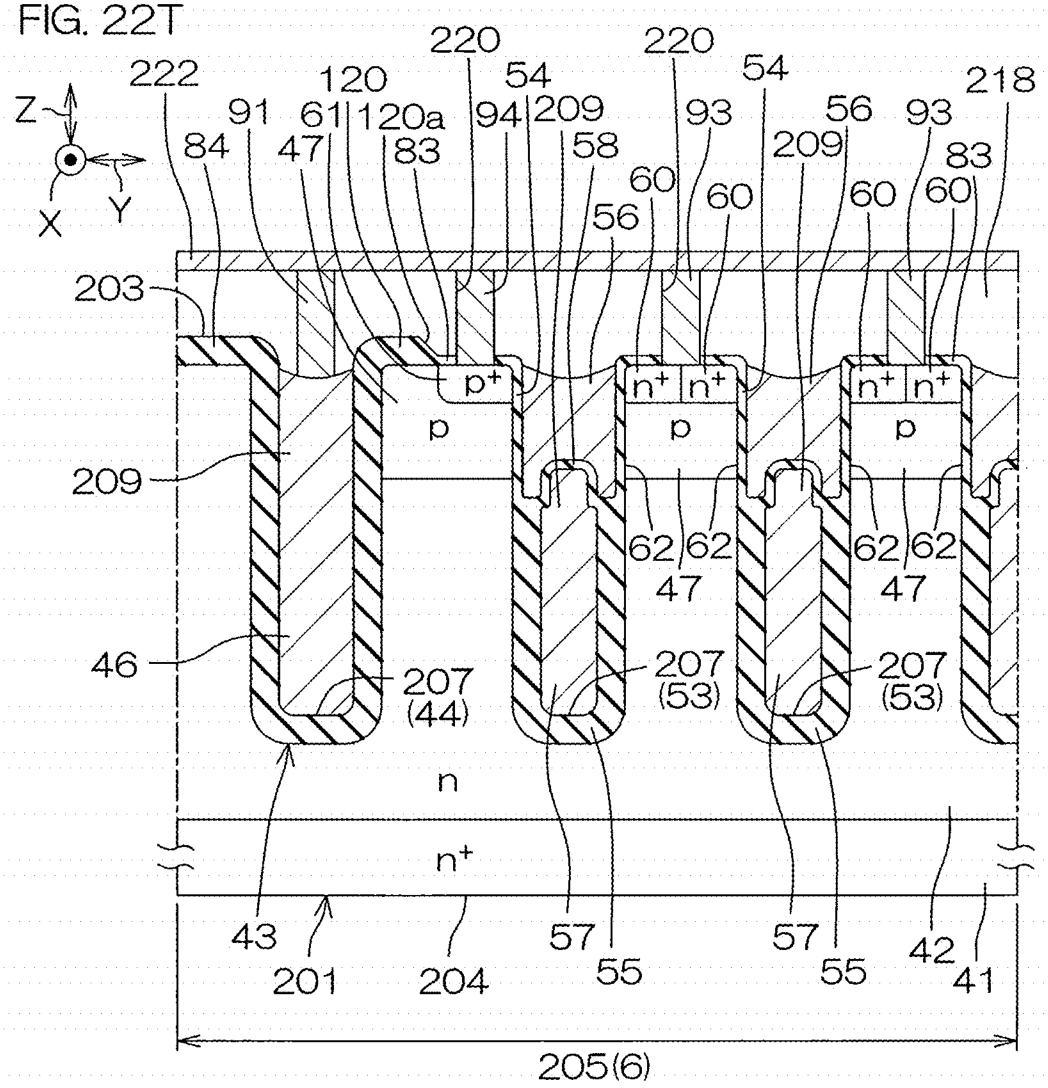
FIG. 22T is a cross-sectional view for describing a step subsequent to that of FIG. 22S.
Figure 22U:
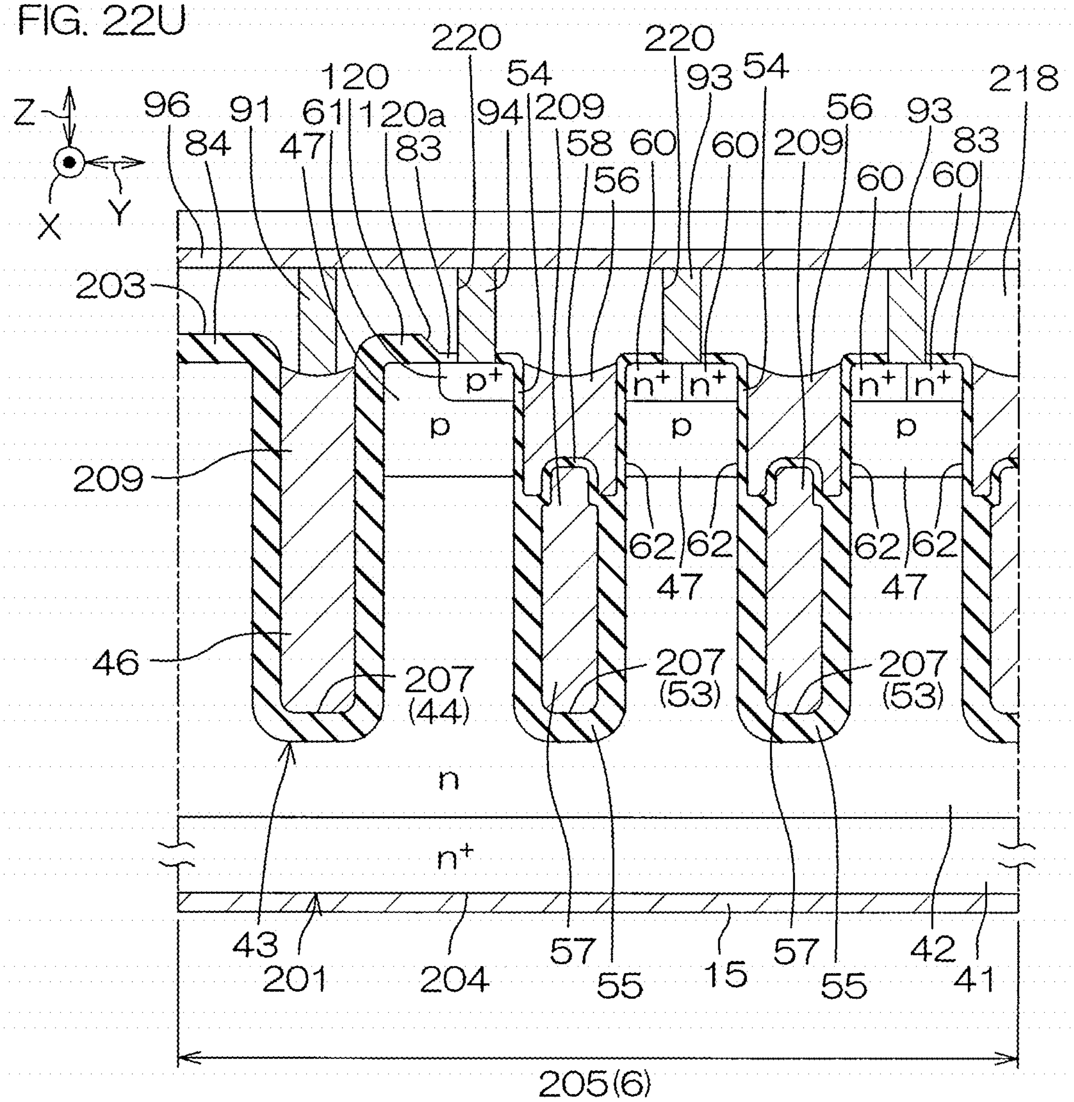
FIG. 22U is a cross-sectional view for describing a step subsequent to that of FIG. 22T.
Figure 23A:
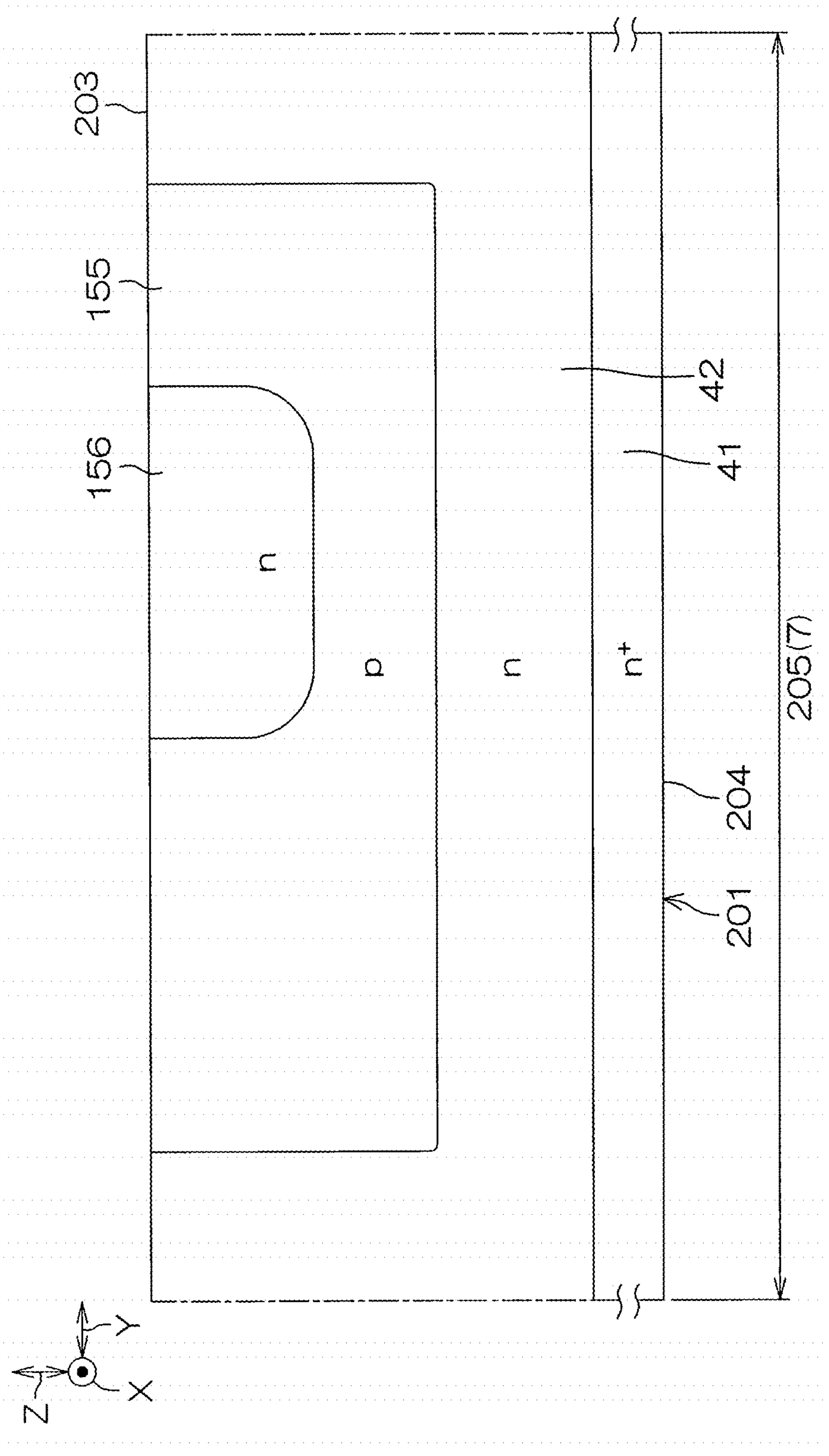
FIG. 23A corresponds to a region shown in FIG. 18 and is a cross-sectional view for describing one example for manufacturing the semiconductor device.

FIG. 22A to FIG. 22U correspond to a region shown in FIG. 12 (a region in which the power transistor 8 is formed) and are each a cross-sectional view for describing an example of a method for manufacturing the semiconductor device 1. FIG. 23A to FIG. 23U correspond to a region shown in FIG. 18 (a region in which the n-type MISFET 102 is formed) and are each a cross-sectional view for describing an example of a method for manufacturing the semiconductor device 1.

With reference to FIG. 22A and FIG. 23A, a semiconductor wafer 201 of a disk-shaped that serves as a base of the semiconductor chip 2 is prepared. The semiconductor wafer 201 has a first wafer main surface 203 on one side and a second wafer main surface 204 on the other side. The first wafer main surface 203 and the second wafer main surface 204 respectively correspond to the first main surface 3 and the second main surface 4 of the semiconductor chip 2.

The semiconductor wafer 201 has the n-type first semiconductor region 41 in a surface layer portion of the second wafer main surface 204. In this embodiment, the first semiconductor region 41 is constituted of a disk-shaped semiconductor substrate. The semiconductor wafer 201 has the n-type second semiconductor region 42 in a surface layer portion of the first wafer main surface 203. In this embodiment, the second semiconductor region 42 is constituted of an epitaxial layer that is formed on a main surface of the semiconductor substrate.

Next, a plurality of device forming regions 205, each of which corresponds to the semiconductor device 1, are set in the first wafer main surface 203. A region that corresponds to FIG. 12 in one device forming region 205 is shown in FIG. 22A to FIG. 22U, and a region that corresponds to FIG. 18 in one device forming region 205 is shown in FIG. 23A to FIG. 23U. The plurality of device forming regions 205 are set, for example, in a matrix form at intervals in the first direction X and the second direction Y in a plan view.

Next, the p-type first well region 105 and the n-type first drift region 107 are formed in the surface layer portion of the first wafer main surface 203 in the first MIS region 103. The first well region 105 is formed by introducing a p-type impurity into the first wafer main surface 203 by an ion implantation method via an ion implantation mask (not shown). The first drift region 107 is formed by introducing an n-type impurity into the first wafer main surface 203 (specifically, first well region 105) by an ion implantation method via an ion implantation mask (not shown).

Also, the p-type second well region 155, the n-type third well region 156, and the p-type second drift region 157 are formed in the surface layer portion of the first wafer main surface 203 in the second MIS region 153. The second well region 155 is formed by introducing a p-type impurity into the first wafer main surface 203 by an ion implantation method via an ion implantation mask (not shown). The third well region 156 is formed by introducing an n-type impurity into the first wafer main surface 203 (specifically, second well region 155) by an ion implantation method via an ion implantation mask (not shown).

The second drift region 157 is formed by introducing a p-type impurity into the first wafer main surface 203 (specifically, third well region 156) by an ion implantation method via an ion implantation mask (not shown). Steps of forming the first well region 105, the first drift region 107, the second well region 155, the third well region 156, and the second drift region 157 are not necessarily executed at this timing but executed at an arbitrary timing.

Figure 23B:
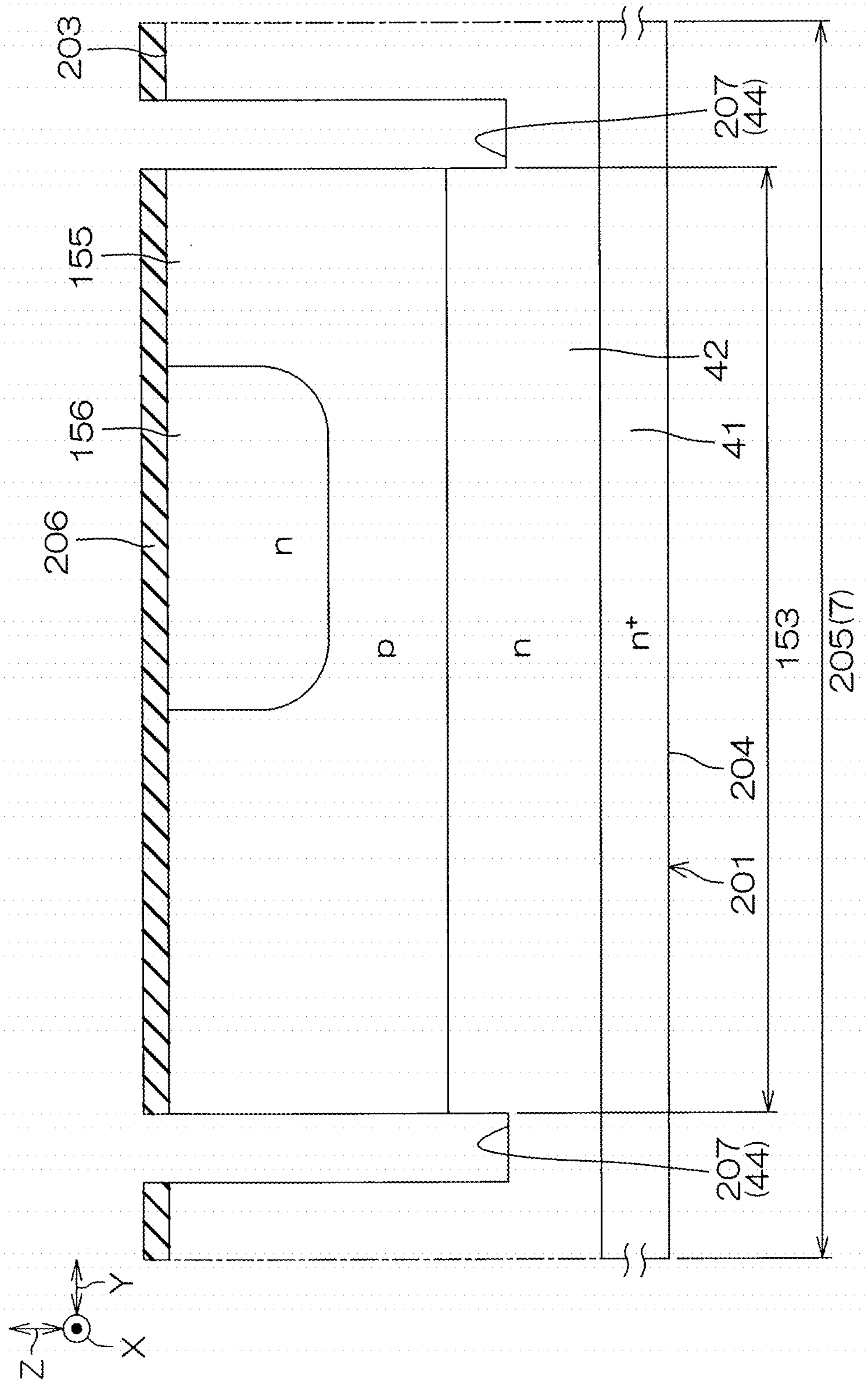
FIG. 23B is a cross-sectional view for describing a step subsequent to that of FIG. 23A.

Next, with reference to FIG. 22B and FIG. 23B, a hard mask 206 having a predetermined pattern is formed on the first wafer main surface 203. In this embodiment, the hard mask 206 is constituted of a silicon oxide film. The hard mask 206 may be formed by an oxidation treatment method (for example, a thermal oxidation treatment method) and/or a CVD (Chemical Vapor Deposition) method. In this embodiment, the hard mask 206 is formed by the thermal oxidation treatment method and formed in a predetermined pattern by an etching method via a mask (not shown).

Specifically, the hard mask 206 exposes a region of the first wafer main surface 203 in which a plurality of trenches 207 are to be formed and covers the other regions. The plurality of trenches 207 include the separation trenches 44 of the first to third trench separation structures 43, 104, 154, the gate trenches 53 of the trench gate structures 51 and the contact trenches 72 of the trench contact structures 71.

Next, an unnecessary portion of the semiconductor wafer 201 is removed by an etching method via the hard mask 206. The etching method may be a wet etching method and/or a dry etching method. The etching method is preferably an anisotropic dry etching (for example, RIE (Reactive Ion Etching)) method. Thereby, the plurality of trenches 207 are formed. The hard mask 206 is removed thereafter.

Figure 23C:
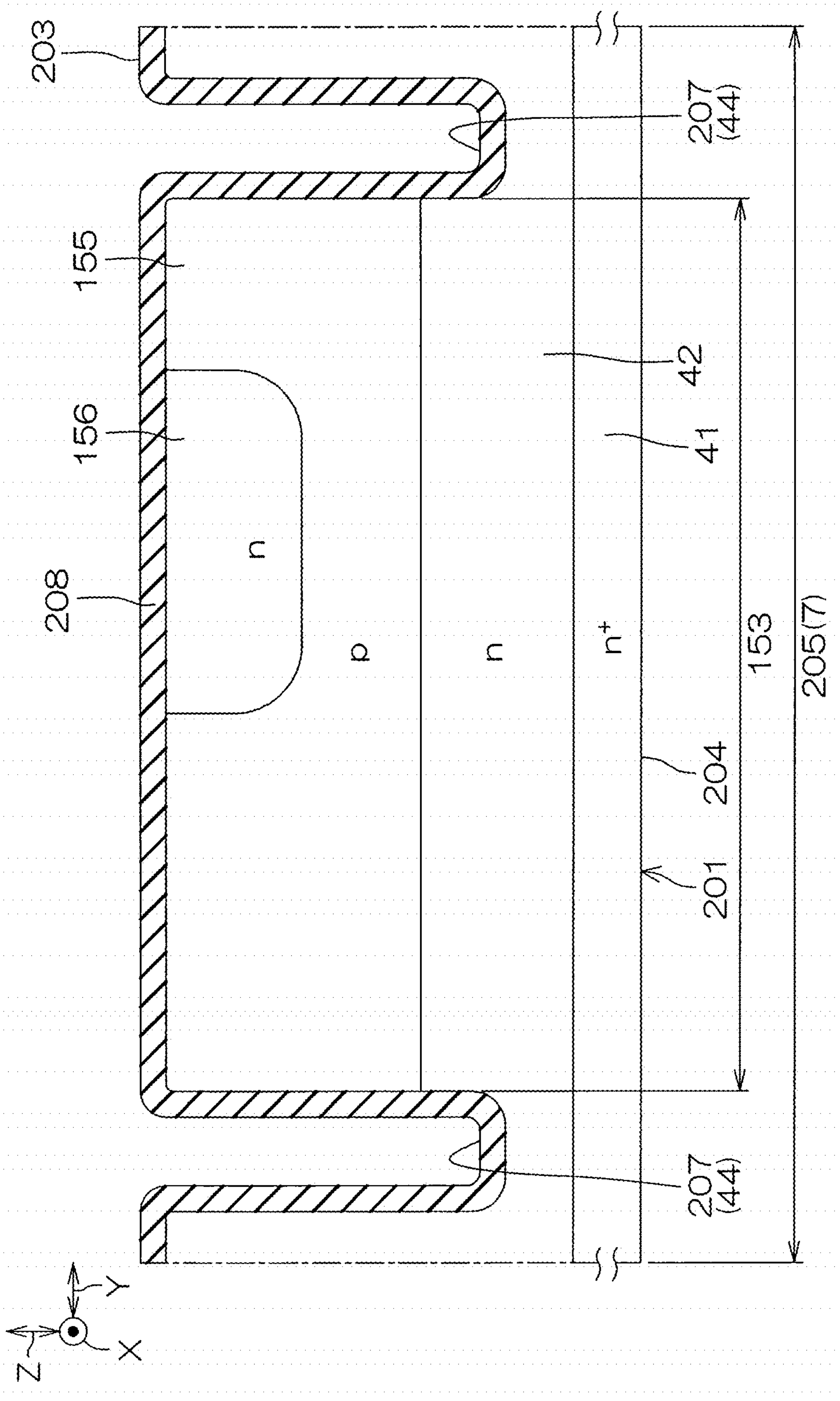
FIG. 23C is a cross-sectional view for describing a step subsequent to that of FIG. 23B.

Next, with reference to FIG. 22C and FIG. 23C, a first base insulating film 208 (first insulating film) is formed on the first wafer main surface 203 and inner walls of the plurality of trenches 207. The first base insulating film 208 serves as a base of the separation insulating films 45, the lower insulating films 55, the contact insulating films 73, the first to third field insulating films 80, 120, 170, and the outer field insulating film 84. In this embodiment, the first base insulating film 208 is constituted of an insulating film having a relatively low first etching rate.

Specifically, the first base insulating film 208 is constituted of a silicon oxide film. The first base insulating film 208 may be formed by an oxidation treatment method (for example, thermal oxidation treatment method) and/or a CVD method. In this embodiment, the first base insulating film 208 is formed by the thermal oxidation treatment method. That is, the first base insulating film 208 is made up of an oxide of the semiconductor wafer 201 and constituted of a silicon oxide film having a relatively high density.

A thickness of the first base insulating film 208 may be not less than 0.1 μm and not more than 1 μm. The thickness of the first base insulating film 208 may be not less than 0.1 μm and not more than 0.25 μm, not less than 0.25 μm and not more than 0.5 μm, not less than 0.5 μm and not more than 0.75 μm, or not less than 0.75 μm and not more than 1 μm. The thickness of the first base insulating film 208 is preferably not less than 0.15 μm and not more than 0.65 μm.

Figure 23D:
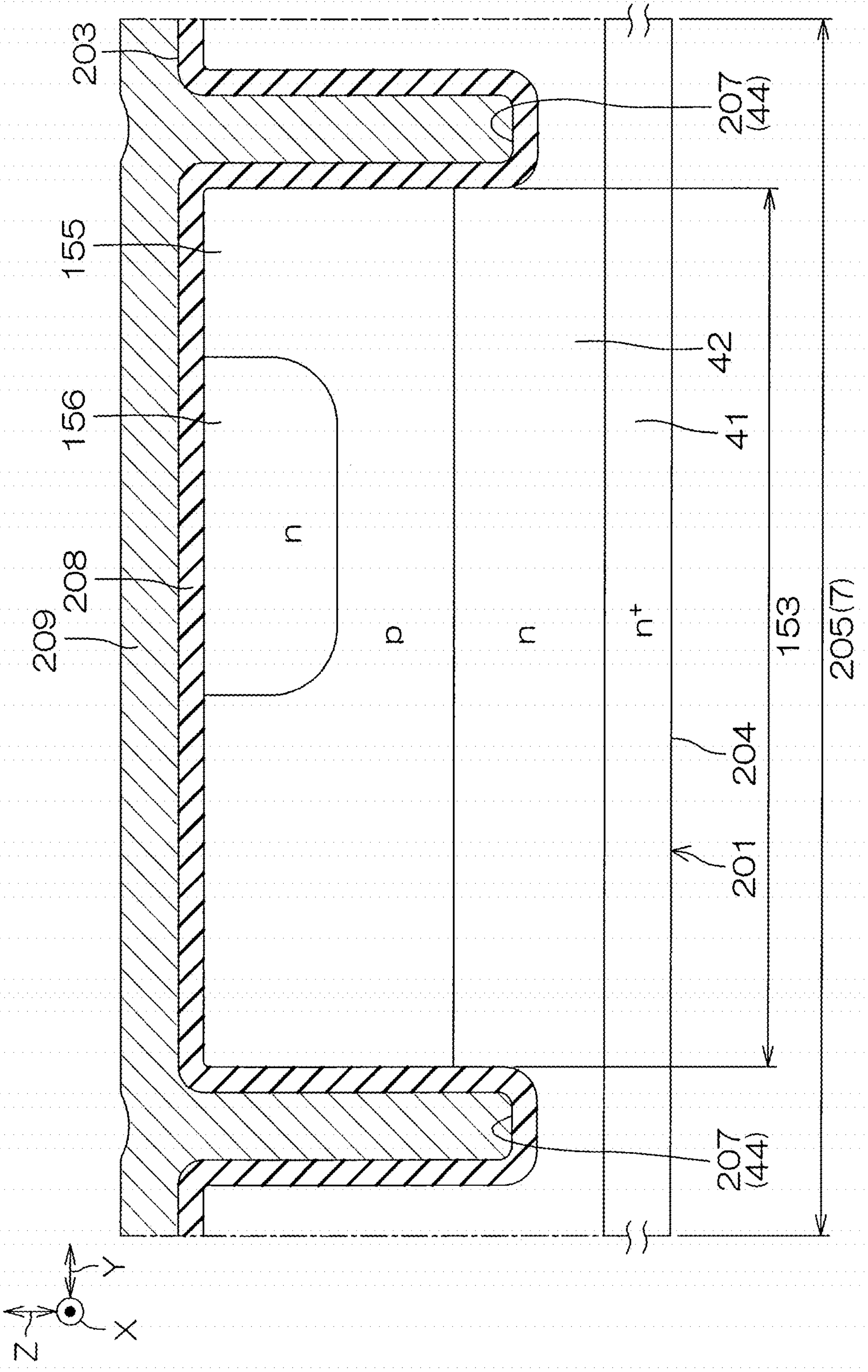
FIG. 23D is a cross-sectional view for describing a step subsequent to that of FIG. 23C.

Next, with reference to FIG. 22D and FIG. 23D, a first base electrode film 209 is formed on the first base insulating film 208. The first base electrode film 209 buries the plurality of trenches 207 across the first base insulating film 208 and covers the first wafer main surface 203 across the first base insulating film 208. The first base electrode film 209 serves as a base of the separation electrodes 46, the lower electrodes 57 and the contact electrodes 74. In this embodiment, the first base insulating film 208 is constituted of conductive polysilicon. The first base electrode film 209 may be formed by a CVD method.

Figure 23E:
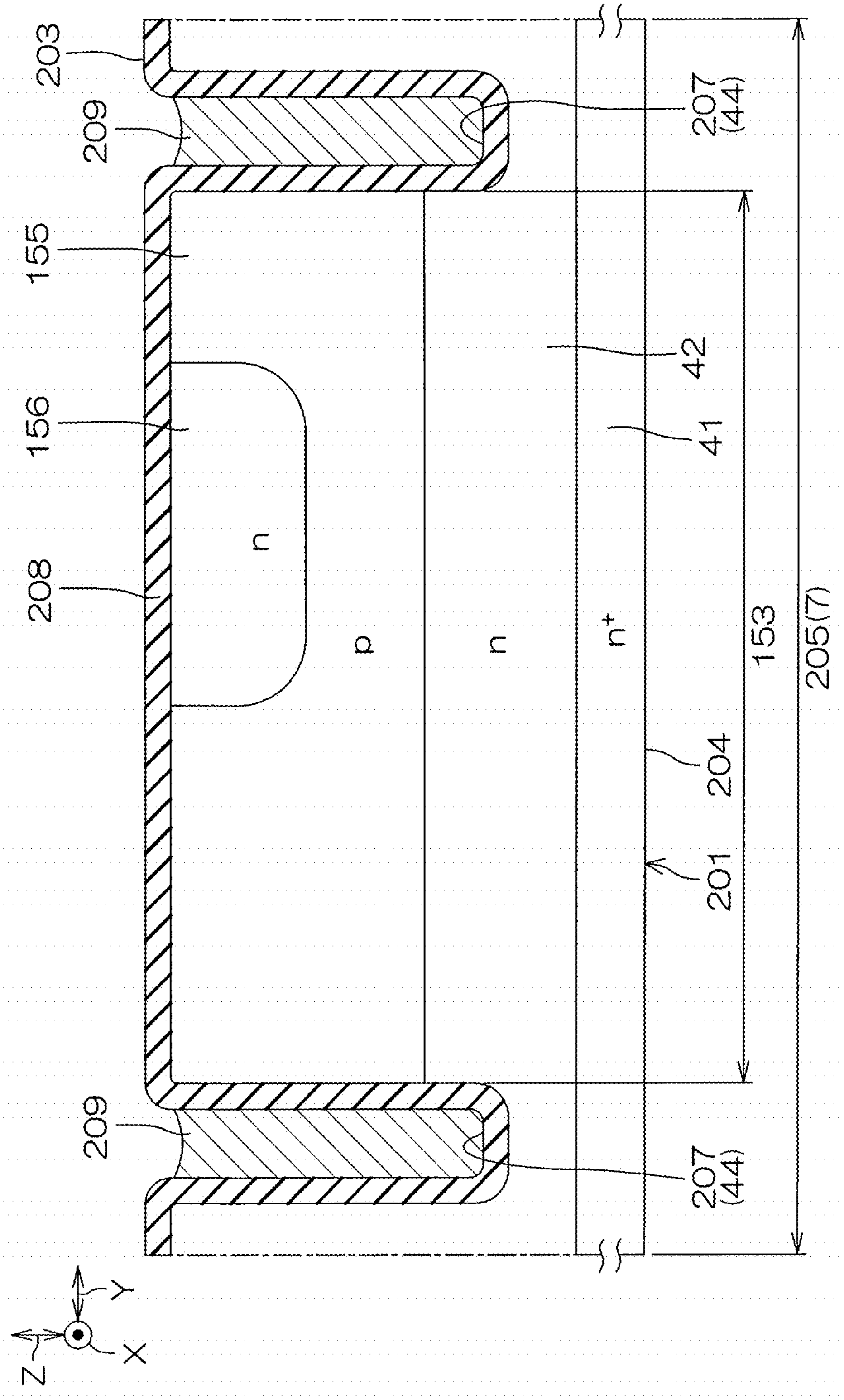
FIG. 23E is a cross-sectional view for describing a step subsequent to that of FIG. 23D.

Next, with reference to FIG. 22E and FIG. 23E, an unnecessary portion of the first base electrode film 209 is removed until the first base insulating film 208 is exposed. An unnecessary portion of the first base electrode film 209 may be removed by an etching method. The etching method may be a wet etching method and/or a dry etching method. Thereby, a part of the first base electrode film 209 is embedded in the plurality of trenches 207 across the first base insulating film 208.

Figure 23F:
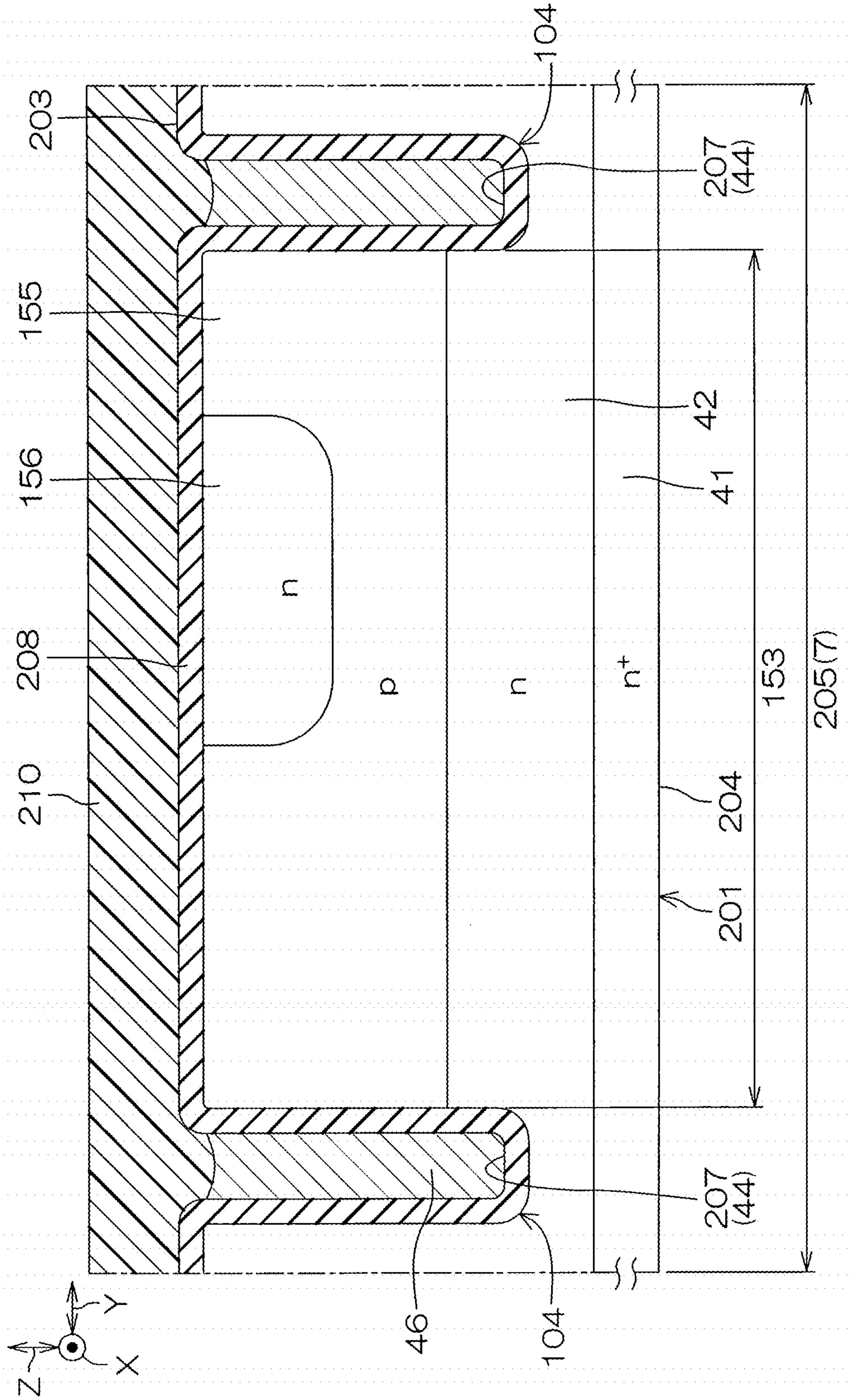
FIG. 23F is a cross-sectional view for describing a step subsequent to that of FIG. 23E.

Next, with reference to FIG. 22F and FIG. 23F, a first resist mask 210 having a predetermined pattern is formed on the first wafer main surface 203. The first resist mask 210 exposes regions in which the lower electrodes 57 are to be formed and covers the other regions. Next, an unnecessary portion of the first base electrode film 209 is removed by an etching method via the first resist mask 210. The etching method may be a wet etching method and/or a dry etching method. Thereby, the separation electrodes 46, the lower electrodes 57, and the contact electrodes 74 are formed. The first resist mask 210 is removed thereafter.

Figure 23G:
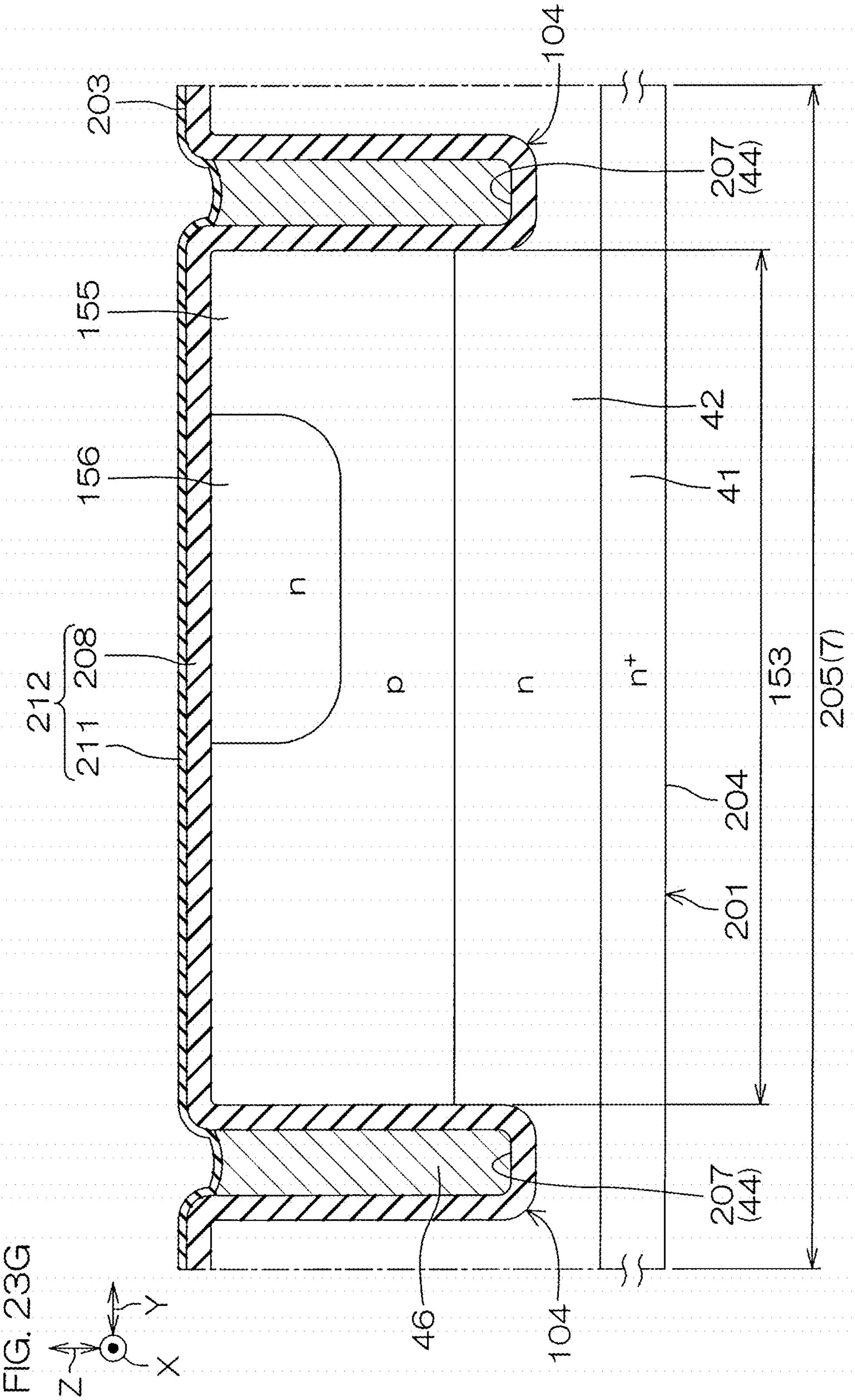
FIG. 23G is a cross-sectional view for describing a step subsequent to that of FIG. 23F.

Next, with reference to FIG. 22G and FIG. 23G, a second base insulating film 211 (second insulating film) is formed on the first base insulating film 208, the separation electrodes 46, the lower electrodes 57 and the contact electrodes 74. The second base insulating film 211 forms a laminated insulating film 212 that serves as a base of the first to third field insulating films 80, 120, 170 and the outer field insulating film 84, together with the first base insulating film 208. In this embodiment, the second base insulating film 211 is constituted of an insulating film having a second etching rate higher than the first etching rate.

Specifically, the second base insulating film 211 is constituted of a silicon oxide film different in property from the first base insulating film 208. More specifically, the second base insulating film 211 is constituted of a TEOS (Tetraethyl orthosilicate) film. That is, the second base insulating film 211 is made up of an oxide (an oxide different from the oxide of the semiconductor wafer 201) that is adhered to the first base insulating film 208 or the like from outside and constituted of a silicon oxide film having a lower density than the first base insulating film 208. The second base insulating film 211 is formed by a CVD method.

The second base insulating film 211 has a thickness less than that of the first base insulating film 208. It is preferable that the thickness of the second base insulating film 211 is not more than half of the thickness of the first base insulating film 208. It is particularly preferable that the thickness of the second base insulating film 211 is not more than one-third of the thickness of the first base insulating film 208.

The thickness of the second base insulating film 211 may be not less than 0.01 μm and not more than 0.5 μm. The thickness of the second base insulating film 211 may be not less than 0.01 μm and not more than 0.1 μm, not less than 0.1 μm and not more than 0.2 μm, not less than 0.2 μm and not more than 0.3 μm, not less than 0.3 μm and not more than 0.4 μm, or not less than 0.4 μm and not more than 0.5 μm. The thickness of the second base insulating film 211 is preferably not less than 0.01 μm and not more than 0.2 μm.

Next, the second base insulating film 211 is sintered by a heating treatment method. Thereby, the second base insulating film 211 is increased in density. After being sintered, the density of the second base insulating film 211 is lower than that of the first base insulating film 208. Therefore, after being sintered, the second etching rate of the second base insulating film 211 is higher than the first etching rate of the first base insulating film 208. A step of heating the second base insulating film 211 may be omitted, if necessary. Where the second base insulating film 211 is removed by a wet etching method, a step of heating the second base insulating film 211 is effective in adjusting the second etching rate.

Figure 23H:
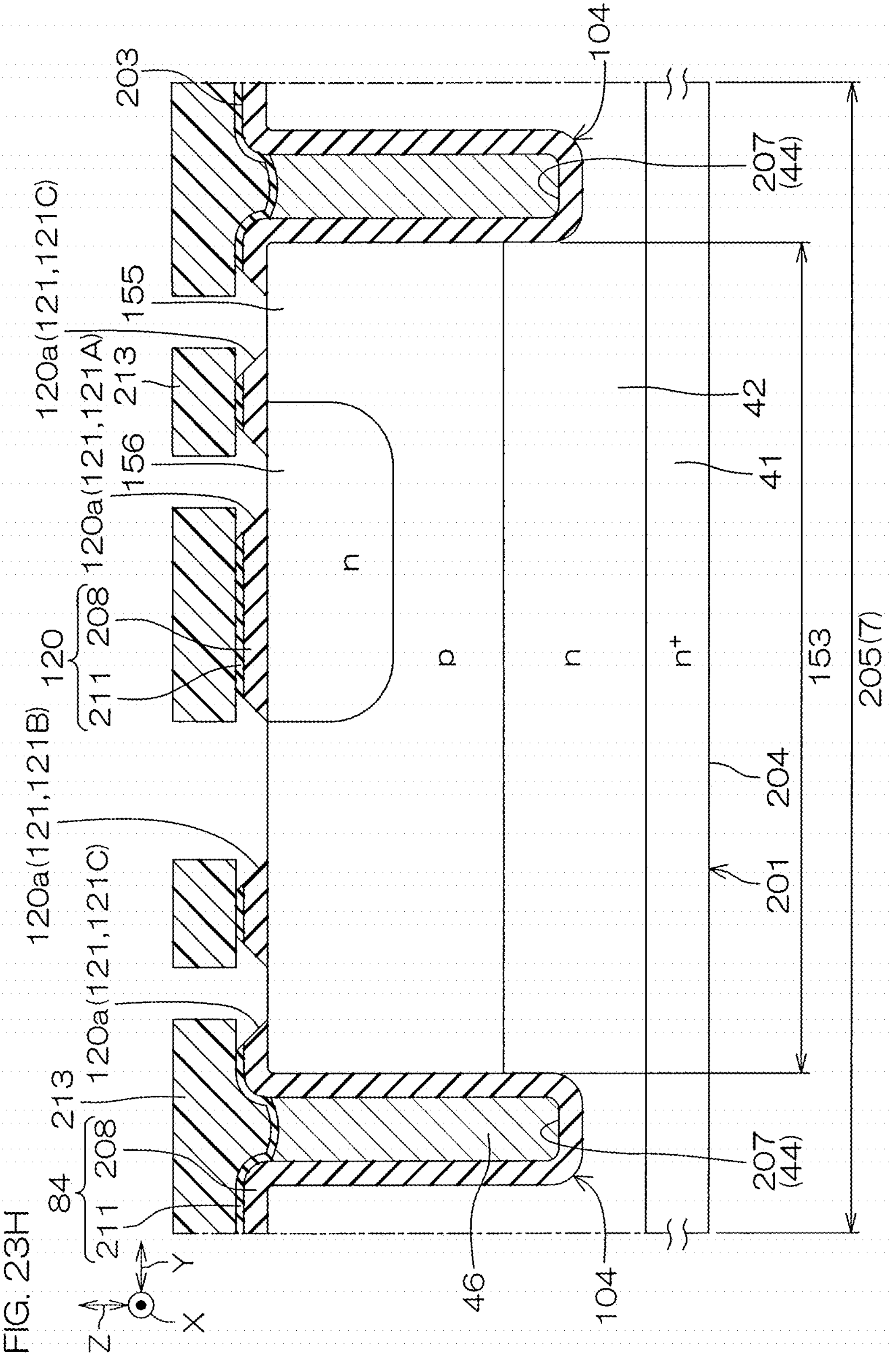
FIG. 23H is a cross-sectional view for describing a step subsequent to that of FIG. 23G.

Next, with reference to FIG. 22H and FIG. 23H, a second resist mask 213 having a predetermined pattern is formed on the second base insulating film 211. Specifically, in the laminated insulating film 212 (second base insulating film 211), the second resist mask 213 covers regions in which the first to third field insulating films 80, 120, 170 are to be formed, a region in which the outer field insulating film 84 is to be formed, regions in which the separation electrodes 46 are to be formed and regions in which the contact electrodes 74 are to be formed, and exposes regions in which the lower insulating films 55 are to be formed (that is, a part of the gate trench 53).

Next, an unnecessary portion of the laminated insulating film 212 is removed by an etching method via the second resist mask 213. In this step, the second base insulating film 211 is first removed by an etching method via the second resist mask 213. The second base insulating film 211 is preferably removed by an isotropic wet etching method that uses an acid etchant (for example, hydrofluoric acid). Next, the first base insulating film 208 is removed by an etching method via the second resist mask 213. The first base insulating film 208 is preferably removed by an isotropic wet etching method that uses an acid etchant (for example, hydrofluoric acid). A step of removing the first base insulating film 208 is in particular preferably executed at the same time and under the same conditions as the step of removing the second base insulating film 211.

A speed of removing the first base insulating film 208 is lower than that of removing the second base insulating film 211. Therefore, during the step of removing the first base insulating film 208, the second base insulating film 211 is removed so as to spread in a planar direction of the first wafer main surface 203 earlier than the first base insulating film 208. Thereby, the first base insulating film 208 is increased in area that is exposed from the second base insulating film 211 (second resist mask 213).

As a result, as compared with a case in which no second base insulating film 211 is present, the first base insulating film 208 is increased in the amount of being removed, with the main surface of the first base insulating film 208 given as a starting point. Thereby, the first to third field insulating films 80, 120, 170 that respectively have relatively gentle first to third insulating side walls 80*a*, 120*a*, 170*a* are formed on the first wafer main surface 203. Also, the lower insulating films 55 are, thereby, formed on the inner walls of the gate trenches 53. The second resist mask 213 is removed thereafter.

Figure 23I:
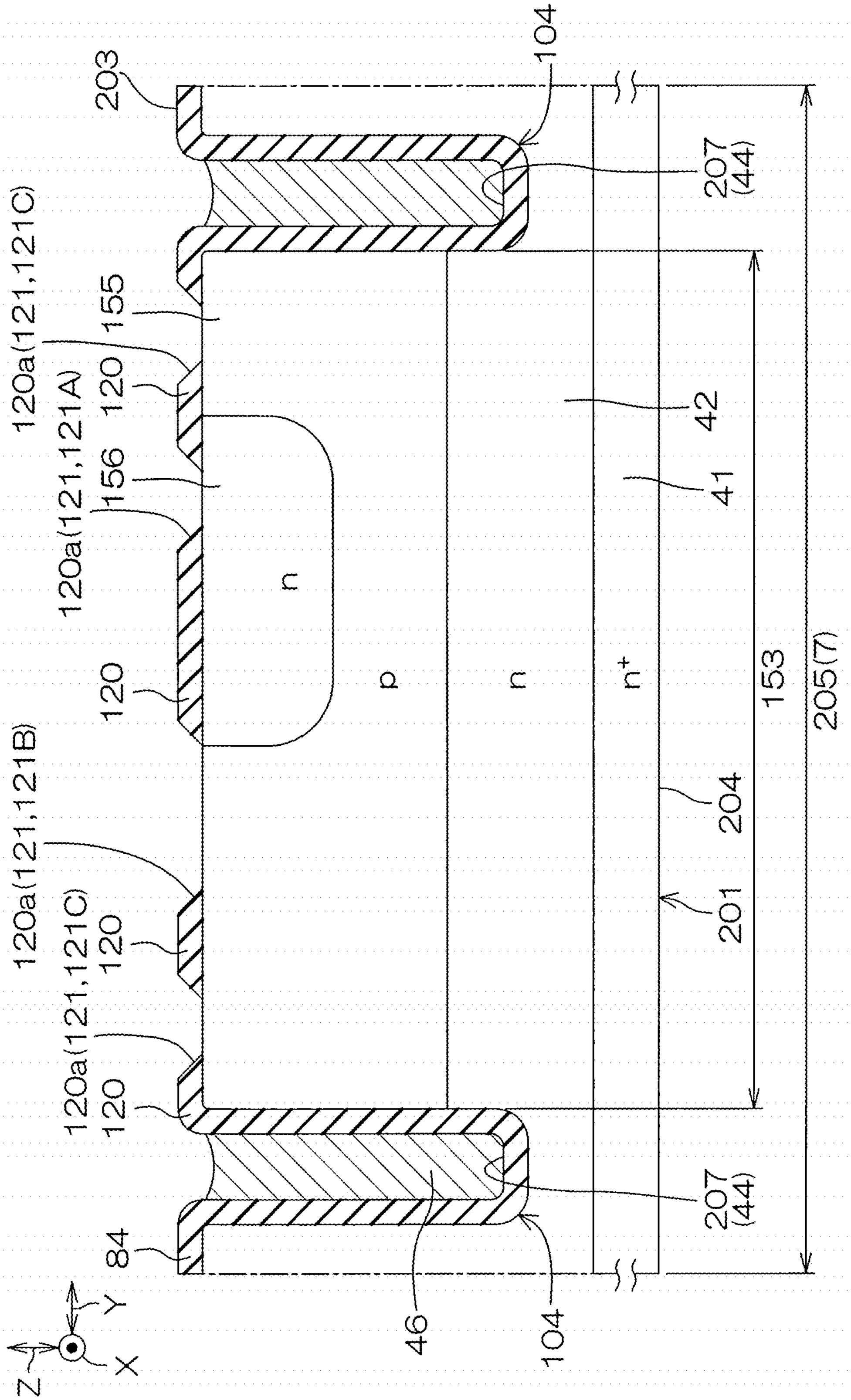
FIG. 23I is a cross-sectional view for describing a step subsequent to that of FIG. 23H.

Next, with reference to FIG. 22I and FIG. 23I, the second base insulating film 211 is removed. In actuality, the second base insulating film 211 is removed at an arbitrary timing after the step of forming the first to third field insulating films 80, 120, 170. The second base insulating film 211 may be spontaneously removed by a chemical liquid that is used in the step of peeling the second resist mask 213 or in partially removing other structures (for example, a structure on the control IC 11 side) or by a chemical liquid or the like that is used in a step of cleaning the semiconductor wafer 201. In this case, the thickness of the second base insulating film 211 is preferably set in advance at a value such that the film can be removed spontaneously and completely.

The second base insulating film 211 suppresses thinning of the first to third field insulating films 80, 120, 170, etc., resulting from the chemical liquid. As a matter of course, the second base insulating film 211 may partially remain as a part of the first to third field insulating films 80, 120, 170. That is, the first to third field insulating films 80, 120, 170 may each have a laminated structure that includes a first insulating film (silicon oxide film) and a second insulating film (TEOS film) having a physical property different from the first insulating film.

Figure 23J:
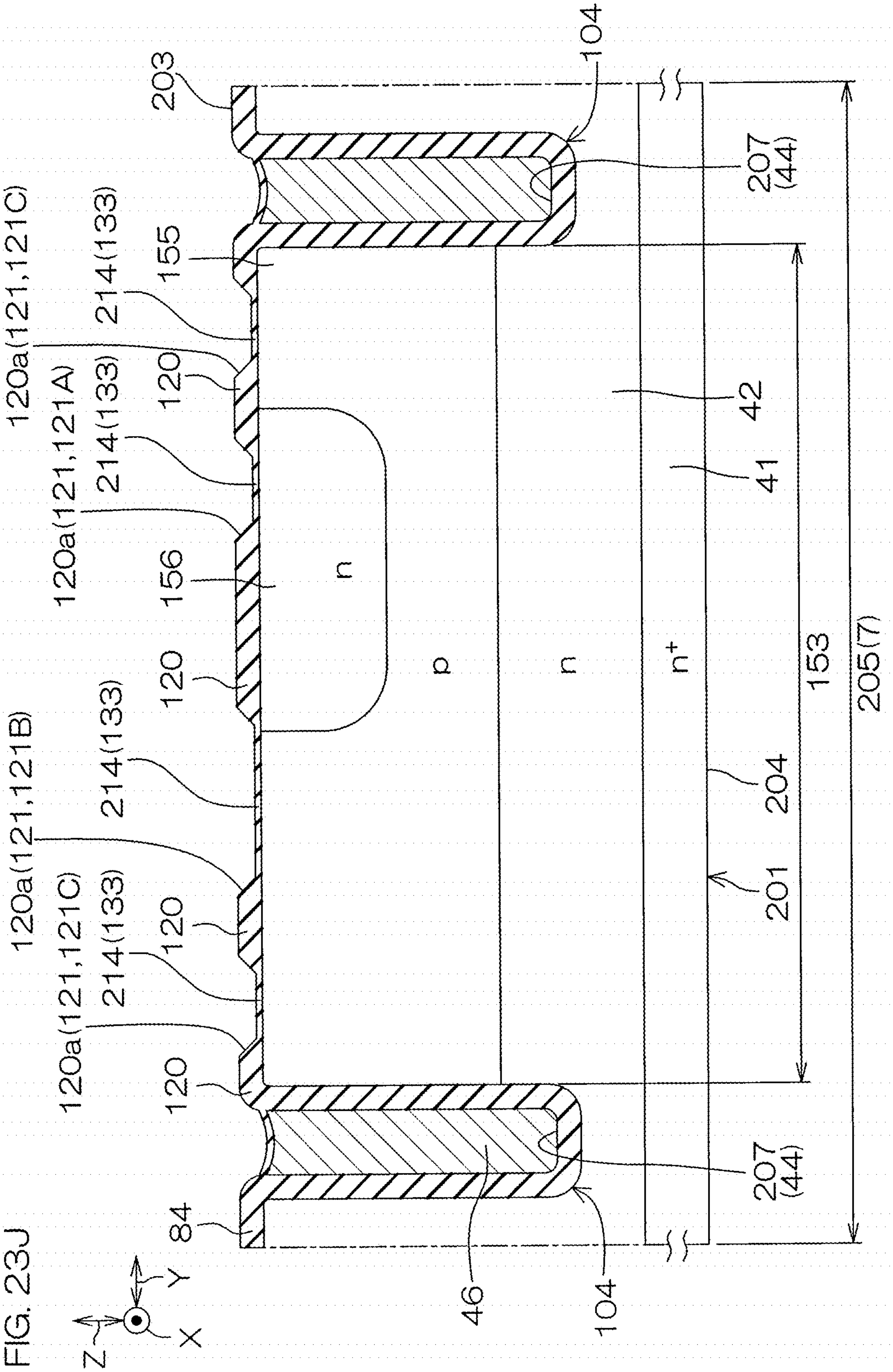
FIG. 23J is a cross-sectional view for describing a step subsequent to that of FIG. 23I.

Next, with reference to FIG. 22J and FIG. 23J, a third base insulating film 214 is formed on the first wafer main surface 203, the separation electrodes 46, the lower electrodes 57 and the inner wall of the gate trenches 53. The third base insulating film 214 serves as a base of the upper insulating films 54, the intermediate insulating films 58, and the first to third main surface insulating films 83, 133, 183. In this embodiment, the second base insulating film 211 is constituted of a silicon oxide film. The third base insulating film 214 may be formed by an oxidation treatment method (for example, thermal oxidation treatment method) and/or a CVD method. In this embodiment, the third base insulating film 214 is formed by a thermal oxidation treatment method. Thereby, the upper insulating films 54, the intermediate insulating films 58, and the first to third main surface insulating films 83, 133, 183 are formed.

In the oxidation treatment method, oxidation of the first wafer main surface 203 progresses in the thickness direction of the semiconductor wafer 201. Thereby, the first to third hidden surfaces 81, 131, 181 that are hidden by the first to third field insulating films 80, 120, 170 and the first to third exposed surfaces 82, 132, 182 that are depressed in the thickness direction of the semiconductor wafer 201 with respect to the first third hidden surfaces 81, 131, 181 are formed in the first wafer main surface 203 (also refer to FIG. 14A, FIG. 14B, FIG. 19 and FIG. 21). The first to third exposed surfaces 82, 132, 182 are also portions that are hidden by the first to third main surface insulating films 83, 133, 183 in the first wafer main surface 203.

Figure 23K:
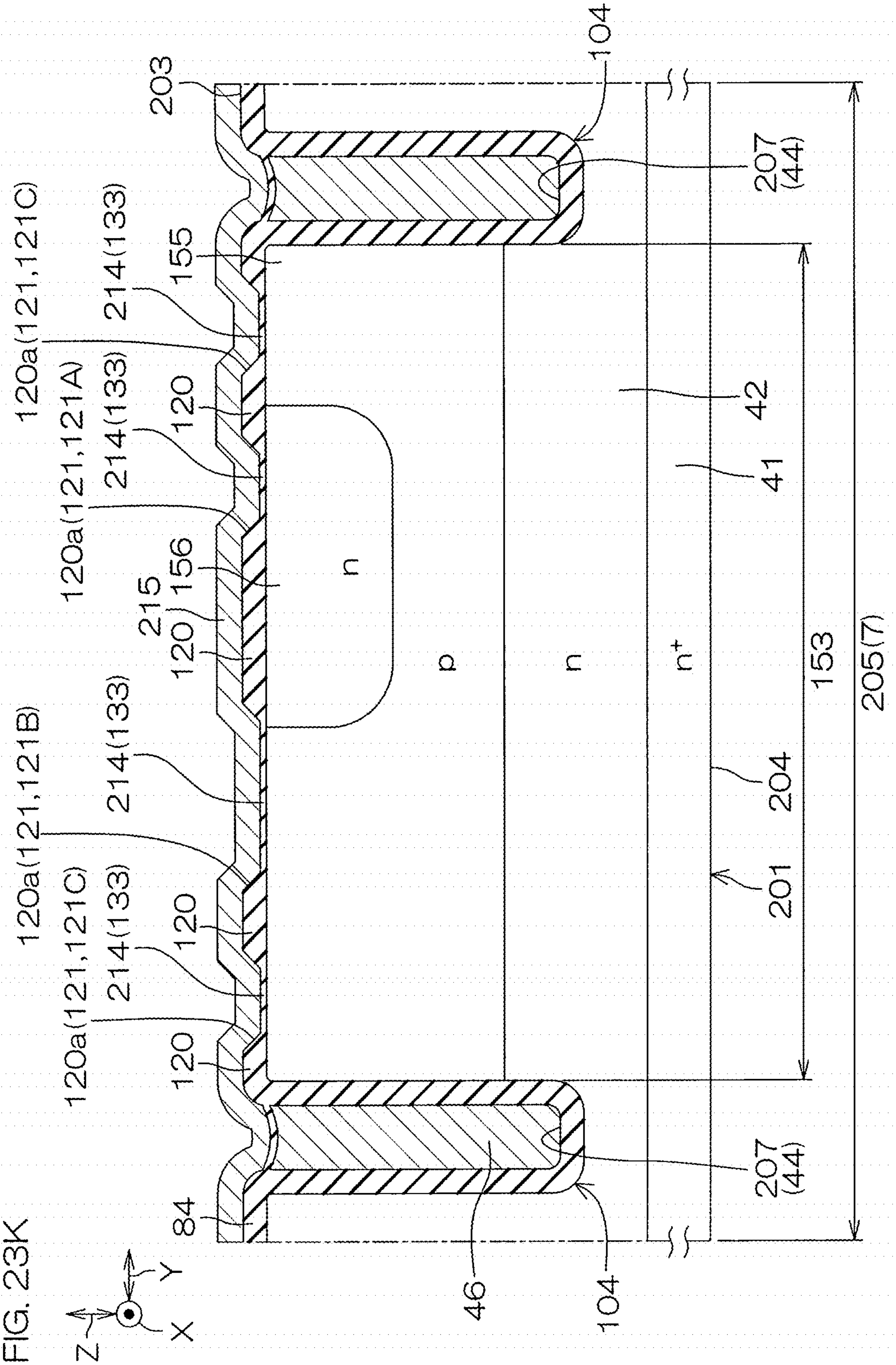
FIG. 23K is a cross-sectional view for describing a step subsequent to that of FIG. 23J.

Next, with reference to FIG. 22K and FIG. 23K, a second base electrode film 215 is formed on the first wafer main surface 203. The second base electrode film 215 buries the plurality of gate trenches 53 across the upper insulating films 54 and the intermediate insulating films 58 and covers the first wafer main surface 203 across the first to third field insulating films 80, 120, 170 and the first to third main surface insulating films 83, 133, 183. The second base electrode film 215 serves as a base of the upper electrodes 56, the first gate electrode 134, and the second gate electrode 184. In this embodiment, the second base insulating film 211 is constituted of conductive polysilicon. The second base electrode film 215 may be formed by a CVD method.

Figure 23L:
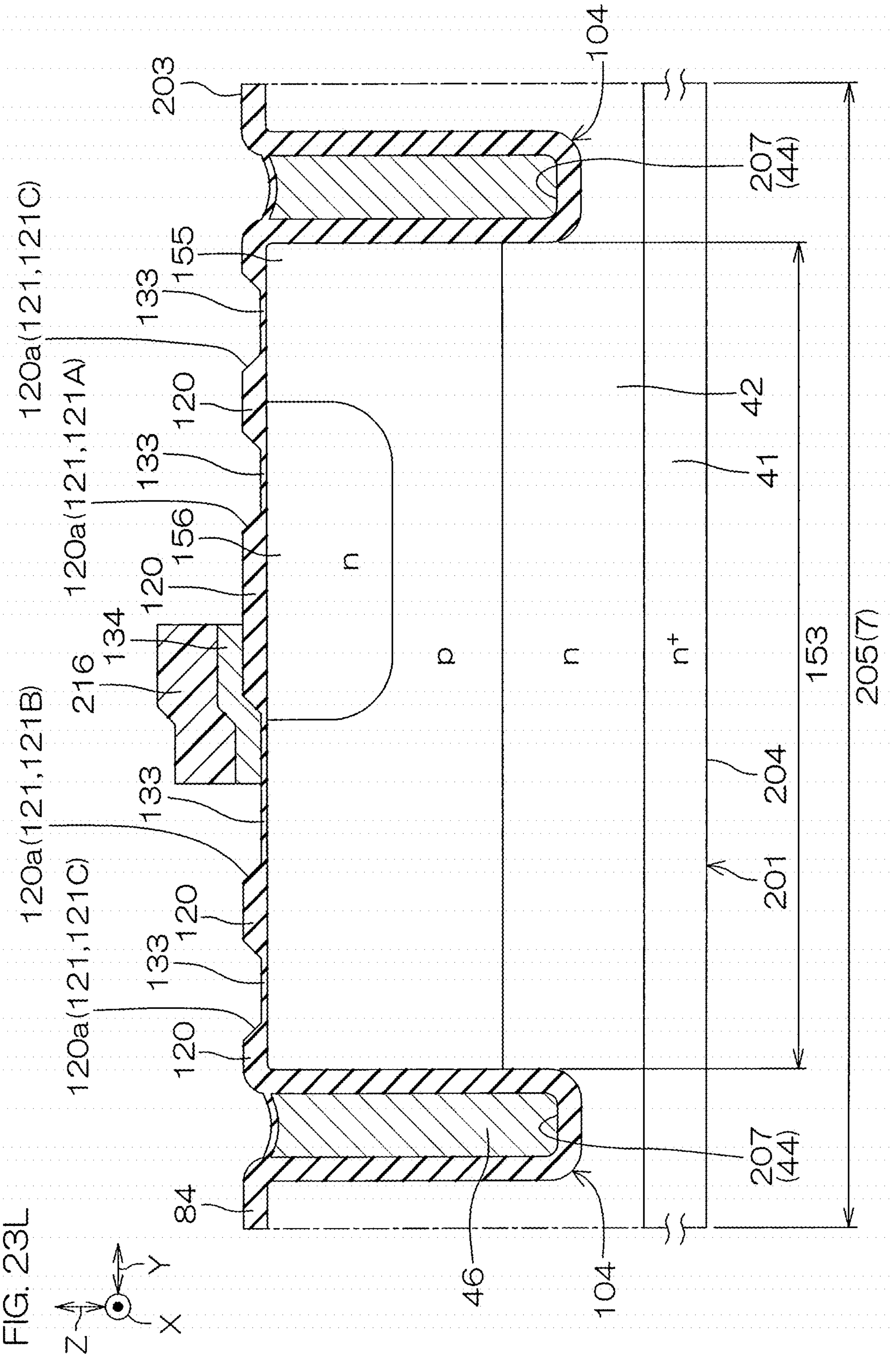
FIG. 23L is a cross-sectional view for describing a step subsequent to that of FIG. 23K.

Next, with reference to FIG. 22L and FIG. 23L, a third resist mask 216 having a predetermined pattern is formed on the second base electrode film 215. The third resist mask 216 covers regions in which the first gate electrode 134 and the second gate electrode 184 are to be formed and exposes the other regions. Next, an unnecessary portion of the second base electrode film 215 is removed by an etching method via the third resist mask 216 until the first to third field insulating films 80, 120, 170 and the first to third main surface insulating films 83, 133, 183 are exposed. The etching method may be a wet etching method and/or a dry etching method. Thereby, the upper electrodes 56, the first gate electrode 134, and the second gate electrode 184 are formed.

The first to third field insulating films 80, 120, 170 respectively have the relatively gentle first to third insulating side walls 80*a*, 120*a*, 170*a*. Therefore, in this step, residue (residual materials) of the second base electrode film 215 is suppressed from remaining in a state of adhering to the first to third insulating side walls 80*a*, 120*a*, 170*a*. It is, thereby, possible to suppress a change in electrical characteristics resulting from the residue. It is also possible to omit a step of removing the residue of the second base electrode film 215 after the step of removing the second base electrode film 215. That is, it is possible to omit an over-etching step of the second base electrode film 215. Thereby, it is possible to suppress thinning of the first to third field insulating films 80, 120, 170 and the first to third main surface insulating films 83, 133, 183, etc.

Figure 23M:
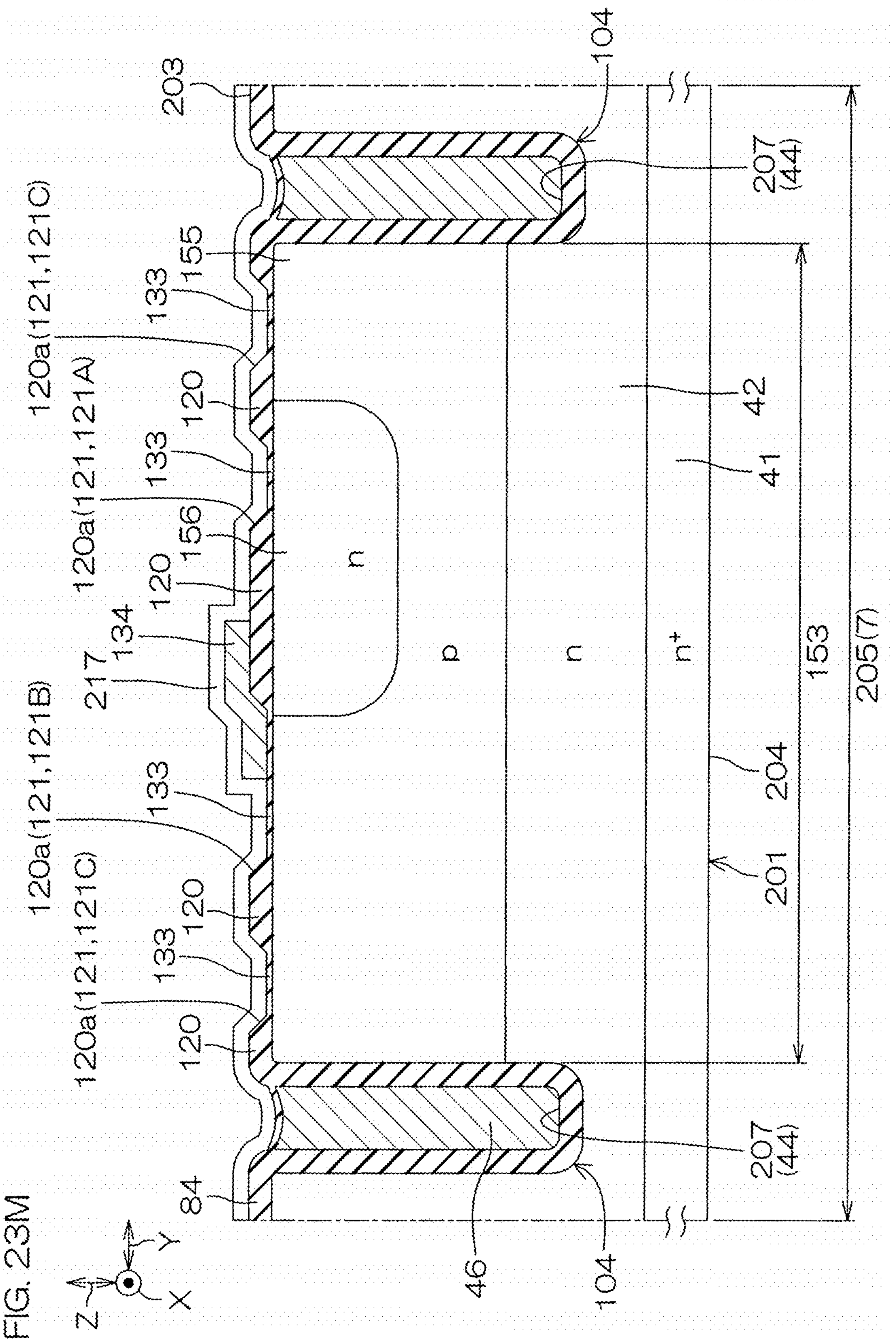
FIG. 23M is a cross-sectional view for describing a step subsequent to that of FIG. 23L.

Next, with reference to FIG. 22M and FIG. 23M, a fourth base insulating film 217 is formed on the first wafer main surface 203. The fourth base insulating film 217 serves as a base of the first and second side wall structures 136, 186. In this embodiment, the fourth base insulating film 217 is constituted of a silicon nitride film. The fourth base insulating film 217 may be formed by a CVD method.

Figure 23N:
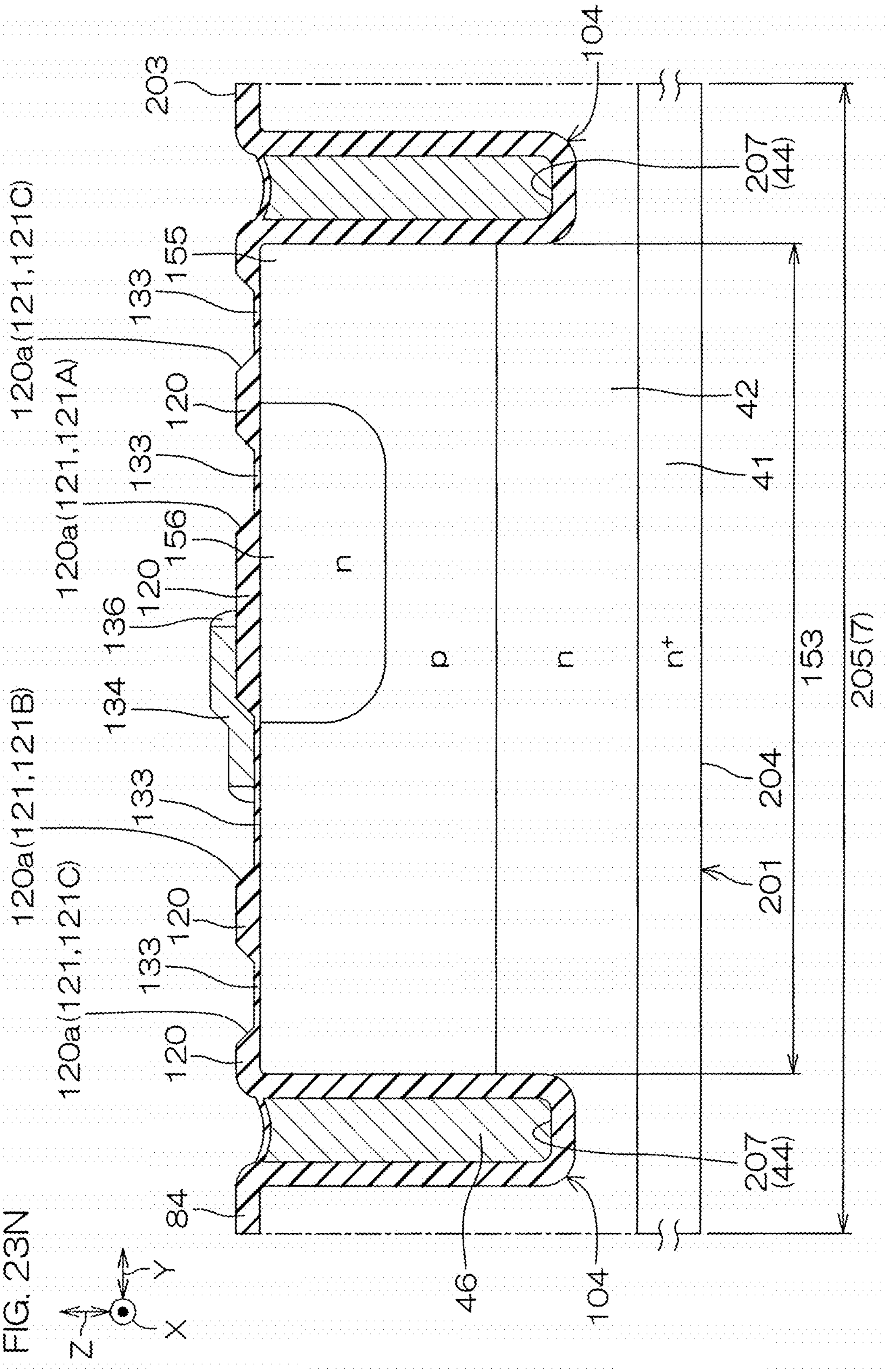
FIG. 23N is a cross-sectional view for describing a step subsequent to that of FIG. 23M.

Next, with reference to FIG. 22N and FIG. 23N, an unnecessary portion of the fourth base insulating film 217 is removed by an etching method. The fourth base insulating film 217 is removed so that parts of the fourth base insulating film 217 are remained on the side walls of the first and second gate electrodes 134, 184. The etching method may be a wet etching method and/or a dry etching method. The etching method is preferably an anisotropic dry etching method. Thereby, the first and second side wall structures 136, 186 are formed in a self-aligning manner with respect to the first and second gate electrodes 134, 184.

The first and second gate electrodes 134, 184 each has a side wall that is steeper in inclined angle than the first to third insulating side walls 80*a*, 120*a*, 170*a* of the first to third field insulating films 80, 120, 170. Therefore, although a part of the fourth base insulating film 217 remains in a state of adhering to the side walls of the first and second gate electrodes 134, 184, in this step, a part of the fourth base insulating film 217 is suppressed from remaining in a state of adhering to the first to third insulating side walls 80*a*, 120*a*, 170*a*.

Therefore, it is possible to omit a step of removing the residue of the fourth base insulating film 217 after the step of removing the fourth base insulating film 217. That is, it is possible to omit an over-etching step of the fourth base insulating film 217. Thereby, it is possible to form the first and second side wall structures 136, 186 and also possible to suppress thinning of the first to third field insulating films 80, 120, 170 and the first to third main surface insulating films 83, 133, 183, etc.

Figure 23O:
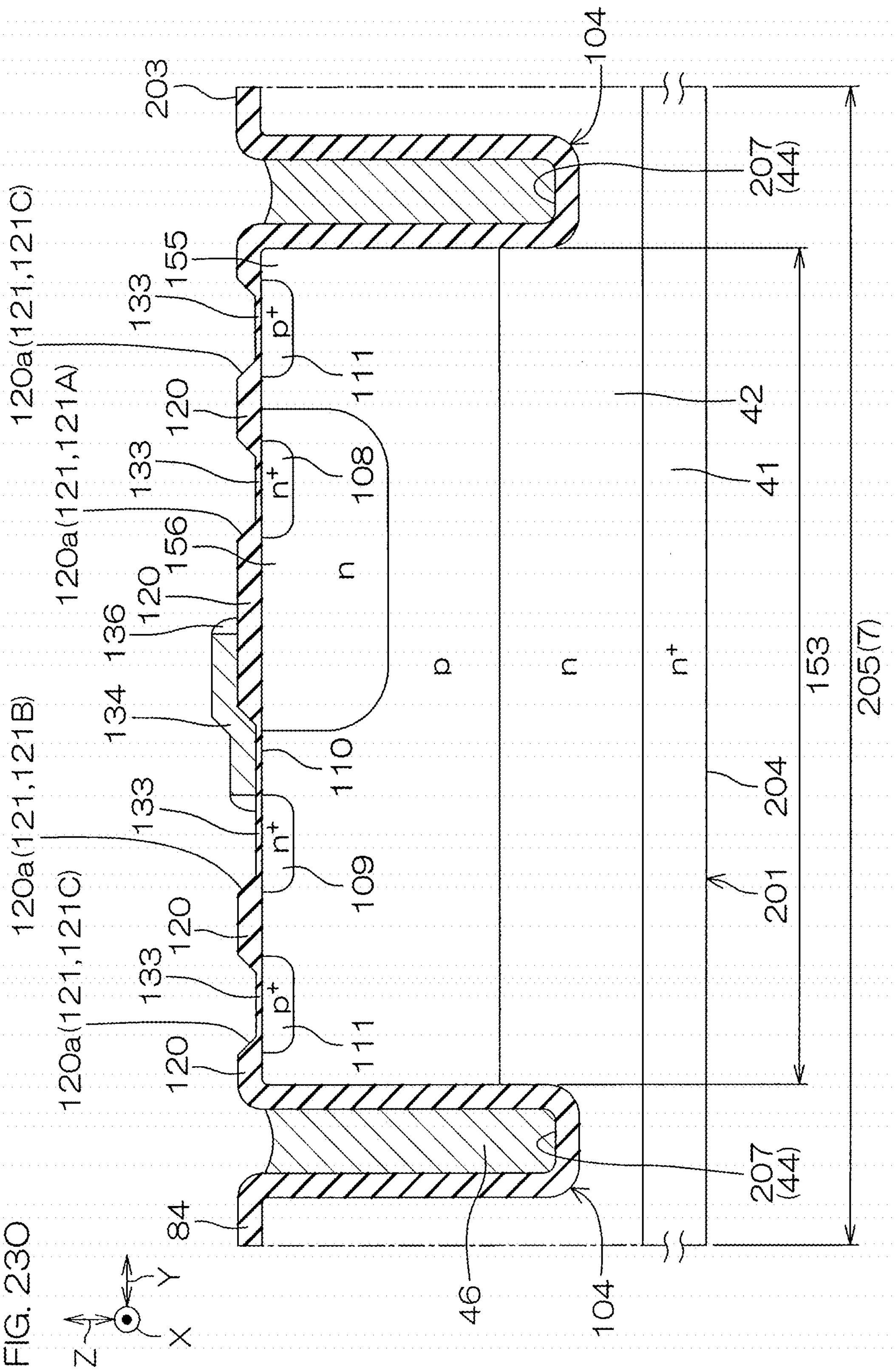
FIG. 23O is a cross-sectional view for describing a step subsequent to that of FIG. 23N.

Next, with reference to FIG. 22O and FIG. 23O, in the first device region 6, the body region 47, the source region 60 and the contact region 61 are formed in the surface layer portion of the first wafer main surface 203. The body region 47, the source region 60, and the contact region 61 are each formed in the surface layer portion of the first wafer main surface 203 via a side wall of the gate trench 53. Steps of forming the body region 47, the source region 60, and the contact region 61 are executed in an arbitrary order. The body region 47 is formed by introducing a p-type impurity into the first wafer main surface 203 by an ion implantation method via an ion implantation mask (not shown).

The source region 60 is formed by introducing an n-type impurity into the first wafer main surface 203 by an ion implantation method via an ion implantation mask (not shown). The source region 60 is formed so as to be positioned in the surface layer portion of the body region 47. The contact region 61 is formed in the surface layer portion of the first wafer main surface 203. The contact region 61 is formed by introducing a p-type impurity into the first wafer main surface 203 by an ion implantation method via an ion implantation mask (not shown). The contact region 61 is formed so as to be positioned in the surface layer portion of the body region 47.

Also, in the first MIS region 103 of the second device region 7, the first drain region 108, the first source region 109, and the first contact region 111 are formed in the surface layer portion of the first wafer main surface 203. The first drain region 108, the first source region 109 and the first contact region 111 are each formed in the surface layer portion of the first wafer main surface 203 via the second main surface insulating film 133. Steps of forming the first drain region 108, the first source region 109 and the first contact region 111 are executed in an arbitrary order. In this embodiment, the first drain region 108 and the first source region 109 are formed at the same time.

The first drain region 108 and the first source region 109 are formed by introducing an n-type impurity into the first wafer main surface 203 by an ion implantation method via an ion implantation mask (not shown). The first drain region 108 is formed so as to be positioned in the surface layer portion of the first drift region 107. The first source region 109 is formed so as to be positioned in the surface layer portion of the first well region 105. The first contact region 111 is formed by introducing a p-type impurity into the first wafer main surface 203 according to an ion implantation method via an ion implantation mask (not shown). The first contact region 111 is formed in the surface layer portion of the first well region 105.

Also, in the second MIS region 153 of the second device region 7, the second drain region 158, the second source region 159 and the second contact region 161 are formed in the surface layer portion of the first wafer main surface 203. The second drain region 158, the second source region 159 and the second contact region 161 are each formed in the surface layer portion of the first wafer main surface 203 via the third main surface insulating film 183. Steps of forming the second drain region 158, the second source region 159 and the second contact region 161 are executed in an arbitrary order. In this embodiment, the second drain region 158 and the second source region 159 are formed at the same time.

The second drain region 158 and the second source region 159 are formed by introducing a p-type impurity into the first wafer main surface 203 according to an ion implantation method via an ion implantation mask (not shown). The second drain region 158 is formed so as to be positioned in the surface layer portion of the second drift region 157. The second source region 159 is formed so as to be positioned in the surface layer portion of the third well region 156. The second contact region 161 is formed by introducing a p-type impurity into the first wafer main surface 203 according to an ion implantation method via an ion implantation mask (not shown). The second contact region 161 is formed in the surface layer portion of the second well region 155.

In these steps, an n-type impurity and a p-type impurity can be introduced into the first wafer main surface 203 in a structure that suppresses residue from adhering to the first to third insulating side walls 80*a*, 120*a*, 170*a* of the first to third field insulating film 80, 120, 170. It is, therefore, possible to suppress the residue from hindering introduction of the n-type impurity and the p-type impurity. Thereby, the n-type impurity and the p-type impurity can be appropriately introduced into the first wafer main surface 203.

Figure 23P:
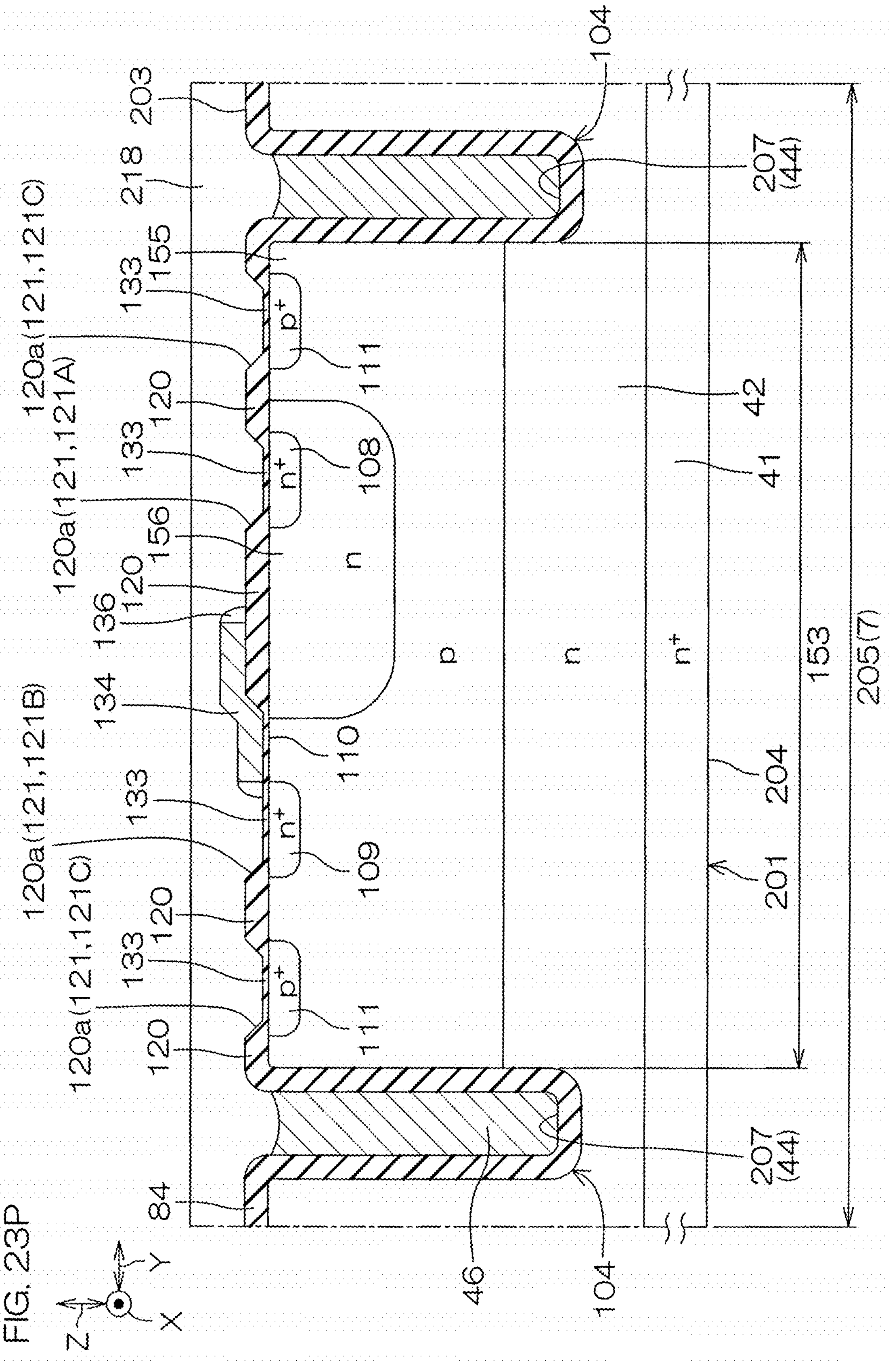
FIG. 23P is a cross-sectional view for describing a step subsequent to that of FIG. 23O.

Next, with reference to FIG. 22P and FIG. 23P, a lowermost insulating film 218 is formed on the first wafer main surface 203. The lowermost insulating film 218 forms the lowest layer of the interlayer insulating layer 13. The lowermost insulating film 218 may include at least one of a silicon oxide film and a silicon nitride film. The lowermost insulating film 218 may be formed by a CVD method.

Figure 23Q:
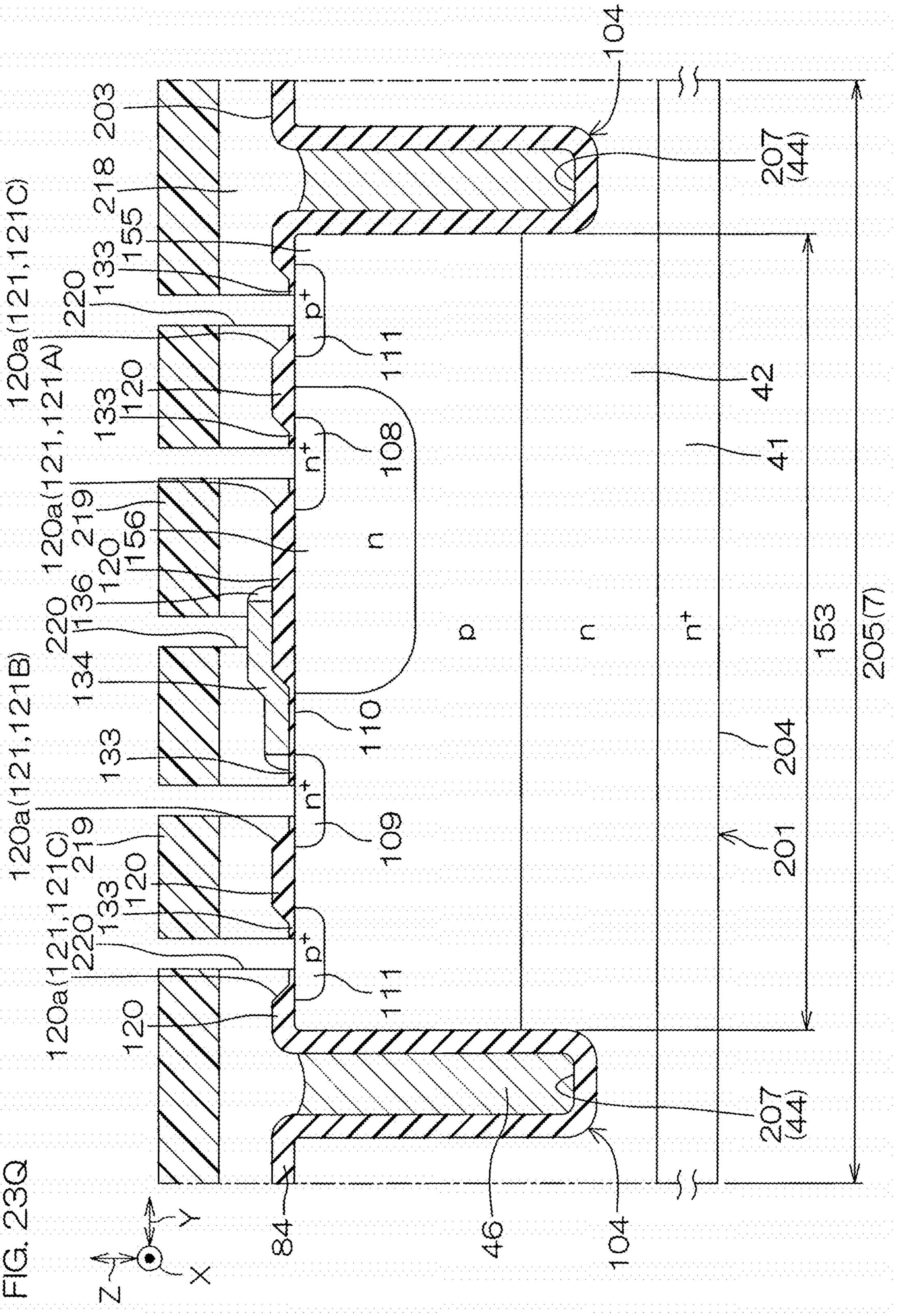
FIG. 23Q is a cross-sectional view for describing a step subsequent to that of FIG. 23P.

Next, with reference to FIG. 22Q and FIG. 23Q, a fourth resist mask 219 having a predetermined pattern is formed on the lowermost insulating film 218. The fourth resist mask 219 individually exposes regions of the lowermost insulating film 218 in which a plurality of plug openings 220 for the plurality of plug electrodes 91 to 95, 141 to 145, 191 to 195 are to be formed and covers the other regions.

Next, an unnecessary portion of the lowermost insulating film 218 is removed by an etching method. The etching method may be a wet etching method and/or a dry etching method. The etching method is preferably an anisotropic dry etching method. Thereby, the plurality of plug openings 220 are formed in the lowermost insulating film 218. The fourth resist mask 219 is removed thereafter.

Figure 23R:
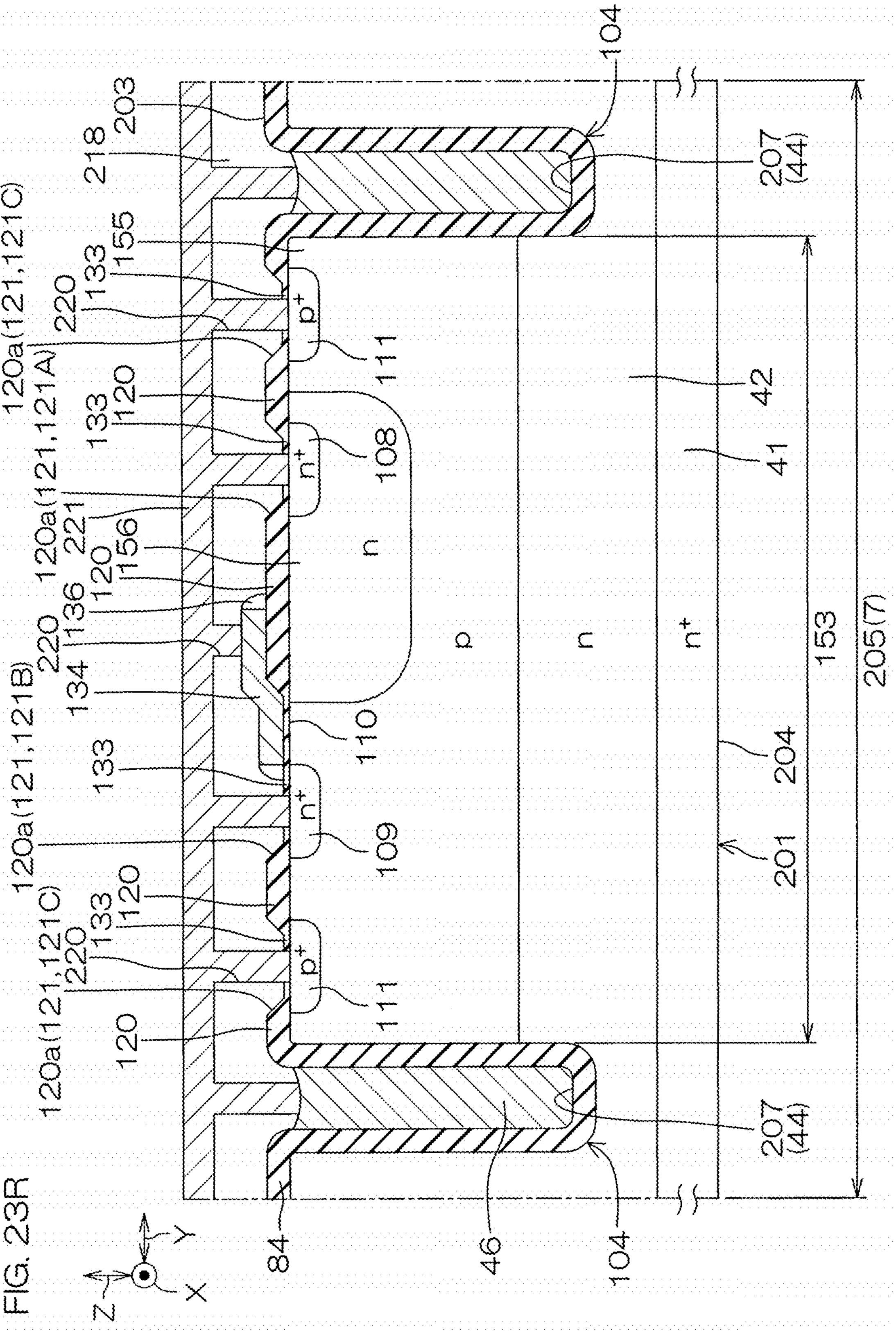
FIG. 23R is a cross-sectional view for describing a step subsequent to that of FIG. 23Q.

Next, with reference to FIG. 22R and FIG. 23R, a fourth base electrode film 221 is formed on the lowermost insulating film 218. The fourth base electrode film 221 buries the plurality of plug openings 220 and covers the lowermost insulating film 218. The fourth base electrode film 221 may have a laminated structure that includes a titanium-based metal film and a tungsten film. The fourth base electrode film 221 may be formed by a sputtering method and/or a CVD method.

Figure 23S:
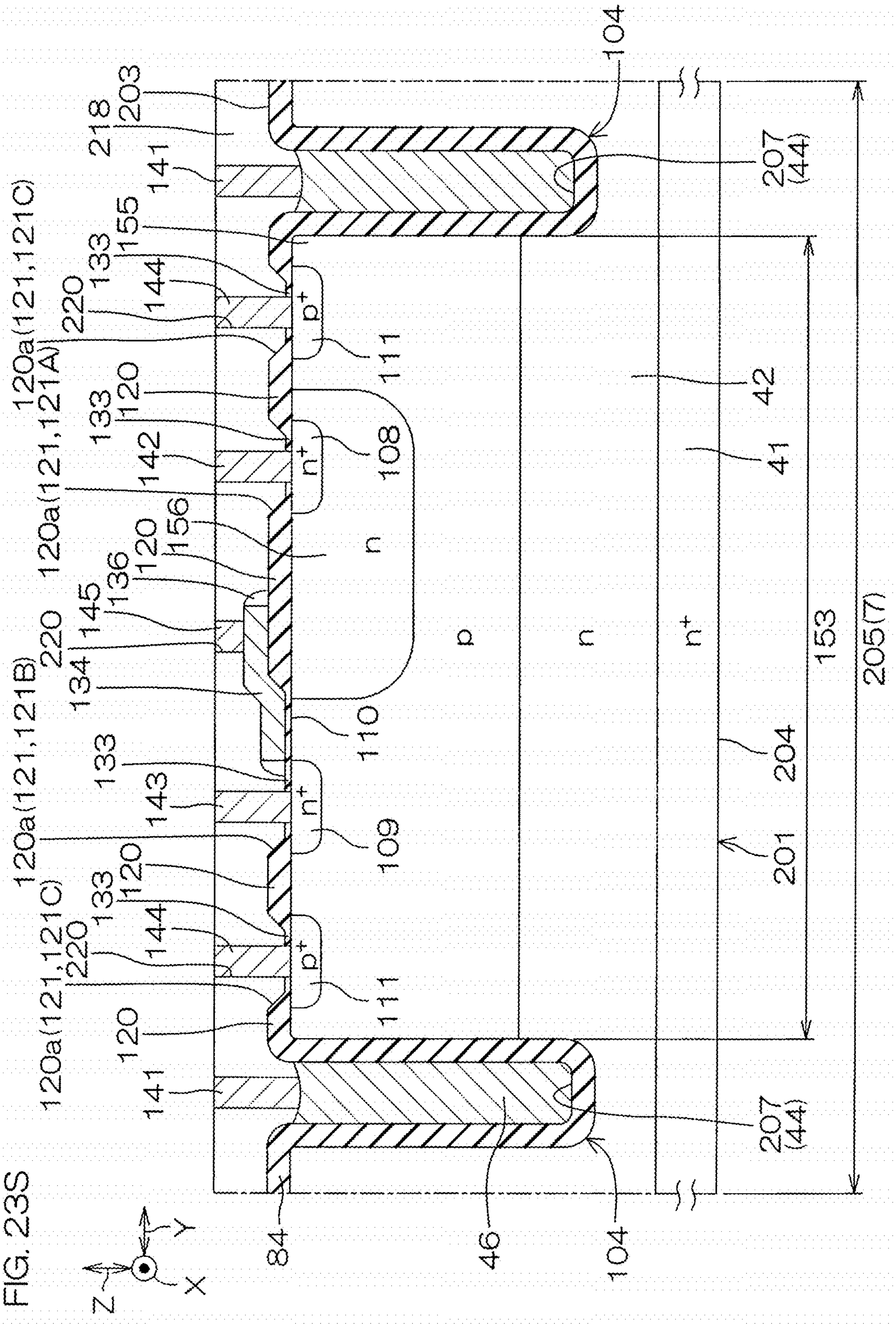
FIG. 23S is a cross-sectional view for describing a step subsequent to that of FIG. 23R.

Next, with reference to FIG. 22S and FIG. 23S, an unnecessary portion of the fourth base electrode film 221 is removed by an etching method. The fourth base electrode film 221 is removed until the lowermost insulating film 218 is exposed. The etching method may be a wet etching method and/or a dry etching method. Thereby, the plurality of plug electrodes 91 to 95, 141 to 145, 191 to 195 are buried in the lowermost insulating film 218.

Figure 23T:
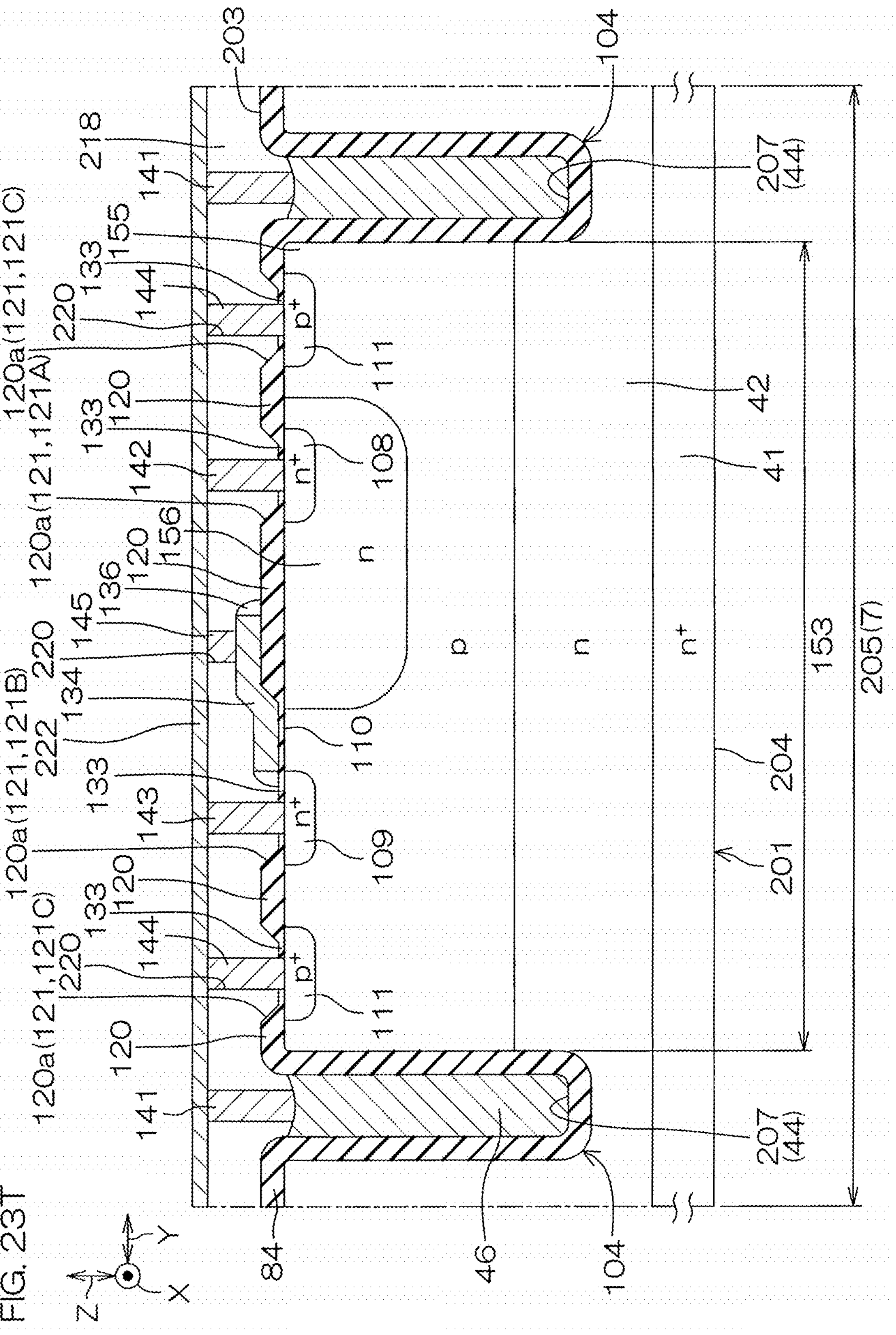
FIG. 23T is a cross-sectional view for describing a step subsequent to that of FIG. 23S.
Figure 23U:
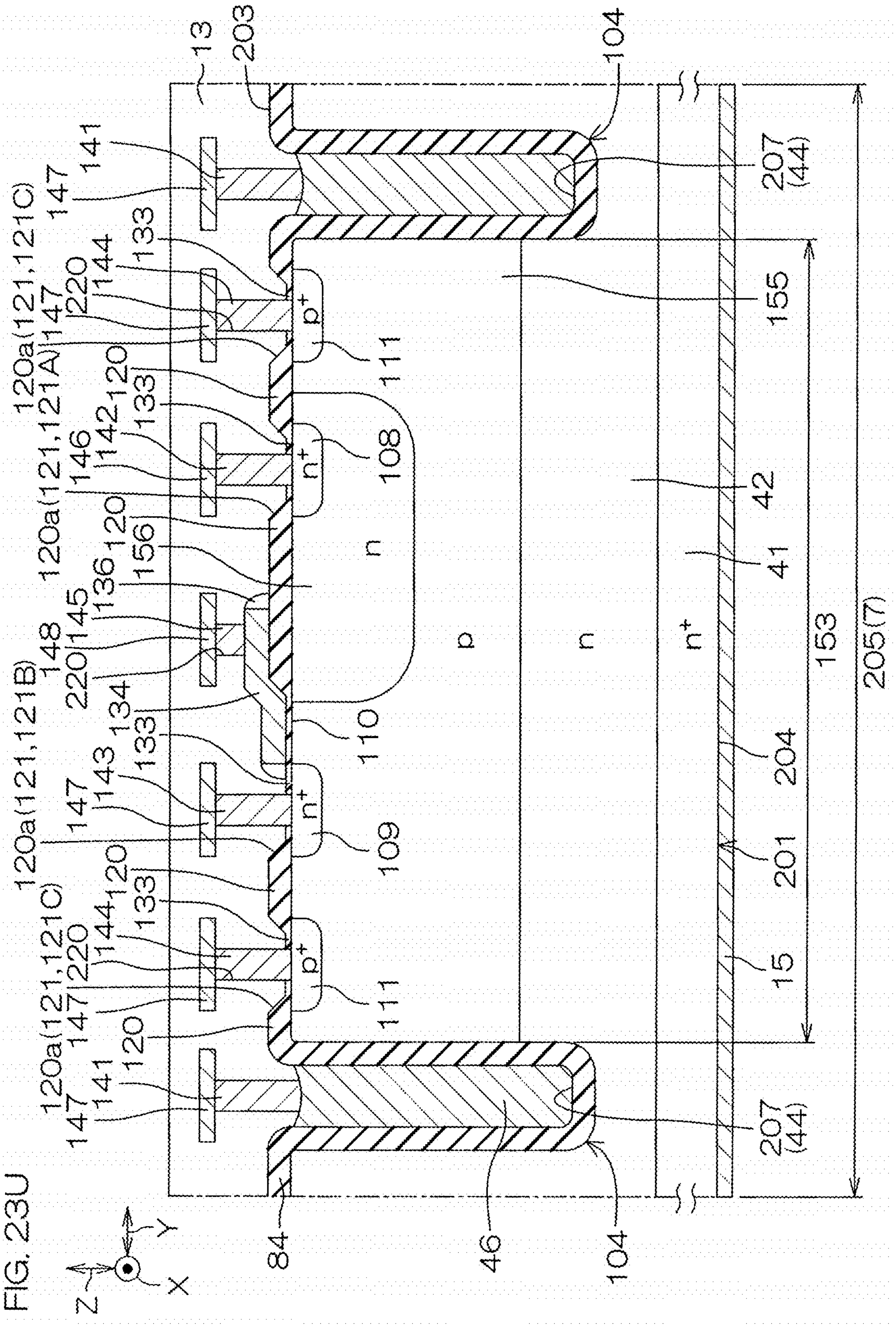
FIG. 23U is a cross-sectional view for describing a step subsequent to that of FIG. 23T.

Next, with reference to FIG. 22T and FIG. 23T, a fifth base electrode film 222 is formed on the lowermost insulating film 218. The fifth base electrode film 222 serves as a base of a wiring layer that forms a part of a multilayer wiring. In this embodiment, the fifth base electrode film 222 serves as a base of the gate wiring 14, the source wiring 96, the first drain wiring 146, the first source wiring 147, the first gate wiring 148, the second drain wiring 196, the second source wiring 197 and the second gate wiring 198. The fifth base electrode film 222 may include at least one among an Al layer, a Cu layer, an AlCu alloy layer, an AlSiCu alloy layer, and an AlSi alloy layer. The fifth base electrode film 222 may be formed by a sputtering method and/or a CVD method.

Next, with reference to FIG. 22U and FIG. 23U, an unnecessary portion of the fifth base electrode film 222 is removed by an etching method via a resist mask (not shown). An unnecessary portion of the fifth base electrode film 222 is removed until the lowermost insulating film 218 is exposed. The etching method may be a wet etching method and/or a dry etching method. Thereby, the gate wiring 14, the source wiring 96, the first drain wiring 146, the first source wiring 147, the first gate wiring 148, the second drain wiring 196, the second source wiring 197, and the second gate wiring 198 are formed.

Next, a remaining portion of the interlayer insulating layer 13 is formed on the lowermost insulating film 218. The remaining portion of the interlayer insulating layer 13 may include at least one of a silicon oxide film and a silicon nitride film. As with the lowermost insulating film 218, the remaining portion of the interlayer insulating layer 13 may be formed by a CVD method. A wiring layer that forms a part of the multilayer wiring during a step of forming the remaining portion of the interlayer insulating layer 13 may be formed after going through a step similar to that of the fifth base electrode film 222.

Next, a sixth base electrode film (not shown) is formed on the interlayer insulating layer 13. The sixth base electrode film serves as a base of the plurality of terminal electrodes 16 to 20. The sixth base electrode film may include at least one among a pure Al layer, a pure Cu layer, an AlCu alloy layer, an AlSiCu alloy layer and an AlSi alloy layer. The sixth base electrode film may be formed by a sputtering method and/or a CVD method. Next, an unnecessary portion of the sixth base electrode film is removed by an etching method via a resist mask (not shown). Thereby, the plurality of terminal electrodes 16 to 20 are formed.

Next, a drain terminal 15 is formed on the second wafer main surface 204. The drain terminal 15 covers an entire area of the second wafer main surface 204. The drain terminal 15 may include at least one among a Ti layer, an Ni layer, an Au layer, an Ag layer and an Al layer. The drain terminal 15 may be formed by a sputtering method, a vapor deposition method and/or a plating method. Prior to a step of forming the drain terminal 15, a step of thinning the semiconductor wafer 201 may be executed. In this case, the semiconductor wafer 201 may be thinned by grinding the second wafer main surface 204. The second wafer main surface 204 may be ground by a CMP (Chemical Mechanical Polishing) method.

Thereafter, the semiconductor wafer 201 is cut along the plurality of device forming regions 205. Thereby, the plurality of semiconductor devices 1 are cut out from one sheet of the semiconductor wafer 201. After the steps that include the above description, the semiconductor device 1 is manufactured.

As described so far, the semiconductor device 1 includes the semiconductor chip 2 and the n-system (n≥2) power transistor 8. The n-system power transistor 8 includes the n-number (n≥2) of system transistors 9 which are each formed in the semiconductor chip 2 so as to be individually controlled and generates the single output current IOUT (output signal) by a selective control of the n-number of the system transistors 9.

Specifically, the n-system power transistor 8 is constituted of the parallel circuit of the n-number of the system transistors 9 that are connected in parallel so that the n-number of gate signals G are to be input individually. The n-number of the system transistors 9 each generates the electrical signal for each system in response to the gate signal G. The n-system power transistor 8 generates the single output current IOUT made up of an additional value of the n-number of electrical signals that are generated by the n-number of the system transistors 9.

The n-system power transistor 8 changes in channel utilization rate and on-resistance Ron with the selective control of the n-number of the system transistors 9. Thereby, the power transistor 8 can be controlled in the plural operational modes each of which is made up of the different on-resistance Ron. It is thus possible to provide the semiconductor device 1 that can be changed in on-resistance. This semiconductor device 1 is able to drive and control the power transistor 8 by an appropriate on-resistance Ron in accordance with an operational situation.

The power transistor 8 may be controlled in at least two types of operation modes by the selectively controlling at least two system transistors 9. The power transistor 8 is preferably controlled in at least three types of operation modes by selectively controlling at least three system transistors 9.

The semiconductor device 1 includes the first device region 6 that is demarcated into the semiconductor chip 2. The power transistor 8 has the n-number of the system transistors 9 that are collectively formed in the first device region 6. According to this structure, the n-number of the system transistors 9 are not required to be discretely arranged in the semiconductor chip 2, and a wiring distance can thereby be shortened and thus a wiring resistance is reduced. Thereby, a variation in switching speed of the n-number of the system transistors 9 can be suppressed to appropriately drive and control the power transistor 8.

Preferably, the n-number of the system transistors 9 each include one or the plurality of unit transistors 10 that are systematized as an individually controlled object. According to this structure, the unit transistors 10 are adjusted for the number thereof and the channel ratio RC, thus making it possible to adjust the channel utilization rate and on-resistance characteristics for each system transistor 9. Thereby, it is possible to appropriately adjust the on-resistance characteristics of the power transistor 8.

Each of the unit transistors 10 may have the trench gate structure 51. The trench gate structure 51 may have the multiple electrode structure that includes the upper electrode 56 and the lower electrode 57 that are embedded in the gate trench 53 so as to be insulated and separated in an up/down direction by the insulator (upper insulating film 54, lower insulating film 55 and intermediate insulating film 58). In this structure, the lower electrode 57 is preferably to be fixed at the same potential as the upper electrode 56.

According to this structure, it is possible to suppress the voltage drop between the upper electrode 56 and the lower electrode 57 and also to suppress the electric field concentration between the upper electrode 56 and the lower electrode 57. Also, the on-resistance Ron of the semiconductor chip 2 (in particular, second semiconductor region 42) can be reduced. This structure is effective in the case that the semiconductor device 1 is provided as the in-vehicle device.

The semiconductor device 1 includes the second device region 7 that is demarcated in the region of the semiconductor chip 2 different from the first device region 6, and the control IC 11 that is formed in the second device region 7. The semiconductor device 1 includes the n-number of gate wirings 14 that are formed on the semiconductor chip 2 so as to be electrically connected to the power transistor 8 and the control IC 11.

The control IC 11 generates the n-number of gate signals G that individually control the n-number of the system transistors 9 and outputs the n-number of gate signals G to the n-number of the gate wirings 14. The n-number of the gate wirings 14 individually transmit the n-number of the gate signals G that are generated by the control IC 11 to the n-number of the system transistors 9. According to this structure, it is possible to provide the semiconductor device 1 having the IPD that integrally includes the power transistor 8 and the control IC 11.

The semiconductor device 1 includes the semiconductor chip 2, and the first field insulating film 80. The first field insulating film 80 partially covers the first main surface 3 of the semiconductor chip 2 and has the first insulating side wall 80*a* in which the first inclined angle θ1 made with the first main surface 3 is not less than 20° and not more than 40°. According to this structure, it is possible to suppress residue from remaining in a state of adhering to the first insulating side wall 80*a*.

Also, according to the first insulating side wall 80*a* having the relatively gentle first inclined angle θ1, for example, a step of removing residue can be omitted or the step of removing residue can be time-shortened. Therefore, it is possible to suppress thinning of a structure (for example, the first field insulating film 80) other than the residue resulting from the step of removing the residue. Therefore, it is possible to suppress a deterioration in reliability of the semiconductor device 1 resulting from the residue.

The first inclined angle θ1 is preferably less than 40° (θ1<40°). The first inclined angle θ1 in particular preferably falls within the range of 30°±6° (24°≤θ1≤36°). The first inclined angle θ1 typically falls within the range of not less than 28° and not more than 36° (28°≤θ1≤36°). The first field insulating film 80 is preferably made up of the oxide of the semiconductor chip 2.

The semiconductor device 1 includes the first hidden surface 81 that is formed at the portion of the first main surface 3 which is covered by the first field insulating film 80. In this case, the semiconductor device 1 may include the first exposed surface 82 that is formed at the portion of the first main surface 3 that is exposed from the first field insulating film 80 and depressed in the thickness direction of the semiconductor chip 2 from the first hidden surface 81.

The semiconductor device 1 may include the first main surface insulating film 83 that covers the first exposed surface 82. In this case, the first main surface insulating film 83 may have the first insulation thickness TMI1 less than the first field thickness TF1 of the first field insulating film 80 (TMI1<TF1). According to this structure, it is possible to suppress thinning of the first main surface insulating film 83 having the relatively thin first insulation thickness TMI1 resulting from the step of removing residue. In this case, the first main surface insulating film 83 preferably continues to the first insulating side wall 80*a* of the first field insulating film 80.

The first main surface insulating film 83 may include the first region 83*a* that is positioned on the semiconductor chip 2 side with respect to the first hidden surface 81 and the second region 83*b* that is positioned on the side opposite to the semiconductor chip 2 (main surface side of the first field insulating film 80) with respect to the first hidden surface 81. The first main surface insulating film 83 may be formed at an interval on the semiconductor chip 2 side from the intermediate portion in the thickness direction of the first field insulating film 80. The first main surface insulating film 83 may have the thickness that is not more than one-fifth of the first field insulating film 80.

The first main surface insulating film 83 may further include the first trench separation structure 43 that demarcates the first device region 6 in the first main surface 3. The first trench separation structure 43 may include the separation trench 44 that is formed in the first main surface 3, the separation insulating film 45 that covers the inner wall of the separation trench 44 and the separation electrode 46 that is embedded in the separation trench 44 across the separation insulating film 45.

In this case, the first field insulating film 80 preferably covers the first main surface 3 in the first device region 6. According to this structure, the first field insulating film 80 can be improved in reliability and, therefore, the functional device (power transistor 8 in this embodiment) formed in the first device region 6 can be improved in reliability.

In this case, the first field insulating film 80 preferably continues to the separation insulating film 45. The separation insulating film 45 may include the first portion 45*a* that covers the side wall of the separation trench 44 and the second portion 45*b* that covers the bottom wall of the separation trench 44. The first portion 45*a* has the first separation thickness TI1, and the second portion 45*b* has the second separation thickness TI2. The first field insulating film 80 preferably has the first field thickness TF1 greater than the second separation thickness TI2. The second separation thickness TI2 is preferably less than the first separation thickness TI1.

The semiconductor device 1 may include a functional device that is formed in the first device region 6 on the first main surface 3. In this case, the first field insulating film 80 preferably partially covers the first main surface 3 at an interval from the functional device in the first device region 6. In this case, the first field insulating film 80 can be improved in reliability and, therefore, the functional device (power transistor 8 in this embodiment) that is formed in the first device region 6 can be improved in reliability.

In this case, it is preferable that the first trench separation structure 43 demarcates the first device region 6 inside the semiconductor chip 2 and the first field insulating film 80 demarcates the first device region 6 on the semiconductor chip 2. The first field insulating film 80 may continue to the separation insulating film 45.

The functional device may include the trench gate structure 51 having a multiple electrode structure that includes the gate trench 53 formed in the first main surface 3, and the upper electrode 56 and the lower electrode 57 that are embedded in the gate trench 53 so as to be insulated and separated in an up/down direction by the insulator (upper insulating film 54, lower insulating film 55, and intermediate insulating film 58). In this case, the first field insulating film 80 is preferably formed at an interval from the trench gate structure 51.

The functional device may include the plurality of unit transistors 10, each of which has the trench gate structure 51. In this case, the functional device may include the n-system power transistor 8 (gate-split transistor) that includes the n-number (n≥2) of the system transistors 9, each of which is constituted of one or the plurality of unit transistors 10 which are systematized as the individually controlled object and hat generates the single output current IOUT by selectively controlling the n-number of the system transistors 9. According to this structure, it is possible to improve the reliability of the first field insulating film 80 and, therefore, possible to improve the reliability of the n-system power transistor 8.

The semiconductor device 1 may include the gate control circuit 12 that individually controls the n-number of system transistors 9. The gate control circuit 12 is preferably formed in the region of the first main surface 3 different from the first device region 6.

The semiconductor device 1 includes the semiconductor chip 2, and the second and the third field insulating films 120, 170. The second and third field insulating films 120, 170 have the second and third insulating side walls 120*a*, 170*a* that partially cover the first main surface 3 of the semiconductor chip 2 and have the second and third inclined angles θ2, θ3 made with the first main surface 3 which are not less than 20° and not more than 40°. According to this structure, it is possible to suppress residue from remaining in a state of adhering to the second and third insulating side walls 120*a*, 170*a*.

Also, according to the second and third insulating side walls 120*a*, 170*a* with the relatively gentle second and the third inclined angles θ2, θ3, for example, the step of removing residue can be omitted or the step of removing residue can be time-shortened. Therefore, it is possible to suppress thinning of structures (for example, second and third field insulating films 120, 170) other than residue resulting from the step of removing the residue. It is thus possible to suppress a deterioration in reliability of the semiconductor device 1 resulting from the residue.

The second and third inclined angles θ2, θ3 are preferably less than 40° (θ1<40°). It is particularly preferable that the second and third inclined angles θ2, θ3 fall within the range of 30°±6° (24°≤θ1≤36°). The second and third inclined angles θ2, θ3 typically fall within the range of not less than 28° and not more than 36° (28°≤θ1≤36°. The second and third field insulating films 120, 170 are preferably made up of the oxide of the semiconductor chip 2.

The semiconductor device 1 includes the second and third hidden surfaces 131, 181 that are formed at the portion of the first main surface 3 covered by the second and third field insulating films 120, 170. In this case, the semiconductor device 1 may include the second and third exposed surfaces 132, 182 that are depressed from the second and third hidden surfaces 131, 181 in the thickness direction of the semiconductor chip 2 and formed at the portion of the first main surface 3 exposed from the second and third field insulating films 120, 170.

The semiconductor device 1 may include the second and third main surface insulating films 133, 183 that cover the second and third exposed surfaces 132, 182. In this case, the second and third main surface insulating films 133, 183 may have the second and third insulation thickness TMI2, TMI3 which are less than the second and third field thickness TF2, TF3 of the second and third field insulating film 120, 170 (TMI2, TMI3<TF2, TF3). According to this structure, it is possible to suppress thinning of the second and third main surface insulating films 133, 183 having the relatively thin second and third insulation thicknesses TMI2, TMI3 resulting from the step of removing residue. In this case, the second and third main surface insulating films 133, 183 preferably continue to the second and third insulating side walls 120*a*, 170*a* of the second and third field insulating films 120, 170.

The second and third main surface insulating films 133, 183 may include the first regions 133*a*, 183*a* that are positioned on the semiconductor chip 2 side with respect to the second and third hidden surfaces 131, 181 and the second regions 133*b*, 183*b* that are positioned on the side opposite to the semiconductor chip 2 (on the main surface side of the second and third field insulating films 120, 170) with respect to the second and third hidden surfaces 131, 181. The second and third main surface insulating films 133, 183 may be formed at an interval on the semiconductor chip 2 side from the intermediate portions of the second and third field insulating films 120, 170 in the thickness direction. The second and third main surface insulating films 133, 183 may have the thickness that is not more than one-fifth of that of the second and third field insulating films 120, 170.

The second and third main surface insulating films 133, 183 may further include the second and third trench separation structures 104, 154 that demarcate the CMIS region 100 (first and second MIS regions 103, 153) as an example of the device region in the first main surface 3. The second and third trench separation structures 104, 154 may include the separation trench 44 (second and third separation trenches) that is formed in the first main surface 3, the separation insulating film 45 (second and third separation insulating films) that covers the inner wall of the separation trench 44, and the separation electrode 46 (second and third separation electrodes) that is embedded in the separation trench 44 across the separation insulating film 45.

In this case, the second and third field insulating films 120, 170 preferably cover the first main surface 3 in the first and second MIS regions 103, 153. According to this structure, the second and third field insulating films 120, 170 can be improved in reliability and, therefore, the functional device (in this embodiment, CMIS 100*a* including n-type first MISFET 101 and p-type second MISFET 102) that is formed in the first and second MIS regions 103, 153 can be improved in reliability.

In this case, the second and third field insulating films 120, 170 preferably continue to the separation insulating film 45. The separation insulating film 45 may include the first portion 45*a* that covers the side wall of the separation trench 44 and the second portion 45*b* that covers the bottom wall of the separation trench 44. The first portion 45*a* has the first separation thickness TI1, and the second portion 45*b* has the second separation thickness TI2. The second and third field insulating films 120, 170 preferably have the second and third field thicknesses TF2, TF3 greater than the second separation thickness TI2 (TI2<TF2, TF3). The second separation thickness TI2 is preferably less than the first separation thickness TI1.

The semiconductor device 1 may further include the first and second gate electrodes 134, 184 that cover the second and third main surface insulating films 133, 183. According to this structure, it is possible to suppress adhesion of residue to the second and third insulating side walls 120*a*, 170*a* and, therefore, to suppress a deterioration in reliability of the first and second gate electrodes 134, 184 resulting from residue. It is possible to suppress, for example, a change in film formability of the first and second gate electrodes 134, 184 or a change in gate threshold voltage resulting from the residue, etc.

The first and second gate electrodes 134, 184 may have the first and second lead-out portions 135, 185 that pass through the second and third insulating side walls 120*a*, 170*a* from on the second and third main surface insulating films 133, 183 and are led out onto the second and third field insulating films 120, 170. According to this structure, it is possible to suppress a deterioration in reliability of the first and second gate electrodes 134, 184 resulting from residue in a structure having the first and second lead-out portions 135, 185.

The present invention can be executed still in other modes.

As described in the aforementioned preferred embodiment, the first to third field insulating films 80, 120, 170 having relatively gentle first to third insulating side walls 80*a*, 120*a*, 170*a* can be applied to various functional devices. For example, in a semiconductor device having a LOCOS film, the LOCOS film can be replaced by the first to third field insulating films 80, 120, 170 that have the relatively gentle first to third insulating side walls 80*a*, 120*a*, 170*a*.

In the aforementioned preferred embodiment, a mode in which no power transistor 8 is provided may be adopted. That is, the aforementioned semiconductor device 1 may be provided only with the control IC 11. In the aforementioned preferred embodiment, a mode in which no control IC 11 is provided may be adopted. That is, the aforementioned semiconductor device 1 may be provided only with the power transistor 8. As a matter of course, the semiconductor device 1 that is provided only with the CMIS region 100 may be adopted.

In the aforementioned preferred embodiment, the lower electrode 57 of the trench gate structure 51 and the contact electrode 74 of the trench contact structure 71 are formed as a gate electrode. However, the lower electrode 57 and the contact electrode 74 may be formed as a source electrode. That is, the lower electrode 57 and the contact electrode 74 may be formed as a field electrode. In this case, the source wiring 96 is electrically connected to the contact electrode 74 in place of the gate wiring 14. According to this structure, it is possible to decrease a parasitic capacitance between the trench gate structure 51 and the semiconductor chip 2 (specifically, second semiconductor region 42) and, therefore, switching speed can be improved.

In the aforementioned preferred embodiment, a description has been given of an example in which the control IC 11 includes the sense transistor 21. The sense transistor 21 is preferably similar in structure to the power transistor 8 in view of a function that monitors a current flowing through the power transistor 8. That is, the sense transistor 21 preferably includes one or a plurality of unit transistors 10 (unit cell 50).

The sense transistor 21 may be formed in the second device region 7 or may be formed in the first device region 6. Where the sense transistor 21 is formed in the first device region 6, among the plurality of unit transistors 10, one or the plurality of unit transistors 10 (unit cell 50) may be used as the sense transistor 21. In this case, the power transistor 8 is constituted of a unit transistor 10 (unit cell 50) other than the unit transistor (unit cell 50) functioning as the sense transistor 21.

In the aforementioned preferred embodiment, a description has been given of an example in which the semiconductor device 1 includes the p-type second well region 155, the n-type third well region 156 and the p-type second contact region 161 in the second MIS region 153. However, the semiconductor device 1 does not necessarily include the p-type second well region 155 or the n-type third well region 156 in the second MIS region 153. In this case, an n-type contact region 161 may be adopted in place of the p-type contact region 161. The n-type contact region 161 preferably has an n-type impurity concentration higher than the n-type impurity concentration of the second semiconductor region 42.

In the aforementioned preferred embodiment, a description has been given of an example in which the first conductive type is an n-type and the second conductive type is a p-type. However, the first conductive type may be a p-type and the second conductive type may be an n-type. A specific configuration of this case is obtained by replacing the n-type region by the p-type region and replacing the p-type region by the n-type region in the aforementioned description and attached drawings.

Figure 24:
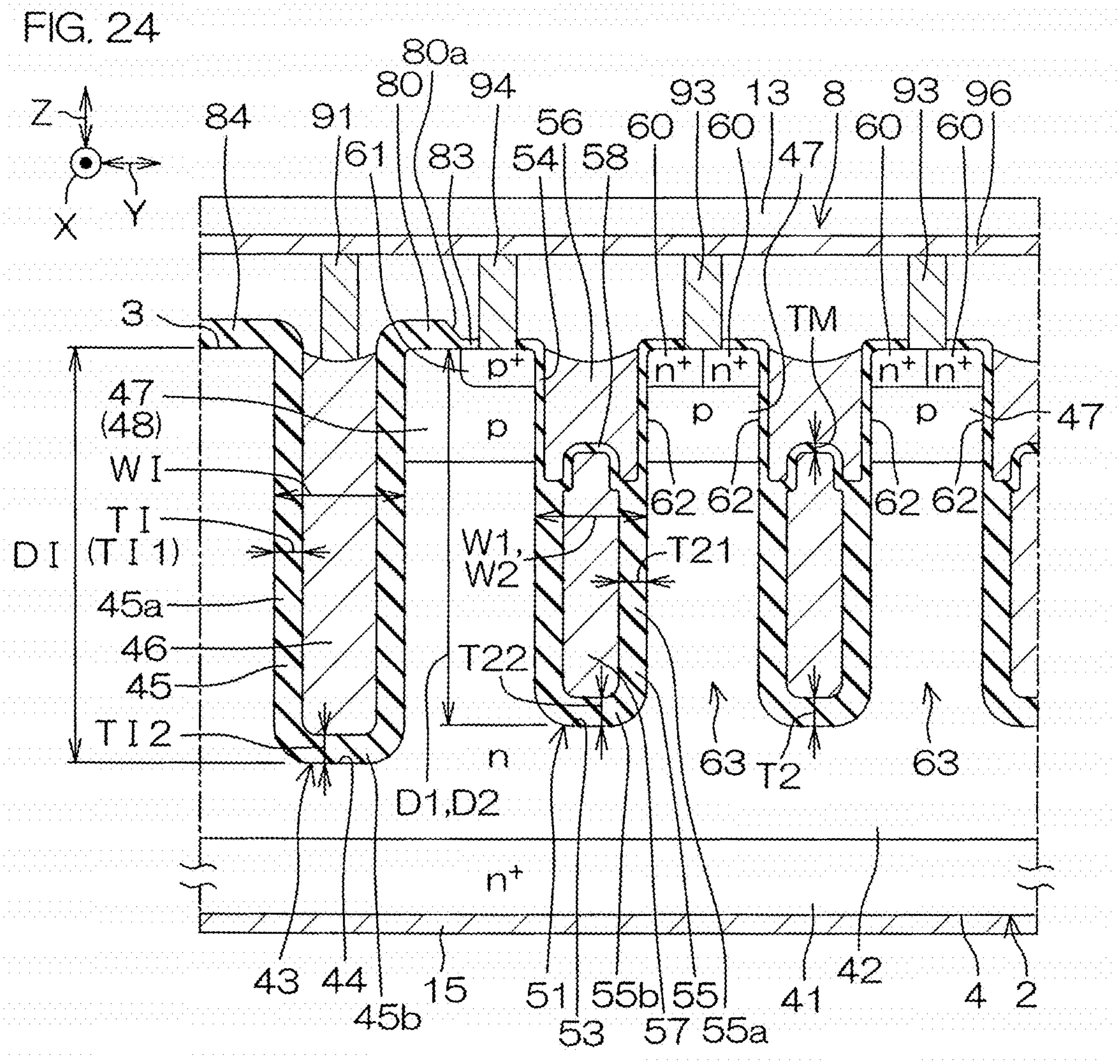
FIG. 24 corresponds to FIG. 12 and is a cross-sectional view of a modified example of a first trench separation structure.

In the aforementioned preferred embodiment, a description has been given to the effect that the first depth D1 of the trench gate structure 51 is preferably less than the separation depth D1 of the first trench separation structure 43 (D1<D1). This specific structure is shown in FIG. 24. FIG. 24 corresponds to FIG. 12 and is a cross-sectional view that shows a modified example of the first trench separation structure 51. In FIG. 24, a structure corresponding to the structure described in the aforementioned preferred embodiment will not be described specifically.

With reference to FIG. 24, the first trench separation structure 43 has the separation depth DI greater than the first depth D1 of the trench gate structure 51 (D1<DI). The first trench separation structure 43 has the separation width WI greater than the first width W1 of the trench gate structure 51 (W1<WI). Therefore, in the steps described in FIG. 22B and FIG. 23B, a total amount of an etchant that enters the separation trench 44 is larger than that of the etchant that enters the gate trench 53 (contact trench 72). As a result, the first trench separation structure 43 (separation trench 44) is formed deeper than the trench gate structure 51 (gate trench 53). According to such a structure, the first device region 6 can be appropriately demarcated from the other regions by the first trench separation structure 43.

This structure is applicable not only to the first trench separation structure 43 but also to the second trench separation structure 104 and the third trench separation structure 154. That is, each of the second trench separation structure 104 and the third trench separation structure 154 may have the separation depth DI greater than the first depth D1 of the trench gate structure 51 (D1<DI). In this case, the second trench separation structure 104 and the third trench separation structure 154 may have the separation depth DI substantially equal to the first trench separation structure 51.

Also, each of the second trench separation structure 104 and the third trench separation structure 154 may have the separation width WI greater than the first width W1 of the trench gate structure 51 (W1<WI). In this case, the second trench separation structure 104 and the third trench separation structure 154 may have the separation width WI substantially equal to that of the first trench separation structure 51. According to such a structure, the first MIS region 101 can be appropriately demarcated from the other regions by the second trench separation structure 104, and the second MIS region 153 can be appropriately demarcated from the other regions by the third trench separation structure 154.

Hereinafter, examples of the features extracted from the specification and the drawings will be shown.

Where the inclined angle of the insulating side wall is relatively steep (for example, where the inclined angle is more than 45°), residue (residual materials) remains in a state of adhering to the insulating side wall during a process of manufacturing a semiconductor device. Where the residue adheres to the insulating side wall, a change in electrical characteristics or a decrease in film formability resulting from the residue may be found.

This residue is removed by executing a step of over-etching a film forming material that could allow residue to remain or a step of etching the residue. The over-etching step is a step in which an etching is imparted to the film forming material in excess of an etching amount (etching time) necessary for removing the film forming material.

In the step of removing residue, structures other than the residue are also exposed to a chemical liquid and the structures other than the residue are also slightly removed. For example, where the field insulating film is thinned due to the step of removing residue, the field insulating film is deteriorated in reliability. As a result, the semiconductor device is also deteriorated in reliability. The following [A1] to [A20] provide a semiconductor device capable of improving the reliability. The following [B1] to [B15] provide a method for manufacturing the semiconductor device capable of improving the reliability.

[A1] A semiconductor device (1), comprising: a semiconductor chip (2) that has a main surface (3); and a field insulating film (80, 120, 170) that partially covers the main surface (3) and has an insulating side wall (80*a*, 120*a*, 170*a*) in which an inclined angle (81, 82, 83) made with the main surface (3) is not less than 20° and not more than 40°.

This semiconductor device has a structure that suppresses residue from remaining in a state of adhering to the insulating side wall. According to the relatively gentle insulating side wall, for example, a step of removing residue can be omitted or the step of removing residue can be time-shortened. Therefore, it is possible to suppress thinning of a structure other than residue (for example, field insulating film) resulting from the step of removing residue. It is thus possible to suppress a deterioration in reliability of the semiconductor device.

[A2] The semiconductor device (1) according to A1, further comprising: a hidden surface (81, 131, 181) that is formed at a portion of the main surface (3) which is covered by the field insulating film (80, 120, 170) and an exposed surface (82, 132, 182) that is formed at a portion of the main surface (3) which is exposed from the field insulating film (80, 120, 170) and depressed from the hidden surface (81, 131, 181) in the thickness direction of the semiconductor chip (2).

[A3] The semiconductor device (1) according to A2, further comprising: a main surface insulating film (83, 133, 183) that covers the exposed surface (82, 132, 182) and has a thickness (TMI1,TMI2,TMI3) less than the thickness (TF1, TF2, TF3) of the field insulating film (80, 120, 170).

[A4] The semiconductor device (1) according to A3, wherein the main surface insulating film (83, 133, 183) continues to the insulating side wall (80*a*, 120*a*, 170*a*) of the field insulating film (80, 120, 170).

[A5] The semiconductor device (1) according to A3 or A4, wherein the main surface insulating film (83, 133, 183) includes a first region (83*a*, 133*a*, 183*a*) positioned on the semiconductor chip (2) side with respect to the hidden surface (81, 131, 181) and a second region (83*b*, 133*b*, 183*b*) positioned on an upper end portion side of the field insulating film (80, 120, 170) with respect to the hidden surface (81, 131, 181).

[A6] The semiconductor device (1) according to any one of A3 to A5, wherein the main surface insulating film (83, 133, 183) is formed at an interval on the semiconductor chip (2) side from an intermediate portion of the field insulating film (80, 120, 170) in the thickness direction.

[A7] The semiconductor device (1) according to any one of A3 to A6, wherein the main surface insulating film (83, 133, 183) has a thickness that is not more than one-fifth of that of the field insulating film (80, 120, 170).

[A8] The semiconductor device (1) according to any one of A3 to A7, further comprising: a main surface electrode (134, 184) that covers the main surface insulating film (133, 183).

[A9] The semiconductor device (1) according to A8, wherein the main surface electrode (134, 184) passes through the insulating side wall (120*a*, 170*a*) from above the main surface insulating film (133, 183) and is led out onto the field insulating film (120, 170).

[A10] The semiconductor device (1) according to any one of A1 to A9, further comprising: a trench separation structure (43) that demarcates a device region (6, 7, 100, 103, 153) in the main surface (3) and that includes a separation trench (44) which is formed in the main surface (3), a separation insulating film (45) which covers an inner wall of the separation trench (44) and a separation electrode (46) which is embedded in the separation trench (44) across the separation insulating film (45); wherein the field insulating film (80, 120, 170) covers the main surface (3) in the device region (6, 7, 100, 103, 153).

[A11] The semiconductor device (1) according to A10, wherein the field insulating film (80, 120, 170) continues to the separation insulating film (45).

[A12] The semiconductor device (1) according to A10 or A11, wherein the separation insulating film (45) includes a first portion (45*a*) that covers a side wall of the separation trench (44) and a second portion (45*b*) that covers a bottom wall of the separation trench (44), and the field insulating film (80, 120, 170) has a thickness (TF1, TF2, TF3) greater than a thickness (TI2) of the second portion (45*b*).

[A13] The semiconductor device (1) according to any one of A1 to A12, wherein the field insulating film (80, 120, 170) has a first side extending in one direction (X) and a second side extending in an intersecting direction (Y) that intersects the one direction (X) in a plan view, and the insulating side wall (80*a*, 120*a*, 170*a*) is formed in the first side and the second side of the field insulating film (80, 120, 170).

[A14] The semiconductor device (1) according to any one of A1 to A13, wherein the field insulating film (80, 120, 170) is made up of an oxide of the semiconductor chip (2).

[A15] A semiconductor device (1) comprising: a semiconductor chip (2) that has a main surface (3); a trench separation structure (43) that demarcates a device region (6) in the main surface (3) and that includes a separation trench (44) formed in the main surface (3), a separation insulating film (45) covering an inner wall of the separation trench (44) and a separation electrode (46) embedded in the separation trench (44) across the separation insulating film (45); a functional device (8) that is formed in the device region (6) at the main surface (3); and a field insulating film (80) that partially covers the main surface (3) at an interval from the functional device (8) in the device region (6) and has an insulating side wall (80*a*) in which an inclined angle (θ1) made with the main surface (3) is not less than 20° and not more than 40°.

This semiconductor device has a structure that suppresses residue from remaining in a state of adhering to the insulating side wall. According to the relatively gentle insulating side wall, for example, a step of removing residue can be omitted or the step of removing residue can be time-shortened. Therefore, it is possible to suppress thinning of a structure other than the residue (for example, field insulating film) resulting from the step of removing residue. Also, the field insulating film can be improved in reliability and, therefore, the functional device that is formed in the device region can be improved in reliability. It is thus possible to suppress a deterioration in reliability of the semiconductor device.

[A16] The semiconductor device (1) according to A15, wherein the field insulating film (80, 120, 170) continues to the separation insulating film (45).

[A17] The semiconductor device (1) according to A15 or A16, wherein the functional device (8) includes a trench gate structure (51) that has a gate trench (53) formed in the main surface (3), and an upper electrode (56) and a lower electrode (57) which are embedded in the gate trench (53) so as to be insulated and separated in an up/down direction by the insulator (54, 55, 58), and the field insulating film (80) is formed at an interval from the trench gate structure (51).

[A18] The semiconductor device according to A17, wherein the functional device (8) includes a plurality of unit transistors (10) each of which has the plurality of trench gate structures (51).

[A19] The semiconductor device (1) according to A18, wherein the functional device (8) includes an n-system gate-split transistor (8) that includes n-number (n≥2) of system transistors (9) each of which is constituted of one or the plurality of unit transistors (10) systematized as an individually controlled object, and which generate a single output signal by selectively controlling the n-number of the system transistors (9).

[A20] The semiconductor device (1) according to A19, further comprising: a control circuit (11) that is formed in a region of the main surface (3) which is different from the device region (6), and that individually controls the n-number of the system transistors (9).

[B1] A method for manufacturing a semiconductor device (1) comprising: a step of preparing a semiconductor wafer (201) that has a main surface (203); a step of forming a first insulating film (208) that has a first etching rate and covers the main surface (203); a step of forming a second insulating film (211) that has a second etching rate higher than the first etching rate and covers the first insulating film (208), thereby forming a laminated insulating film (212) which has a laminated structure including the first insulating film (208) and the second insulating film (211); a step of forming a mask (213) that partially covers the laminated insulating film (212); and a step of forming a field insulating film (80, 120, 170) that partially covers the main surface (203) and has an insulating side wall (80*a*, 120*a*, 170*a*) on the main surface (203) in which an inclined angle (01, 02, 03) made between the main surface (203) and the insulating side wall (80*a*, 120*a*, 170*a*) is not less than 20° and not more than 40° by partially removing the laminated insulating film (212) by an etching method via the mask (213).

[B2] The method for manufacturing the semiconductor device (1) according to B1, wherein the first insulating film (208) has a first thickness and the second insulating film (211) has a second thickness less than the first thickness.

[B3] The method for manufacturing the semiconductor device (1) according to B1 or B2, wherein the first insulating film (208) is made up of an oxide film that is formed by an oxidation treatment method, and the second insulating film (211) is made up of an oxide film that is formed by a CVD method.

[B4] The method for manufacturing the semiconductor device (1) according to B3, further comprising: a step of sintering the second insulating film (211) before the step of forming the mask (213).

[B5] The method for manufacturing the semiconductor device (1) according to any one of B1 to B4, wherein the second insulating film (211) is partially removed by a wet etching method.

[B6] The method for manufacturing the semiconductor device (1) according to any one of B1 to B5, wherein the first insulating film (208) is partially removed by a wet etching method.

[B7] The method for manufacturing the semiconductor device (1) according to any one of B1 to B6, wherein a step of removing the first insulating film (208) is executed under the same conditions as the step of removing the second insulating film (211).

[B8] The method for manufacturing the semiconductor device (1) according to any one of B1 to B7, further comprising: a step of forming a trench (207, 44, 53, 72) in the main surface (203) before the step of forming the first insulating film (208); wherein the first insulating film (208) which covers the main surface (203) and an inner wall of the trench (207, 44, 53, 72) is formed.

[B9] The method for manufacturing the semiconductor device (1) according to B8, further comprising: a step of embedding an electrode (209, 46, 57, 74) in the trench (207, 44, 53, 72) across the first insulating film (208) before the step of forming the second insulating film (211); wherein the second insulating film (211) covers the first insulating film (208) and the electrode (209, 46, 57, 74).

[B10] The method for manufacturing the semiconductor device (1) according to any one of B1 to B9, further comprising: a step of forming a main surface insulating film (83, 133, 183) which covers a portion of the main surface (203) which is exposed from the field insulating film (80, 120, 170) and has a thickness less than a thickness of the field insulating film (80, 120, 170) after the step of removing the field insulating film (80, 120, 170).

[B11] The method for manufacturing the semiconductor device (1) according to B10, wherein the main surface insulating film (83, 133, 183) is made up of an oxide film that is formed by an oxidation treatment method.

[B12] The method for manufacturing the semiconductor device (1) according to B10 or B11, wherein the main surface insulating film (83, 133, 183) is formed at an interval on the semiconductor wafer (201) side from an intermediate portion of the field insulating film (80, 120, 170) in the thickness direction.

[B13] The method for manufacturing the semiconductor device (1) according to any one of B10 to B12, wherein the main surface insulating film (83, 133, 183) has a thickness which is not more than one-fifth of that of the field insulating film (80, 120, 170).

[B14] The method for manufacturing the semiconductor device (1) according to any one of B10 to B13, further comprising: a step of forming an electrode film (215) which covers the main surface insulating film (83, 133, 183), the first insulating film (208) and the second insulating film (211); and a step of forming a main surface electrode (134, 184) which covers at least a part of the main surface insulating film (83, 133, 183) by partially removing the electrode film (215).

[B15] The method for manufacturing the semiconductor device (1) according to any one of B10 to B14, further comprising: a step of forming the field insulating film (80, 120, 170) which is constituted of the first insulating film (208) by removing the second insulating film (211) by an etching method after the step of forming the field insulating film (80, 120, 170).

The following [C1] to [C22] provide a semiconductor device that is provided with an on-resistance changeable transistor.

[C1] A semiconductor device (1), comprising: a semiconductor chip (2); and a plural-system gate-split transistor (8) that includes a first system transistor (9) and a second system transistor (9) which are formed in the semiconductor chip (2), and that generates a single output signal (IOUT) by selectively controlling the first system transistor (9) and the second system transistor (9). According to this structure, it is possible to provide the semiconductor device having an on-resistance changeable transistor.

[C2] The semiconductor device (1) according to 01, wherein the gate-split transistor (8) is to be controlled by a plurality of operation modes different in switching pattern between the first system transistor (9) and the second system transistor (9) during a normal operation and during an active clamp operation.

[C3] The semiconductor device (1) according to C2, wherein the gate-split transistor (8) is to be controlled so as to be in an on state by both of the first system transistor (9) and the second system transistor (9) during the normal operation.

[C4] The semiconductor device (1) according to C2 or C3, wherein the gate-split transistor (8) is to be controlled so as to be in an on state by one of the first system transistor (9) and the second system transistor (9) during the active clamp operation.

[C5] The semiconductor device (1) according to any one of C2 to C4, wherein the gate-split transistor (8) is to be operated in a first on-resistance during the normal operation and operated in a second on-resistance greater than the first on-resistance during the active clamp operation.

[C6] The semiconductor device (1) according to any one of C1 to C5, wherein a first gate signal (G) is to be individually input to the first system transistor (9) and a second gate signal (G) is to be individually input to the second system transistor (9).

[C7] The semiconductor device (1) according to any one of C1 to C6, further comprising: a first gate wiring (14) that is connected to the first system transistor (9) on the semiconductor chip (2); and a second gate wiring (14) that is connected to the second system transistor (9) on the semiconductor chip (2).

[C8] The semiconductor device (1) according to any one of C1 to C7, further comprising: a device region (6) that is demarcated in the semiconductor chip (2); wherein the first system transistor (9) and the second system transistor (9) are collectively formed in the device region (6).

[C9] The semiconductor device (1) according to any one of C1 to C8, further comprising: a plurality of unit transistors (10) that are formed in the semiconductor chip (2); wherein the first system transistor (9) includes one or a plurality of first unit transistors (10) that are systematized as an individually controlled object from the plurality of unit transistors (10), and the second system transistor (9) includes one or a plurality of second unit transistors (10) that are systematized as an individually controlled object from the plurality of unit transistors (10) excluding the first unit transistor (10).

The semiconductor device (1) according to any one of C1 to C9, further comprising: a control circuit (11) that is formed in a region of the semiconductor chip (2) different from the gate-split transistor (8), and that controls the gate-split transistor (8).

[C11] A semiconductor device (1), comprising: a semiconductor chip (2); and a plural-system gate-split transistor (8) that includes a first system transistor (9), a second system transistor (9) and a third system transistor (9) which are formed in the semiconductor chip (2), and that generates a single output signal (IOUT) by selectively controlling the first system transistor (9), the second system transistor (9) and the third system transistor (9). According to this structure, it is possible to provide the semiconductor device that has an on-resistance changeable transistor.

[C12] The semiconductor device (1) according to C11, wherein the gate-split transistor (8) is to be controlled by a plurality of operation modes, each of which is different in switching pattern among the first system transistor (9), the second system transistor (9) and the third system transistor (9), during at least two operations of an on-transition operation, a normal operation, an off-transition operation and an active clamp operation.

[C13] The semiconductor device (1) according to C12, wherein the gate-split transistor (8) is to be controlled so as to be in an on state by all of the first system transistor (9), the second system transistor (9) and the third system transistor (9) during the on-transition operation.

[C14] The semiconductor device (1) according to C12 or C13, wherein the gate-split transistor (8) is to be controlled so as to be in an on state by any two of the first system transistor (9), the second system transistor (9) and the third system transistor (9) during the normal operation.

[C15] The semiconductor device (1) according to any one of C12 to C14, wherein the gate-split transistor (8) is to be controlled so as to be in an on state by all of the first system transistor (9), the second system transistor (9) and the third system transistor (9) during the off-transition operation.

[C16] The semiconductor device (1) according to any one of C12 to C15, wherein the gate-split transistor (8) is to be controlled so as to be in an on state by any one of the first system transistor (9), the second system transistor (9) and the third system transistor (9) during the active clamp operation.

[C17] The semiconductor device (1) according to any one of C12 to C16, wherein the gate-split transistor (8) is to be operated in a first on-resistance during the on-transition operation, operated in a second on-resistance greater than the first on-resistance during the normal operation, operated in a third on-resistance less than the second on-resistance during the off-transition operation, and operated in a fourth on-resistance greater than the second on-resistance during the active clamp operation.

[C18] The semiconductor device (1) according to any one of C11 to C17, wherein a first gate signal (G) is to be individually input to the first system transistor (9), a second gate signal (G) is to be individually input to the second system transistor (9), and a third gate signal (G) is to be individually input to the third system transistor (9).

[C19] The semiconductor device (1) according to any one of C11 to C18, further comprising: a first gate wiring (14) that is connected to the first system transistor (9) on the semiconductor chip (2); a second gate wiring (14) that is connected to the second system transistor (9) on the semiconductor chip (2); and a third gate wiring (14) that is connected to the third system transistor (9) on the semiconductor chip (2).

[C20] The semiconductor device (1) according to any one of C11 to C19, further comprising: a device region (6) that is demarcated in the semiconductor chip (2); wherein the first system transistor (9), the second system transistor (9) and the third system transistor (9) are collectively formed in the device region (6).

[C21] The semiconductor device (1) according to any one of C11 to C20, further comprising: a plurality of unit transistors (10) that are formed in the semiconductor chip (2); wherein the first system transistor (9) includes one or a plurality of first unit transistors (10) that are systematized as an individually controlled object from the plurality of unit transistors (10), the second system transistor (9) includes one or a plurality of second unit transistors (10) that are systematized as an individually controlled object from the plurality of unit transistors (10) excluding the first unit transistor (10), and the third system transistor (9) includes one or a plurality of third unit transistors (10) that are systematized as an individually controlled object from the plurality of unit transistors (10) excluding the first unit transistor (10) and the second unit transistor (10).

[C22] The semiconductor device (1) according to any one of C11 to C21, further comprising: a control circuit (11) that is formed in a region of the semiconductor chip (2) different from the gate-split transistor (8), and that controls the gate-split transistor (8).

While preferred embodiments of the present invention have been described in detail, these are merely specific examples used to clarify the technical content of the present invention, and the present invention should not be interpreted as being limited to these specific examples and the scope of the present invention shall be limited only by the attached Claims.

REFERENCE SIGNS LIST

1 Semiconductor device
2 Semiconductor chip
3 First main surface
6 First device region
8 Power transistor (gate-split transistor)
9 System transistor
10 Unit transistor
12 Gate control circuit (control circuit)
43 First trench separation structure
44 Separation trench
45 Separation insulating film
45*a* First portion of separation insulating film
45*b* Second portion of separation insulating film
46 Separation electrode
51 Trench gate structure
53 Gate trench
54 Upper insulating film
55 Lower insulating film
56 Upper electrode
57 Lower electrode
58 Intermediate insulating film
80 First field insulating film
80*a* First insulating side wall
81 First hidden surface
82 First exposed surface
83 First main surface insulating film
83*a* First region of first main surface insulating film
83*b* Second region of first main surface insulating film
100 CMIS region
101 First MIS region
104 Second trench separation structure
120 Second field insulating film
120*a* Second insulating side wall
131 Second hidden surface
132 Second exposed surface
133 Second main surface insulating film
133*a* First region of second main surface insulating film
133*b* Second region of second main surface insulating film
134 Second gate electrode (electrode)
153 Second MIS region
154 Third trench separation structure
170 Third field insulating film
170*a* Third insulating side wall
181 Third hidden surface
182 Third exposed surface
183 Third main surface insulating film
183*a* First region

183*b* Second region
184 Second gate electrode (electrode)
IOUT Output current (output signal)
TF1 First field thickness
TF2 Second field thickness
TF3 Third field thickness
TI1 First separation thickness
TI2 Second separation thickness
TMI1 First insulation thickness
TMI2 Second insulation thickness
TMI3 Third insulation thickness
θ1 First inclined angle
θ2 Second inclined angle
θ3 Third inclined angle

The invention claimed is:

1. A semiconductor device comprising:
a semiconductor chip that has a main surface;
a field insulating film that partially covers the main surface and has an insulating side wall in which an inclined angle made with the main surface is not less than 20° and not more than 40°;
a hidden surface that is formed in a portion of the main surface which is covered by the field insulating film;
an exposed surface that is formed in a portion of the main surface which is exposed from the field insulating film and depressed from the hidden surface to a thickness direction of the semiconductor chip; and
an inclined surface that is formed in a portion of the main surface which connects the hidden surface and the exposed surface and slopes obliquely from the hidden surface toward the exposed surface.

2. The semiconductor device according to claim 1, further comprising:
a main surface insulating film that covers the exposed surface and has a thickness less than a thickness of the field insulating film, wherein the main surface insulating film is integrally connected to the field insulating film at the inclined surface.

3. The semiconductor device according to claim 2, wherein the main surface insulating film continues to the insulating side wall of the field insulating film.

4. The semiconductor device according to claim 2, wherein the main surface insulating film includes a first region that is positioned on the semiconductor chip side with respect to the hidden surface and a second region that is positioned on a side opposite to the semiconductor chip with respect to the hidden surface.

5. The semiconductor device according to claim 2, wherein the main surface insulating film is formed at an interval on the semiconductor chip side from an intermediate portion of the field insulating film in the thickness direction.

6. The semiconductor device according to claim 2, wherein the main surface insulating film has a thickness that is not more than one-fifth of that of the field insulating film.

7. The semiconductor device according to claim 2, further comprising:
a main surface electrode that covers the main surface insulating film.

8. The semiconductor device according to claim 7, wherein the main surface electrode passes through the insulating side wall from above the main surface insulating film and is led out onto the field insulating film.

9. The semiconductor device according to claim 1, further comprising:
a trench separation structure that demarcates a device region in the main surface and that includes a separation trench which is formed in the main surface, a separation insulating film which covers an inner wall of the separation trench and a separation electrode which is embedded in the separation trench across the separation insulating film;
wherein the field insulating film covers the main surface in the device region.

10. The semiconductor device according to claim 9, wherein the field insulating film continues to the separation insulating film.

11. The semiconductor device according to claim 9, wherein
the separation insulating film includes a first portion that covers a side wall of the separation trench and a second portion that covers a bottom wall of the separation trench, and
the field insulating film has a thickness greater than a thickness of the second portion.

12. The semiconductor device according to claim 1, wherein
the field insulating film has a first side extending in one direction and a second side extending in an intersecting direction that intersects the one direction in a plan view, and
the insulating side wall is formed in the first side and the second side of the field insulating film.

13. The semiconductor device according to claim 1, wherein the field insulating film includes an oxide of the semiconductor chip.

14. A semiconductor device comprising:
a semiconductor chip that has a main surface;
a trench separation structure that demarcates a device region in the main surface and that includes a separation trench which is formed in the main surface, a separation insulating film which covers an inner wall of the separation trench and a separation electrode which is embedded in the separation trench across the separation insulating film;
a functional device that is formed in the device region at the main surface; and
a field insulating film that partially covers the main surface at an interval from the functional device in the device region and has an insulating side wall in which an inclined angle made with the main surface is not less than 20° and not more than 40°,
wherein the functional device includes a trench gate structure that has a gate trench formed in the main surface, and an upper electrode and a lower electrode which are embedded in the gate trench so as to be insulated and separated in an up/down direction by an insulator,
the field insulating film is formed at an interval from the trench gate structure,
the functional device includes a plurality of unit transistors each of which includes the plurality of trench gate structures,
the functional device includes an n-system gate-split transistor that includes n-number (n≥2) of system transistors each of which is constituted of one or the plurality of unit transistors systematized as an individually controlled object, and which generate a single output signal by selectively controlling the n-number of the system transistors, and
the semiconductor device further comprises a control circuit that is formed in a region of the main surface which is different from the device region, and that individually controls the n-number of the system transistors.

15. The semiconductor device according to claim 14, wherein the field insulating film continues to the separation insulating film.

* * * * *